US006772181B1

(12) United States Patent
Fu et al.

(10) Patent No.: US 6,772,181 B1
(45) Date of Patent: Aug. 3, 2004

(54) APPARATUS AND METHOD FOR TRIGONOMETRIC INTERPOLATION

(75) Inventors: Dengwei Fu, Santa Clara, CA (US); Alan N. Willson, Jr., Pasadena, CA (US)

(73) Assignee: Pentomics, Inc., Pasadena, CA (US)

( * ) Notice: Subject to any disclaimer, the term of this patent is extended or adjusted under 35 U.S.C. 154(b) by 454 days.

(21) Appl. No.: 09/699,088

(22) Filed: Oct. 30, 2000

Related U.S. Application Data

(60) Provisional application No. 60/162,391, filed on Oct. 29, 1999.

(51) Int. Cl.[7] .............................. G06F 17/17; G06F 7/38
(52) U.S. Cl. ....................................... 708/313; 708/290
(58) Field of Search ................................ 708/313, 290, 708/405

(56) References Cited

U.S. PATENT DOCUMENTS

| | | | |
|---|---|---|---|
| 3,646,337 A | | 2/1972 | Bifulco, Jr. |
| 3,974,367 A | | 8/1976 | Mayer |
| 4,340,939 A | | 7/1982 | Mayer |
| 4,719,833 A | * | 1/1988 | Katoh et al. ................. 708/290 |
| 5,276,633 A | | 1/1994 | Fox et al. |
| 5,373,236 A | * | 12/1994 | Tsui et al. ................... 708/290 |
| 5,500,874 A | * | 3/1996 | Terrell ......................... 708/313 |
| 6,115,726 A | * | 9/2000 | Ignjatovic ................... 708/300 |
| 6,144,712 A | * | 11/2000 | Samuelli et al. ............ 708/290 |

OTHER PUBLICATIONS

Ahn, Y. et al., "VLSI Design Of A Cordic–Based Derotator," *Proc. 1998 IEEE Int. Symp. Circuits Syst.*, vol. II, pp. 449–452 (May 1998).

Andronico, M. et al., "A New Algorithm for Fast Synchronization in a Burst Mode PSK Demodulator," *Proc. 1995 IEEE Int. Conf. Comm.*, vol. 3, pp. 1641–1646 (Jun. 1995).

Arivoli, T. et al., "A Sinle Chip DMT Modem for High–Speed WLANs," *Proc. 1998 Custom Integrated Circuits Conf.*, IEEE, pp. 9–11 (May 1998).

Boutin, N., "An Arctangent Type Wideband PM/FM Demodulator With Improved Performance," *IEEE Trans. Consumer Electron.*, vol. 38, No. 1, pp. 5–9 (Feb. 1992).

Buchanan, K. et al., "IMT–2000: Service Provider's Perspectives," *IEEE Personal Communications*, pp. 8–13 (Aug. 1997).

Chen, A. et al., "Modified CORDIC Demodulator Implementation for Digital IF–Sampled Receiver," *Proc. Globecom 1995*, vol. 2, pp. 1450–1454 (1995)

(List continued on next page.)

*Primary Examiner*—Tan V. Mai
(74) *Attorney, Agent, or Firm*—Sterne, Kessler, Goldstein & Fox PLLC

(57) ABSTRACT

A trigonometric interpolator interpolates between two data samples at an offset $\mu$, where the two data samples are part of a set of N data samples. The trigonometric interpolator fits a trigonometric polynomial to the N data samples and evaluates the trigonometric polynomial at the offset $\mu$. The trigonometric inteprolator can be utilized for data rate changing and to correct mismatches between received samples and transmitted symbols. Simulations demonstrate that the trigonometric interpolater attains better performance than "conventional" interpolators, while simultaneously reducing the required hardware. In embodiments, the filter response of the trigonometric interpolator can be modified to achieve an arbitrary frequency response in order to enhance the interpolator performance. More specifically, the frequency response of the interpolator can be shaped to effectively correspond with the frequency response of the input data samples and the offset $\mu$. Using this optimization technique, the overall interpolation error is reduced. As for the implementation, the optimal interpolator does not require additional hardware when a lookup table is used for sine and cosine values. When high precision, high speed and a small table are desired, the trigonometric interpolator can be implemented using an angle-rotation processor that is also described here.

43 Claims, 64 Drawing Sheets-

OTHER PUBLICATIONS

Chen, A. et al., "Reduced Complexity CORDIC Demodulator Implementation for D–AMPS and Digital IF–Sampled Receiver," *Proc. Globecom 1998*, vol. 3, pp. 1491–1496 (1998).

Cho, K., *A Frequency–Agile Single–Chip QAM Modulator with Beamforming Diversity*, Dissertation Submitted to the University of California, Los Angeles, 137 pages (1999).

Critchlow, D.N., *The Design and Simulation of a Modulatable Direct Digital Synthesizer With Non Iterative Coordinate Transformation and Noise Shaping Filter*, Thesis Submitted to the University of California, San Diego, 55 pages (1989).

Daneshrad, B., Ph.D., *System design of a 1.6 Mbps all–digital QAM transceiver for digital subscriber line applications*, Dissertation Submitted to the University of California, Los Angeles, 156 pages (1993).

Erup, L. et al., "Interpolation in Digital Modems—Part II: Implementation and Performance," *IEEE Transactions on Communications*, vol. 41, No. 6, pp. 998–1008 (Jun. 1993).

Farrow, C.W., "A Continuously Variable Digital Delay Element," *ISCAS' 88*, IEEE, pp. 2641–2645 (1988).

Fitz, M.P. and Lindsey, W.C., "Decision–Directed Burst–Mode Carrier Synchronization Techniques," *IEEE Transactions on Communicaitons*, vol. 40, No. 10, pp, 1644–1653 (Oct. 1992).

Fowler, D.L. and Smith, J.E., "An Accurate, High Speed Implementation of Division by Reciprocal Approximation," *Proc. 9th Symp. On Computer Arithemtic*, pp. 60–67 (1989).

Freeman, H., *Discrete–Time Systems: An Introduction to the Theory*, John Wiley & Sons, Inc., Library of Congress Catalog Card No. 65–14255, Entire Book submitted (1965).

Fu, D. and Willson Jr., A.N., "Interpolation In Timing Recovery Using A Trigonometric Polynomial And Its Implemenation," *Globecom 1998 Comm. Theory Mini Conf. Record*, IEEE, pp. 173–178 (Nov. 1998).

Gardner, F.M., "Interpolation in Digital Modems—Part I: Fundamentals," *IEEE Transactions on Communications*, vol. 41, No. 3, pp. 501–507 (Mar. 1993).

Gardner, S., "Burst modem design techniques: part 1," *Electronic Engineering*, p. 85(5), (Sep. 1999).

Gardner, S., "Burst modem design techniques: part 2," *Electronic Engineering*, p. 75(5), (Dec. 1999).

Koren, I., *Computer Arithmetic Algorithms*, Prentice Hall, ISBN No. 0–13–151952–2, Entire book submitted (1993).

Lang, T. and Antelo, E., "CORDIC Vectoring with Arbitrary Target Value," *IEEE Transactions On Computers*, vol. 47, No. 7, pp. 736–749 (Jul. 1998).

Madisetti, A. et al., "A 100–MHz, 16–b, Direct Digital Frequency Synthesizer with a 100–dBc Spurious–Free Dynamic Range," *IEEE Journal of Solid–State Circuits*, vol. 34, No. 8, pp. 1034–1043 (Aug. 1999).

Madisetti, A., *VLSI Architectures and IC Implementations for Bandwidth Efficient Communications*, Dissertation submitted to the University of California, Los Angeles, 132 pages (1996).

Meyr, H. et al., *Digital Communication Receivers: Synchronization, Channel Estimation, and Signal Processing*, John Wiley & Sons, Inc., ISBN No. 0–471–50275–8, Entire book submitted (1998).

Moeneclaey, M., "A Simple Lower Bound on the Linearized Performance of Practical Symbol Synchronizers," *IEEE Transaction on Communications*, vol. COM–31, No. 9, pp. 1029–1032 (Sep. 1983).

Oerder, M. and Meyr, H., "Digital Filter and Square Timing Recovery," *IEEE Transactions on Communications*, vol. 36, No. 5, pp. 605–612 (May 1988).

Pollet, T. and Peeters, M., "Synchronization with DMT Modulation," *IEEE Communications Magazine*, pp. 80–86 (Apr. 1999).

Proakis, J. G., *Digital Communications, Third Edition*, McGraw–Hill, Inc., ISBN No. 0–07–051726–6, Entire book submitted (1995).

Proakis, J.G. and Manolakis, D.G., *Digital Signal Processing: Principles, Algorithms, and Applications, Second Edition*, Macmillan Publishing Company, ISBN No. 0–02–396815–X, Entire book submitted (1992).

Reimers, U., "Digital Video Broadcasting," *IEEE Communications Magazine*, pp. 104–110 (Jun. 1998).

Sabel, L.P. and Cowley, W.G., "A Recursive Algorithm For The Estimation Of Symbol Timing In PSK Burst Modems," *Proc. Globecom 1992*, vol. 1, pp. 360–364 (1992).

Tan, L.K, *High Performance Architectures And Circuits For QAM Transceivers*, Dissertation submitted to the University of California, Los Angeles, 208 pages (1995).

Tan, L.K. and Samueli, H., "A 200 MHz Quadrature Digital Synthesizer/Mixer in 0.8$\mu$m CMOS," *IEEE Journal of Solid–State Circuits*, vol. 30, No. 3, pp. 193–200 (Mar. 1995).

Vankka, J., "Methods of Mapping from Phase to Sine Amplitude in Direct Digital Synthesis," *IEEE Transactions on Ultrasonics, Ferroelectrics, and Frequency Control*, vol. 44, No. 2, pp. 526–534 (Mar. 1997).

Vesma, J. and Saramäki, T., "Interpolation Filters With Arbitrary Frequency Response For All–Digital Receivers," *Proc. 1996 IEEE Int. Symp. Circuits Syst.*, pp. 568–571 (May 1996).

Vuori, J., "A Digital Multistandard Paging Receiver," *IEEE Transctions on Consumer Electronics*, vol. 45, No. 4, pp, 1098–1103 (Nov. 1999).

Wang, S. et al., "Hybrid CORDIC Algorithms," *IEEE Transactions on Computers*, vol. 46, No. 11, pp. 1202–1207 (Nov. 1997).

Antelo, E. et al., "Redundant CORDIC Rotator Based on Parallel Prediction," pp. 172, 179, IEEE (1995).

* cited by examiner

A SIMPLIFIED PSK TRANSMITTER

A SIMPLIFIED PSK RECEIVER

SIMPLIFIED BLOCK DIAGRAM OF AN OFDM SYSTEM

PSK RECEIVER WITH CARRIER AND TIMING RECOVERY

INTERPOLATION ENVIRONMENT

THE LAGRANGE BASIS POLYNOMIALS

THE FARROW STRUCTURE THAT IMPLEMENTS (2.5) AND (2.6)

IMPULSE RESPONSES OF LAGRANGE INTERPOLATOR

IMPULSE RESPONSES OF TRIGONOMETRIC INTERPOLATOR

FREQUENCY RESPONSES FOR N=4

FREQUENCY RESPONSES FOR N=32

SIGNAL WITH TWO SAMPLES/SYMBOL AND 100% EXCESS BW

NMSE OF THE INTERPOLATED SIGNAL
INTERPOLATOR PERFORMANCE

THE CRITICAL PATH OF THE LAGRANGE CUBIC INTERPOLATOR

TRIGONOMETRIC INTERPOLATOR (N=4)

FIG. 11 TRIGONOMETRIC INTERPOLATOR WITH N=8

CONCEPTUAL MODIFICATION OF INPUT SAMPLES

CORRECTING THE OFFSET DUE TO MODIFICATION OF ORIGINAL SAMPLES

TRIGONOMETRIC INTERPOLATOR N=4

THE MODIFIED TRIGONOMETRIC INTERPOLATOR

LAGRANGE CUBIC

TRIGONOMETRIC INTERPOLATOR. 1000
(FIG. 10)

TRIGONOMETRIC INTERPOLATOR 1400
(FIG. 14)

OPTIMAL STRUCTURE

NORMALIZED IMPULSE RESPONSES
f OF THE INTERPOLATION FILTERS

NORMALIZED IMPULSE RESPONSES
f OF THE INTERPOLATION FILTERS

NORMALIZED FREQUENCY RESPONSES
F OF THE INTERPOLATION FILTERS

NORMALIZED FREQUENCY RESPONSES
F OF THE INTERPOLATION FILTERS

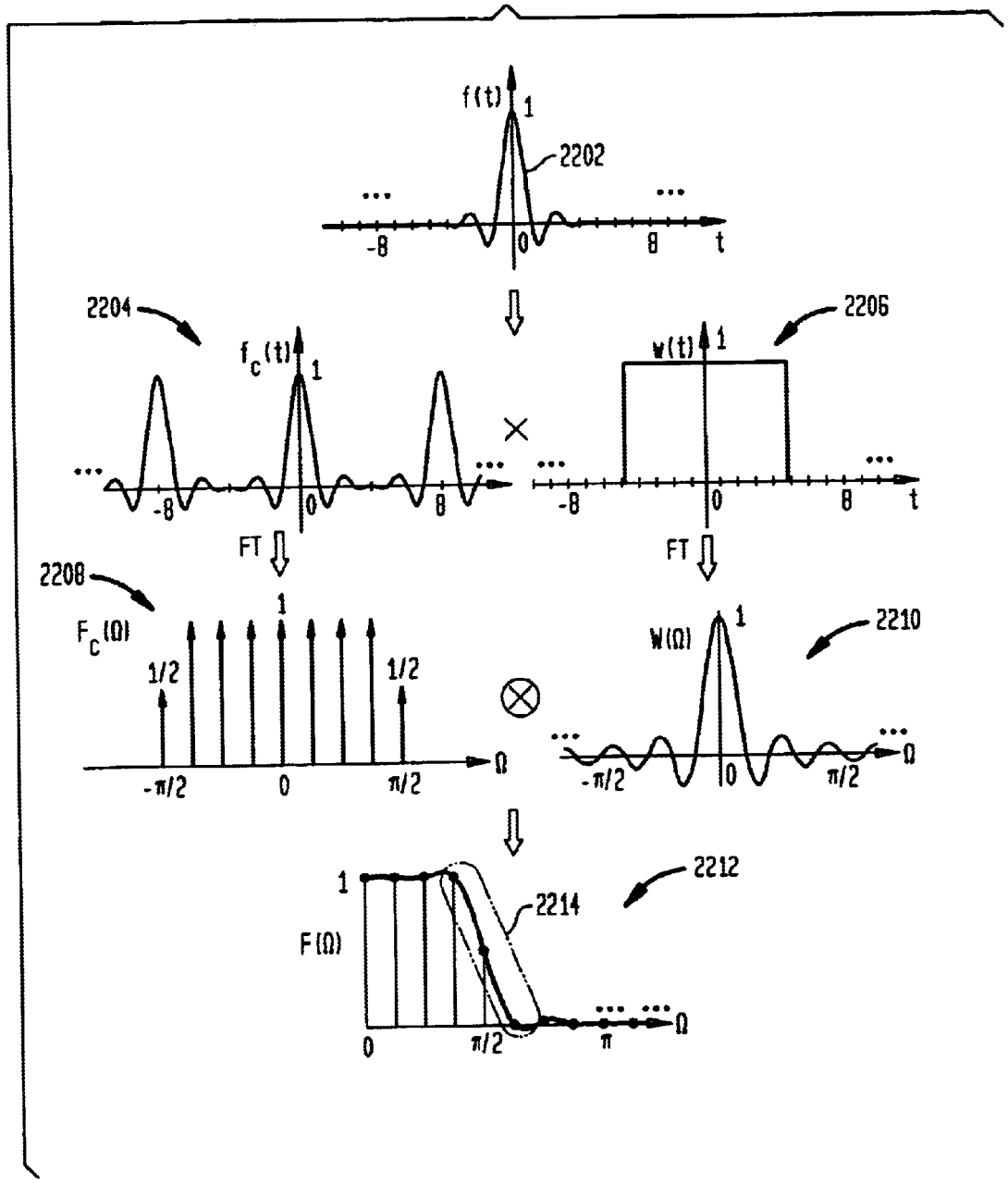

EFFECT OF A MORE GRADUAL TRANSITION AT THE BAND EDGE

EFFECT OF A MORE GRADUAL TRANSITION AT THE BAND EDGE

REDUCING THE TRANSITION BANDWIDTH BY INCREASING N

IMPULSE RESPONSE OF THE ORIGINAL FILTER AND THE MODIFIED FILTER

THE EQUIVALENT WINDOW

FORMING THE FREQUENCY RESPONSE OF THE DISCRETE-TIME FRACTIONAL-DELAY FILTER

FRACTIONAL-DELAY FILTER WITH $u=0.12$, USING THE PRELIMINARY N=8 INTERPOLATOR

FRACTIONAL-DELAY FILTER WITH $u=0.5$, USING THE PRELIMINARY N=8 INTERPOLATOR

μ=0.12

μ=0.5

μ=0.12

μ=0.5

$F_\mu(\omega)$, WITH $\mu=0.5$, N=8, BEFORE OPTIMIZATION $F_\mu(\omega)$, WITH $\mu=0.5$, N=8, AFTER OPTIMIZATION $F_\mu(\omega)$, WITH $\mu=0.5$, N=4, BEFORE MODIFICATION $F_\mu(\omega)$, WITH $\mu=0.5$, N=4, AFTER MODIFICATION $F_u(\omega)$, $u=0.5$, SIMPLIFIED N=4 STRUCTURE BEFORE MODIFICATION $F_u(\omega)$, $u=0.5$, SIMPLIFIED N=4 STRUCTURE AFTER MODIFICATION REAL AND IMAGINARY COMPONENTS OF THE $F_u(1)e^{j\frac{\pi}{2}u}$ VALUE

SIGNAL WITH TWO SAMPLES/SYMBOL AND 40% EXCESS BANDWIDTH

THE OPTIMIZED STRUCTURE FOR N=4

THE OPTIMIZED STRUCTURE FOR N=4

FIG. 42 THE INTERNAL WORDLENGTH OF THE STRUCTURE THAT ACHIEVED 90.36 db SFDR

OUTPUT SPECTRUM SHOWING 90.36 dB SFDR

A MODIFIED ARCHITECTURE WHEN ONLY ONE OUTPUT IS NEEDED

WHERE THE ADDER IS AN OVERFLOWING ACCUMULATOR

ORIGINAL BOOTH TABLE — 5002

| b2 | b1 | b0 | PP |
|----|----|----|------|
| 0  | 0  | 0  | 0*A  |
| 0  | 0  | 1  | 1*A  |
| 0  | 1  | 0  | 1*A  |
| 0  | 1  | 1  | 2*A  |
| 1  | 0  | 0  | -2*A |
| 1  | 0  | 1  | -1*A |
| 1  | 1  | 0  | -1*A |
| 1  | 1  | 1  | 0*A  |

NEGATING BOOTH TABLE — 5102

| b2 | b1 | b0 | PP |
|----|----|----|------|
| 0  | 0  | 0  | 0*A  |
| 0  | 0  | 1  | -1*A |
| 0  | 1  | 0  | -1*A |
| 0  | 1  | 1  | -2*A |
| 1  | 0  | 0  | 2*A  |
| 1  | 0  | 1  | 1*A  |
| 1  | 1  | 0  | 1*A  |
| 1  | 1  | 1  | 0*A  |

ANGLE ROTATOR CONFIGURED AS A QUADRATURE DIRECT DIGITAL SYNTHESIZER (QDDS)

ANGLE ROTATOR CONFIGURED AS A "COSINE-ONLY" DIRECT DIGITAL SYNTHESIZER (DDS) (FROM FIG. 39)

ANGLE ROTATOR CONFIGURED AS A "COSINE-ONLY" DIRECT DIGITAL SYNTHESIZER (DDS) (FROM FIG. 44)
5700

COMMON PACKET FORMAT

THE SIMPLIFIED SYSTEM MODEL

MEAN VALUES OF THE PREAMBLE CORRELATOR OUTPUT, FOR θ=0

PRELIMINARY SYMBOL-TIMING ESTIMATION STRUCTURE

BIAS DUE TO TRUNCATION

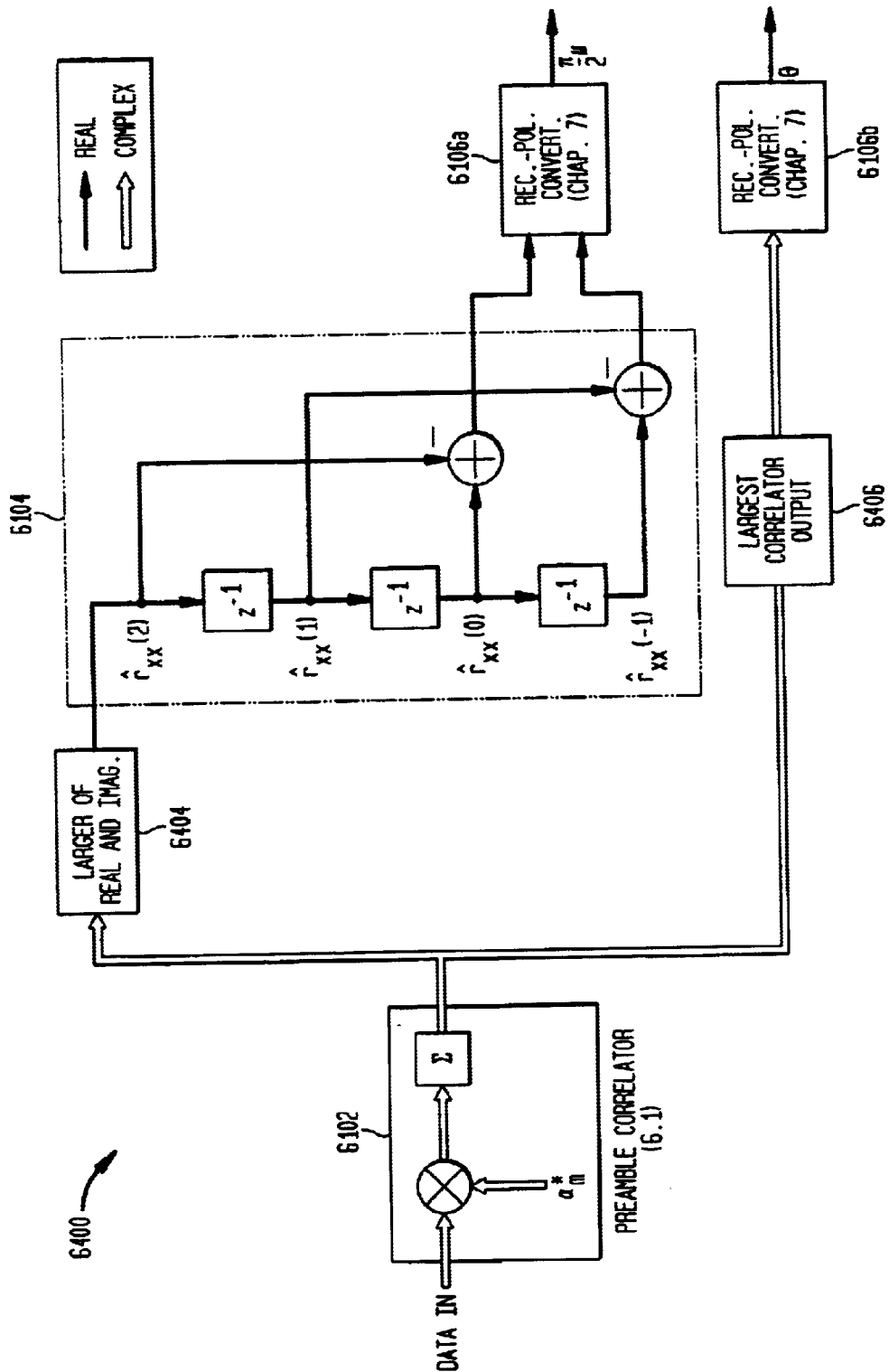

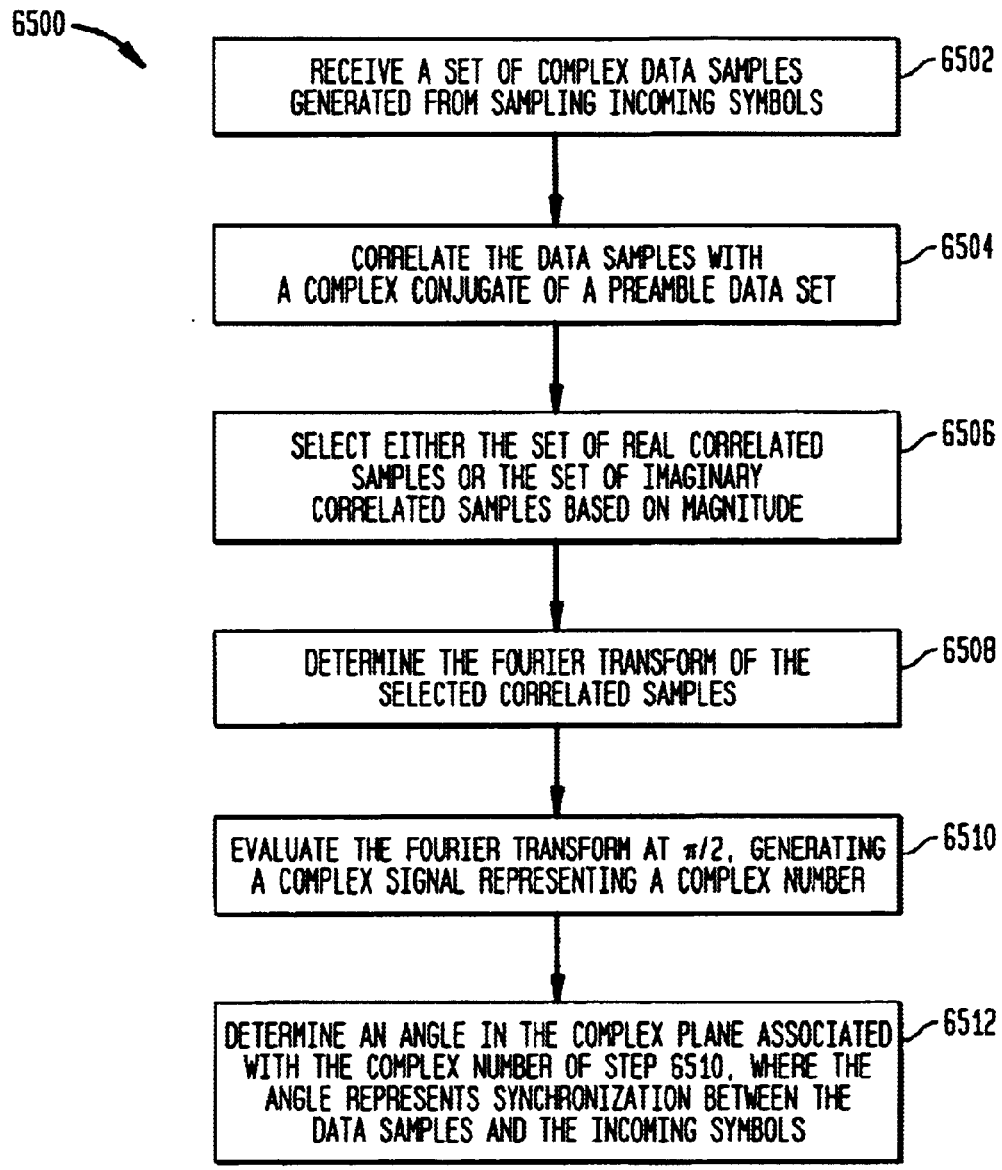

TIMING JITTER VARIANCE, α=0.4

TIMING JITTER VARIANCE, α=0.1

PHASE JITTER VARIANCE, α=0.1

CARTESIAN TO POLAR CONVERSION

USING NEWTON-RAPHSON ITERATION TO FIND $1/X_1$

ONE NEWTON-RAPHSON ITERATION

INTERPOLATION IN A NON-CENTER INTERVAL

IMPULSE RESPONSES OF THE NON-CENTER-INTERVAL INTERPOLATION FILTER BEFORE OPTIMIZATION

IMPULSE RESPONSES OF THE NON-CENTER-INTERVAL INTERPOLATION FILTER AFTER OPTIMIZATION

FREQUENCY RESPONSES OF THE NON-CENTER-INTERVAL INTERPOLATOR BEFORE OPTIMIZATION

FREQUENCY RESPONSES OF THE NON-CENTER-INTERVAL INTERPOLATOR AFTER OPTIMIZATION

DATA RATE EXPANSION CIRCUIT

APPARATUS AND METHOD FOR TRIGONOMETRIC INTERPOLATION

This application claims the benefit of U.S. Provisional Application No: 60/162,391, filed on Oct. 29, 1999, which is incorporated by reference.

This invention was made with Government support under grant no. MIP 9632698 awarded by the National Science Foundation. The U.S. Government has certain rights in this invention.

CROSS-REFERENCE TO OTHER APPLICATIONS

Apparatus and Method for Angle Rotation," U.S. patent application Ser. No. 09/698,246, filed Oct. 30, 2000; and Apparatus and Method for Rectangular-to-Polar Conversion," U.S. patent application Ser. No. 09/698,249, filed Oct. 30, 2000.

BACKGROUND OF THE INVENTION

1. Field of the Invention

The present invention is related to digital signal processing and digital communications. More specifically the present invention is related to interpolation, angle rotation, rectangular-to-polar conversion, and carrier and symbol timing recovery for digital processing and digital communications applications.

2. Related Art

Advances in technology have enabled high-quality, low-cost communications with global coverage, and provide the possibility for fast Internet access and multimedia to be added to existing services. Exemplary emerging technologies include cellular mobile radio and digital video broadcasting, both of which are described briefly as follows.

In recent years, cellular mobile radio has experienced rapid growth due to the desire for mobility while enjoying the two-way voice services it provides. GSM, IS-136 and personal digital cellular (PDC) are among the most successful second-generation personal communications (PCS) technologies in the world today, and are responsible for providing cellular and PCS services globally. As the technology advances, customers will certainly demand more from their wireless services. For example, with the explosive growth of the world wide web over the wired networks, it is desirable to provide Internet services over mobile radio networks. One effort to specify the future global wireless access system is known as IMT-2000 (Buchanan, K., et al., IEEE Pers. Comm. 4:8–13 (1997)). The goal of IMT-2000 is to provide not only traditional mobile voice communications, but also a variety of voice and data services with a wide range of applications such as multimedia capabilities, Internet access, imaging and video conferencing. It is also an aim to unify many existing diverse systems (paging, cordless, cellular, mobile satellite, etc.) into a seamless radio structure offering a wide range of services. Another principle is to integrate mobile and fixed networks in order to provide fixed network services over the wireless infrastructure. Such systems might well utilize broadband transport technologies such as a synchronous transfer mode (ATM).

For the applications of IMT-2000, a high-bit-rate service is needed. Moreover, for multimedia applications, the system should provide a multitude of services each requiring 1) a different rate, and 2) a different quality-of-service parameter. Thus, a flexible, variable-rate access with data rates approaching 2 Mb/s is proposed for IMT-2000.

The advent of digital television systems has transformed the classical TV channel into a fast and reliable data transmission medium. According to the specifications of the DVB project (Reimers, U., IEEE Comm. Magazine 36:104–110 (1998)), digital TV is no longer restricted to transmitting sound and images but instead has become a data broadcasting mechanism which is fully transparent to all contents. Digital TV broadcasting by satellite, cable and terrestrial networks is currently under intensive development. A typical system looks like this: a DVB signal is received from a satellite dish, from cable, or from an antenna (terrestrial reception). A modem built into an integrated receiver/decoder (IRD) will demodulate and decode the signal. The information received will be displayed on a digital TV or a multimedia PC. In addition to being used as a digital TV, DVB can receive data streams from companies who wish to transmit large amounts of data to many reception sites. These organizations may be banks, chains of retail stores, or information brokers who wish to offer access to selected Internet sites at high data rates. One such system is MultiMedia Mobile ($M^3$), which has a data rate of 16 Mb/s.

For proper operation, these third generation systems require proper synchronization between the transmitter and the receiver. More specifically, the frequency and phase of the receiver local oscillator should substantially match that of the transmitter local oscillator. When there is a mismatch, then an undesirable rotation of the symbol constellation will occur at the receiver, which will seriously degrade system performance. When the carrier frequency offset is much smaller than the symbol rate, the phase and frequency mismatches can be corrected at baseband by using a phase rotator. It is also necessary to synchronize the sampling clock such that it extracts symbols at the correct times. This can be achieved digitally by performing appropriate digital resamples resampling.

The digital resampler and the direct digital frequency synthesizer (DDS) used by the phase rotator are among the most complex components in a receiver (Cho, K., "A frequency-agile single-chip QAM modulator with beamforming diversity," Ph.D. dissertation, University of California, Los Angeles (1999)). Their performance is significant in the overall design of a communications modem. For multimedia communications, the high-data-rate requirement would impose a demand for high computational power. However, for mobile personal communication systems, low cost, small size and long battery life are desirable. Therefore, it would be desirable to have an efficient implementation of the phase rotator, re-sampler, and DDS in order to perform fast signal processing that operates within the available resources. Furthermore, it would be desirable to have an efficient synchronization mechanism that uses a unified approach to timing and carrier phase corrections.

For Internet services it is important to provide instantaneous throughput intermittently. Packet data systems allow the multiplexing of a number of users on a single channel, providing access to users only when they need it. This way the service can be made more cost-effective. However, the user data content of such a transmission is usually very short. Therefore, it is essential to acquire the synchronization parameters rapidly from the observation of a short signal-segment.

For applications where low power and low complexity are the major requirements, such as in personal communications, it is desirable to sample the signal at the lowest possible rate, and to have a synchronizer that is as simple as possible. Therefore, it is also desirable to have an efficient synchronizer architecture that achieves these goals.

For applications utilizing Orthogonal Frequency Division Multiplexing (OFDM), sampling phase shift error produces a rotation of the Fast Fourier Transform (FFT) outputs (Pollet T., and Peters, M., *IEEE Comm. Magazine* 37:80–86 (1999)). A phase correction can be achieved at the receiver by rotating the FFT outputs. Therefore, it is also desirable to have an efficient implementation structure to perform rotations of complex numbers.

SUMMARY OF THE INVENTION

The present invention is directed at high-performance and low-cost methods and apparatus for performing an accurate interpolation operation in a digital device for generating an output signal. Applications include digital re-sampling to change the data sampling rate of a given signal, and interpolation to correct for symbol timing errors in a digital communications device, as well as other applications.

More specifically, the present invention includes a method and apparatus for trigonometric interpolation that interpolates between two data samples at an offset $\mu$, where the two data samples are part of a set of N-data samples. The trigonometric interpolator fits a trigonometric polynomial to the N-data sample set, and then evaluates the trigonometric polynomial at the offset $\mu$. The trigonometric interpolator can be implemented for any number of data samples N, where the accuracy of the interpolation (and the hardware complexity) increases with the number of data samples. Simulations have shown that the trigonometric interpolator achieves superior interpolation performance over other methods of interpolation. Moreover, the trigonometric interpolator generally requires less hardware than other methods of interpolation.

The trigonometric interpolator can be implemented using a delay module, an adder/subtractor module, and at least one angle rotator. The delay module and adder/subtractor module generate one or more complex trigonometric coefficients based on the input samples. Each angle rotator rotates a corresponding complex trigonometric coefficient in the complex plane according the offset $\mu$. The angle rotator can be implemented using a lookup table (e.g. memory device) or by using an angle rotator processor. The table lookup approach is advantageous for low latency applications and can be efficiently shared with a phase rotator that performs carrier synchronization. The angle rotator processor is advantageous for applications that require low complexity, and or low power requirements.

In embodiments, the number of angle rotators that are required to implement the trigonometric interpolation is reduced for a given set of N-data samples. This is accomplished by modifying data samples so that the trigonometric coefficient $c_{N/2}$ is zero, thereby eliminating the need for the corresponding angle rotator. The hardware "price" for eliminating an angle rotator using this method is an additional multiplier.

In embodiments, the filter response of the interpolator can be modified to achieve an arbitrary frequency response in order to enhance the interpolator performance. More specifically, the frequency response of the interpolator can be shaped to effectively correspond with the frequency response of the input data samples and the offset $\mu$. In other words, instead of optimizing the performance of the continuous-time interpolation filter, the fractional-delay filter for each delay value is optimized, thereby achieving even better performance.

Further features and advantages of the invention, as well as the structure and operation of various embodiments of the invention, are described in detail below with reference to the accompanying drawings. The drawing in which an element first appears is typically indicated by the leftmost character(s) and/or digit(s) in the corresponding reference number.

BRIEF DESCRIPTION OF THE FIGURES

FIG. 22 illustrates analysis of the frequency responses according to embodiments of the present invention.

value according to embodiments of the present invention.

Figure 33:
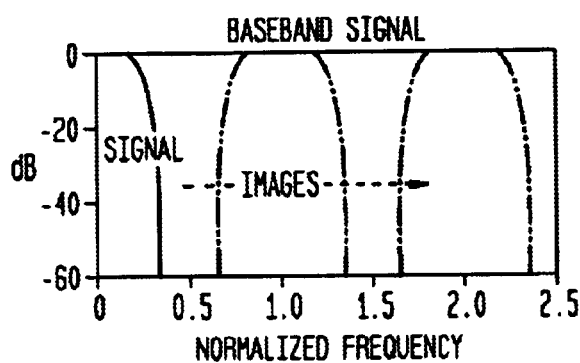

FIG. 33 illustrates a signal with two samples/symbol and 40% excess bandwidth according to embodiments of the present invention.

Figure 34:
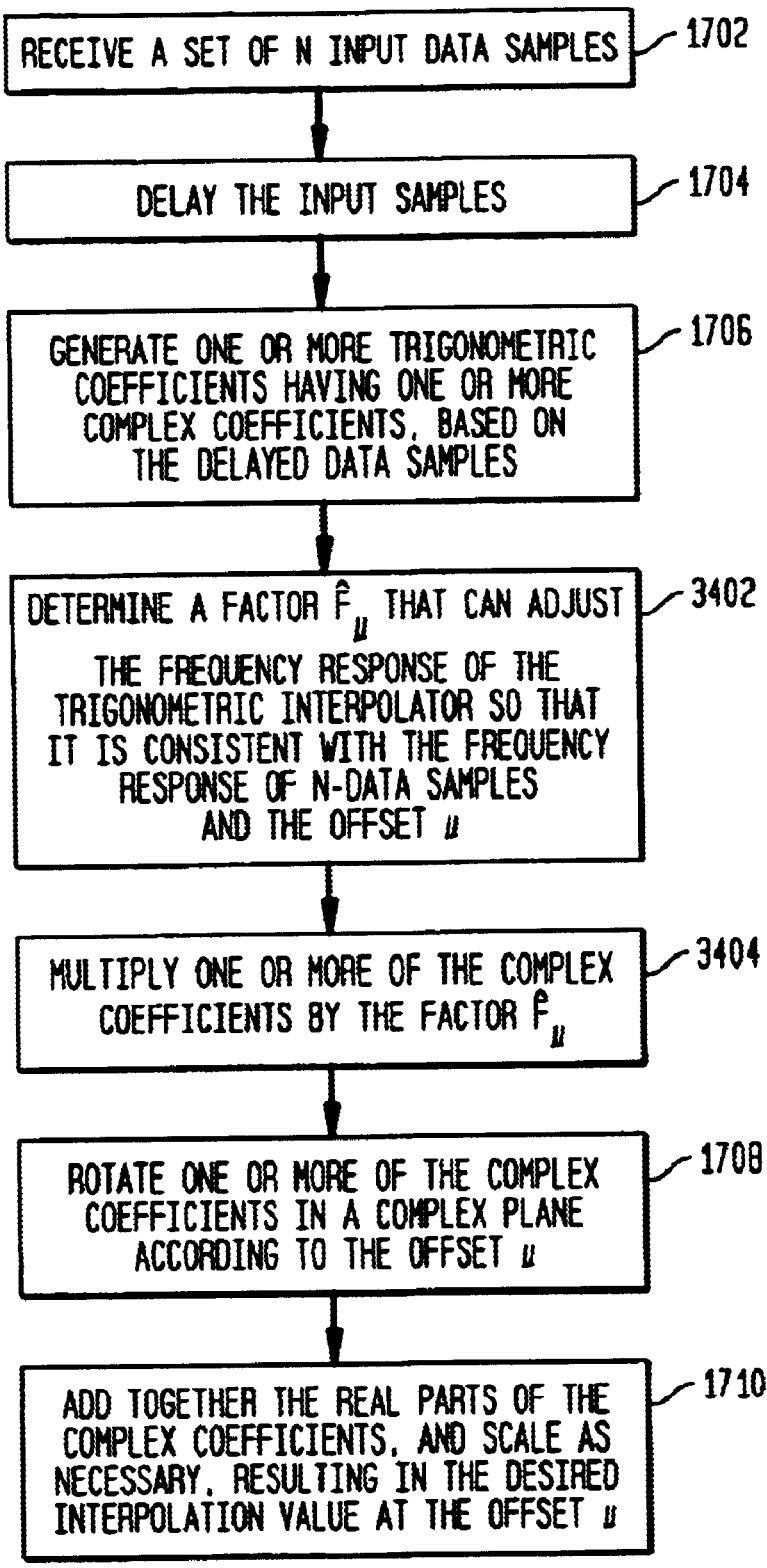

FIG. 34 illustrates a flowchart 3400 for optimizing trigonometric interpolation according to embodiments of the present invention.

Figure 35:
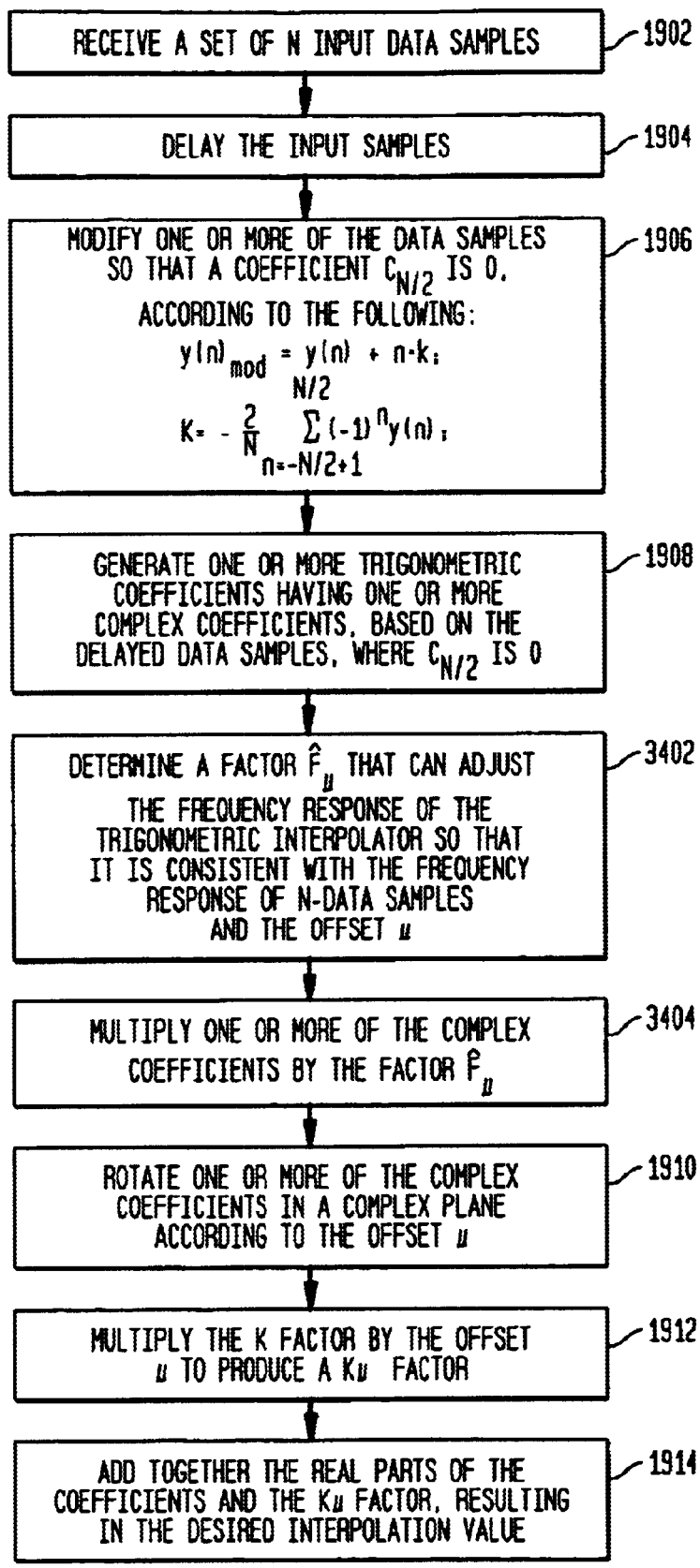

FIG. 35 illustrates a flowchart 3500 for optimizing trigonometric interpolation according to embodiments of the present invention.

Figure 36:
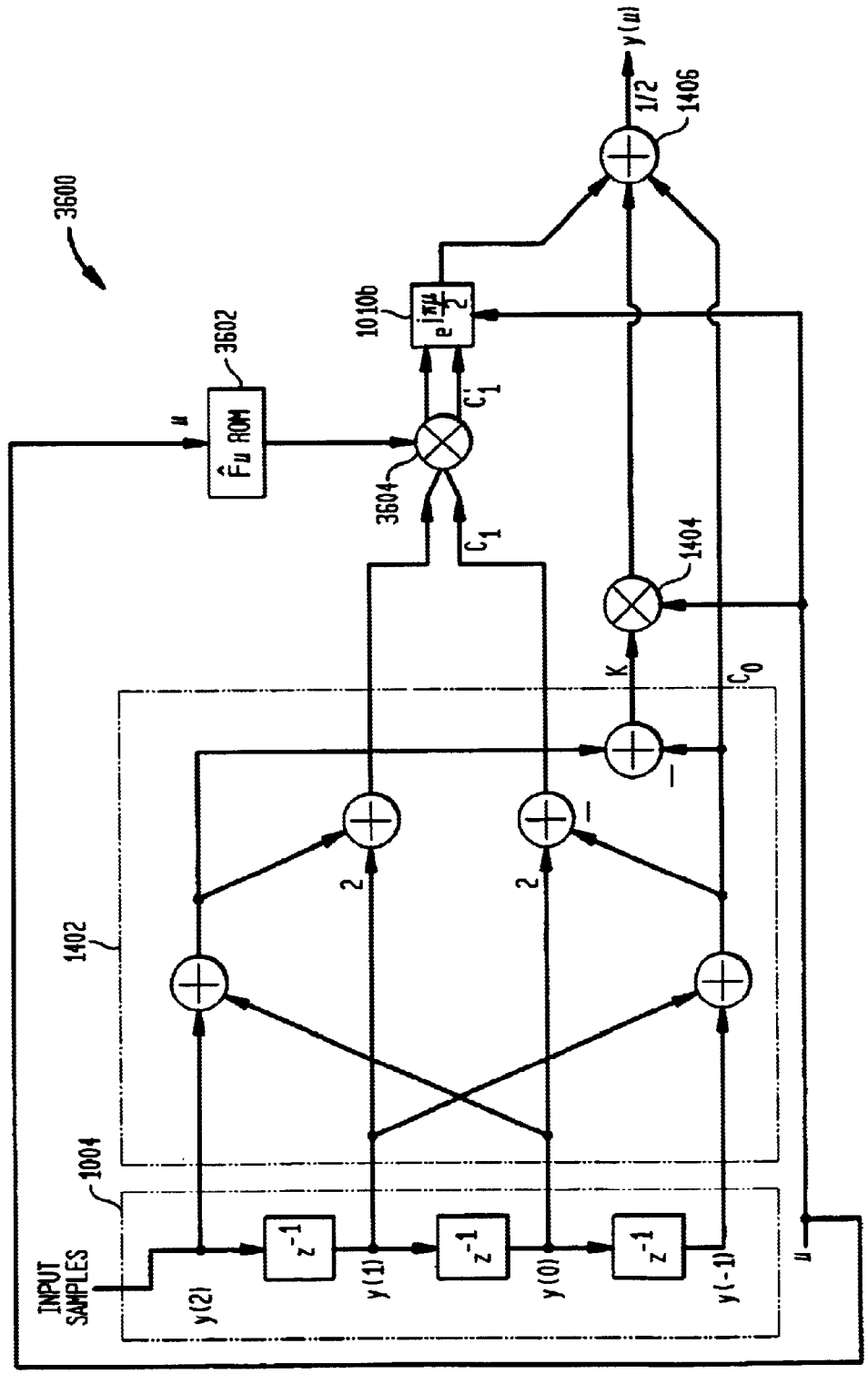

FIG. 36 illustrates an optimized interpolator 3600 according to embodiments of the present invention.

Figure 37:
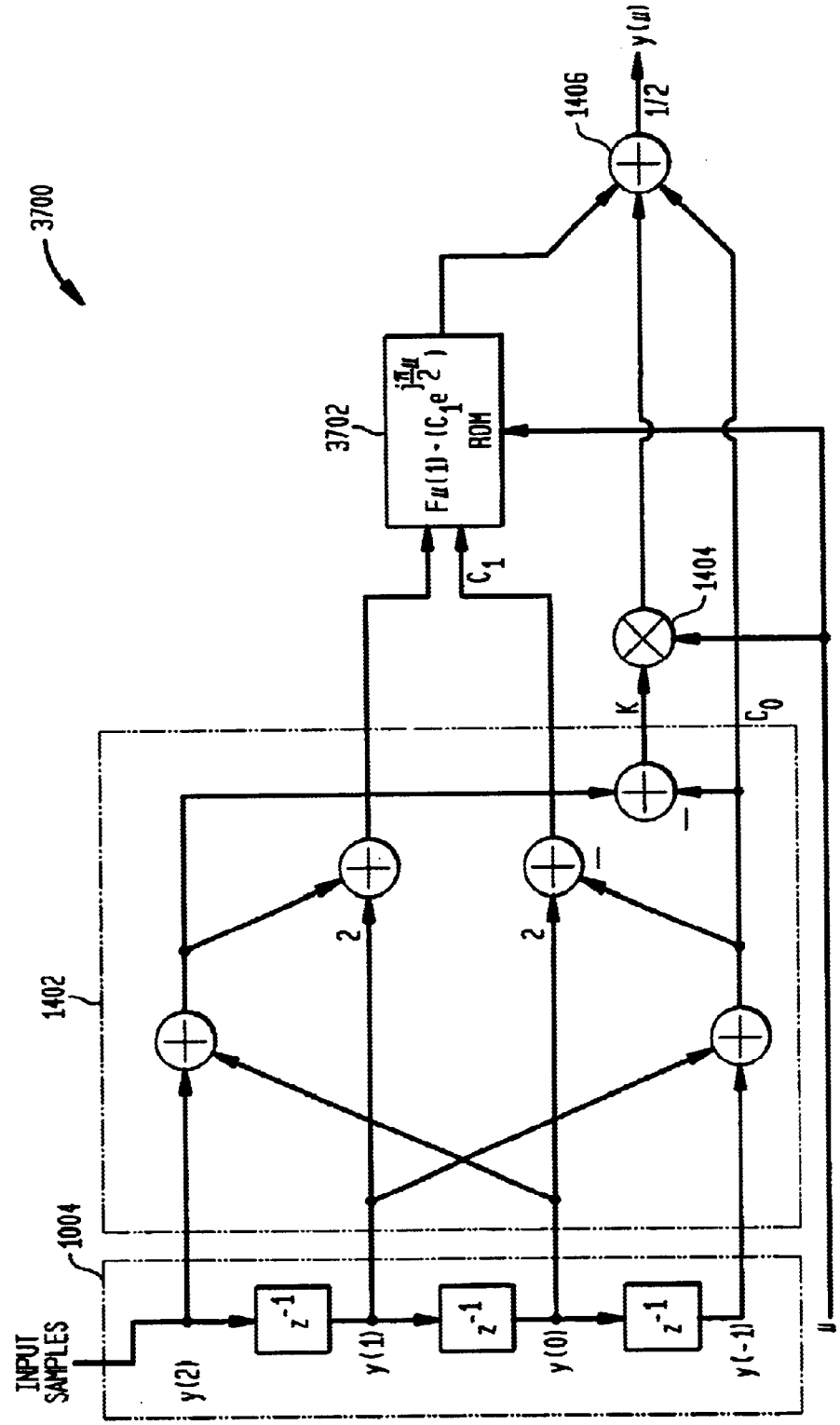

FIG. 37 illustrates an optimized interpolator 3700 according to embodiments of the present invention.

Figure 38:
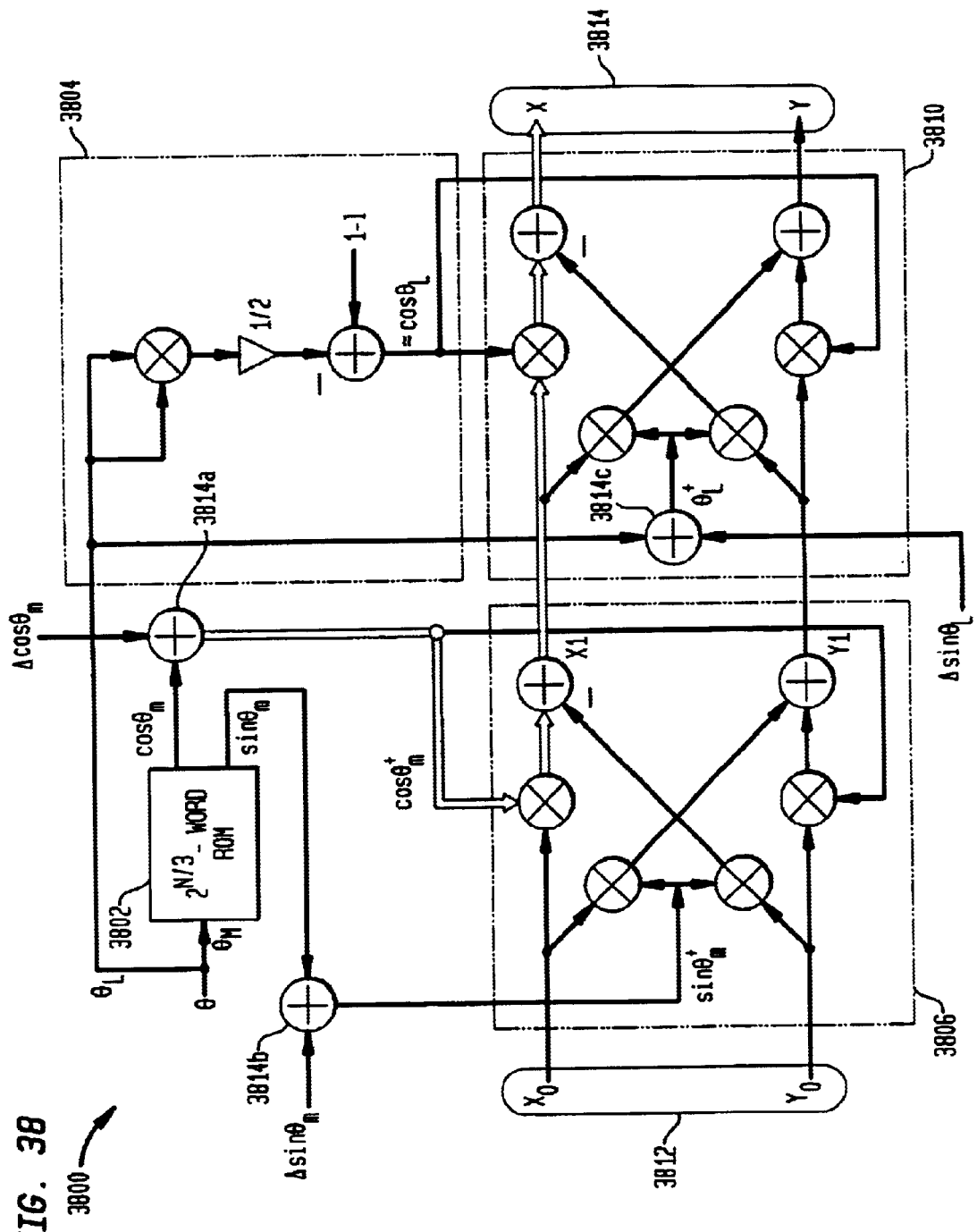

FIG. 38 illustrates an angle rotator 3800 according to embodiments of the present invention.

Figure 39:
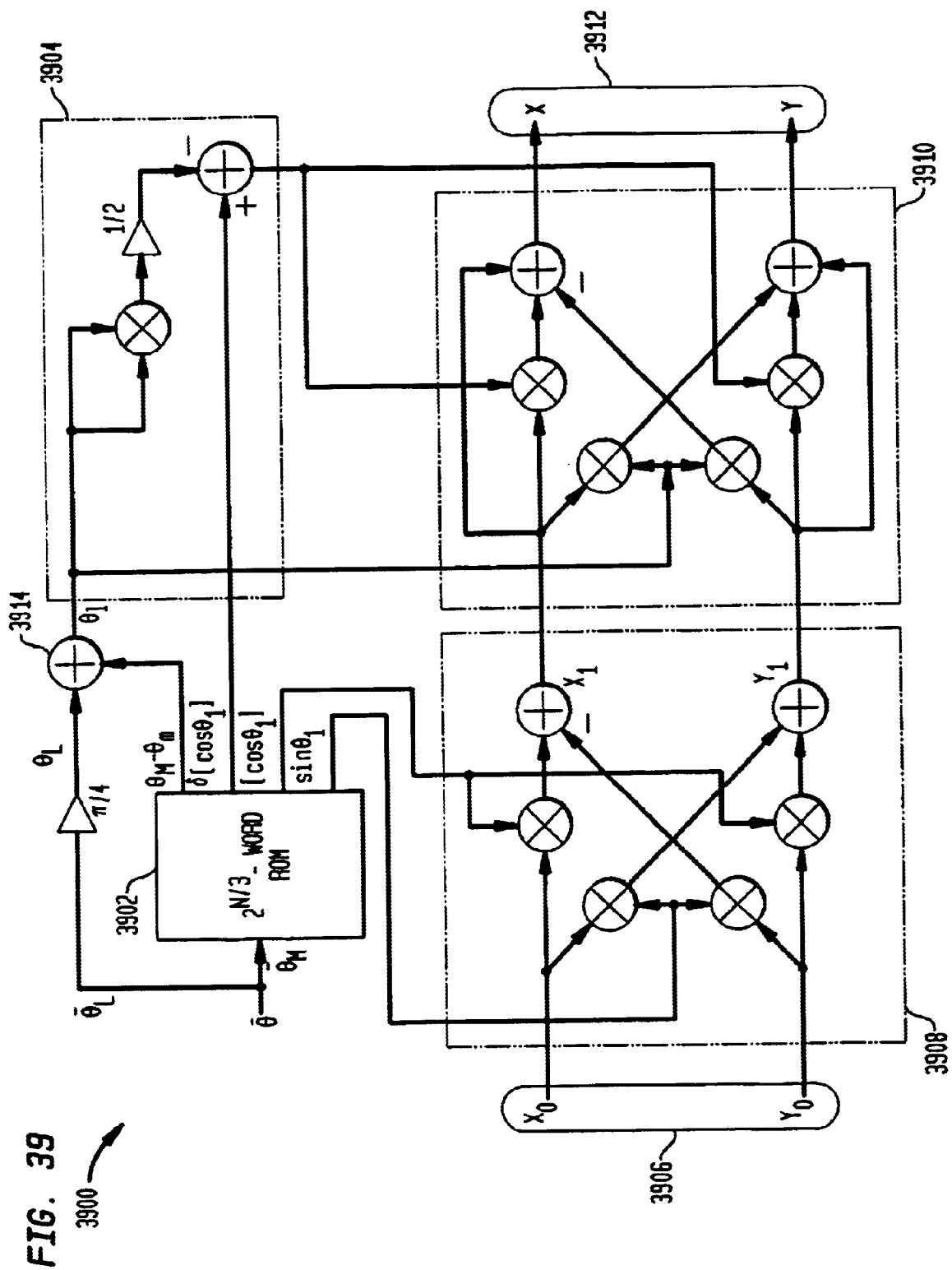

FIG. 39 illustrates an angle rotator 3900 according to embodiments of the present invention.

Figure 40:
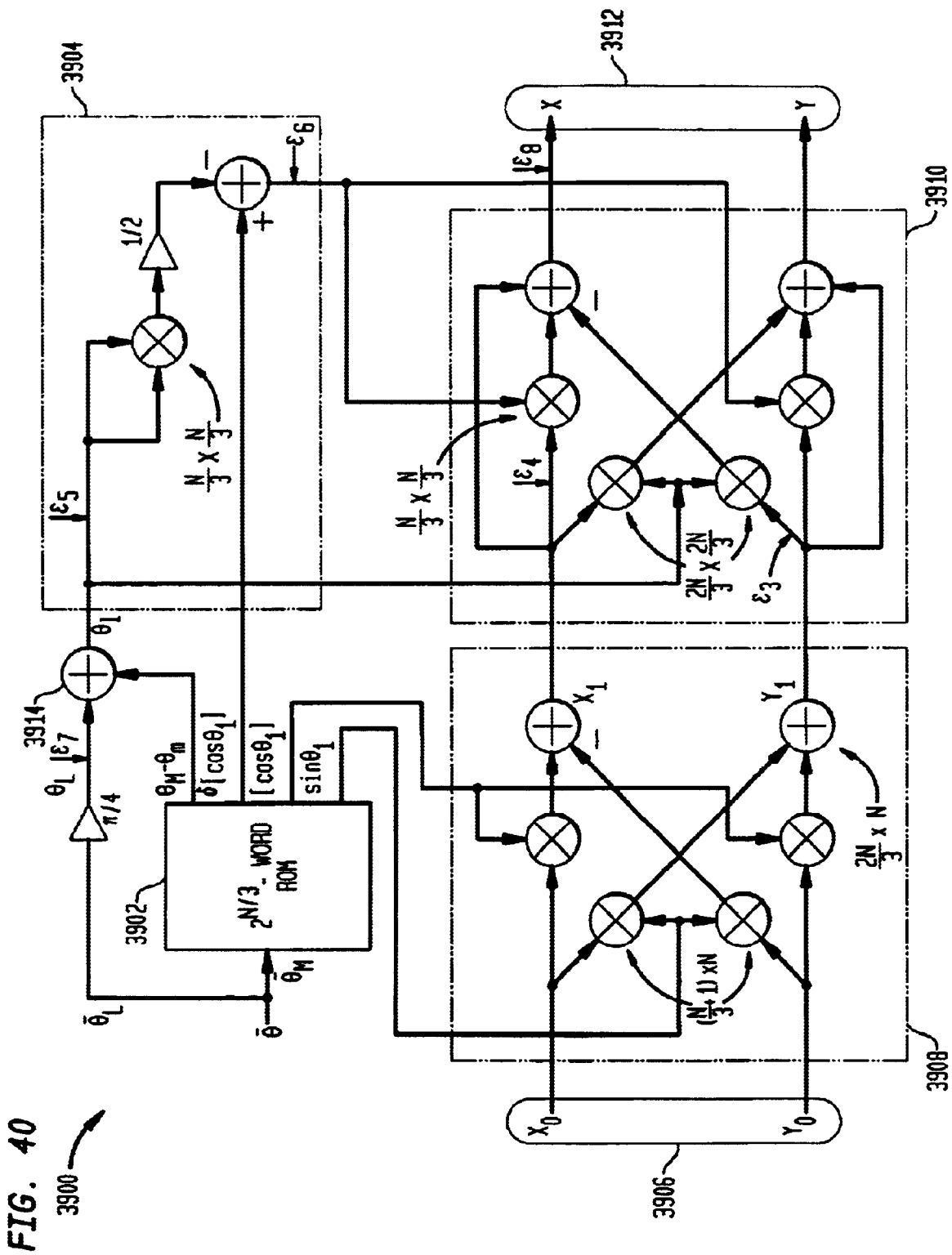

FIG. 40 illustrates an angle rotator 3900 and example multiplier sizes according to embodiments of the present invention.

Figure 41:
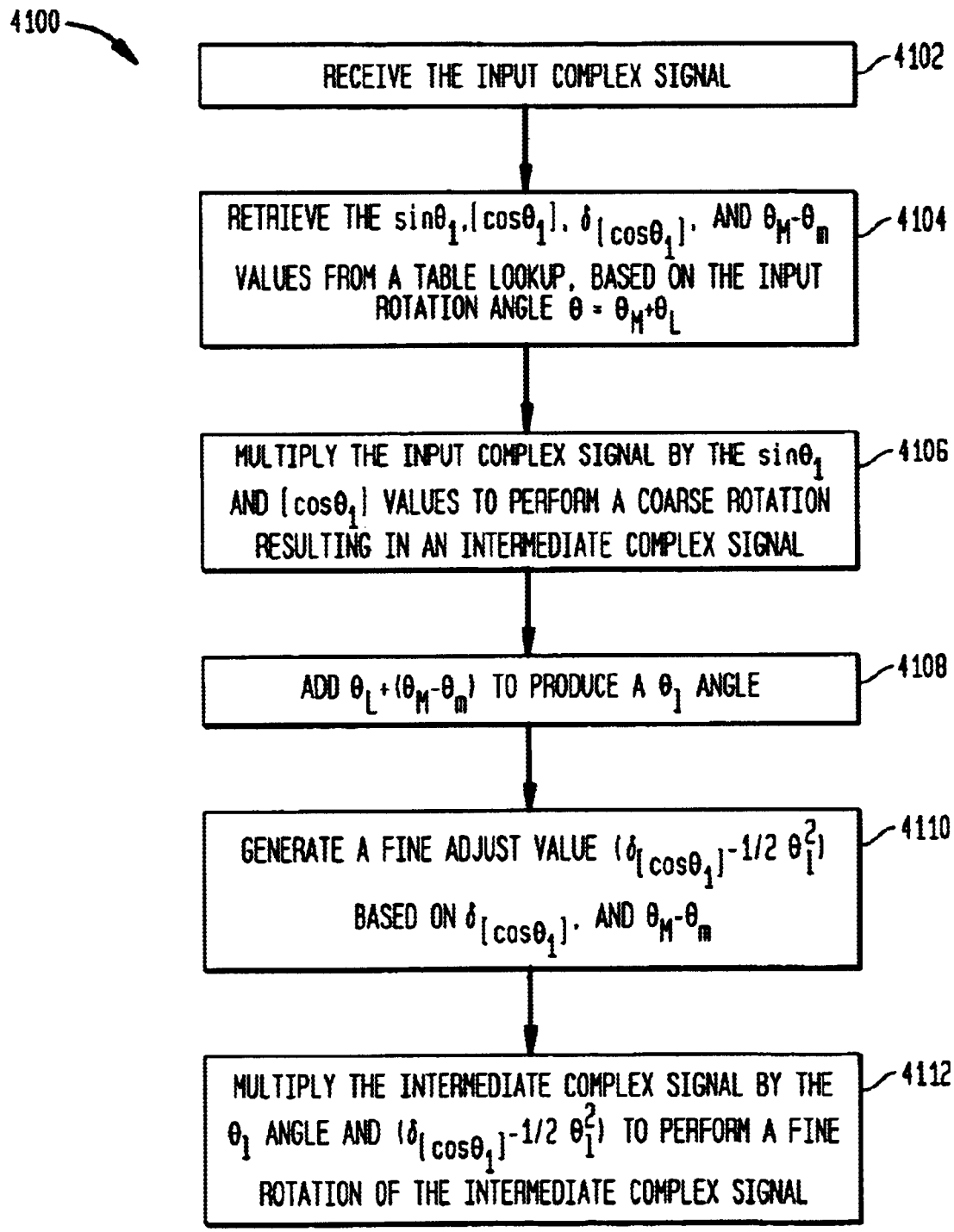

FIG. 41 illustrates a flowchart 4100 for angle rotation according to embodiments of the present invention.

Figure 42:
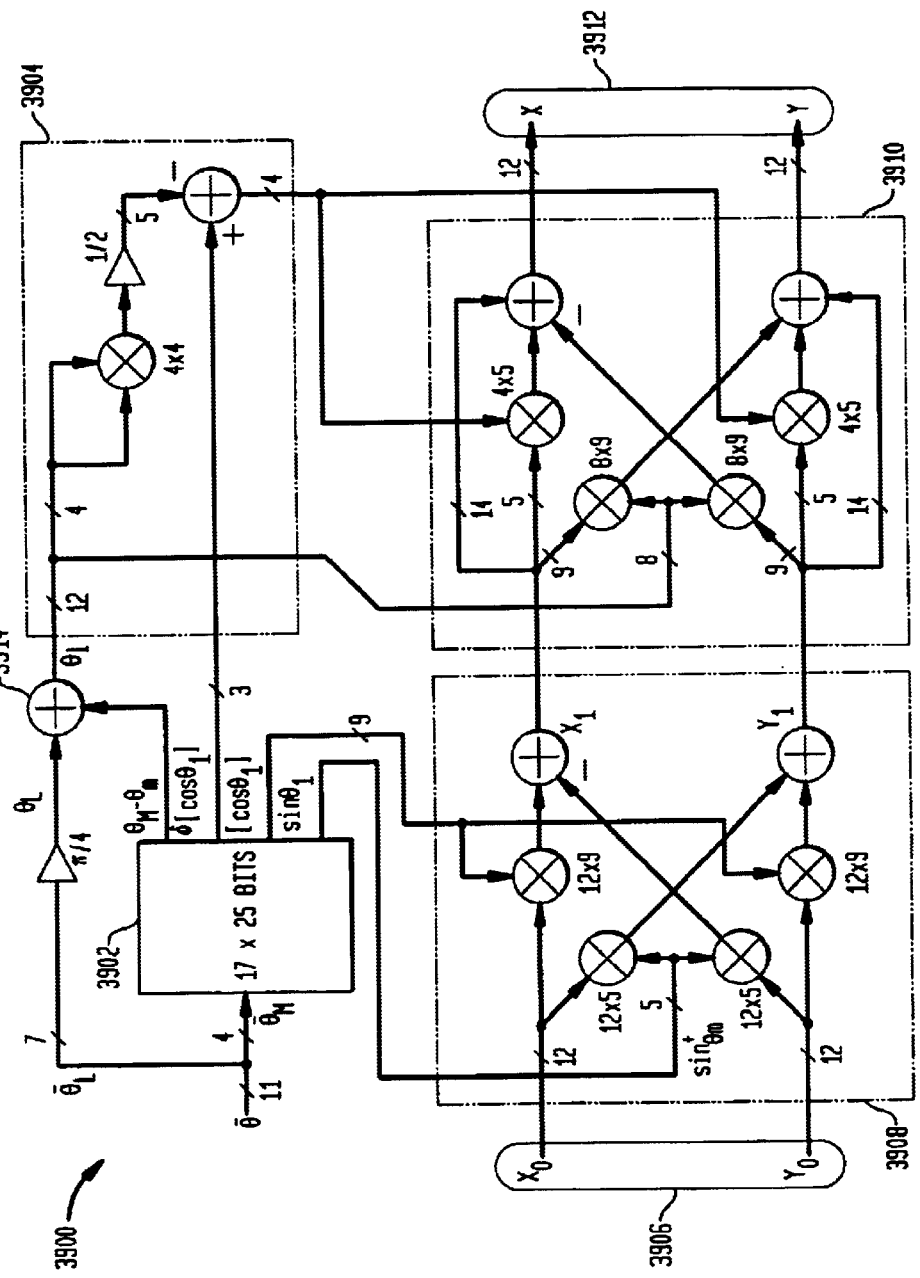

FIG. 42 illustrates an angle rotator 3900 and multiplier sizes to achieve 90.36 dB SFDR according to embodiments of the present invention.

Figure 43:
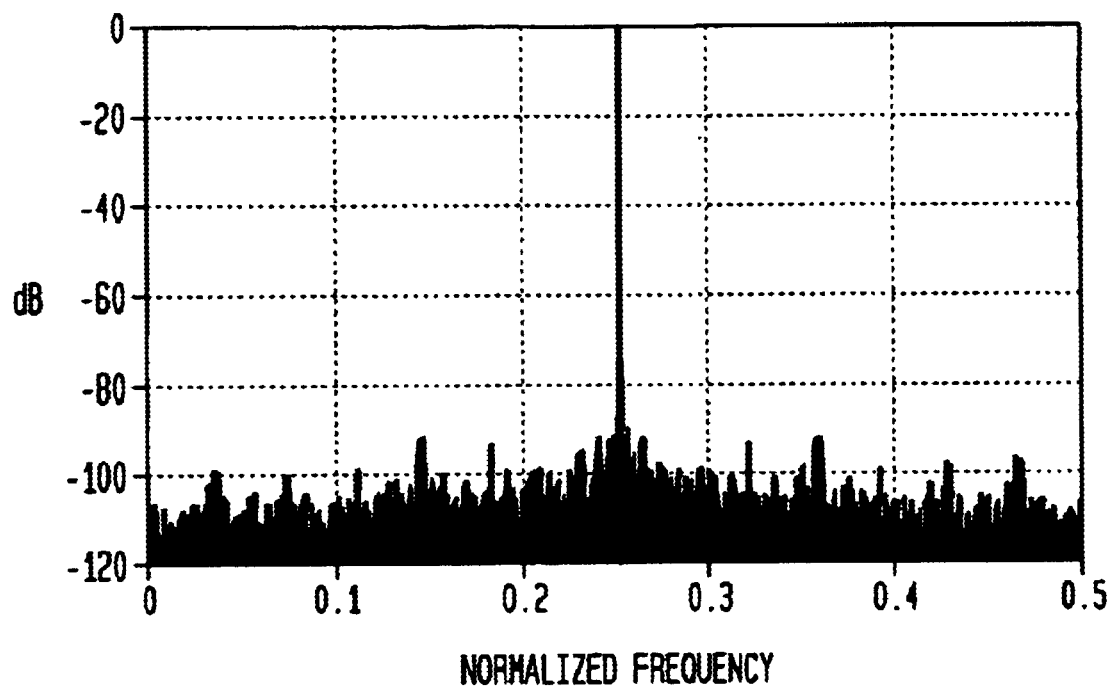

FIG. 43 illustrates an output spectrum showing 90.36 dB SFDR according to embodiments of the present invention.

Figure 44:
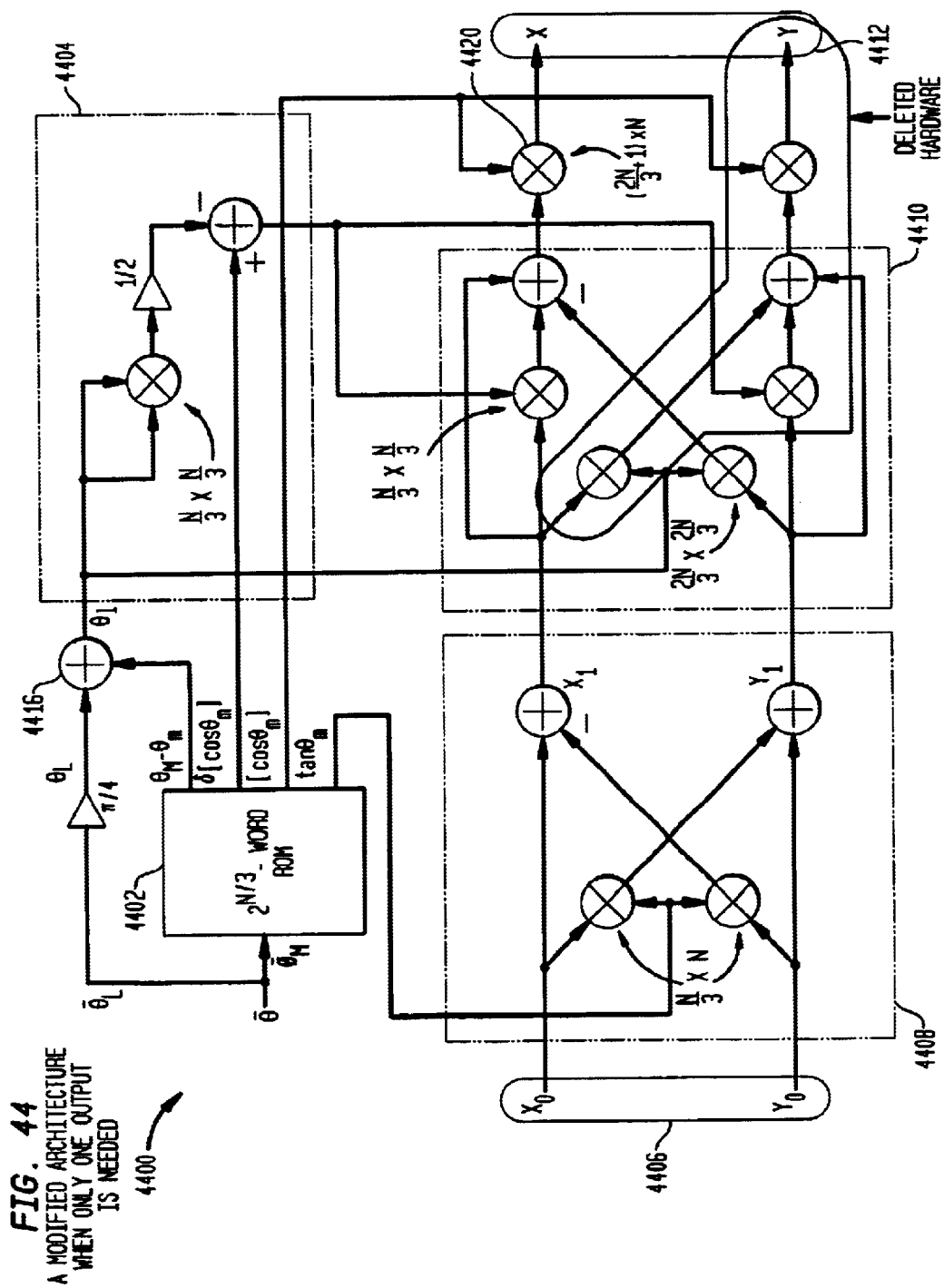

FIG. 44 illustrates a modified angle rotator 4400 when only one output is needed according to embodiments of the present invention.

Figure 45:
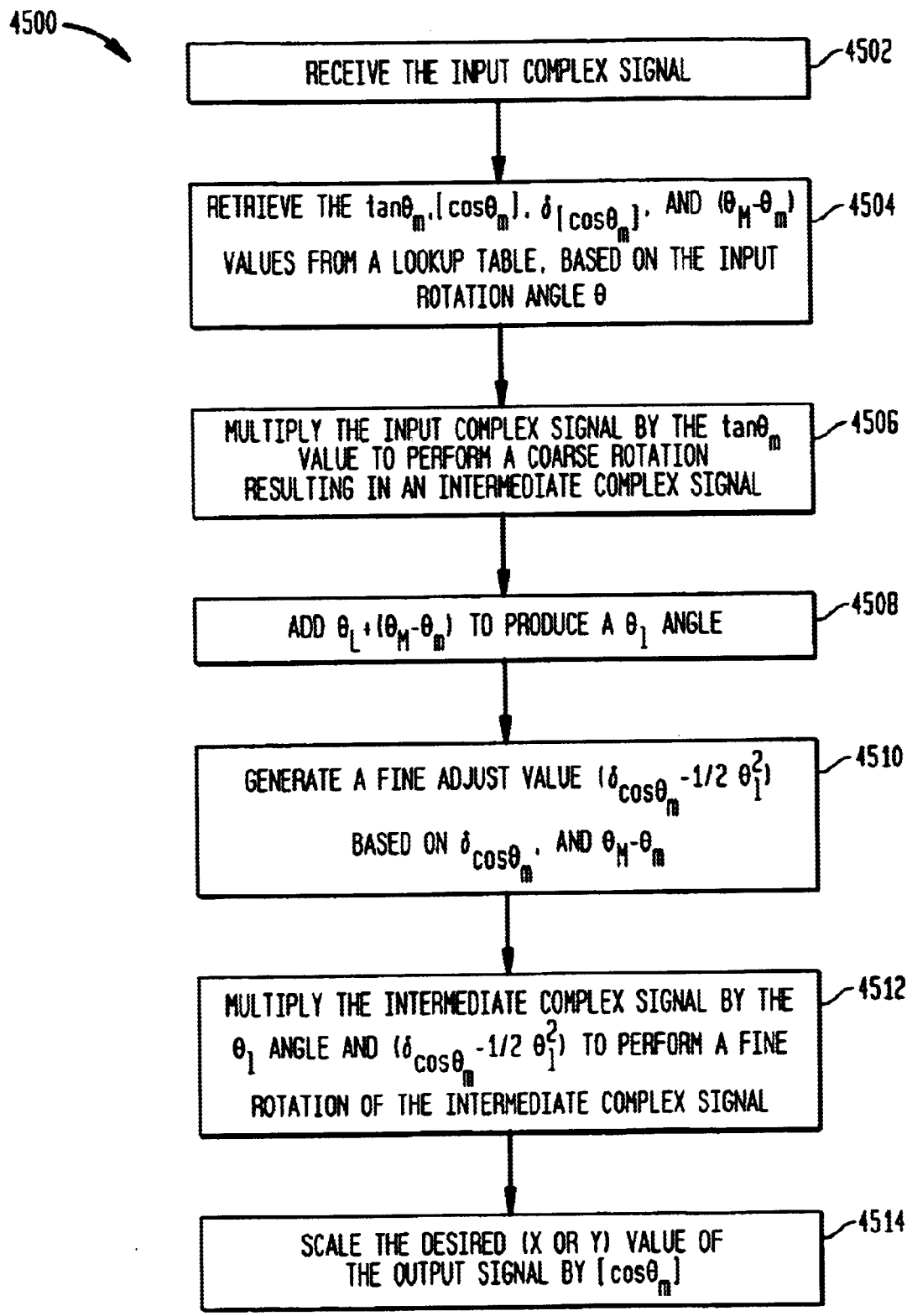

FIG. 45 illustrates a flowchart 4500 for angle rotation when only one output is needed according to embodiments of the present invention.

Figure 46:
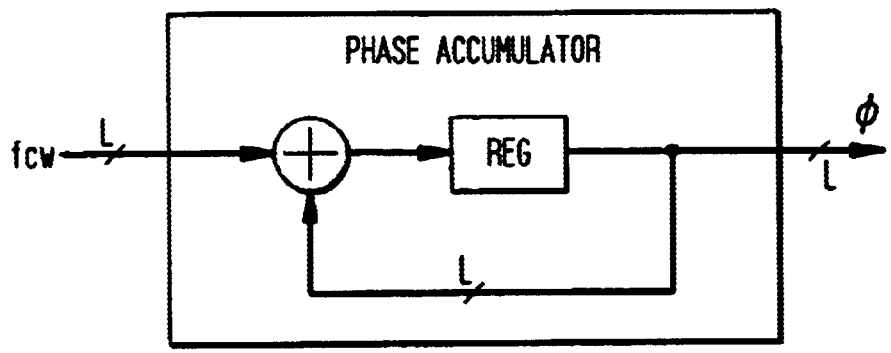

FIG. 46 illustrates a phase accumulator 4600.

Figure 47:
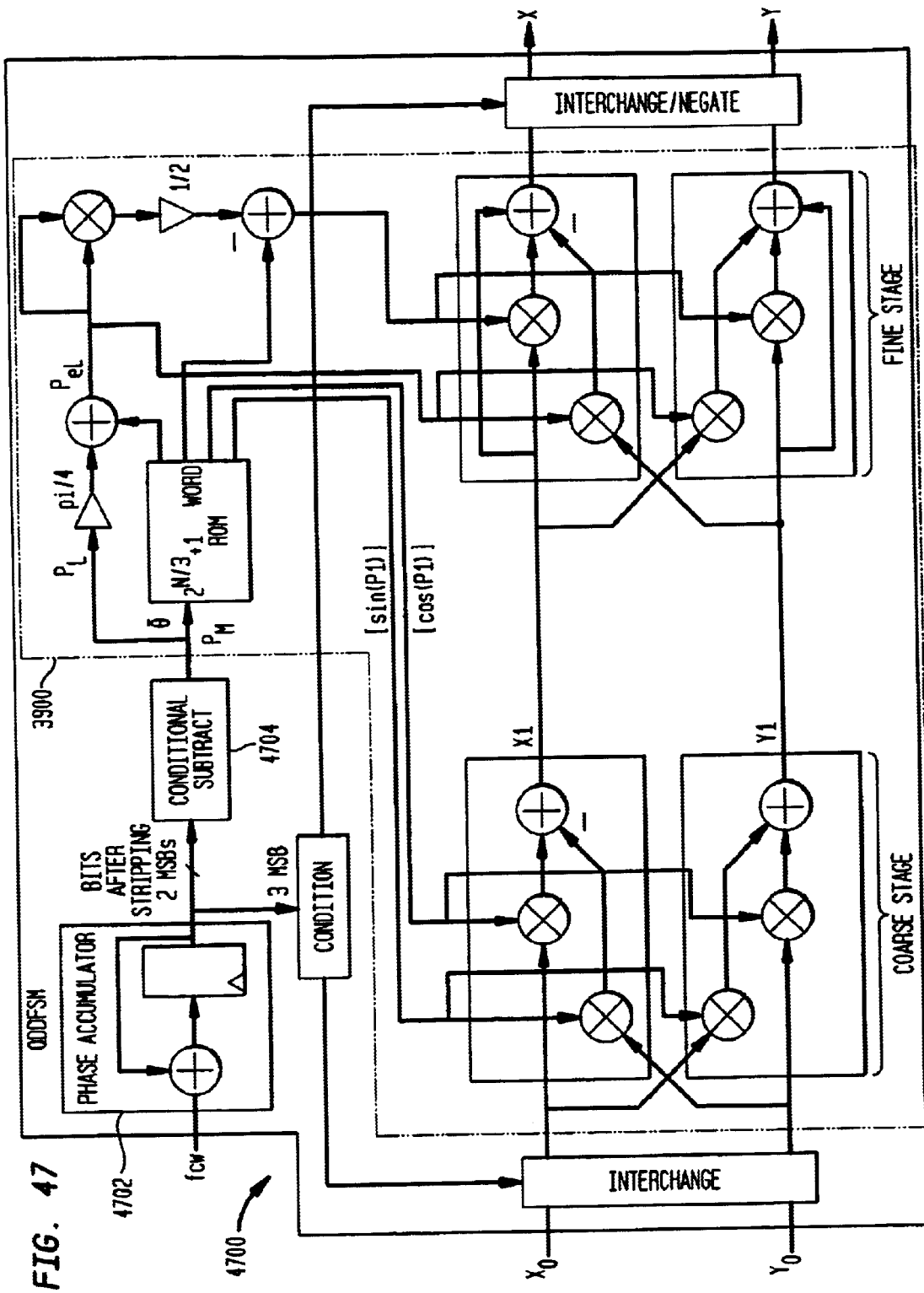

FIG. 47 illustrates a Quadrature Direct Digital Frequency Synthesizer/Mixer (QDDFSM) according to embodiments of the present invention.

Figure 48:
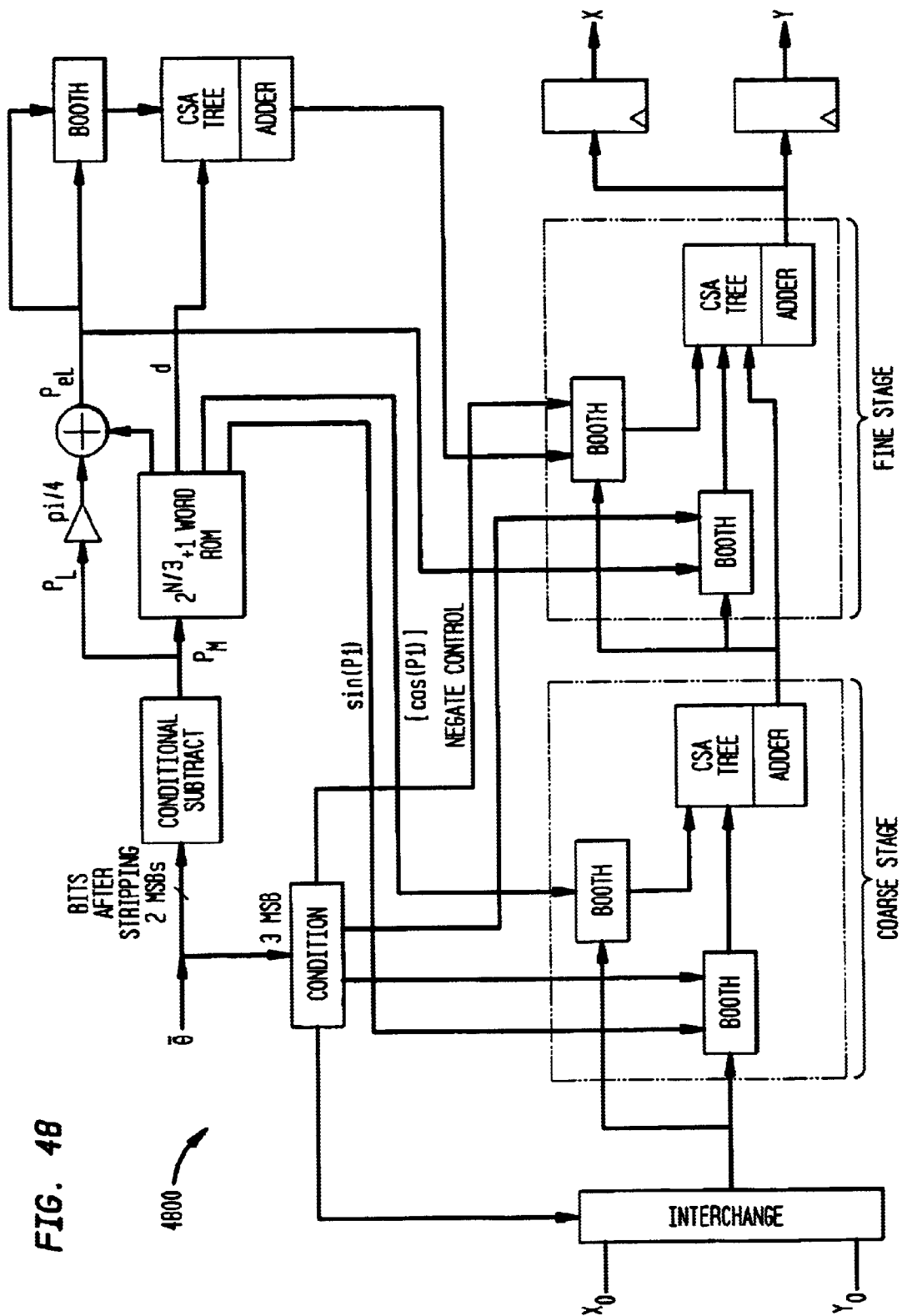

FIG. 48 illustrates an angle rotator 4800 according to embodiments of the present invention.

Figure 49:
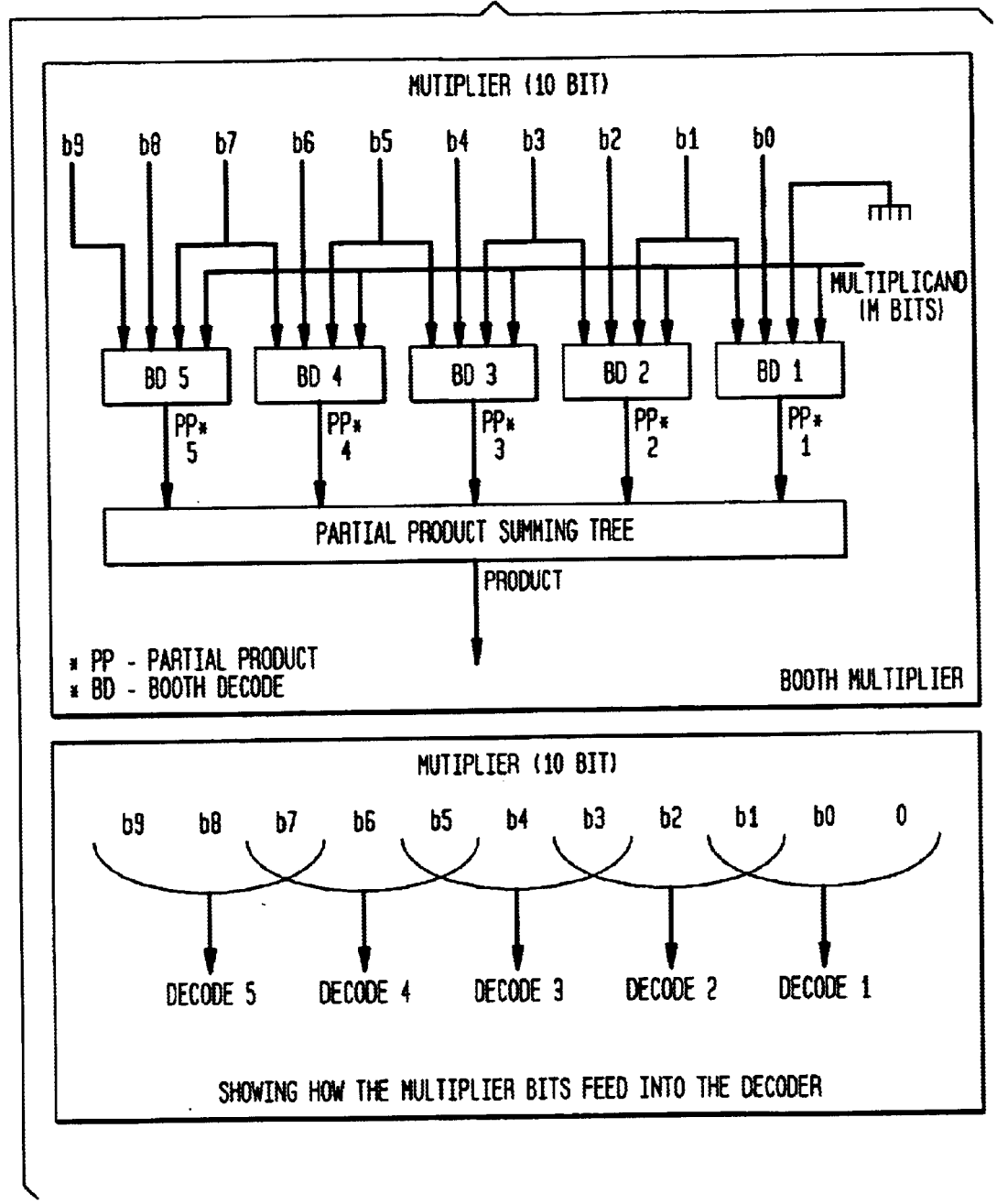

FIG. 49 illustrates a Booth multiplier

FIG. 50 illustrates an original Booth table 5000.

FIG. 51 illustrates a negating Booth table 5100 according to embodiments of the present invention.

Figure 52:
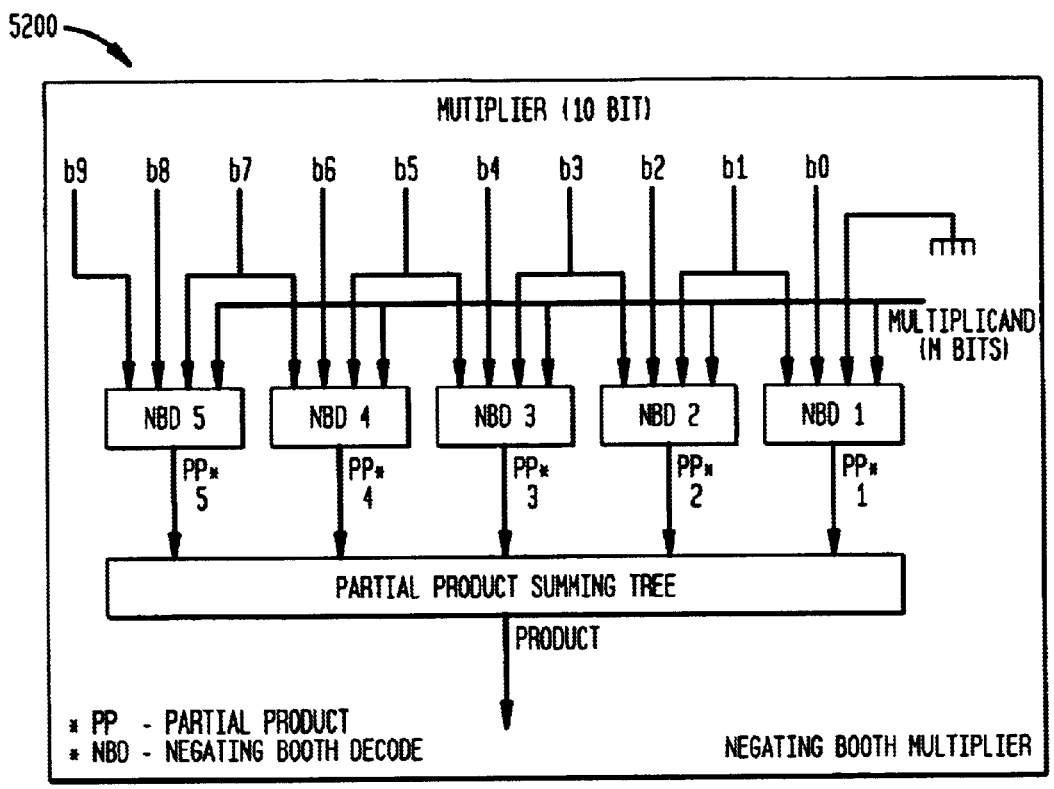

FIG. 52 illustrates a negating Booth multiplier 5200.

Figure 53:
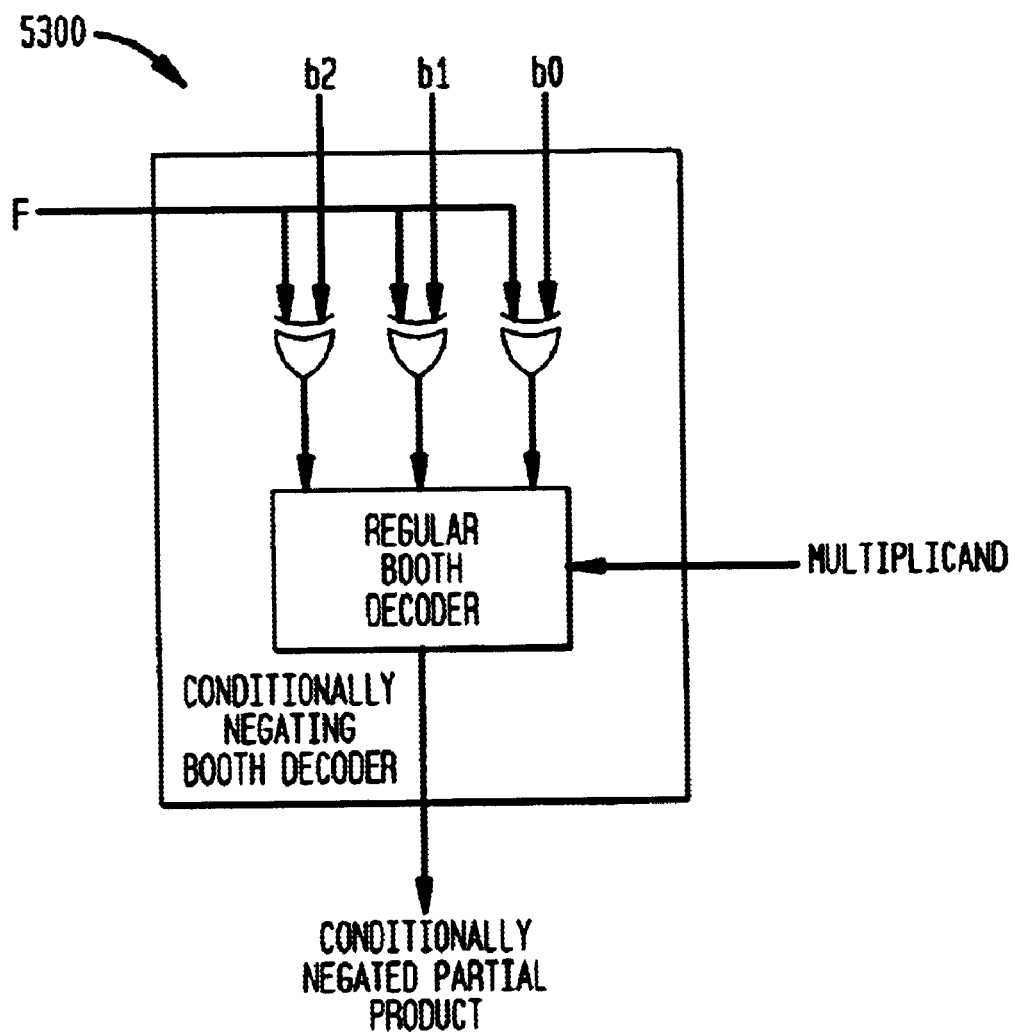

FIG. 53 illustrates a conditionally negating Booth decoder 5300 according to embodiments of the present invention.

Figure 54:
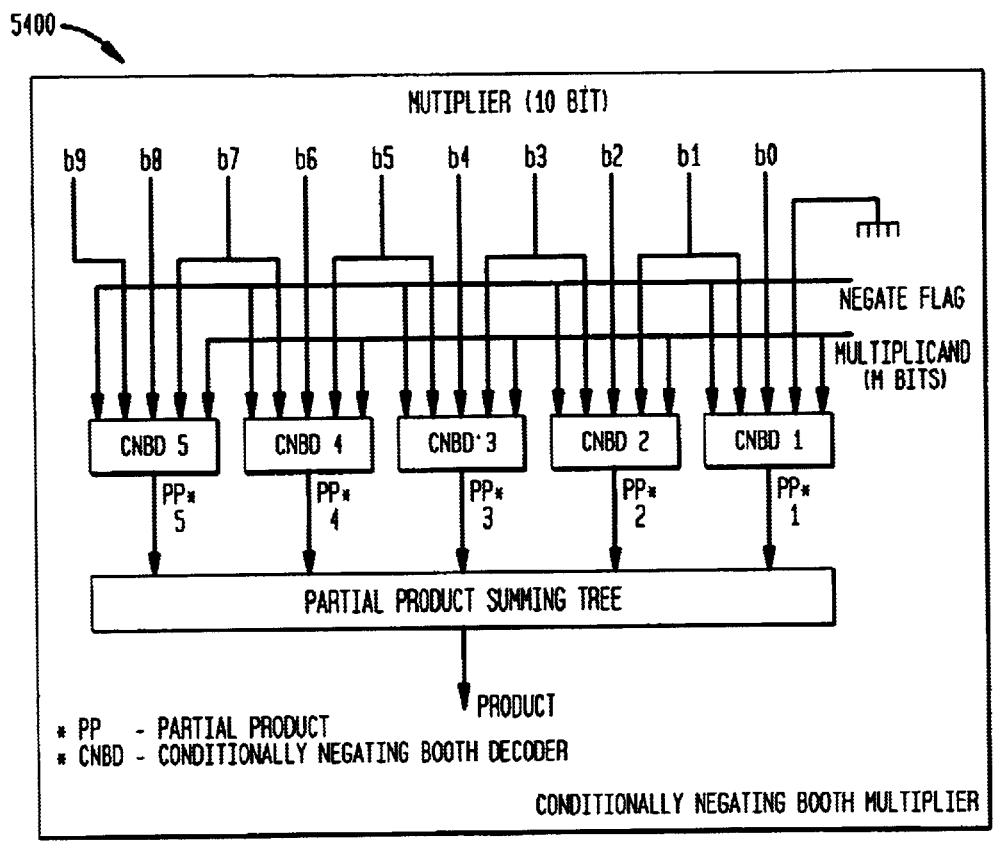

FIG. 54 illustrates a conditionally negating multiplier 5400 according to embodiments of the present invention.

Figure 56:
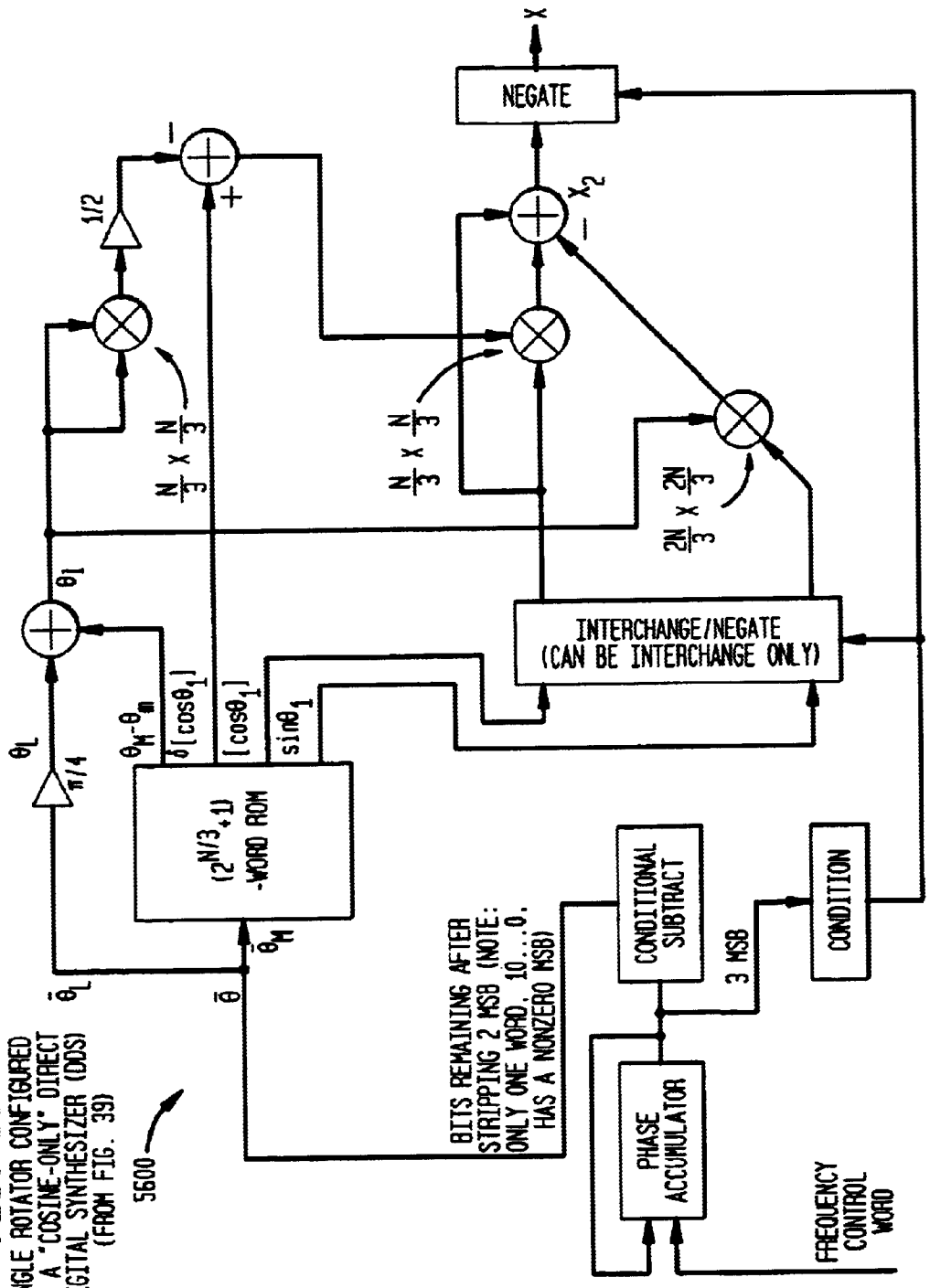

FIG. 56 illustrates an angle rotator as a cosine only direct digital synthesizer based on angle rotator 3900 according to embodiments of the present invention.

Figure 57:
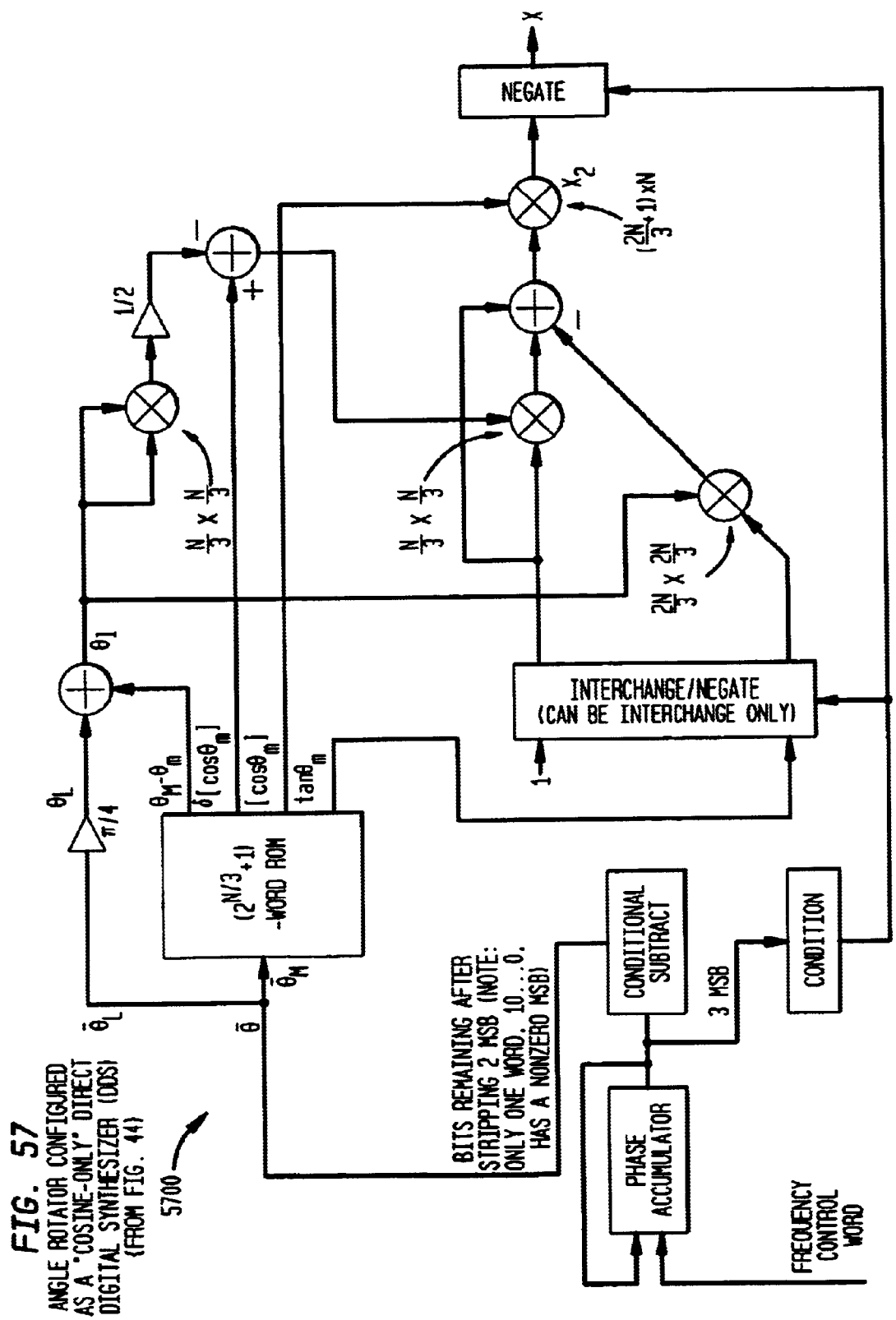

FIG. 57 illustrates an angle rotator as a cosine only direct digital synthesizer based on angle rotator 4400 according to embodiments of the present invention.

Figure 58:
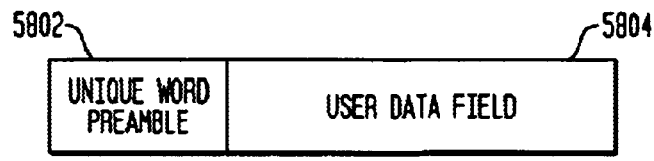

FIG. 58 illustrates a common packet format for packet based communications.

Figure 59:
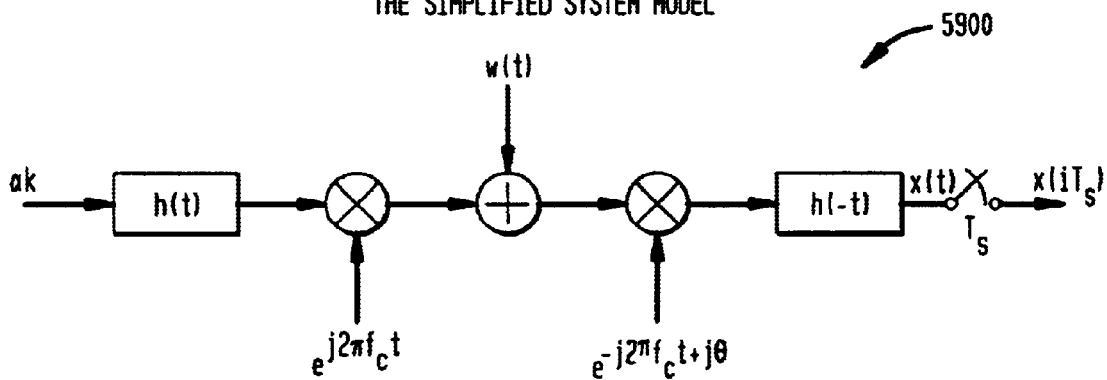

FIG. 59 illustrates a system model for packet based communications.

Figure 60:
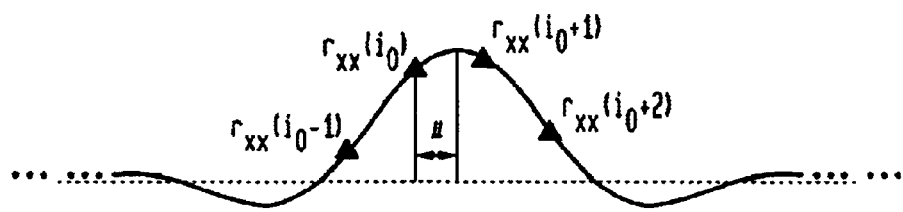

FIG. 60 illustrates mean values of a preamble correlator output, for $\theta$=0, according to embodiments of the present invention.

Figure 61:
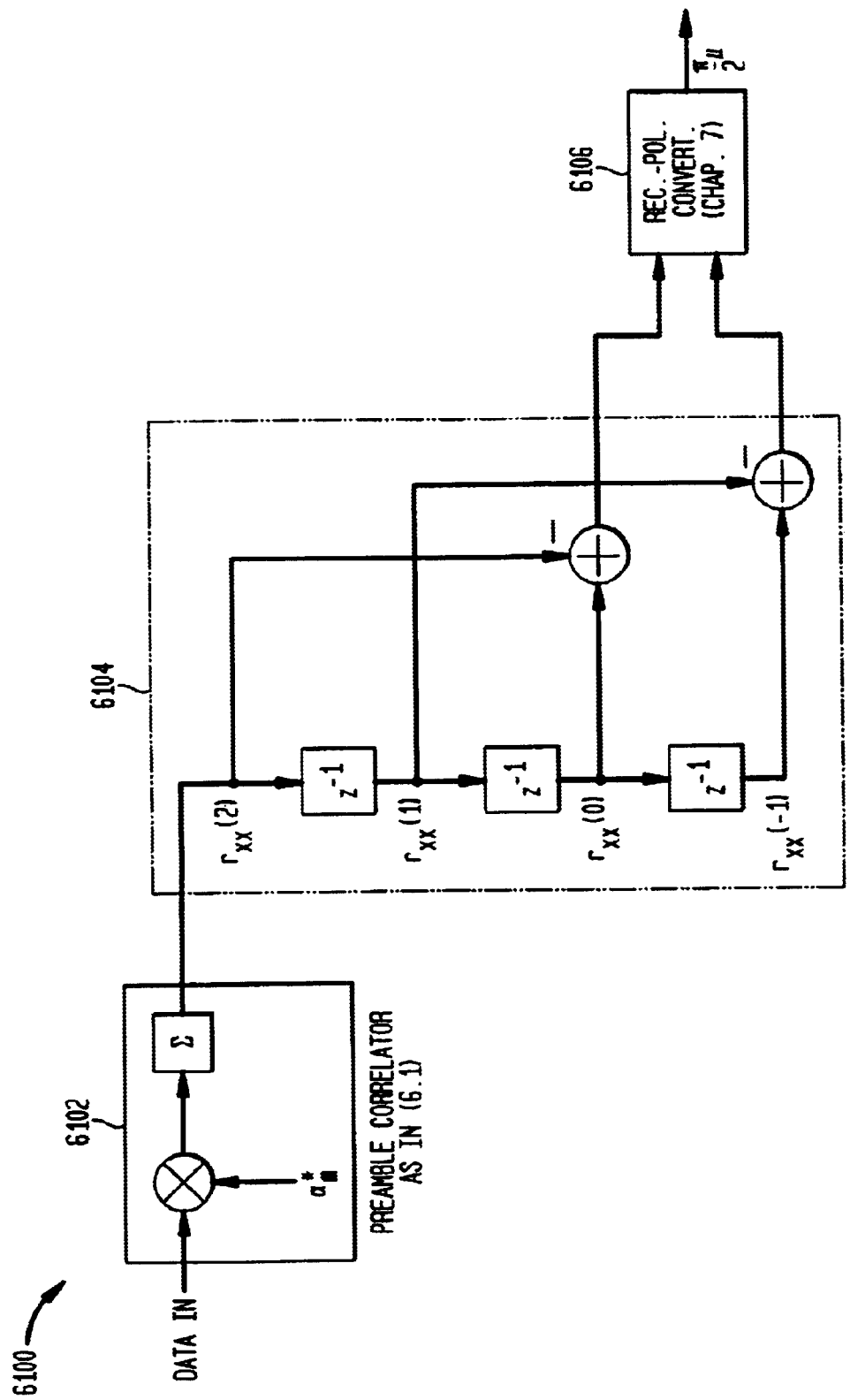

FIG. 61 illustrates a synchronizer 6100 according to embodiments of the present invention.

Figure 62:
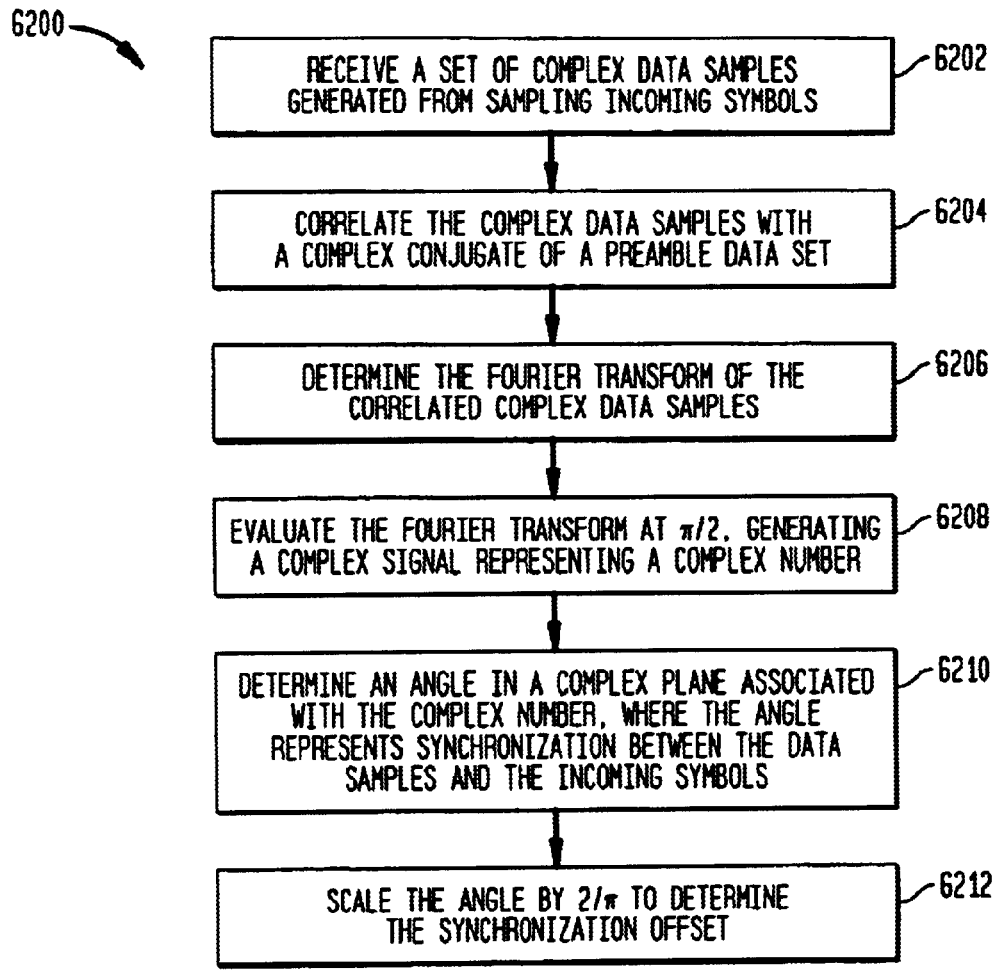

FIG. 62 illustrates a flowchart 6200 associated with the synchronizer 6100 according to embodiments of the present invention.

Figure 63:
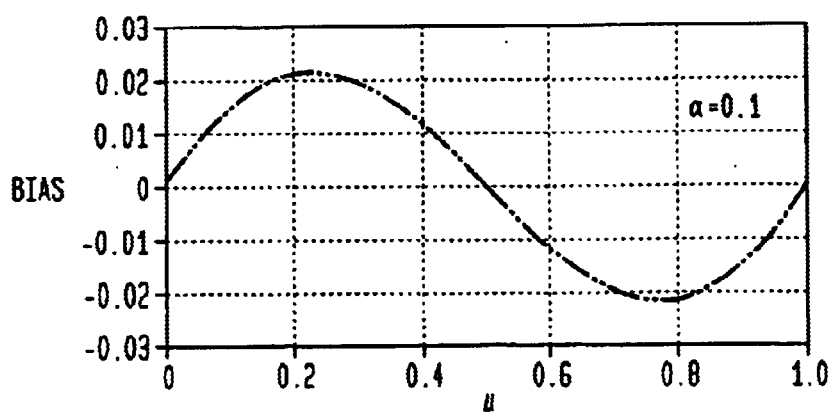

FIG. 63 illustrates bias due to truncation.

FIG. 64 illustrates simultaneous operation of a symbol-timing synchronizer and a carrier phase recovery system 6400 according to embodiments of the present invention.

Figure 65B:
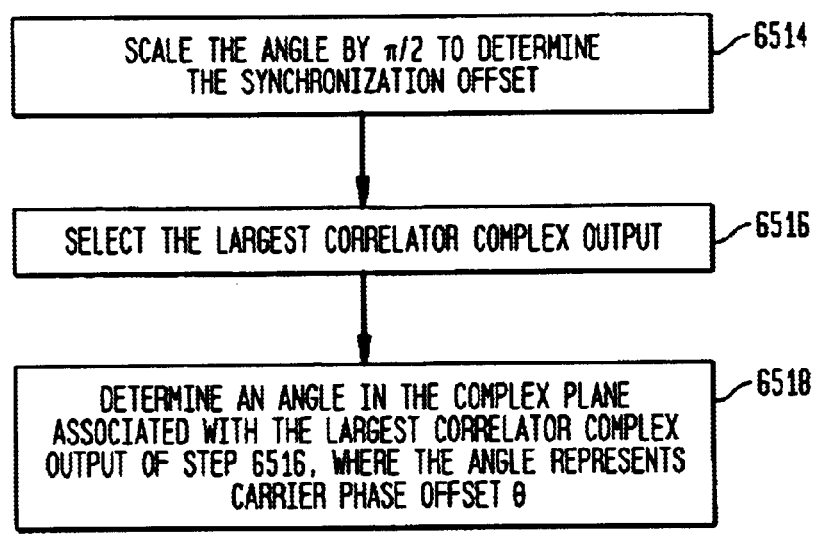

FIGS. 65A–65B illustrate a flowchart 6200 6500 associated with the synchronizer 6100 6400 according to embodiments of the present invention.

Figure 66:
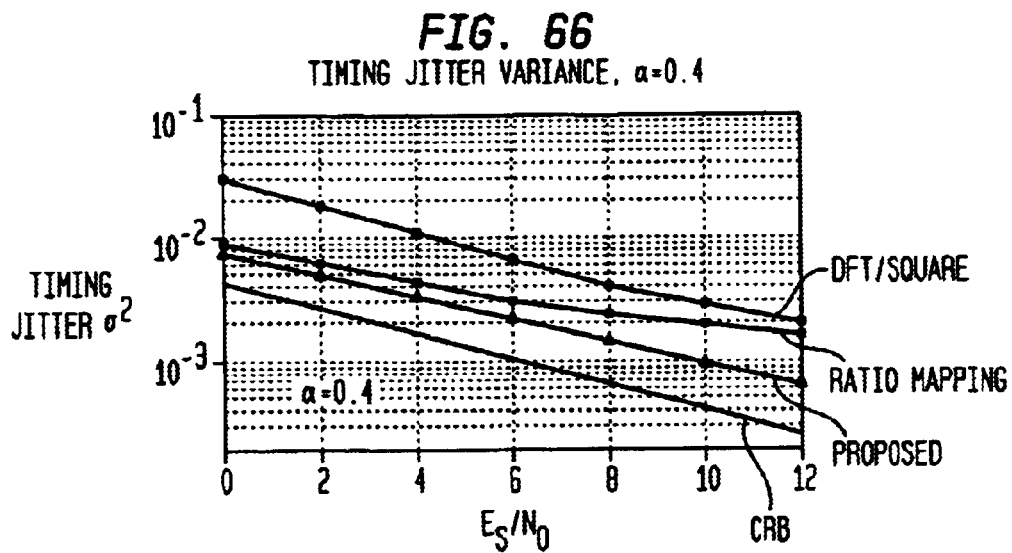

FIG. 66 illustrates timing variance, $\alpha$=0.4.

Figure 67:
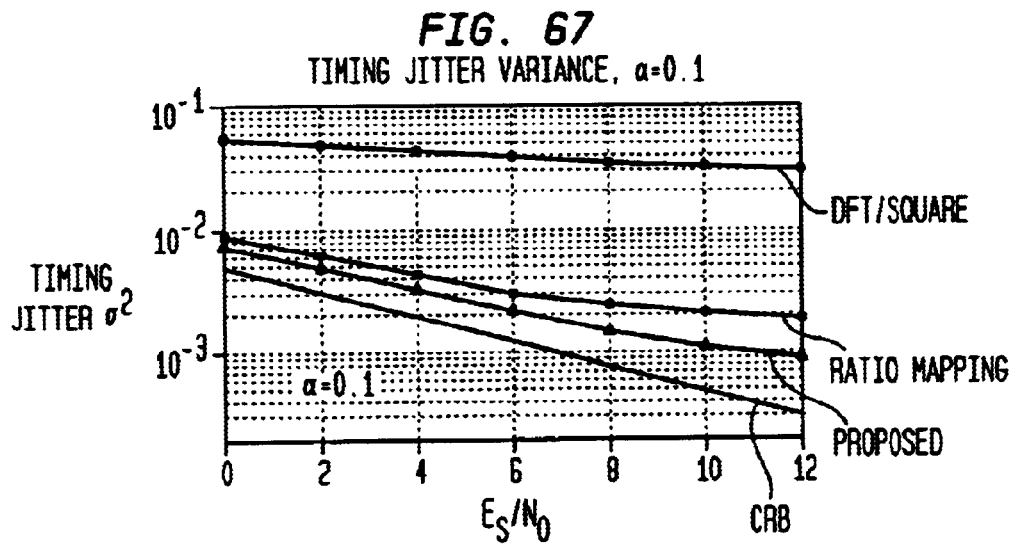

FIG. 67 illustrates timing jitter variance, $\alpha$=0.1.

Figure 68:
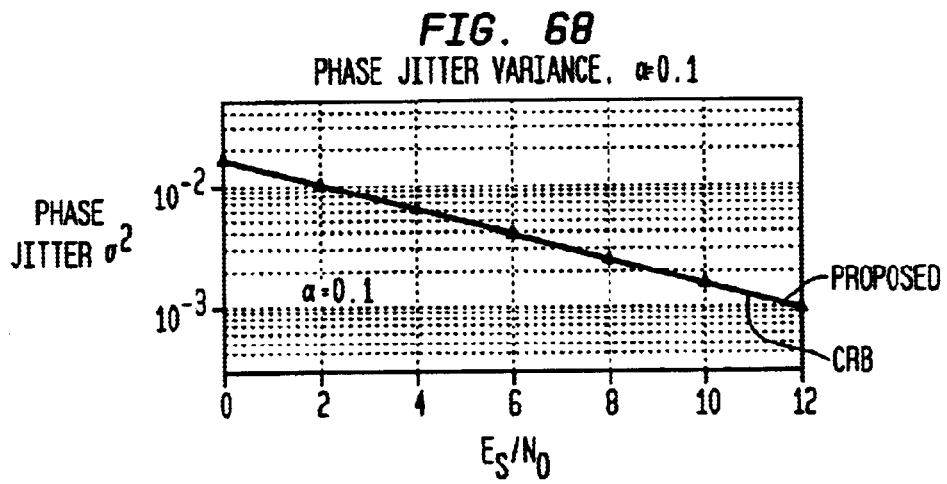

FIG. 68 illustrates phase jitter variance, $\alpha$=0.1.

Figure 69:
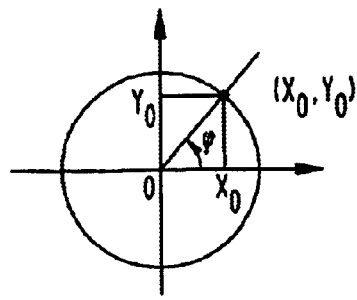

FIG. 69 illustrates Cartesian-to-polar conversion.

Figure 70A:
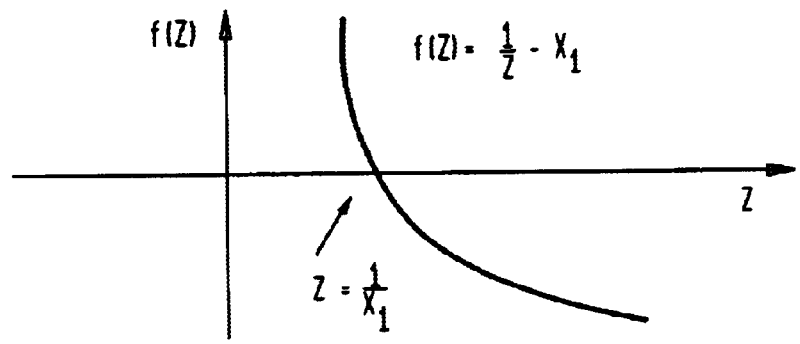
Figure 70B:
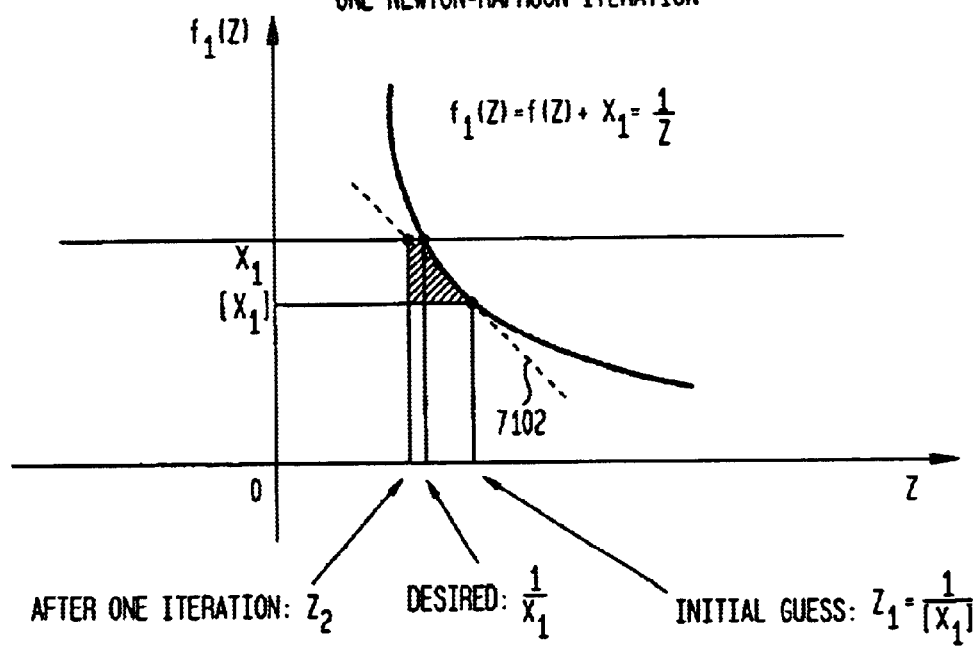

FIGS. 70A–70B illustrate using Newton-Raphson iteration to find $1/X_1$.

Figure 71:
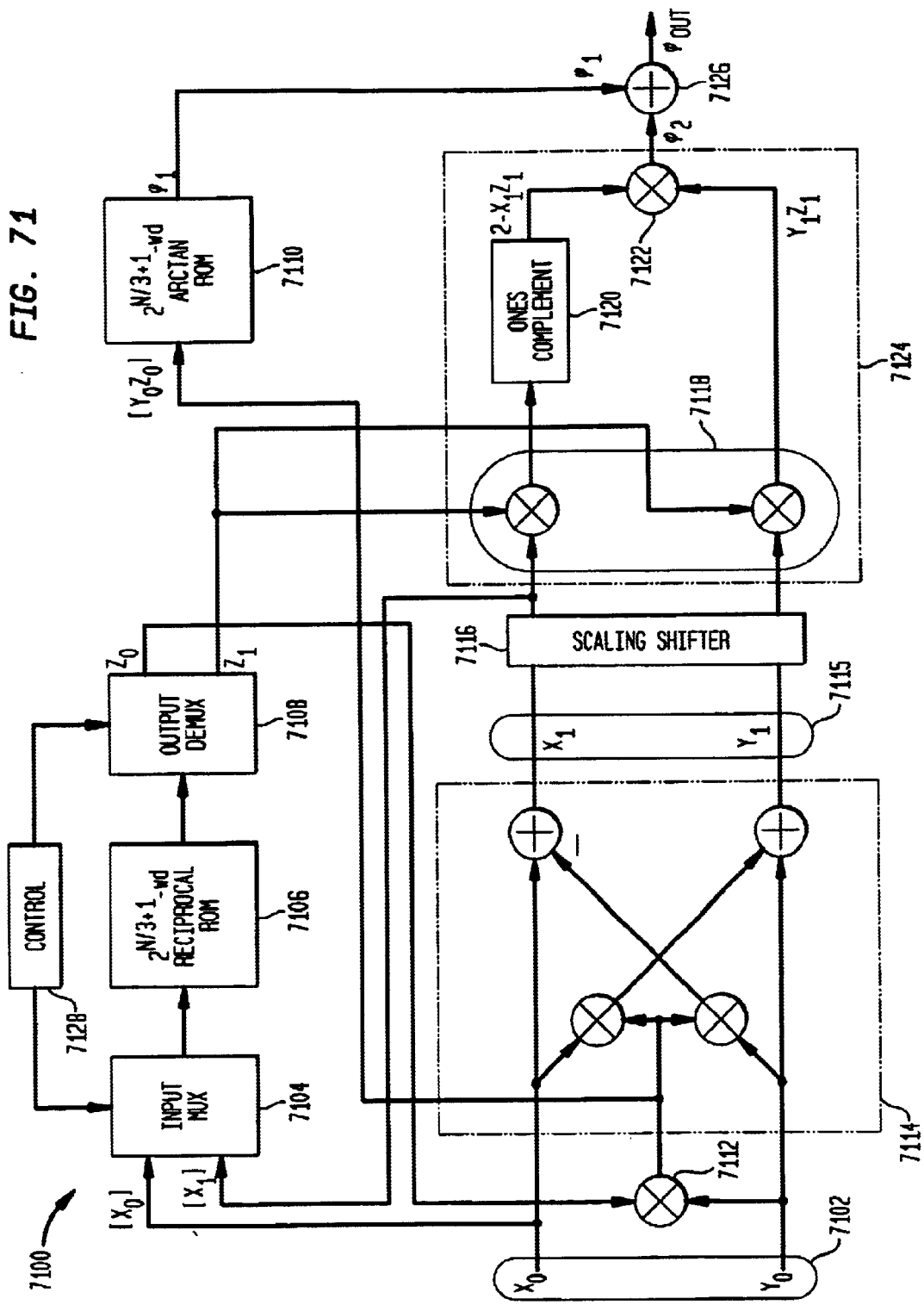

FIG. 71 illustrates a rectangular-to-polar converter 7100 according to embodiments of the present invention.

Figure 72:
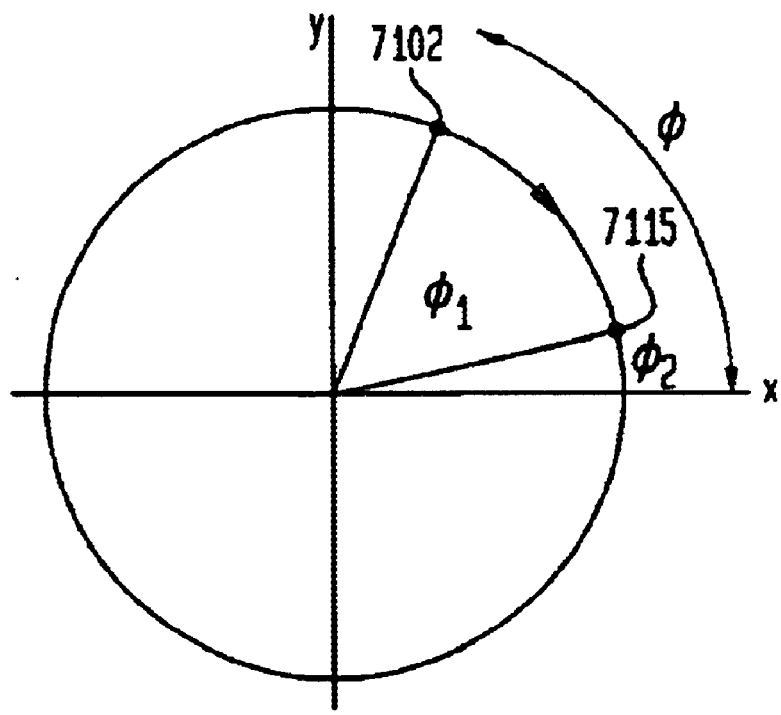

FIG. 72 illustrates angle rotation associated with the rectangular-to-polar converter 7100 according to embodiments of the present invention.

Figure 73:
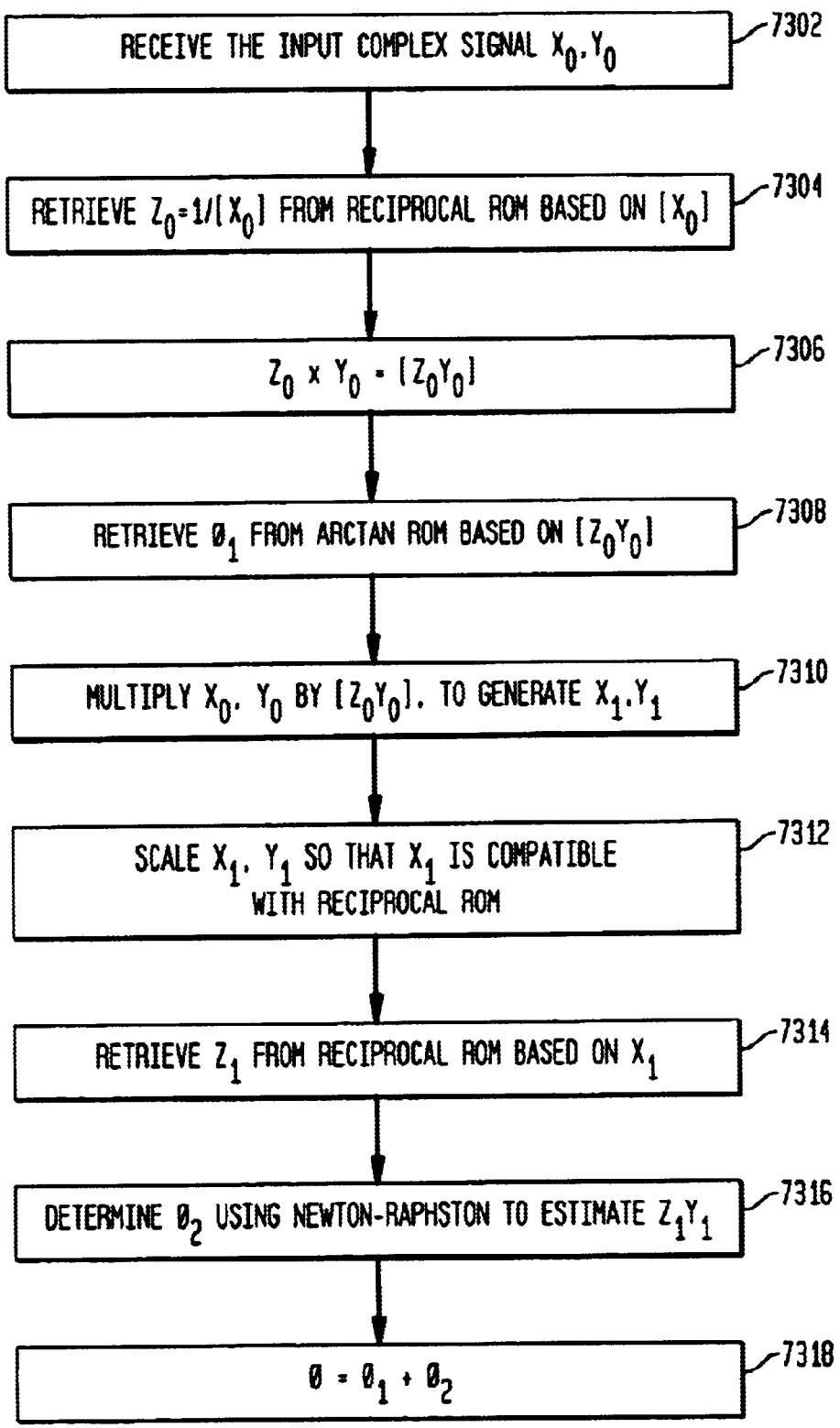

FIG. 73 illustrates a flowchart 7300 associated with the synchronizer 7100 according to embodiments of the present invention.

Figure 74:
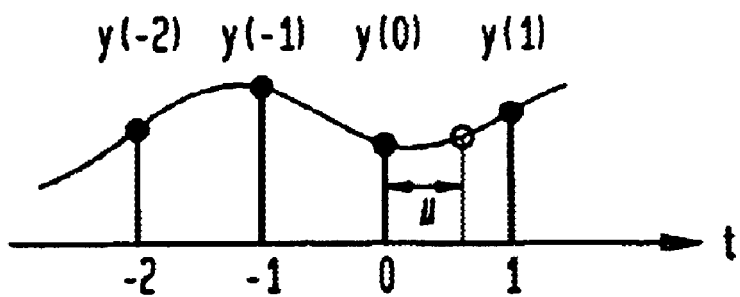

FIG. 74 illustrates Interpolation in a non-center interval according to embodiments of the present invention.

Figure 75A:
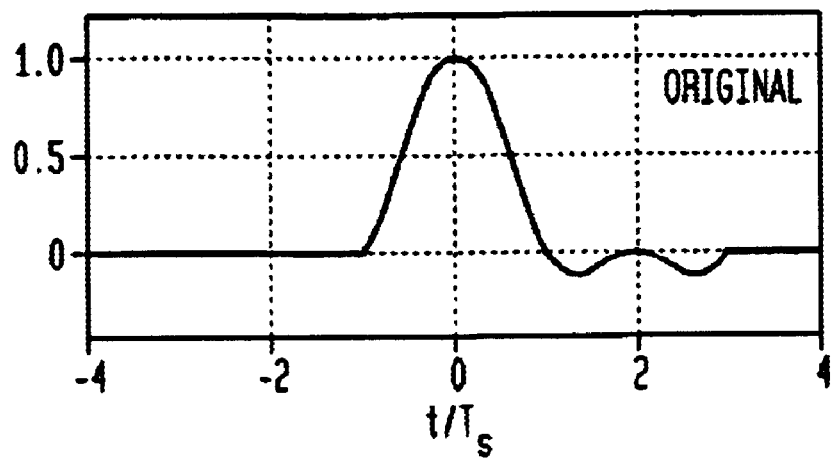
Figure 75B:
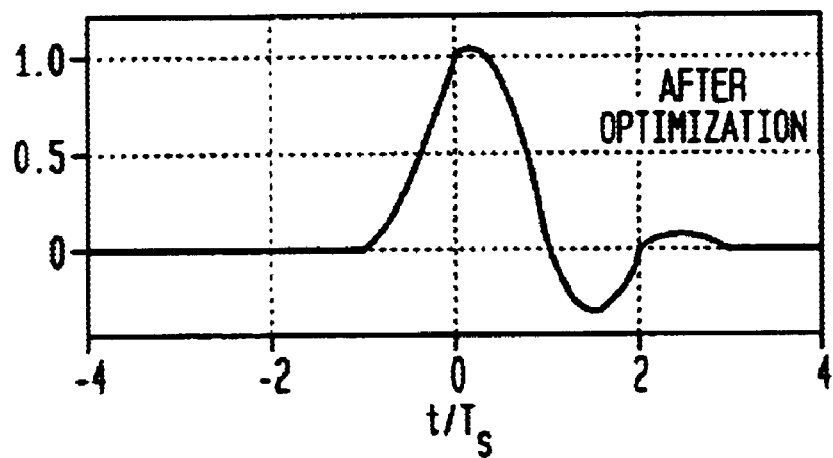

FIGS. 75A–B illustrate impulse responses of the non-center-interval interpolation filter (A) before and (B) after optimization, according to embodiments of the present invention.

Figure 76A:
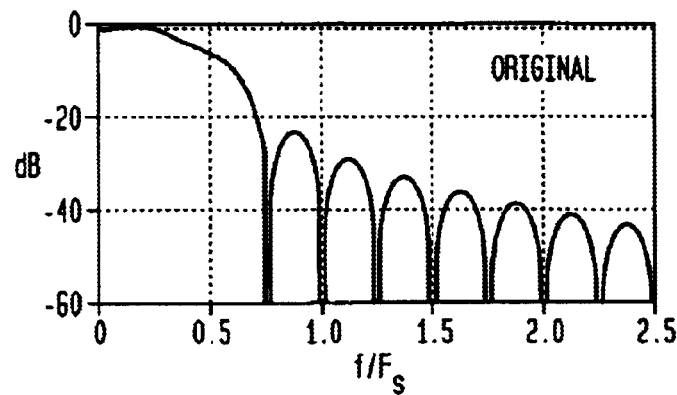
Figure 76B:
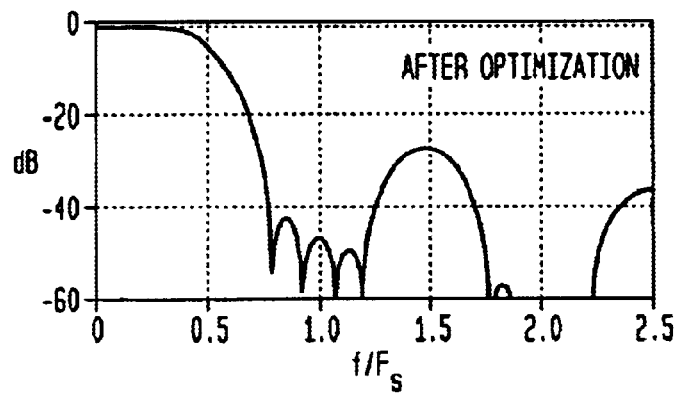

FIGS. 76A–B illustrate frequency responses of the non-center-interval interpolator (A) before optimization and (B) after optimization, according to embodiments of the present invention.

Figure 77:
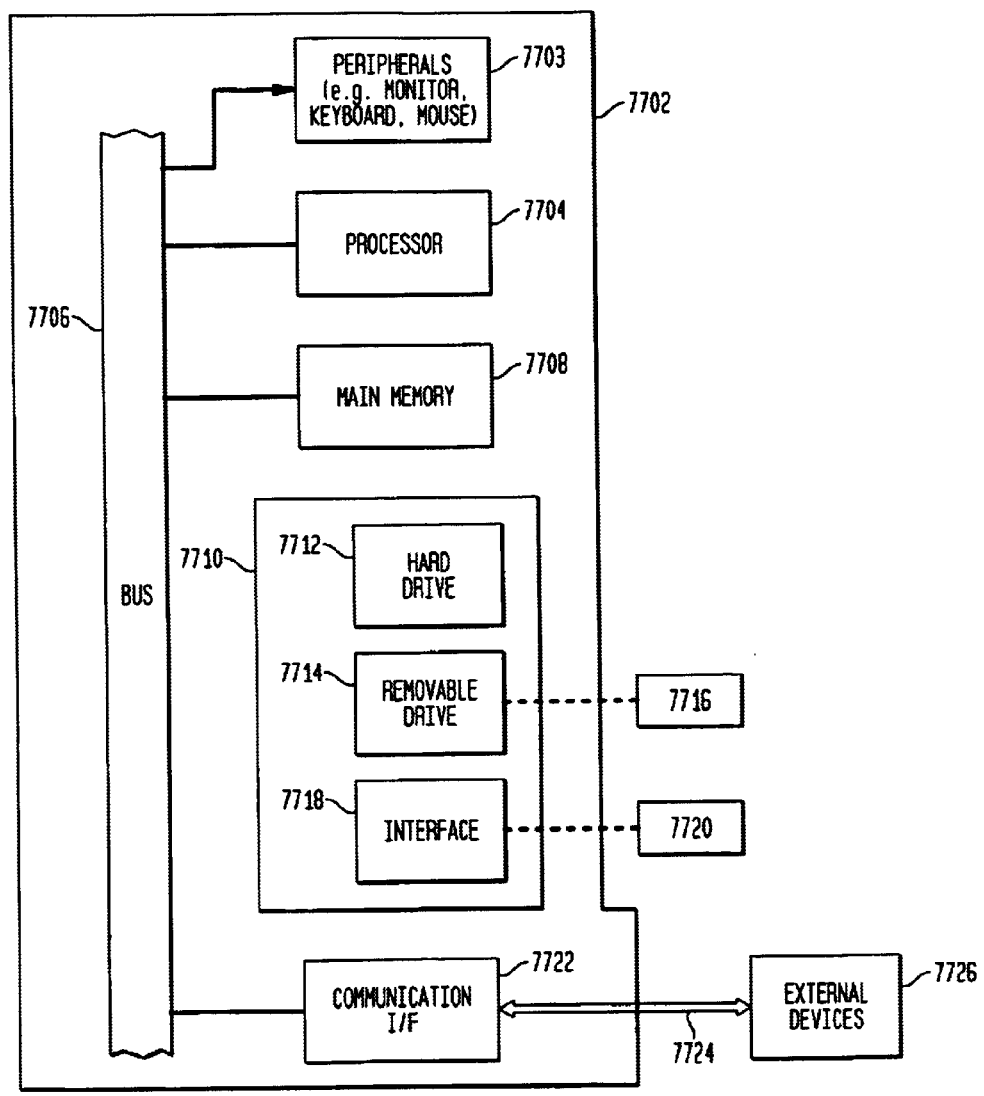

FIG. 77 illustrates an exemplary computer system 7702, according to embodiments of the present invention.

Figure 78:
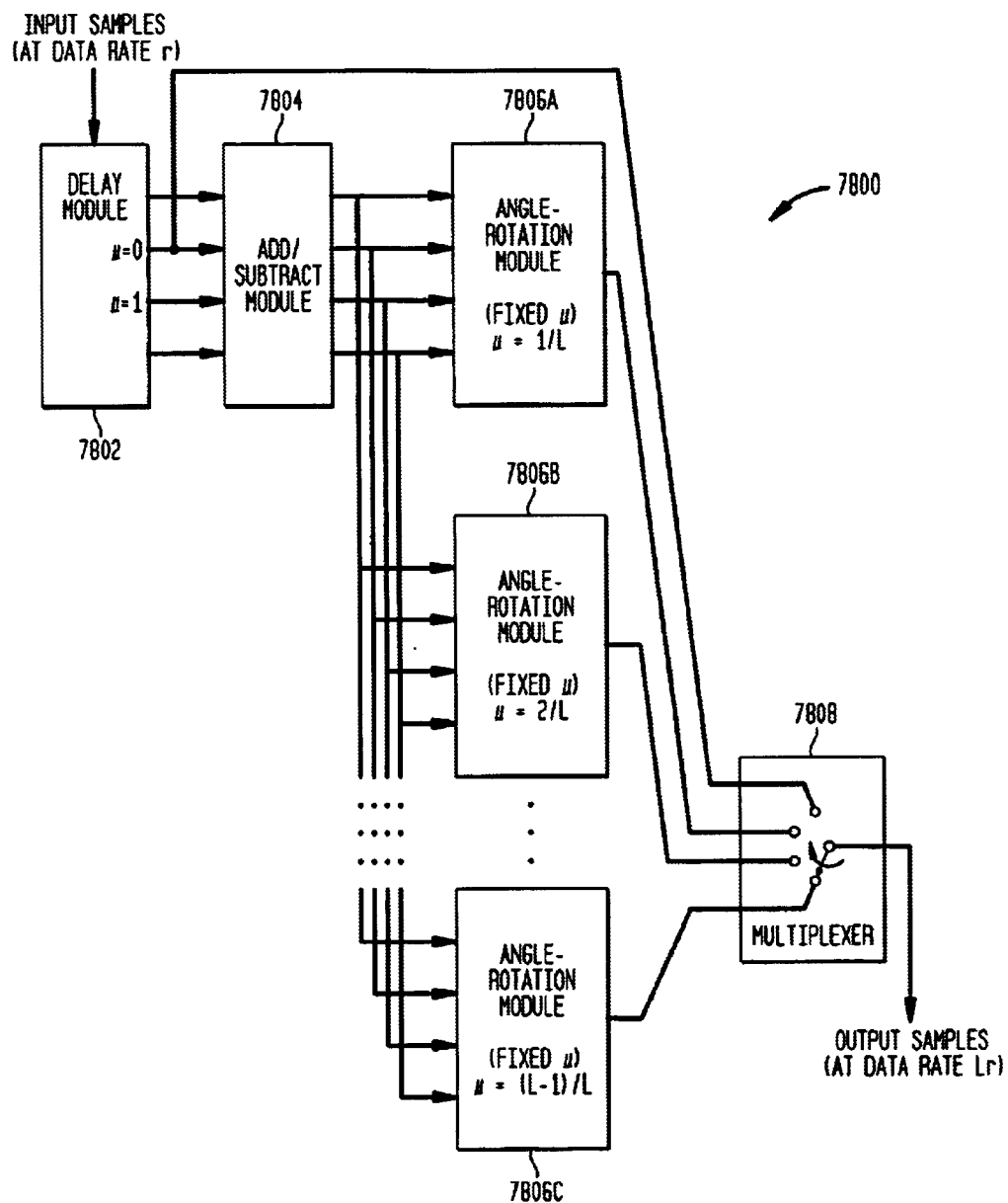

FIG. 78 illustrates a data rate expansion circuit 7800 according to embodiments of the present invention.

DETAILED DESCRIPTION OF THE PREFERRED EMBODIMENTS

Table of Contents

1. Introduction
1.1 Exemplary Modulation Schemes and Synchronization Issues
1.2 Overview
2. Interpolation Using a Trigonometric Polynomial
2.1 Interpolation Using an Algebraic Polynomial
2.2 The Trigonometric Polynomial Method
2.3 Performance Comparisons
2.4 Efficient Implementation Structures
    2.4.1 Using a Lookup Table
    2.4.2 Using an Angle Rotation Processor
2.5 Delays in the Computation
2.6 Simplifications of the Preliminary Structures
    2.6.1 The Simplified Structure for N=4
    2.6.2 The Simplified Structure for N=8
    2.6.3 Performance Comparisons with Other Structures
2.7 Trigonometric Interpolator Application
2.8 Trigonometric Interpolator Summary
3. Interpolation Filters with Arbitrary Frequency Response
3.1 Formulating the Trigonometric Interpolator as an Interpolation Filter
3.2 Analysis of the Frequency Response
3.3 Implementing the Modified Algorithm
3.4 Conditions for Zero ISI
3.5 Optimization Algorithm
3.6 Conclusion
4. Design of Optimal Resamplers
4.1 Motivation
4.2 Resampler Optimizations
4.3 Implementations
4.4 Simulation Results
4.5 Conclusion
5. A High-Speed Angle Rotation Processor
5.1 The angle rotation problem
    5.1.1 Single-Stage Angle Rotation
    5.1.2 Rotation by a Small Angle
    5.1.3 Partitioning into Coarse and Fine Rotations
5.2 Simplification of the Coarse Stage
5.3 Reduction of Multiplier Size in the Fine Stage
5.4 Scaling Multiplier Simplification
5.5 Computational Accuracy and Wordlength
5.6 Comparison with the Single-Stage Mixer
5.7 A Modified Structure When Only One Output is Needed
    5.7.1 Modifications to the Coarse Stage
    5.7.2 Scaling Multiplier Simplification
5.8 Application of Angle Rotation Processors
    5.8.1 Using the Angle Rotation Processor in a Quadrature Direct Digital Frequency Synthesizer/Mixer
        5.8.1.1 A General Angle Rotator for Arbitrary Input Angles
        5.8.1.2 Adapting the General Angle Rotator to Make a QDDFSM
    5.8.2 How to Use the Conditionally Negating Multipliers in the General Angle Rotator
        5.8.2.1 Booth Multiplier
        5.8.2.2 How to Make a Negating Booth Multiplier
        5.8.2.3 How to Make a Conditionally Negative Booth Multiplier
    5.8.3 Using the Angle Rotation Processor in a Quadrature Direct Digital Frequency Synthesizer
5.9 Conclusion
6. Symbol Synchronization for Bursty Transmissions
6.1 Initial Parameter Estimations for Burst Modems
6.2 Background Information
6.3 Symbol Timing Estimation Assuming θ=0
6.4 Bias in Symbol Timing Estimation due to Truncating the Sequence
6.5 Carrier-Independent Symbol Timing Recovery
6.6 Carrier Phase Computation
6.7 Simulation Result
6.8 Conclusion
7. A High-Speed Processor for Rectangular-to-Polar Conversion
7.1 Partitioning the Angle
7.2 The Two-Stage Algorithm
    7.2.1 Simplification in the Coarse Computation Stage
        7.2.1.1 The Reciprocal Table 7106
        7.2.1.2 The Arctangent Table 7110
    7.2.2 Hardware Reduction in the Fine Computation Stage 7124
7.3 Magnitude Calculation
7.4 Converting Arbitrary Inputs
7.5 Test Result
7.6 Conclusion
8. Exemplary Computer System
9. Appendices
9.1 Appendix A: Proof of the Zero ISI Condition.
9.2 Appendix B: Impulse Response of the Simplified Interpolators
9.3 Appendix C: Fourier Transform of $g(nT_s-\mu)$
9.4 Appendix D: Interpolation on Non-Center Intervals
9.5 Appendix E
10. Conclusion

1. Introduction

As discussed herein, third generation and other cutting edge communications systems require proper synchronization between the transmitter and the receiver. More specifically, the frequency and phase of the receiver local oscillator should substantially match that of the transmitter local oscillator and accurate symbol timing must be achieved. The following section discuss some exemplary modulation schemes and configurations, and their related synchronization issues. These example configurations are not meant to be limiting, and are provided for example purposes only. After which, an overview of the present invention is provided.

1.1 Exemplary Modulation Schemes and Synchronization Issues

A key to the evolution of third-generation PCS is the ability to provide higher data rates via increased spectral efficiency of the access scheme. The IS-136 community intends to add a 200-KHz carrier bandwidth and adopt 8PSK modulation. This allows for data rates up to 384 Kb/s.

Figure 1A:
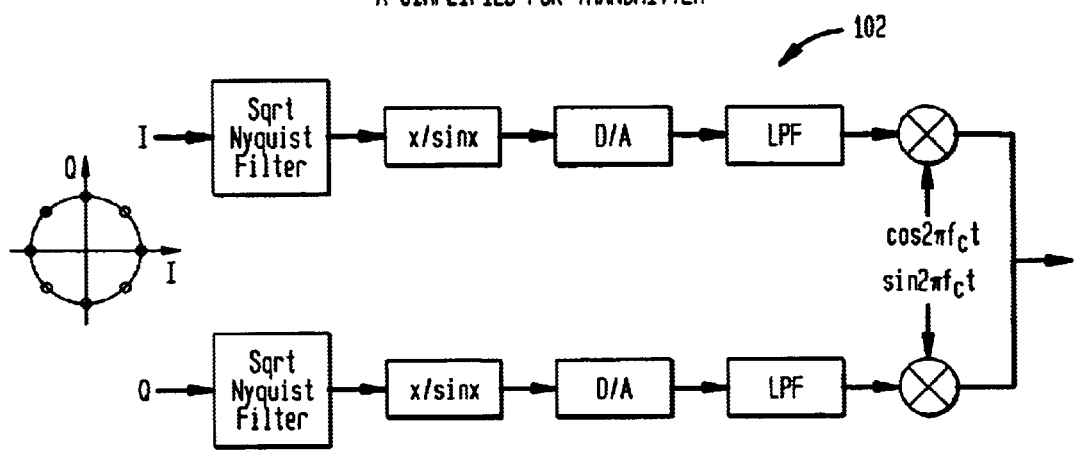
FIG. 1A illustrates a PSK transmitter.

A simplified 8PSK transmitter 102 and receiver 104 are shown in FIG. 1A and FIG. 2B, respectively. The receiver 104, as shown, performs baseband sampling. Alternatively, the received signal could be sampled at an IF frequency, where the down-conversion to baseband is performed digitally. However, since it does not alter the main subject in the present invention, the baseband-sampled system is used as an example.

Figure 1B:
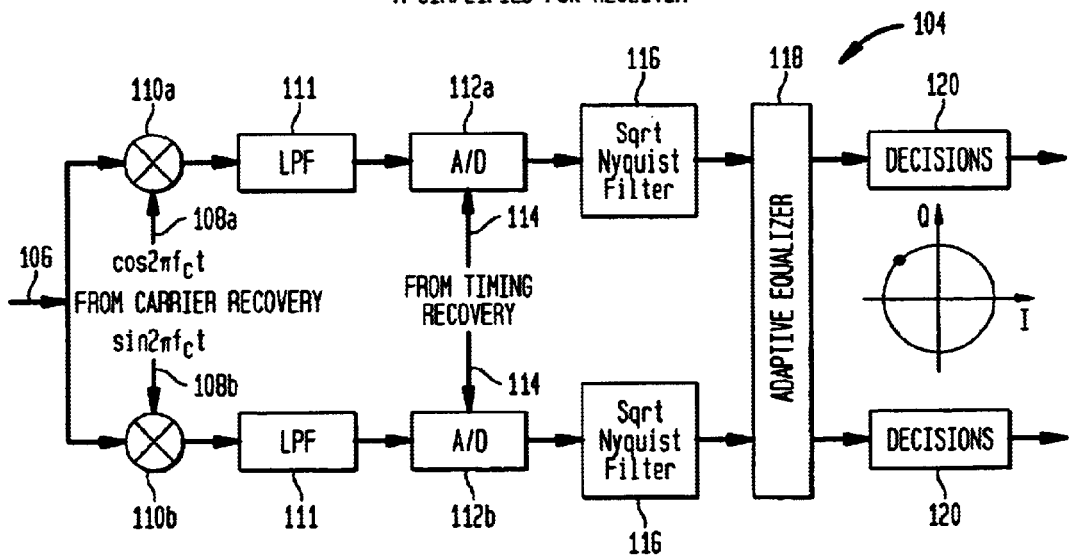
FIG. 1B illustrates a PSK receiver.

Referring to FIG. 1B, PSK receiver 104 down-converts an IF input signal 106 to baseband by multiplication with a local oscillator signal 108 using mixers 110. After filtering 111, A/D converters 112 sample the down-converted signal according to a sampling clock 114 in preparation for logic examination. After further filtering 116 and equalization 118, the logic decision devices 120 examine the sampled signal to determine a logic output for the two channels.

During down-conversion, an undesirable rotation of the symbol constellation will occur if the frequency and phase of the oscillator signal 108 does not match the oscillator signal of the transmitter 102. This symbol rotation can seriously degrade system performance. When the carrier frequency offset is much smaller than the symbol rate, the phase and frequency mismatches can be corrected at baseband, using a phase rotator 124, as shown in FIG. 1D.

The sampling clock 114 is generated locally in the receiver 104. The logic decision devices 120 make more accurate decisions when the sampling instant is optimal, i.e., synchronous to the incoming symbols.

If the timing information can be extracted from the signal 106, it can be used to adjust the phase of the sampling clock 114. This adjustment would require a voltage controlled oscillator (VCO) to drive the A/D converters 112. In this scenario, the digital portion of the circuit 104 needs to keep in synchronization with the A/D converters 112, which places strict requirements on the VCO. Moreover, changing the phase of the sampling clock 114 would cause jitter. High data-rate receivers are more sensitive to such jitter when used in multimedia communications.

Figure 1C:
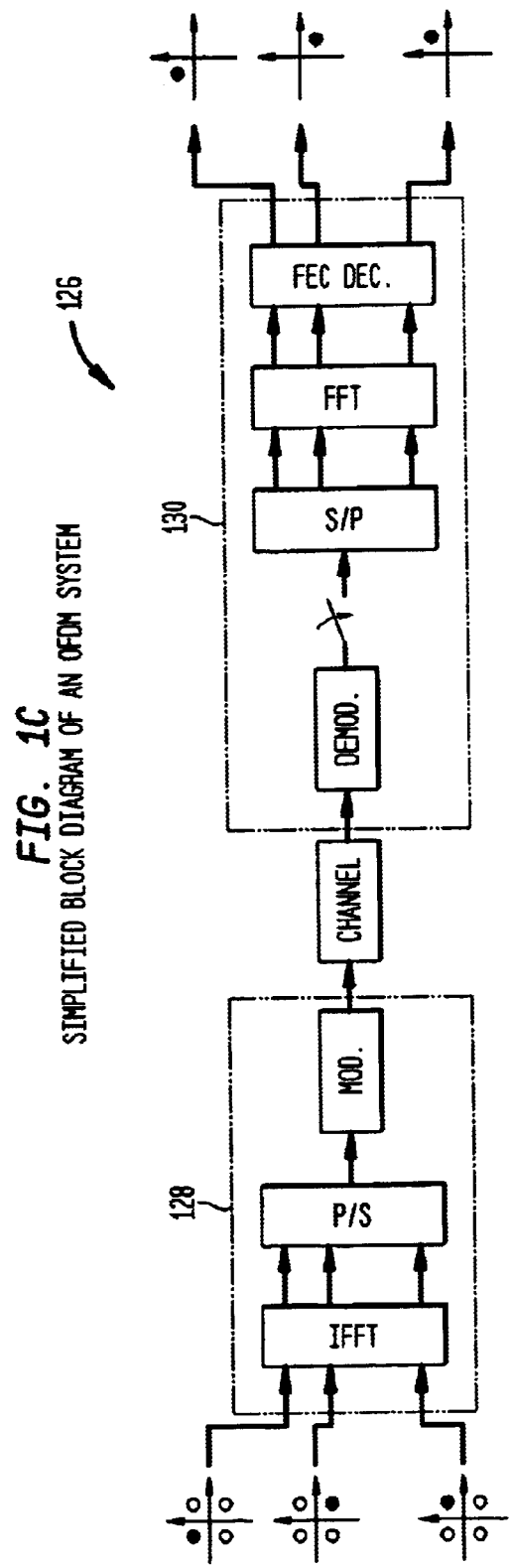
FIG. 1C illustrates a block diagram of an OFDM system.
Figure 1D:
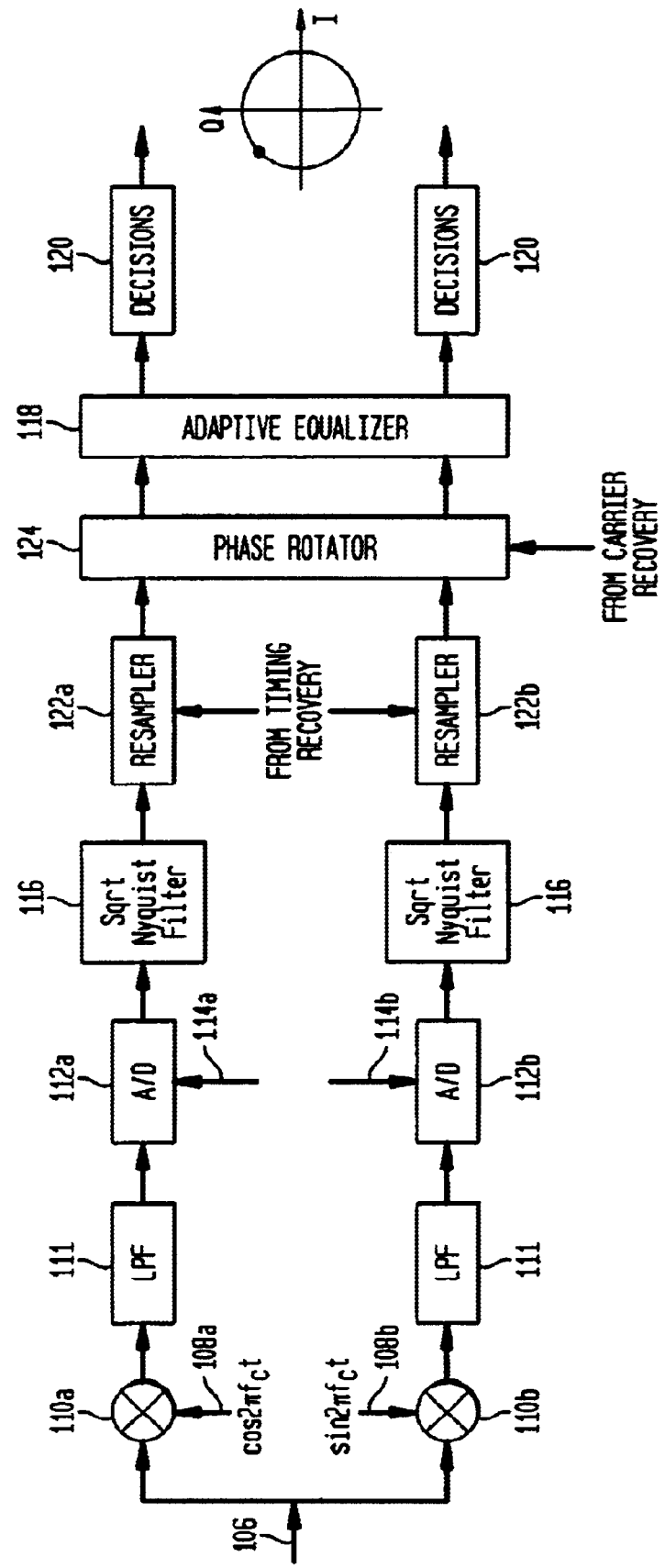
FIG. 1D illustrates a PSK receiver with carrier and timing recovery.

Another solution to timing errors is to correct them entirely in the digital domain, with the equivalent of A/D sampling adjustment performed by a digital resampler 122, as shown in FIG. 1D. This resampler 122 is controlled by a timing recovery circuit (not shown) and it attempts to supply the optimal samples (i.e. synchronous) to the decision circuits 120. Using the digital resampler 122, the timing recovery loop is closed entirely in the digital domain. This allows the complete separation of digital components from analog components.

The digital resampler 122 and a direct digital frequency synthesizer (not shown) used by the phase rotator 124 are among the most complex components in a receiver (Cho, K., "A frequency-agile single-chip QAM modulator with beam-forming diversity," Ph.D. dissertation, University of California, Los Angeles (1999)). Their performance is significant in the overall design of the modem. For multimedia communications, the high-data-rate requirement imposes a demand for high computational power. However, for mobile personal communication systems, low cost, small size, and long battery life are desirable. Therefore, efficient implementation is the key to implementing fast signal processing within the available resources. It is also desirable to provide an efficient synchronization mechanism by using a unified approach to timing and carrier phase corrections. This can be accomplished by sharing resources between the resampler 122 and the phase rotator 124.

As for the digital video broadcasting system (DVB) systems, the most challenging of all DVB transmissions is the one used in terrestrial channels (DVB-T) due to the presence of strong echoes which characterize the propagation medium. A common approach for DVB-T is based on Coded-OFDM (orthogonal frequency division multiplexing). The major benefit of OFDM is that the serial baseband bitstream which needs to be transmitted is distributed over many individual subcarriers. Such spreading makes the signal robust against the effects of multipath and narrowband interference. The simplified block diagram of an OFDM modem 108 is shown in FIG. 1C.

FIG. 1C illustrates an orthogonal frequency division multiplexing system (OFDM) 126 having an OFDM transmitter 128 and an OFDM receiver 130. For the OFDM system 126, synchronization errors produce a rotation of the fast Fourier Transform (FFT) outputs of the OFDM receiver 130. (Pollet T., and Peeters, M., *IEEE Comm. Magazine* 37:80–86 (1999)). A sampling phase correction for the received signals can be achieved by rotating the FFT outputs at the receiver. For FFT rotation, it is desirable to have an efficient implementation structure to perform rotations of complex numbers.

The example applications and modulation schemes described above in this section were provided for illustrative purposes only, and are not meant to be limiting. Other applications and combinations of such applications will be apparent to persons skilled in the relevant art(s) based on the teachings contained herein. These other applications are within the scope and spirit of the present invention.

1.2 Overview

The following is an overview of the sections that follow.

Sections 2, 3 and 4, discussed herein, present a novel interpolation method for digital resampling using a trigonometric polynomial. In Section 2, after a brief review of interpolation methods, particularly those using a conventional polynomial, the trigonometric interpolation method is introduced. Efficient implementation structures for trigometric interpolation are given. The performance, hardware complexity and computational delay are compared with conventional polynomial interpolators. The trigonometric-polynomial based resampler can use the same hardware as is employed in the phase rotator for carrier synchronization, thus further reducing the total complexity in the synchronization circuitry.

In Section 3, a signal processing approach is used to analyze the interpolation method devised in Section 2. It shows how an arbitrary frequency response is achieved by applying a simple modification to the original interpolation algorithm. This enables the interpolator to also perform matched filtering of the received signal.

The approaches in Section 3 can be employed to improve the interpolator performance by optimizing the frequency response of the continuous-time interpolation filter. This method is based on optimizing the performance by conceptually reconstructing the continuous-time signal from existing samples. From the point of view of designing digital resamplers, however, what we are actually interested in are new samples corresponding to the new sampling instants. In Section 4, we optimize the interpolation filter such that the error in producing a new sample corresponding to every resampling instant is minimized, hence further improving the overall interpolation accuracy.

Section 5 presents an angle rotation processor that can be used to efficiently implement the trigonometric resampler and the carrier phase rotator. This structure can also implement the resampler for an OFDM receiver, which rotates the FFT outputs. It has many other practical applications.

The discussions in the previous Sections have assumed that the sampling mismatch that is supplied to the resampler is known. The problem of obtaining the synchronization parameters is studied in Section 6. For burst mode transmissions in packet data systems, we present an efficient architecture for feedforward symbol-timing and carrier-phase estimation.

Section 7 presents an efficient implementation of a key component in the feedforward synchronizer of Section 6, as well as in many other such synchronizers. This involves computing the angle from the real and imaginary components of a complex number. The discussion, however, extends to a general problem of Cartesian-to-polar conversion, which is encountered in many communication applications. An architecture that efficiently accomplishes this conversion is presented.

Section 8 presents an exemplary computer system in which the invention can be operated.

Section 9 includes various appendices.

Further discussions related to materials in Sections 2–7 are included in Dengwei Fu, "Efficient Synchronization for Multimedia Communications," Ph.D dissertation, University of California, Los Angeles, 2000, which is incorporated-by-reference, in its entirety.

Additionally, the following articles are herein incorporated by reference in their entireties:

D. Fu and A. N. Willson, Jr., "A high-speed processor for digital sine/cosine generation and angle rotation," in *Conf. Record 32nd Annual A silomar Conference on Signals, Systems and Computers*, vol. 1, pp. 177–181, November 1998;

D. Fu and A. N. Willson, Jr., "Interpolation in timing recovery using a trigonometric polynomial and its implementation," in *Proc. GLOBECOM 1998, Comm. Theory Mini-Conference Record*, pp. 173–178, November 1998;

D. Fu and A. N. Willson, Jr., "Design of an improved interpolation filter using a trigonometric polynomial," in *Proc. Int. Symp. Circuits & Systems*, vol. 4, pp. 363–366, May 30–Jun. 3, 1999;

D. Fu and A. N. Willson, Jr., "A high-speed processor for rectangular-to-polar conversion with applications in digital communications," in *Proc. GLOBECOM* 1999, vol. 4, pp. 2172–2176, December 1999;

D. Fu and A. N. Willson, Jr., "A fast synchronizer for burst modems with simultaneous symbol timing and carrier phase estimations," in *Proc. Int. Symp. Circuits & Systems*, vol. 3, pp. 379–382, May 28–31, 2000; and D. Fu and A. N. Willson, Jr., "Optimal interpolator using a trigonometric polynomial," in *Proc. 43rd Midwest Symp. Circuits & Systems*, 4 pages, Aug. 8–11, 2000.

2. Interpolation Using a Trigonometric Polynomial

As discussed in Section 1, when an analog-to-digital converter (ADC) is clocked at a fixed rate, the resampler must provide the receiver with correct samples, as if the sampling is synchronized to the incoming symbols. How can the resampler recover the synchronized samples by digital means without altering the sampling clock? Since the input analog signal to the ADC is bandlimited, as long as the sampling rate is at least twice the signal bandwidth, according to the sampling theorem, the sampled signal carries as much information as the continuous-time signal. Therefore, the value of the original continuous-time signal at an arbitrary point can be evaluated by applying an interpolation filter (e.g., sinc interpolation) to the samples. Hence, the design of the resampler has been transformed to the design of effective interpolation filters or, in other words, fractional-delay filters with variable delay.

There are numerous methods for designing fractional-delay filters. These filters have different coefficients for different delays. Thus, to implement variable-delay interpolation filters, one could compute one set of coefficients for each quantized delay value and store them in a memory. Then, in real-time, depending on the fractional delay extracted from the incoming signal, the corresponding coefficients could be loaded. However, this method is likely to result in a large coefficient memory.

To design low-cost modems, a large coefficient memory is undesirable. Gardner, et al., have shown that polynomials can be incorporated to compute the desired samples that are synchronous with the transmitted samples (Gardner, F. M., *IEEE Trans. Comm.* 41:502–508 (1993); Erup, L., et al., *IEEE Trans. Comm.* 41:998–1008 (1993)). In this case, an extensive coefficient memory is not needed. Moreover, the polynomial-based structure can be implemented efficiently with a so-called Farrow structure (Farrow, C., "A continuously variable digital delay element," in Proc. *IEEE Int. Symp. Circuits Syst.* (June 1988), pp. 2641–2645). This method is reviewed in Section 2.1. Although this approach achieves reasonable performance, the hardware complexity grows rapidly as the number of samples used to calculate each new sample is increased for better accuracy. In addition, given a fractional delay $\mu$, to produce a new sample using a degree N–1 polynomial, there will be N–1 sequential multiplications that involve $\mu$ since we must compute $\mu$ raised to the (N–1)-th power times a data value. Thus, the critical data path gets longer as N increases, thereby creating a limitation on the achievable data rate.

Starting in Section 2.2, a new approach to interpolation is introduced. Instead of approximating the continuous-time signal with a conventional (i.e., algebraic) polynomial, a trigonometric polynomial is used according to the present invention. First, some background information is given. Next, the detailed implementation is discussed. We then evaluate and compare the performance and computational complexity of the algebraic polynomial interpolation to that of our method, giving numerical results.

2.1 Interpolation Using an Algebraic Polynomial

Figure 2:
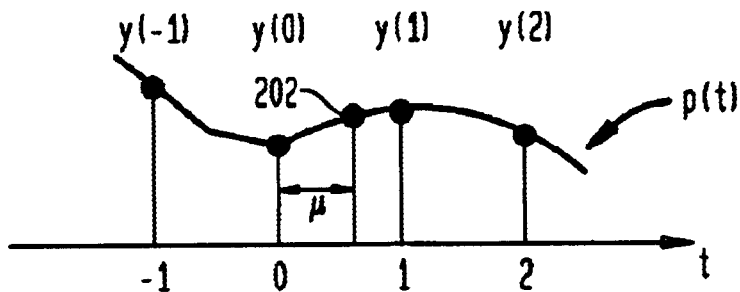
FIG. 2 illustrates an Interpolation environment.

To interpolate using function values y(n) at N equally-spaced sample points, also referred to as a "base point set," we can fit an algebraic polynomial of degree N–1 to the data, as in FIG. 2. As explained in (Gardner, F. M., *IEEE Trans. Comm.* 41:502–508 (1993)), there should be an even number of samples in the base point set, and the interpolation should be performed only in the center interval of the base point set. That is, N is restricted to be even. In other words, given 4 samples points in FIG. 2 including y(−1), y(0), y(1), and y(2), the interpolation is performed at offset ti between the points y(0) and y(1) to determine the point 202 on the curve p(t).

Figure 3:
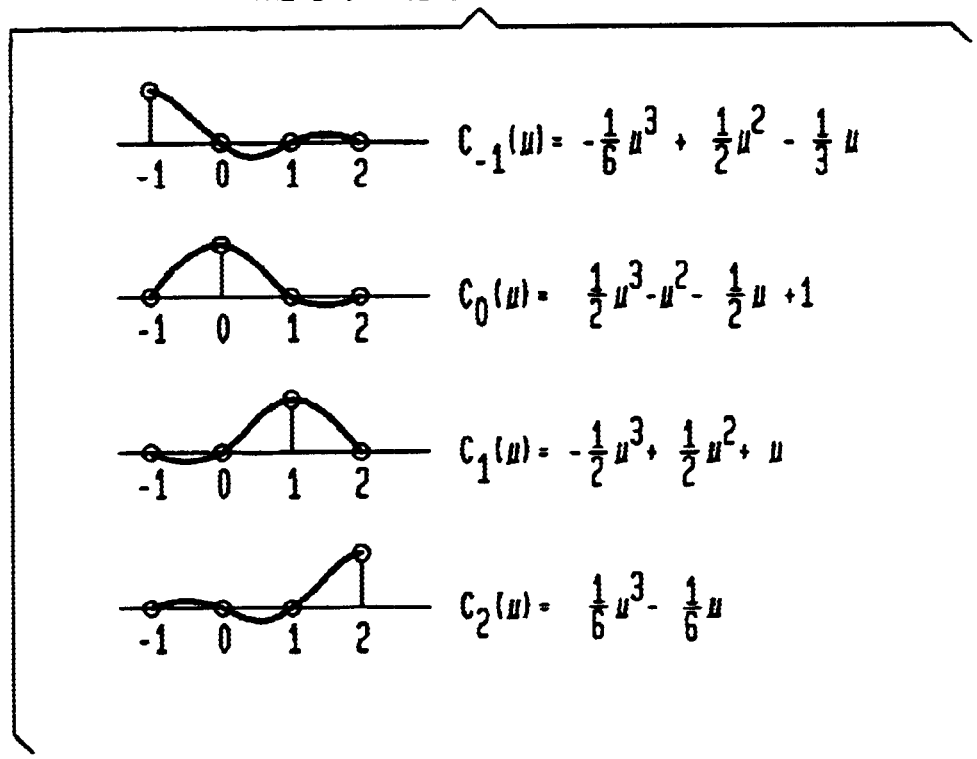
FIG. 3 illustrates Lagrange basis polynomials.

It seems that one would have to solve for the coefficients of the (N−1)-th degree polynomial from these available samples before the synchronized (i.e., interpolated) samples can be computed. However, a method devised by Farrow (Farrow, C., "A continuously variable digital delay element," in *Proc. IEEE Int. Symp. Circuits Syst.* (June 1988), pp. 2641–2645) can compute the synchronized sample from the available samples efficiently with use of an algorithm that is well suited for VLSI implementation. To illustrate, we consider the following example of interpolation using a cubic Lagrange polynomial. Without loss of generality, let us assume the sampling interval is $T_S=1$. Using the Lagrange formula for N=4, the synchronized samples can be computed as $$y(\mu)=y(-1)C_{-1}(\mu)+y(0)C_0(\mu)+y(1)C_1(\mu)+y(2)C_2(\mu) \quad (2.1)$$

where $C_n(\mu)$, n=−1, 0, 1, 2, are the third degree polynomials that are shown in FIG. 3.

Obviously, $$C_n(\mu) = \begin{cases} 1 & \mu = nT_s, n \text{ an integer} \\ 0 & \text{all other integers} \end{cases} \quad (2.2)$$

Thus, $y(\mu)$ in (2.1), the sum of polynomials $C_n(\mu)$ weighted by the y(n) values, must be a third degree polynomial and must go through the samples y(−1), y(0), y(1) and y(2). Writing $C_n(\mu)$ as $$C_n(\mu) = \sum_{k=0}^{3} c_{nk} \mu^k \quad (2.3)$$

the coefficients $C_{nk}$ of $C_n(\mu)$ are fixed numbers. They are independent of $\mu$. We can re-write (2.1) as $$y(\mu) = \sum_{n=-1}^{2} y(n) \sum_{k=0}^{3} c_{nk} \mu^k = \sum_{k=0}^{3}\left(\sum_{n=-1}^{2} y(n) c_{nk}\right)\mu^k = \sum_{k=0}^{3} v(k) \mu^k \quad (2.4)$$

where $$v(k) = \sum_{n=-1}^{2} y(n) c_{nk}. \quad (2.5)$$

To minimize the number of multipliers, we can use a nested evaluation of (2.4), as $$y(\mu)=((v(3)\mu+v(2))\mu+v(1))\mu+v(0). \quad (2.6)$$

Figure 4:
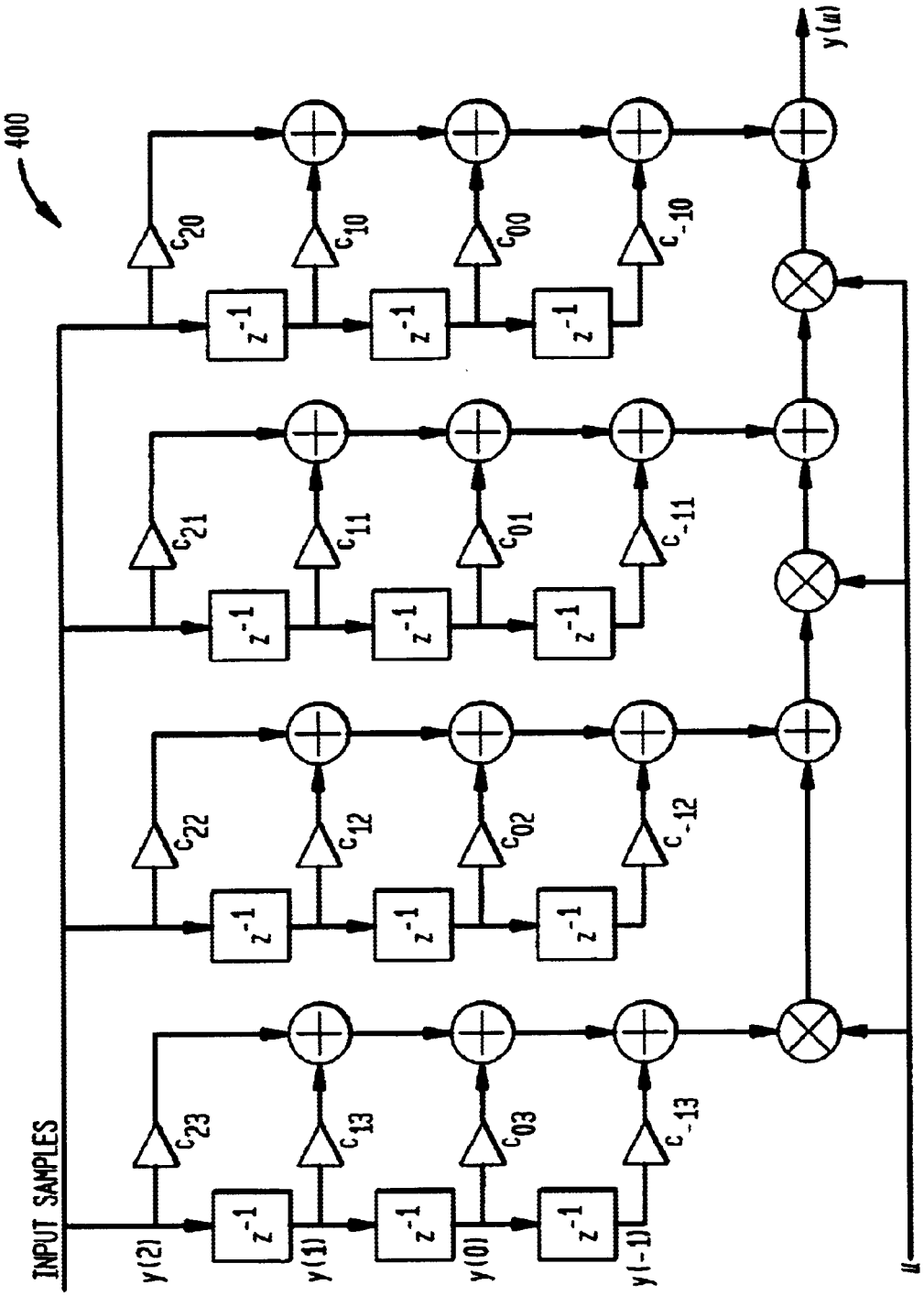
FIG. 4 illustrates a Farrow structure that implements (2.5) and (2.6).

A Farrow structure 400 (for N=4) that implements equations (2.5) and (2.6) is shown in FIG. 4. It consists of multiplications of data by fixed coefficients, and data multipliers, as well as addition operations.

2.2 The Trigonometric Polynomial Method

To solve the problems discussed in the section 2.1, the present invention utilizes a trigonometric polynomial to fit the asynchronous samples in FIG. 2. Using $W_N=e^{-j2\pi/N}$ notation, for t $\in$[−N/2+1, N/2], the polynomial may be written as:

$$y(t) = \frac{1}{N}\left(\sum_{k=-N/2+1}^{N/2-1} c_k W_N^{-kt} + \frac{1}{2}c_{N/2}W_N^{-(N/2)t} + \frac{1}{2}c_{-N/2}W_N^{(N/2)t}\right) \quad (2.7)$$

The polynomial must cross the N samples. Thus, the coefficients $C_k$ can be determined by solving the N linear equations in N unknowns:

$$y(n) = \frac{1}{N}\sum_{k=-N/2+1}^{N/2} c_k W_N^{-kn}, n = -\frac{N}{2}+1, \ldots, \frac{N}{2} \quad (2.8)$$

whose solution is $$c_k = \sum_{n=-N/2+1}^{N/2} y(n) W_N^{kn}, k = -\frac{N}{2}+1, \ldots, \frac{N}{2}. \quad (2.9)$$

The expression in (2.9) is simply the N-point discrete Fourier transform (DFT). This suggests that, given N equally-spaced samples, we can compute the DFT of these samples as in (2.9) to obtain the coefficients of the interpolating trigonometric polynomial in (2.7). Then, for a given offset $\mu$, the synchronized sample $y(\mu)$ can be computed using that polynomial as:

$$y(\mu) = \frac{1}{N}\left(\sum_{k=-N/2+1}^{N/2} c_k W_N^{-k\mu} + c_{N/2}\cos\pi\mu\right). \quad (2.10)$$

Since $c_k$ and $c_{-k}$ are conjugates, this equation can be simplified as $$y(\mu) = \frac{1}{N}\text{Re}\left(c_0 + 2\sum_{k=1}^{N/2-1} c_k W_N^{-k\mu} + c_{N/2}e^{j\pi\mu}\right). \quad (2.11)$$

Figure 5:
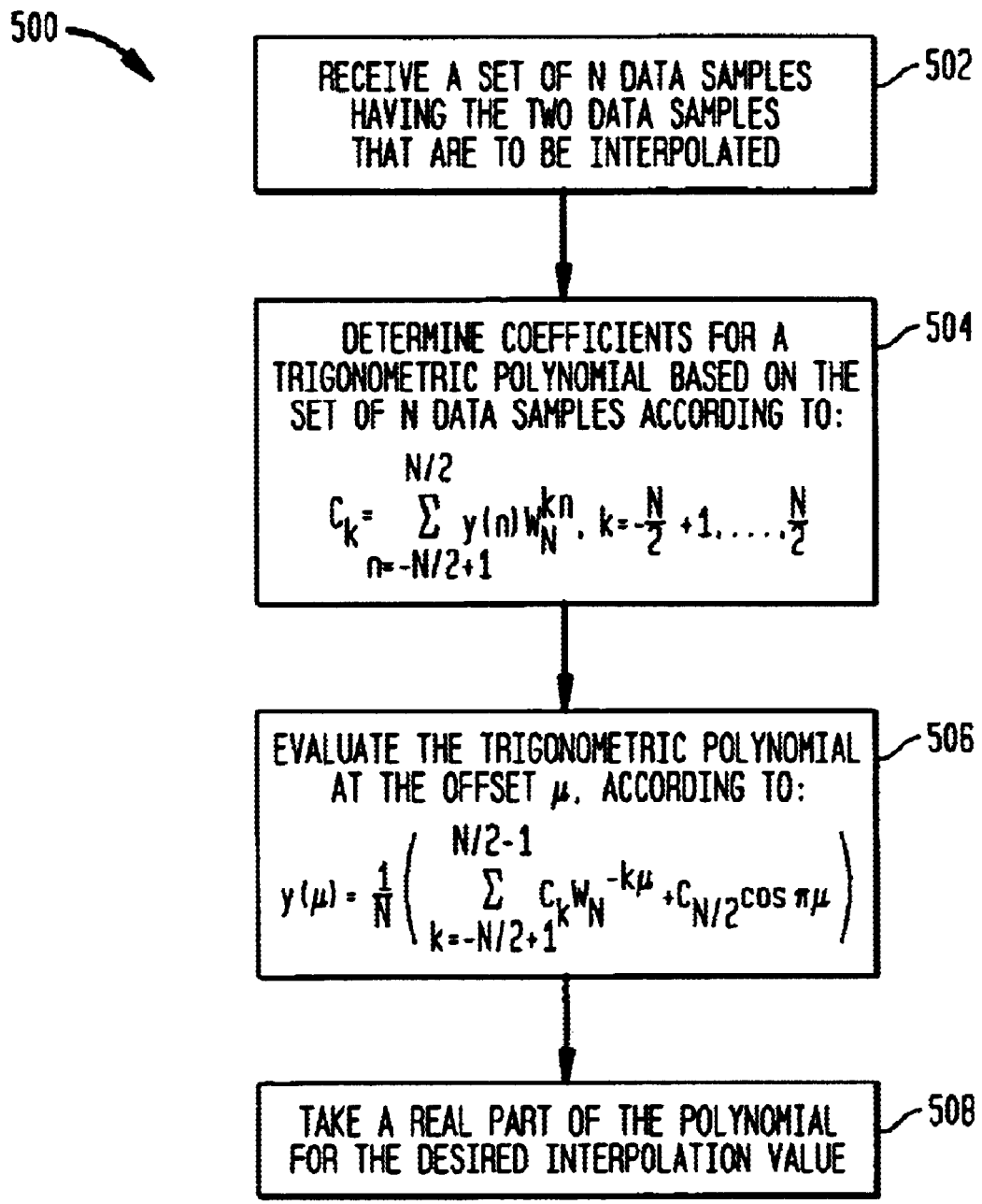
FIG. 5 illustrates a flowchart 500 representing trigonometric interpolation according to embodiments of the present invention.

Flowchart 500 in FIG. 5 summarizes the interpolation between two sample points at an offset $\mu$ using a trigonometric polynomial, where the two data samples that are to be interpolated are part of a set of N-data samples (see FIG.2). The flowchart is described as follows.

In step 502, a set of N-data samples are received having the two data samples that are to be interpolated.

In step 504, coefficients of a trigonometric polynomial are determined based on the set of N data samples, according to equation (2.9). In doing so, the N data samples are multiplied by a complex scaling factor $W_N^{kn}$ to generate a $k^{th}$ coefficient for the trigonometric polynomial, wherein $W_N=e^{-j2\pi/N}$ and wherein n represents an $n^{th}$ data sample of said N data samples.

In step 506, the trigonometric polynomial is evaluated at the offset $\mu$ based on equation (2.10) or (2.11).

In step 508, the real part of the evaluated trigonometric polynomial is determined and represents the desired interpolation value 202 in FIG. 2.

There are three issues that are to be considered in evaluating an interpolation scheme: 1) accuracy of interpolation, 2) complexity of implementation and 3) latency. In following sections, the trigonometric interpolation method is compared to the traditional polynomial method, particularly the Lagrange interpolator, in all these categories.

2.3 Performance Comparisons

Let us first derive the impulse responses of the interpolators. With N samples, N an even integer, the Lagrange formula (2.1) is $$y(\mu) = \sum_{n=-N/2+1}^{N/2} y(n) C_n(\mu). \quad (2.12)$$

In addition, the interpolation is performed in the center interval. Thus $0 \leq \mu \leq 1$. Let us define a new function $f(t)$ such that $$f(\mu-n) = C_n(\mu), \quad 0 \leq \mu \leq 1, \quad -N/2+1 \leq n \leq N/2. \tag{2.13}$$

Using the example of FIG. 3, defining $t = \mu - n$, we have $$f(t) = \begin{cases} C_2(t+2) & -2 \leq t < -1 \\ C_1(t+1) & -1 \leq t < 0 \\ C_0(t) & 0 \leq t < 1 \\ C_{-1}(t-1) & 1 \leq t < 2 \\ 0 & \text{otherwise.} \end{cases} \tag{2.14}$$

Thus, the Lagrange formula becomes $$y(t) = \sum_{n=-N/2+1}^{N/2} y(n) C_n(t) = \sum_{n=-\infty}^{\infty} y(n) f(t-n). \tag{2.15}$$

Figure 6A:
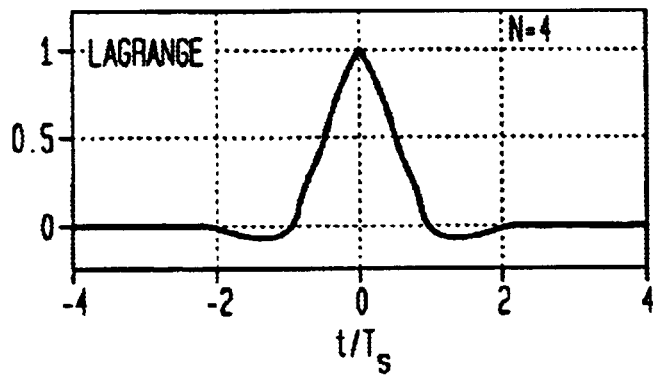
FIG. 6A illustrates an impulse response of a Lagrange interpolator.

Therefore, the approach to reconstruct the continuous signal using the Lagrange polynomial is in fact equivalent to applying an interpolation filter $f(t)$ to the available samples, with $f(t)$ being a piecewise polynomial. The interpolator's impulse response $f(t)$ obtained from (2.14) is shown in FIG. 6A.

Figure 7A:
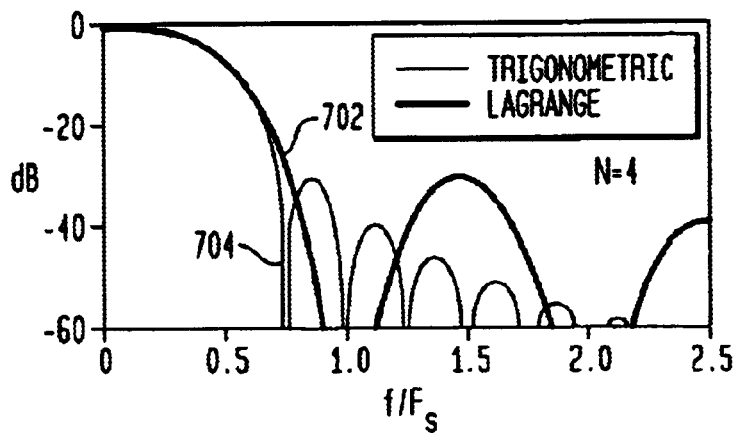
FIG. 7A illustrates a frequency response for N=4 according to embodiments of the present invention.

Taking the Fourier transform of $f(t)$, we obtain its frequency response. This allows us to evaluate the interpolation accuracy by examining the frequency response of the interpolation filter. The frequency response 702 of the Lagrange cubic interpolator (N=4) is shown in FIG. 7A. The horizontal axis is the normalized frequency $f/F_S$, with $F_S = 1/T_S$. An ideal frequency response should have value one in the passband ($0 \leq f/F_S < 0.5$) and be zero in the stopband ($f/F_S \geq 0.5$).

For the interpolator using a trigonometric polynomial, we can express $y(t)$ in terms of $y(n)$ by substituting (2.9) into (2.10):

$$y(\mu) = \frac{1}{N} \sum_{k=-N/2+1}^{N/2-1} c_k W_N^{-k\mu} + \frac{1}{N} c_{N/2} \cos \pi \mu \tag{2.16}$$

$$= \frac{1}{N} \sum_{k=-N/2+1}^{N/2-1} \left( \sum_{n=-N/2+1}^{N/2} y(n) W_N^{kn} \right) W_N^{-k\mu} +$$

$$\frac{1}{N} \left( \sum_{n=-N/2+1}^{N/2} y(n) W_N^{(N/2)n} \right) \cos \pi \mu$$

$$= \frac{1}{N} \sum_{n=-N/2+1}^{N/2} y(n) \left( \sum_{k=-N/2+1}^{N/2-1} W_N^{k(n-\mu)} + (-1)^n \cos \pi \mu \right)$$

$$= \frac{1}{N} \sum_{n=-N/2+1}^{N/2} y(n) \left( 1 + 2 \sum_{k=1}^{N/2-1} \cos \frac{2\pi k}{N} (\mu - n) + \cos \pi (\mu - n) \right).$$

Defining $$f(t) = \begin{cases} 1 + 2 \sum_{k=1}^{N/2-1} \cos \frac{2\pi k}{N} t + \cos \pi t & |t| \leq N/2 \\ 0 & |t| > N/2 \end{cases} \tag{2.17}$$

we have $$y(\mu) = \frac{1}{N} \sum_{n=-\infty}^{\infty} y(n) f(\mu - n) = \frac{1}{N} y \otimes f_\mu. \tag{2.18}$$

Figure 6B:
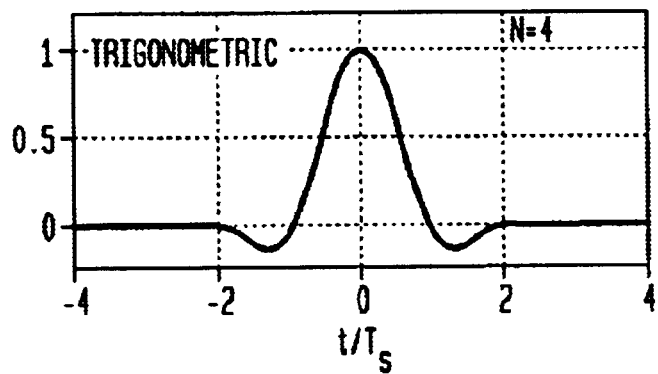
FIG. 6B illustrates an impulse response of a Trigonometric interpolator according to embodiments of the present invention.

The impulse response $f(t)$ in (2.17) is shown in FIG. 6B. The corresponding frequency response 704 of the trigonometric interpolator (for N=4) is shown in FIG. 7A in thin lines.

Figure 7B:
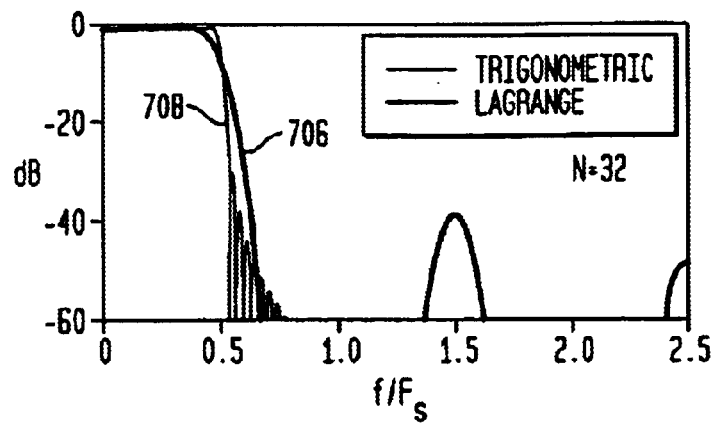
FIG. 7B illustrates a frequency response for N=32 according to embodiments of the present invention.

By comparing the frequency responses of the two interpolators, we can see that the trigonometric interpolation response 704 has a sharper roll-off in the transition band and more rapid attenuation in the stopband than the Lagrange response 702. These traits are enhanced as N increases, as demonstrated in FIG. 7B. For N=32, the trigonometric response 708 has a sharper rolloff than the Lagrange response 706 as shown in FIG. 7B.

Figure 8A:
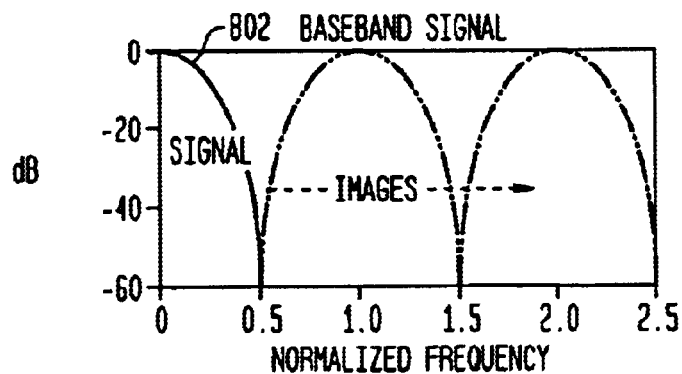
FIG. 8A illustrates a signal with two samples/symbol and 100% excess BW according to embodiments of the present invention.

Next we verify these observations by interpolating the samples of a practical time-domain signal. As an example, we interpolate a baseband signal with raised cosine spectrum and roll-off factor $\alpha = 1.0$, sampled at two samples per symbol period, as shown in FIG. 8A.

Figure 8B:
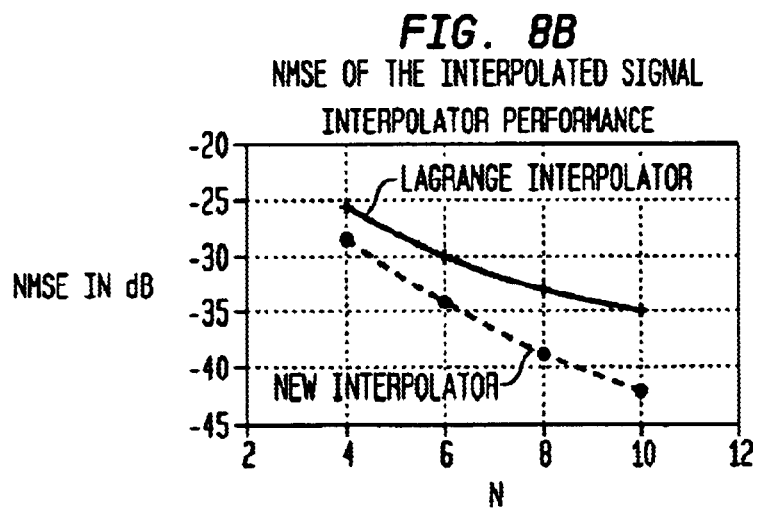
FIG. 8B illustrates an NMSE of the interpolated signal according to embodiments of the present invention.

The interpolation accuracy here is measured as the normalized mean-squared difference between the signal interpolated with an ideal interpolator and the signal interpolated with the practical interpolator. The normalized mean-squared error (NMSE), discussed above, is calculated for both the Lagrange interpolator and the trigonometric interpolator for a range of typical values of N. The results are plotted in FIG. 8B.

Our test results demonstrate that the performance is improved with the trigonometric method. Using the same number of samples to interpolate, the proposed method produces a smaller NMSE, and the performance gain becomes greater as the number of samples increases.

2.4 Efficient Implementation Structures

Recalling from Section 2.2, the trigonometric interpolation algorithm includes substantially two steps:

Step 1. Given a number of data samples N, calculate the Fourier coefficients $c_k$, k=0, . . . , N/2 using (2.9). In a preferred embodiment, an even number of N data samples are used. In other embodiments, an odd number of data samples are used.

Step 2. Compute the synchronized sample $y(\mu)$ for any given $\mu$ according to (2.11).

The first step involves multiplying the data samples by complex scaling factors $W_N^{kn}$. Since these factors lie on the unit circle, the computation in Step 1 can be simplified. Let us examine the case when N=4:

EXAMPLE 2.1

For N=4, the Fourier coefficients are obtained as:

$$c_0 = y(-1) + y(0) + y(1) + y(2)$$

$$c_1 = [y(0) - y(2)] + j[-y(1) + y(-1)]$$

$$c_2 = y(0) - y(1) + y(2) - y(-1). \tag{2.19}$$

As seen in (2.19), there is no nontrivial scaling multiplier required for N=4.

EXAMPLE 2.2

We now compute the coefficients $c_k$ in (2.9) for N=8. Using the trigonometric identities, we can obtain the following simple form for $c_k$, k=0 , . . . , 4:

$$c_0 = y(-3) + y(-2) + y(-1) + y(0) + y(1) + y(2) + y(3) + y(4) \quad (2.20)$$

$$c_1 = \{y(0) - y(4) + [-y(-3) + y(1) + y(-1) - y(3)]\cos(\pi/4)\} +$$
$$j\{y(-2) - y(2) + [y(-3) - y(1) + y(-1) - y(3)]\cos(\pi/4)\}$$

$$c_2 = \{-y(-2) + y(0) - y(0) - y(2) + y(4)\} +$$
$$j\{-y(-3) + y(-1) - y(1) + y(3)\}$$

$$c_3 = \{y(0) - y(4) + [y(-3) - y(1) + (-y(-1) + y(3))]\cos(\pi/4)\} +$$
$$j\{-y(-2) + y(2) + [y(-3) - y(1) + (-y(-1) - y(3))]\cos(\pi/4)\}$$

$$c_4 = -y(-3) + y(-2) - y(-1) + y(0) - y(1) + y(2) - y(3) + y(4).$$

The only non-trivial scaling multiplications are those multiplications by cos (π/4). It appears that four such multiplications are needed to compute all the complex coefficients $c_k$, k=0, . . . , 4. However, if we examine the data being multiplied by cos (π/4) (those terms embraced by the [ ] brackets), we observe that they are either the sums or differences of the [y(-3)-y(1)] and [y(-1)-y(3)] values. Therefore, we can compute [y(-3)-y(1)] cos(π/4) and [y(-1)-y(3)]cos(π/4), then use these two products to generate the $c_n$, coefficients. Thus, only two scaling multiplications are needed in computing all the coefficients.

Having observed the simplicity in the first step, let us focus on the second step. The second step may look complicated because of the complex multiplications $c_k W_N^{-k\mu}$ and $_{N/2}e^{j\pi\mu}$. However, since $|W_N^{-k\mu}|=|e^{j\pi\mu}|=1$, these products are just rotations of points $c_k$ and $c_{N/2}$ in the complex plane. Furthermore, this is the same type of operation performed in the phase rotation for carrier recovery by the phase rotator 124 that is shown in FIG. 1D. This suggests that we can reduce the total complexity of the synchronization circuitry by sharing some resources needed by the digital resampler 122 and the carrier phase rotator 124. In one embodiment, a lookup table is utilized to determine the angle rotation associated with the angle $$\frac{2\pi}{N} k\mu$$

for rotation of the $c_k$ coefficients. In another embodiment, an angle rotator processor is utilized. Both embodiments are discussed further below, and the angle rotator processor is discussed in detail in section 5.

Figure 10:
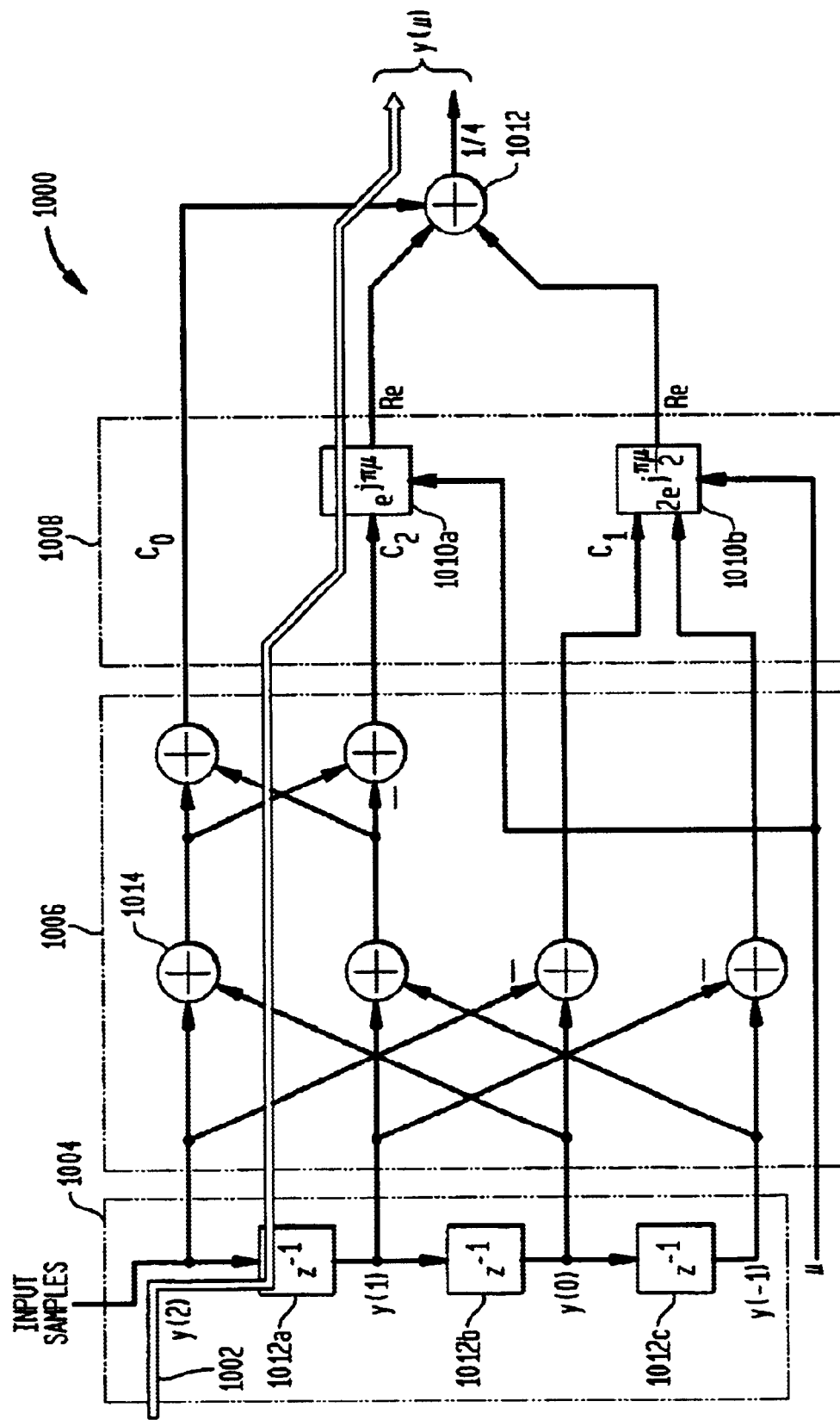
FIG. 10 illustrates a trigonometric interpolator with N=4 according to embodiments of the present invention.

FIG. 10 illustrates a trigonometric interpolator 1000 that is one circuit configuration that implements the trigonometric interpolator equations (2.9)–(2.11), where the number of data samples is N=4. The interpolator 1000 is not meant to be limiting, as those skilled in the arts may recognize other circuit configurations that implement the equations (2.9)–(2.11). These other circuit configurations are within the scope and spirit of the present invention.

The trigonometric interpolator 1000 receives input data samples having two data samples that are to be interpolated at an offset $\mu$ (see FIG. 2). The resulting interpolated value $y(\mu)$ represents the interpolated point 202 in FIG. 2. The interpolator 1000 includes a delay module 1004, an adder/subtractor module 1006, and an angle rotator module 1008, and an adder 1012.

The adder/subtractor module 1006 includes multiple adders (or subtractors) 1014, where subtraction is indicated by a (–) igns sign.

The angle rotator module includes two angle rotators 1010. The angle rotators 1010 can be configured using an angle rotator processor or a table lookup (e.g. read only memory) as discussed below.

Figure 17:
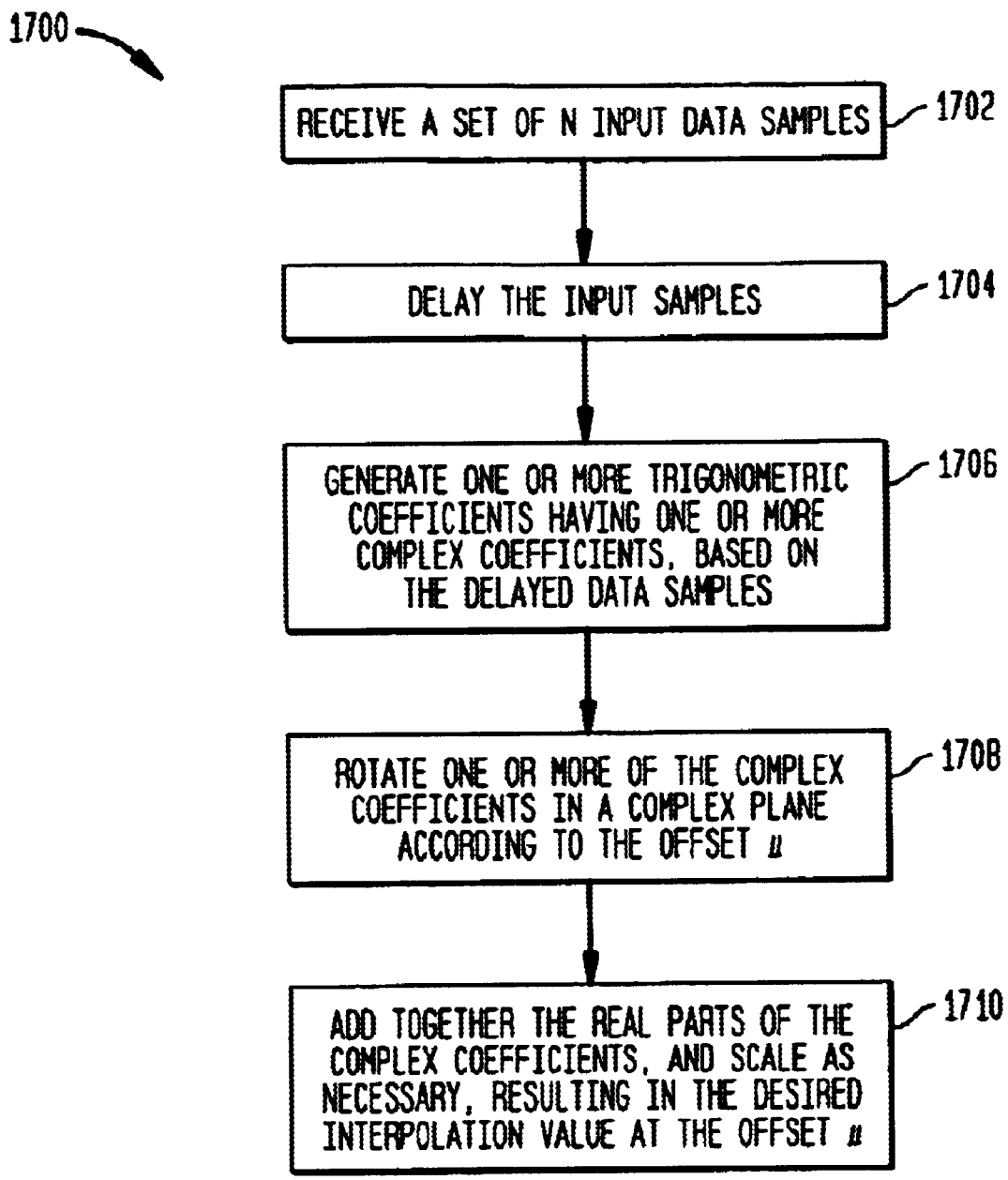
FIG. 17 illustrates a flowchart 1700 representing trigonometric interpolation according to embodiments of the present invention.

The operation of the trigonometric interpolator 1000 is discussed further in reference to the flowchart 1700 in FIG. 17, which is discussed below.

In step 1702, the interpolator 1000 receives a set of N-input data samples. The N-data samples include the two data samples that are to be interpolated at the offset i relative to one of the data samples, as shown in the FIG. 2. In FIG. 2, the interpolation is to be performed between y(0) and y(1) at the offset $\mu$ to determine the interpolation value 202.

In step 1706, the adder/subtractor module 1006 generates one or more trigonometric coefficients according to the equation (2.9). In FIG. 10, the coefficients are represented by $C_0$, $C_1$, and $C_2$ for N=4, where the coefficients coefficient $C_1$ is a complex coefficient.

In step 1708, the angle rotators 1010 rotate appropriate real and complex coefficients in a complex plane according the offset $\mu$, resulting in rotated complex coefficients. More specifically, the angle rotator 1010*a* rotates the real coefficient $C_2$, and the angle rotator 1010*b* rotates the complex coefficient $C_1$ in the complex plane.

Figure 18:
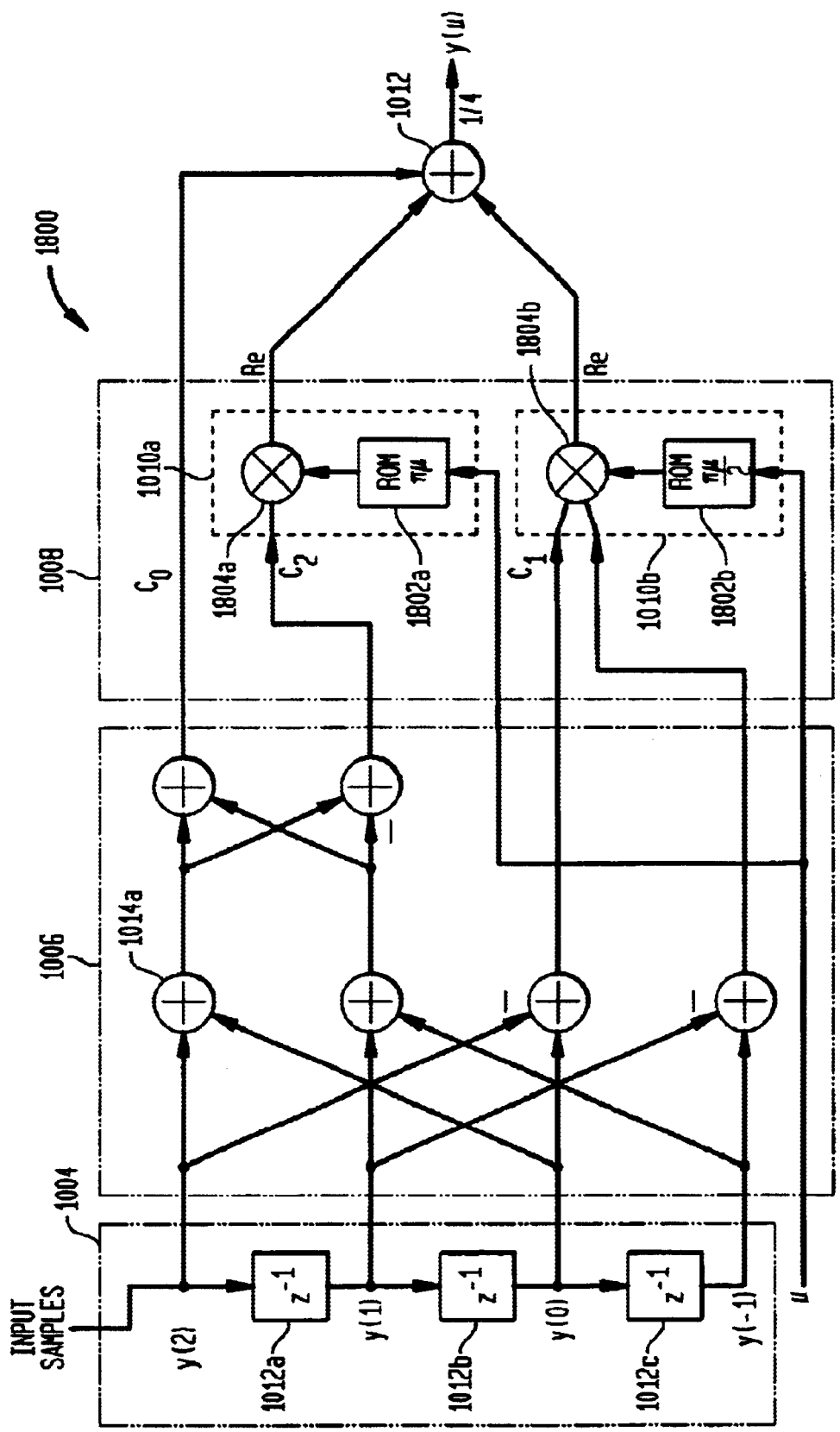
FIG. 18 illustrates trigonometric interpolation using a table lookup for angle rotation according to embodiments of the present invention.
Figure 19:
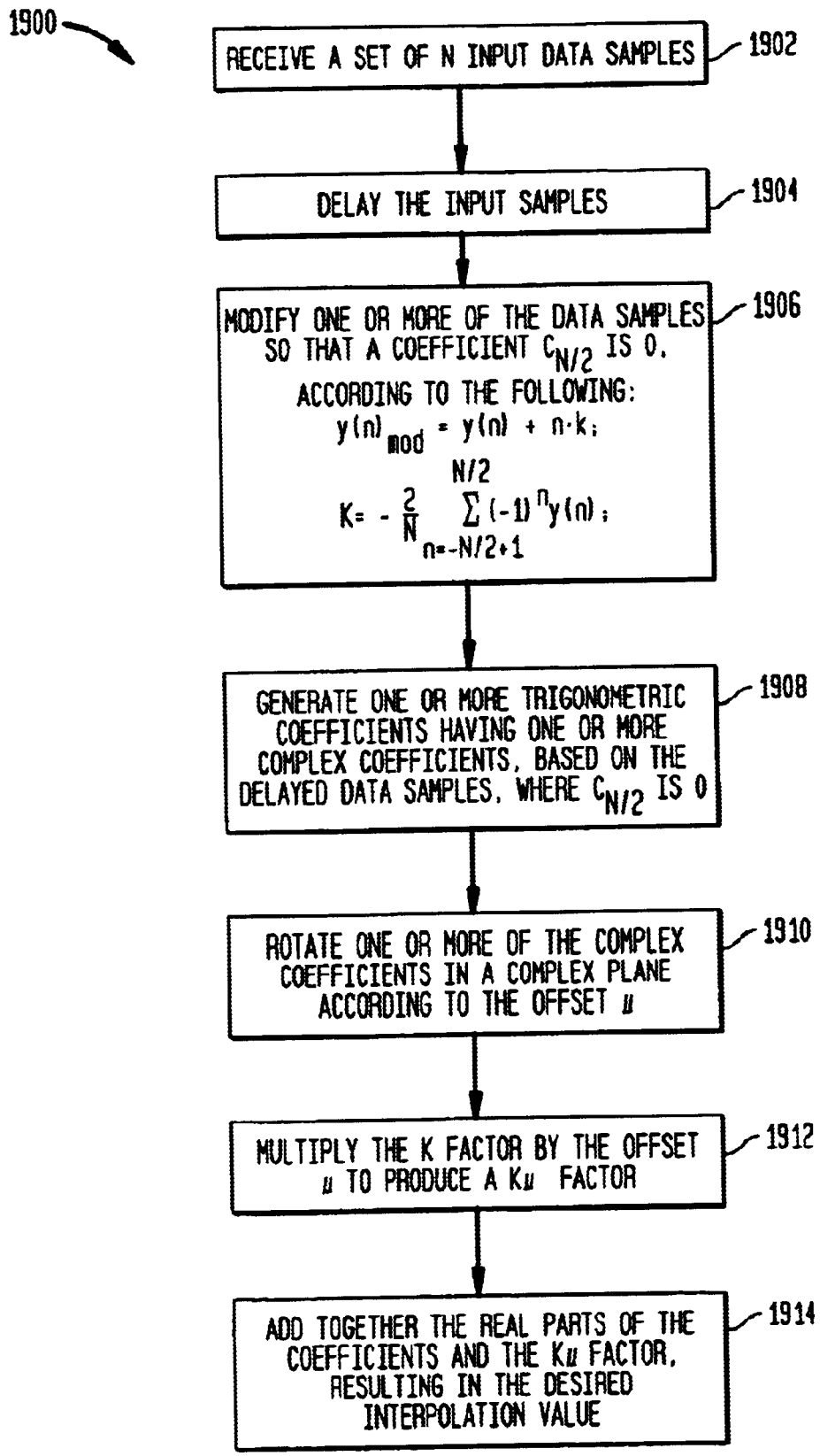
FIG. 19 illustrates trigonometric interpolation using modified samples according to embodiments of the present invention.

In embodiments, as discussed herein, the angle rotators 1010 are table look-ups. In which case, a rotation factor is retrieved from the table lookup based on the offset $\mu$, where the rotation factor includes the evaluated cosine and sine functions of $$\frac{2\pi}{N} k\mu$$

that are shown in the equations (2.21) below. The rotation factor is then multiplied by the corresponding real or complex coefficient, to generate the respective rotated complex coefficient. An interpolator 1800 having a table lookup ROM 1802 and a complex multiplier 1804 are shown in FIG. 18 for illustration.

In step 1710, the adder 1012 adds together $C_0$, a real part of the rotated coefficient $C_1$, and a real part of the rotated coefficient $C_2$. The adder 1012 also scales the output of the adder as necessary according to equation 2.10. The resulting value is the desired interpolation value at the offset $\mu$, as represented by point 202 in FIG.2.

Figure 11:
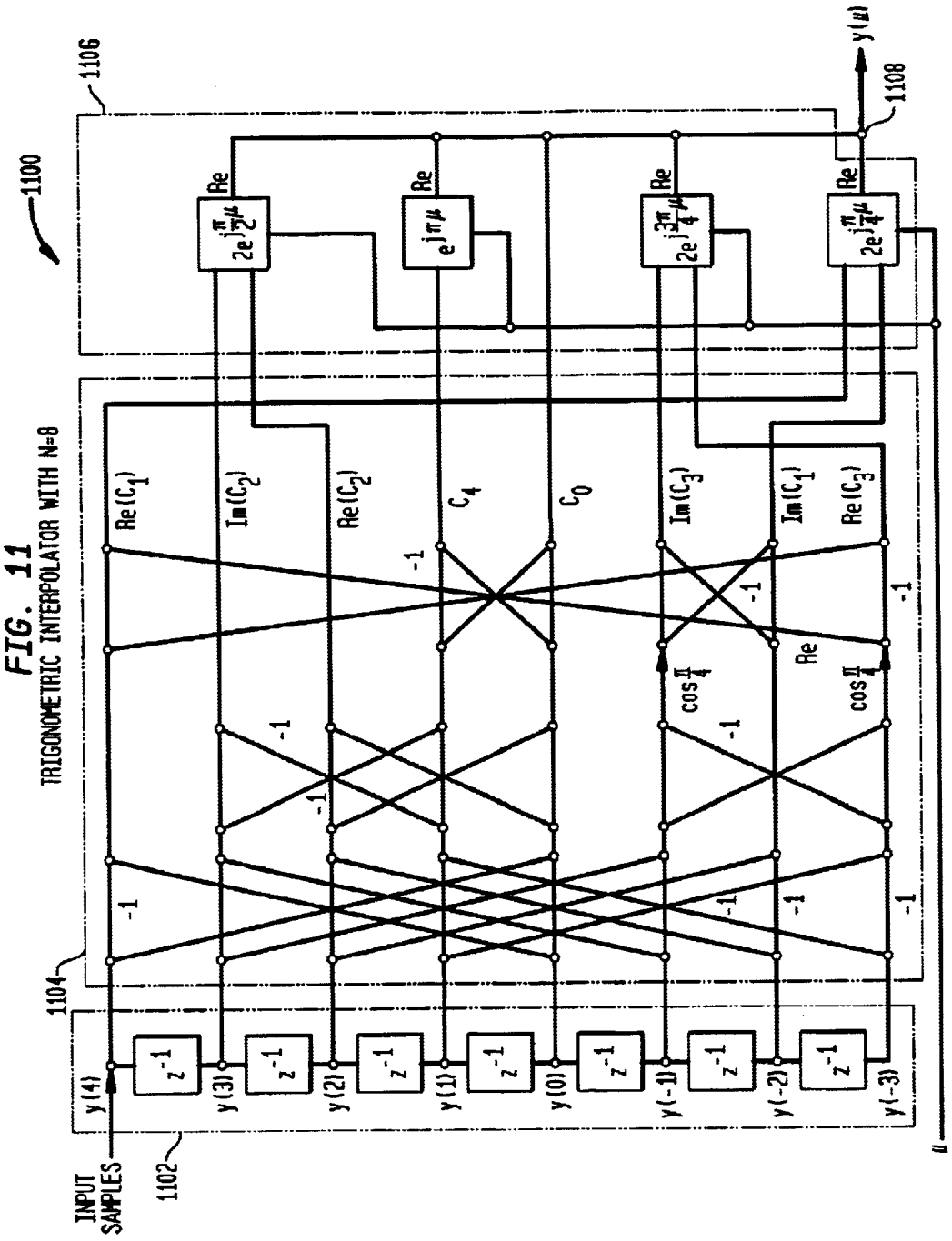
FIG. 11 illustrates a trigonometric interpolator with N=8 according to embodiments of the present invention.

The trigonometric interpolator is not limited to the 4$^{th}$ degree embodiment that is shown in FIG. 10. The trigonometric interpolator can be configured as an N$^{th}$ degree interpolator based on N_data points, as represented by the equations (2.9)–(2.11). These other N$^{th}$ degree interpolators are within the scope and spirit of the present invention. For example and without limitation, FIG. 11 illustrates an interpolator 1100 having N=8. The trigonometric interpolator 1100 includes: a delay module 1102, an adder/subtractor module 1104 (having two scaling multipliers having coefficients cos (π/4)), an angle rotator module 1106, and an adder 1108 (having a ⅛ scale factor that is not shown). The operation of the interpolator 1100 will be understood by those skilled in the arts based on the discussion herein.

2.4.1 Using a Lookup Table

For carrier recovery, the phase correction is generally accomplished by looking up the sine and cosine values corresponding to the phase, then by multiplying these values with the complex data. This requires the same operations as the rotation of $c_k$ by an angle $$\frac{2\pi}{N}k\mu,$$

that is:

$$\text{Re}(c_k W_N^{-k\mu}) = \text{Re}(c_k)\cos\frac{2\pi}{N}k\mu - \text{Im}(c_k)\sin\frac{2\pi}{N}k\mu \quad (2.21)$$

$$\text{Im}(c_k W_N^{-k\mu}) = \text{Re}(c_k)\sin\frac{2\pi}{N}k\mu + \text{Im}(c_k)\cos\frac{2\pi}{N}k\mu.$$

The sine and cosine table can be used for both the resampler, as in (2.21), and the phase rotator for carrier recovery. In embodiments, a read only memory (ROM) is utilized as the lookup table. However, other embodiments could be utilized in including other types of memories. An interpolator 1800 utilizing a table lookup ROM 1802 and complex multiplier 1804 are shown in FIG. 18 for illustration. The ROM table access time is insignificant as compared to the computation time in other parts of the interpolator. Therefore, this method results in low hardware complexity and low computational delay. This implementation will be referred to as the table-lookup method.

2.4.2 Using an Angle Rotation Processor

When a very low complexity implementation is desired at the expense of a slight increase in computational delay, we propose to use an efficient structure for angle rotation, which is described in Section 5. Based on this structure, each angle rotator has a hardware complexity slightly greater than that of two multipliers. In addition, a very small ROM is needed. We will subsequently refer to this particular implementation of our algorithm as the angle-rotation method.

Thus, there are at least two choices for implementing (2.21) as well as the phase rotator for carrier recovery. The trade-off is between complexity and speed. In a base-station where computation power is more affordable, the table lookup method might be used. In a hand-set, where cost is a major concern, an angle rotation processor might be used for both the resampler and the phase rotator, multiplexing the operations.

Now let us compare the complexity of the trigonometric resampler with that of the Lagrange method. Table 2.1 summarizes the comparisons for several typical N values. The numbers are based on the table-lookup method. It indicates that, for the same filter length N the trigonometric interpolation method needs less hardware.

TABLE 2.1

Complexity and latency comparisons.

| | N | 4 | 6 | 8 | 10 |
|---|---|---|---|---|---|
| Nontrivial scaling multipliers | Lagrange | 2 | 10 | 25 | 39 |
| | Trigonometric | 0 | 2 | 6 | 16 |
| Data multipliers | Lagrange | 3 | 5 | 7 | 9 |
| | Trigonometric | 3 | 5 | 7 | 9 |
| Multiplications in the critical path | Lagrange | 4 | 6 | 8 | 10 |
| | Trigonometric | 1 | 2 | 2 | 2 |

2.5 Delays in the Computation

Figure 9:
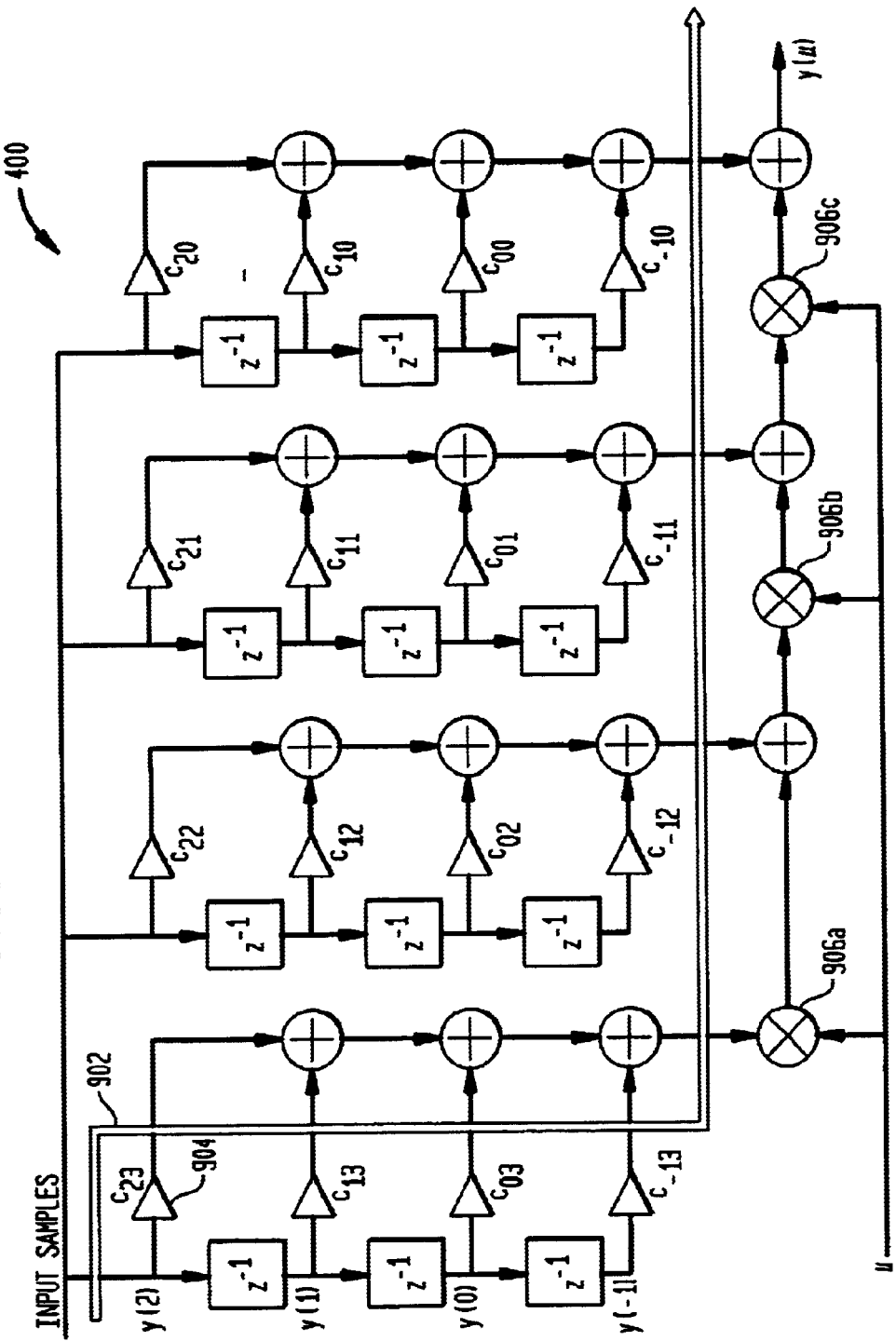
FIG. 9 illustrates the critical path of the Lagrange cubic interpolator.

The critical path of the Farrow structure 400 (FIG. 4) is now compared to that of the trigonometric interpolator. The Farrow structure implements the Lagrange interpolator as discussed above. The Farrow structure 400 is shown in FIG. 9 (or FIG. 4), with the critical path 902 indicated. The critical path 902 for this structure includes one scaling multiplier 904 and N-1 data multipliers 906.

In contrast, the critical path for the trigonometric interpolator 1000 is path 1002 and it contains just one angle rotation 1010, or only one multiplier if the table-lookup method is employed to replace the angle rotator 1010. Since the angle rotations for various angles can be carried out in parallel, the critical path does not lengthen as N increases.

Table 2.1 compares the computational delays for the trigonometric interpolator with that of the Lagrange interpolator for various values of N. The delay data for the trigonometric interpolator 1000 are based on the table-lookup method. As shown in FIG. 10, the trigonometric interpolator (for N=4) has only one multiplier in the critical path, whereas the Lagrange interpolator has 4 multipliers in the critical path. Therefore, the trigonometric interpolator has less latency than the Lagrange interpolator, which is important for voice communications.

2.6 Simplifications of the Preliminary Structures

As mentioned in Section 2.4, to produce each $y(\mu)$ we first calculate the Fourier coefficients $c_k$ using existing samples, according to (2.9). We then compute $\text{Re}(c_k W_N^{-k\mu})$ to be used in (2.11). This is accomplished either by retrieving $W_N^{-k\mu}$ from a lookup table, followed by two real multiplications, or by an angle-rotation processor.

2.6.1 The Simplified Structure for N=4

Let us examine the trigonometric interpolator 1000 having N=4. To compute $\text{Re}(2c_1 W_4^{-\mu})$ and $\text{Re}(c_2 W_4^{-2\mu})$ the system requires either two angle rotators 1004 or two accesses to a lookup table.

If the input samples would happen to be such that $c_2=0$ then one fewer angle rotator, or one fewer ROM access, would be required. Of course, the original data samples y(-1), y(0), y(1), and y(2) are not likely to have the special property that $c_2=y(0)-y(1)+y(2)-y(-1)=0$. However, if the data samples are changed, then the modified samples can be determined to satisfy $c_2=0$. If the modified samples for interpolation, then the $c_2$ angle rotator 1010a can be eliminated. However, the interpolation result will not then correspond to the original data samples.

It seems that the data samples can be changed to attain savings in hardware, as long as the interpolation result is fixed so that it corresponds to the original data samples. Of course, it must also cost less in hardware to "fix" the interpolation result than is saved in hardware by using the modified samples.

Figure 12:
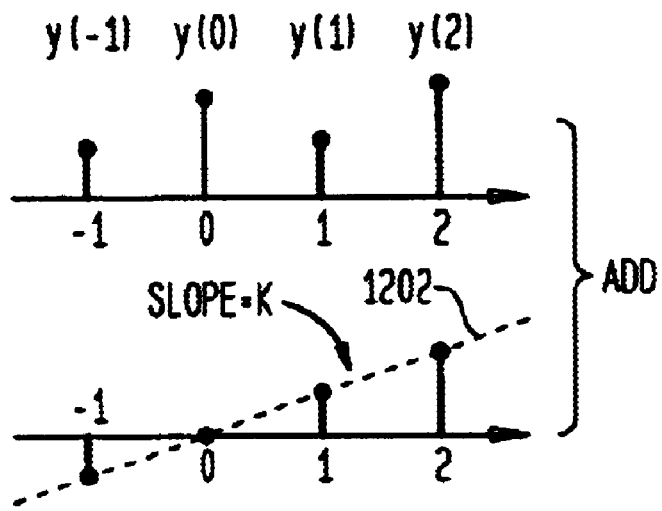
FIG. 12 illustrates a conceptual modification of input samples according to embodiments of the present invention.

If the samples y(k) are modified to form $\tilde{y}(k)$ according to:

$$\tilde{y}(-1)=y(-1)-K$$

$$\tilde{y}(0)=y(0)$$

$$\tilde{y}(1)\ y(1)+K$$

$$\tilde{y}(2)=y(2)+2K \quad (2.22)$$

then the K value can be adjusted to force the $\tilde{y}(k)$ samples to satisfy $c_2=0$, where K is the slope of a straight line 1202 in FIG. 12.

To find K, the $c_2$ value that corresponds to the modified samples is determined according to:

$$c_2=\tilde{y}(0)-\tilde{y}(1)+\tilde{y}(2)-\tilde{y}(-1)$$

$$=y(0)-(y(1)+K)+(y(2)+2K)-(y(-1)-K)$$

$$=2K-(y(1)+y(-1)-y(0)-y(2)). \quad (2.23)$$

To force $c_2=0$, requires:

$$K = \frac{1}{2}(y(1) + y(-1) - y(0) - y(2)) \qquad (2.24)$$

Therefore, the $c_2$ angle-rotator can be eliminated, and $c_0$ and $c_1$ are determined accordingly as, $$c_0 = 2(y(1)+y(-1))$$
$$c_1 = [2y(0)-y(1)-y(-1)]+j[-2y(1)+y(0)+y(2)]. \qquad (2.25)$$

Then, the interpolated sample is $$\tilde{y}(\mu) = \frac{1}{4}c_0 + \frac{1}{2}\text{Re}(c_1 e^{j\frac{\pi}{2}\mu}). \qquad (2.26)$$

Figure 13:
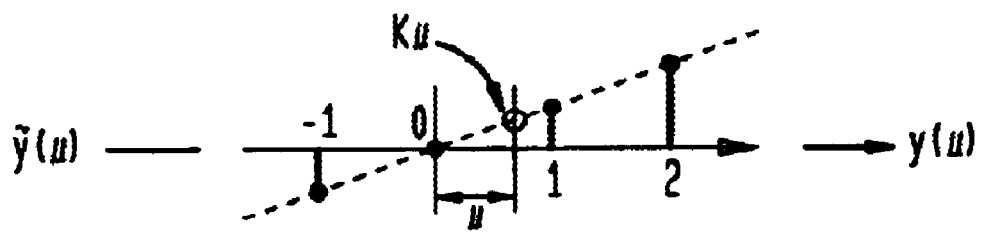
FIG. 13 illustrates correcting the offset due to modification of original samples according to embodiments of the present invention.

However, $\tilde{y}(\mu)$ should be adjusted so that it corresponds to the original samples. From FIG. 12, the values expressing the difference between the original and the modified samples lie on the straight line 1202. From FIG. 13, it follows that the offset due to the modification of samples is $K\mu$. Therefore, the $\tilde{y}(\mu)$ value can be compensated by:

$$y(\mu) = \tilde{y}(\mu p) - K\mu. \qquad (2.27)$$

Figure 14:
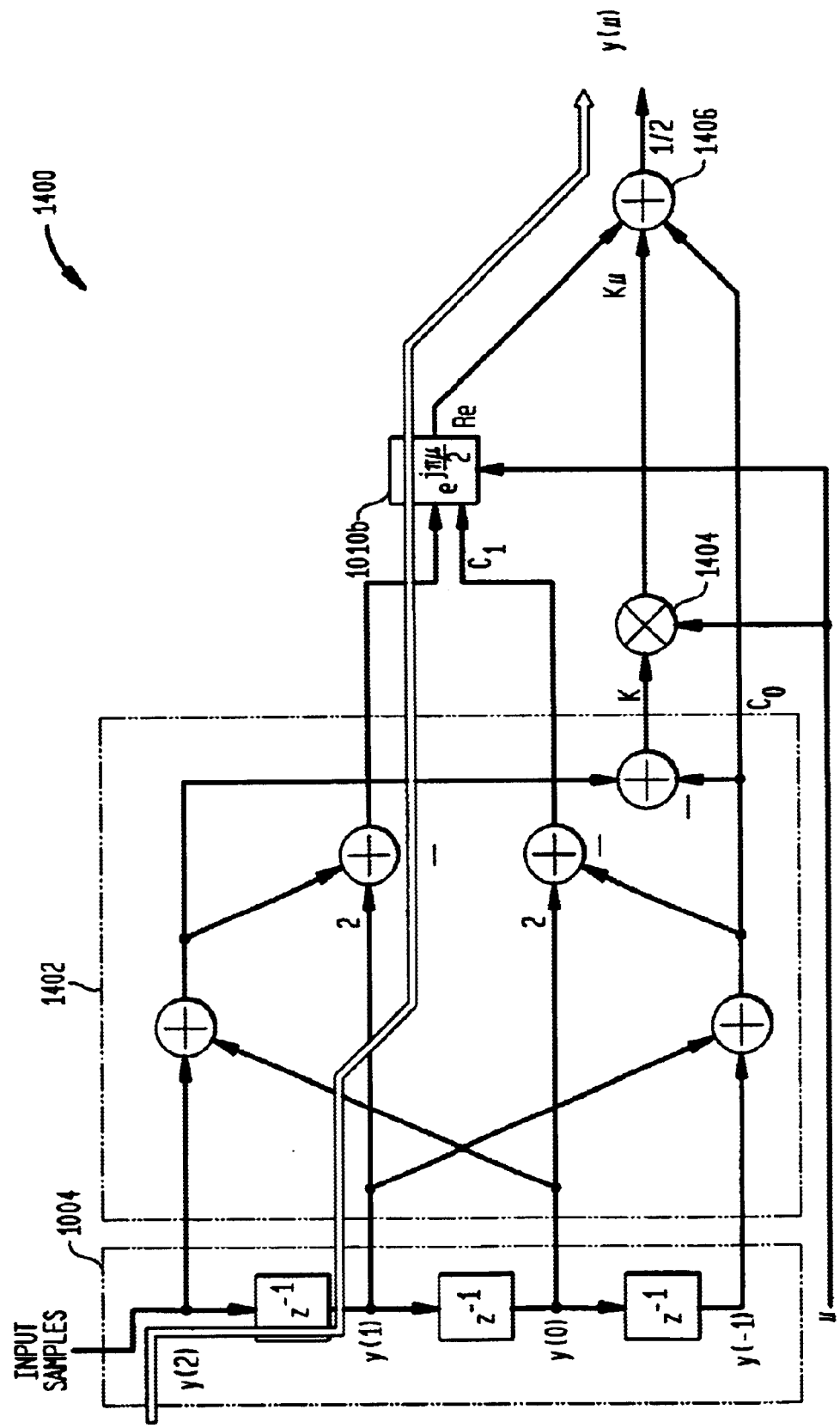
FIG. 14 illustrates the modified trigonometric interpolator for N=4 according to embodiments of the present invention.

Using equations (2.25), (2.26) and (2.27) leads to an interpolator 1400 as shown in FIG. 14. This simplified interpolator structure is not limited to N=4 configurations. In fact, this simplification technique can be applied to an interpolator with an arbitrary N value. To eliminate the angle-rotation needed by $\text{Re}(c_{N/2}e^{j\pi\mu})$ in (2.11), the samples are modified according to $$\tilde{y}(n) = y(n) + nk, \; n = \text{integer}. \qquad (2.28)$$

Using (2.9), and then applying (2.28), results in $$c_{N/2} = \frac{1}{N}\left(\sum_{n=-N/2+1}^{N/2}(-1)^n \tilde{y}(n)\right) = \frac{1}{N}\left(\sum_{n=-N/2+1}^{N/2}(-1)^n y(n)\right) + \frac{1}{2}K. \qquad (2.29)$$

If we choose $$K = -\frac{2}{N}\sum_{n=-N/2+1}^{N/2}(-1)^n y(n) \qquad (2.30)$$

we can force $c_{N/2}=0$.

Referring to FIG. 14, the interpolator 1400 includes the delay module 1004, an adder/subtractor module 1402, the angle rotator 1010b, a multiplier 1404, and an adder 1406. The interpolator 1400 has a simplified structure when compared the interpolator 1000 (in FIG. 10), as the interpolator 1400 replaces the angle rotator 1010b with a multiplier 1404. As discussed above, this can be done because the coefficient $c_{N/2}=0$ ($C_2=0$ for N=4) by modification of the data samples, and therefore there is no need to have an angle rotator for $C_{N/2}$. The operation of the interpolator 1400 is further discussed in reference to the flowchart 1900 that follows.

In step 1902, the interpolator 1400 receives a set of N input data samples. The N data samples include two of the data samples that are to be interpolated at the offset $\mu$, as shown in the FIG. 2.

In step 1904, the delay module 1004 delays the input data samples.

In step 1906, the adder/subtractor module 1402 modifies one or more of the data samples so that a coefficient $c_{N/2}$ is 0. In embodiments the data samples are modified according to $y(n)_{mod}=y(n)+n\cdot K$, wherein K is determined by the equation (2.30) above so that $c_{N/2}$ is 0, and wherein $y(n)$ represents the $n^{th}$ data sample of the N data sample set.

In step 1908, the adder/subtractor module 1402 generates one or more trigonometric coefficients according to modifications to the equation (2.9). In the N=4 case, equations (2.25) are implemented by the module 1402. In FIG. 14, for N=4, the coefficients are represented by $C_0$ and $C_1$, where the coefficient $C_1$ is a complex coefficient coefficicents. By comparing with FIG. 10, it is noted that the $C_2$ coefficient is 0. Additionally, the adder/subtractor module 1402 outputs the K value for further processing. Notice also that in FIG. 14, the output scaling factor has been changed from ¼ to ½. This reflects several other straightforward simplifications that have been made to module 1402 and in the angle rotator 1010b. In embodiments, the steps 1906 and 1908 are to be performed simultaneously by the adder/subtractor module 1402, as will be understood by those skilled in the relevant arts.

In step 1910, the angle rotator 1010b rotates the complex coefficient $C_1$ in a complex plane according the offset $\mu$, resulting in a rotated complex coefficient. In embodiments, as discussed herein, the angle rotator 1010b is table look-up. In which case, a complex rotation factor is retrieved from the table lookup based on the offset $\mu$, and the resulting rotation factor is then multiplied by the corresponding complex coefficient, to generate the respective rotated complex coefficient. The rotation factor includes the evaluation of the cosine and sine factors that are shown in equations (2.21). Note that since $C_2=0$, the angle rotator 1010a is replaced with the multiplier 1404.

In the step 1912, the multiplier 1404 multiplies the K factor by the offset $\mu$, to produce a $K\mu$ factor.

In step 1914, the adder 1406 adds together $C_0$ and $K\mu$ and a real part of the rotated complex coefficient $C_1$, and scales the sum by the trivial factor ½, to produce the desired interpolation value. The addition of the $K\mu$ factor compensates the desired interpolation value for the modification that was done to the data samples in order to force $C_{N/2}$, to zero in step 1906.

The simplified trigonometric interpolator is not limited to the four-sample embodiment that is shown in FIG. 14. The simplified trigonometric interpolator can be configured as an N-sample interpolator based on N_data points, as represented by the equations (2.28)–(2.30). These other N-sample interpolators are within the scope and spirit of the present invention. For example and without limitation, an interpolator with N=8 is discussed below.

2.6.2 The Simplified Structure for N=8

According to (2.30), we choose $$K = \frac{1}{4}(y(1) + y(3) + y(-3) + y(-1) - y(0) - y(2) - y(4) - y(-2)). \qquad (2.31)$$

The coefficient values can be computed following this procedure:

$$p1 = (4K + y(1) - y(-3))\cos \pi/4$$
$$p2 = (4K + y(3) - y(-1))\cos \pi/4 \qquad (2.32)$$
$$c_0 = 2(y(1) + y(3) + y(-3) + y(-1))$$
$$c_1 = [y(0) - y(4) - 4K + p1 - p2] + j[y(-2) - y(2) - 4K - p1 - p2]$$
$$c_2 = [4K + y(0) + y(4) - y(2) - y(-2)] + j[4K + y(3) + y(-1) - y(-3)]$$
$$c_3 = [y(0) - y(4) - 4K - p1 + p2] + j[-y(-2) + y(2) + 4K - p1 - p2]$$
$$c_4 = 0. \qquad (2.33)$$

Figure 15:
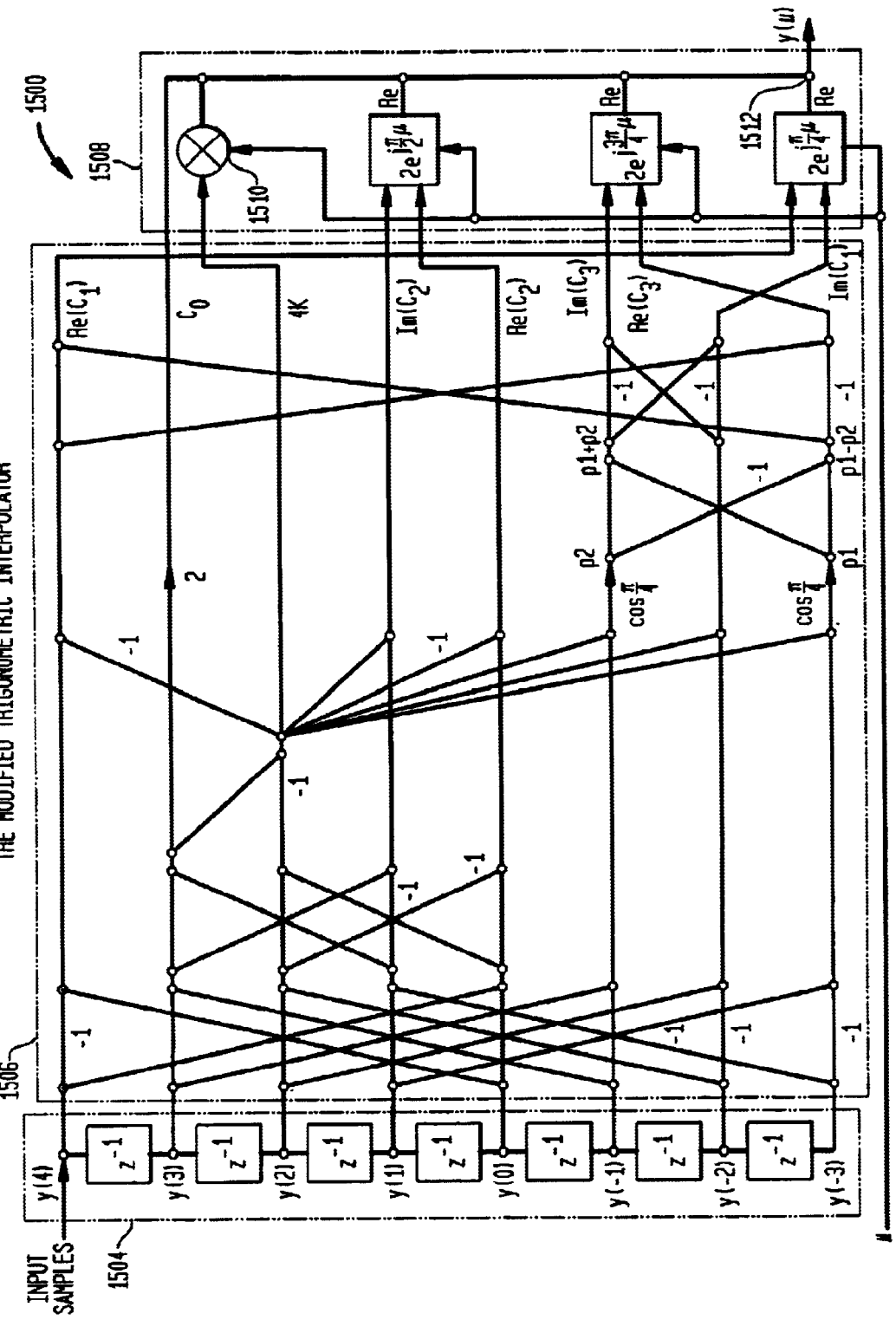
FIG. 15 illustrates the modified trigonometric interpolator for N=8 according to embodiments of the present invention.

The resulting modified structure for N=8 is shown in FIG. 15 as interpolator 1500. Similar to the interpolator 1400, the interpolator 1500 includes a delay module 1504, an adder/subtractor module 1506, an angle rotator module 1508, a multiplier 1510, and an output scaling adder 1512. As in the interpolator 1400, the multiplier 1510 substantially replaces an angle rotator module. As in the interpolator 1100 for N=8 (FIG. 11), only two non-trivial scaling multiplications are needed for the modified structure 1500.

2.6.3 Performance Comparisons with Other Structures

Figure 16A:
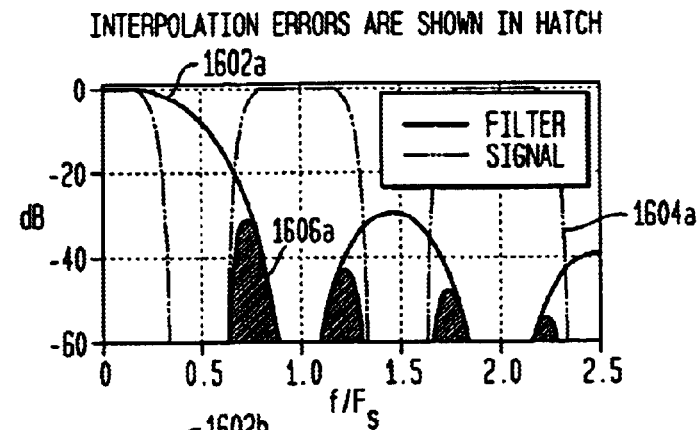
FIGS. 16A–D illustrates a comparison of the amount of interpolation error using (A) Lagrange cubic, (B) the trigonometric interpolator 1000, (C) the trigonometric interpolator 1400, (D) the optimal structure (to be discussed in Section 4).
Figure 16B:
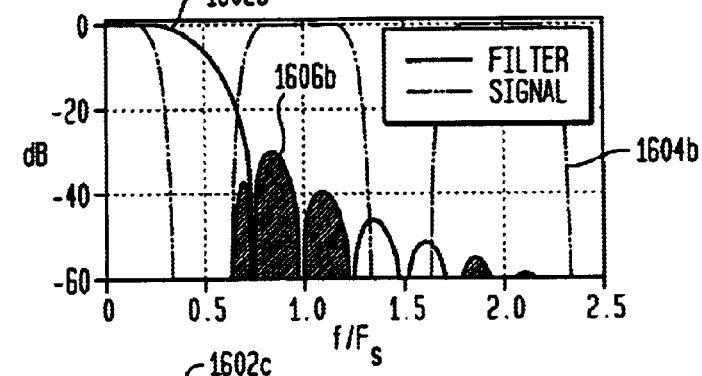
Figure 16C:
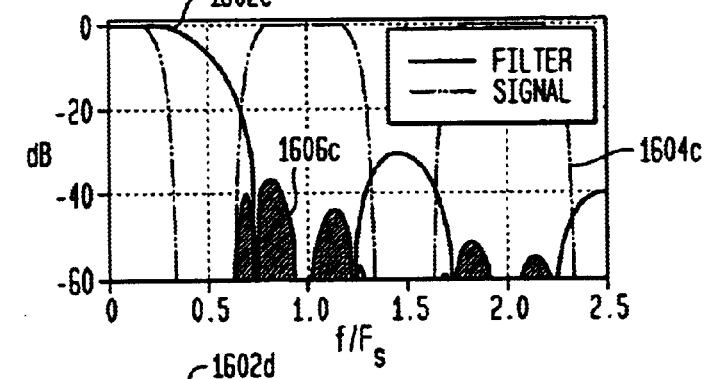
Figure 16D:
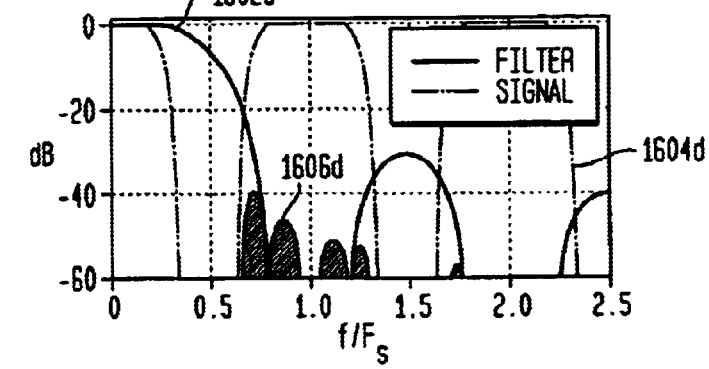

How does the simplified interpolator 1400 (FIG. 14) perform as compared to the interpolator 1000 (FIG. 10)? FIGS. 16A–C show the frequency responses, in solid lines, of the Lagrange cubic interpolator 400 (FIG. 4), the interpolator 1000 (FIG. 10) and the simplified interpolator 1400 (FIG. 14), respectively. For an input signal whose spectrum is a raised cosine with a=0.4, as shown in dashed lines, the amount of interpolation error corresponds to the gray areas. Clearly, the interpolator 1400 produces less error than the Lagrange cubic interpolator 400 and the interpolator 1000. (FIG. 16D will be discussed in Section 4.)

The results in Table 2.2 show that the modified structure for N=4 not only requires less hardware, it also obtains the highest accuracy among the three methods for these practical signals used in our simulation.

TABLE 2.2

Comparison of interpolators for N = 4.

| N = 4 | Lagrange cubic | Structure in FIG. 10 | Structure in FIG. 14 |
|---|---|---|---|
| NMSE for Signal 1 in dB | −25.80 | −28.45 | −29.41 |
| NMSE for Signal 2 in dB | −31.08 | −31.21 | −33.51 |
| Nontrivial scaling multipliers | 2 | 0 | 0 |
| Data multipliers | 3 | * | * |
| Multipliers in critical path | 4 | 2 | 2 |

*The trigonometric interpolator 1000 employs two one-output angle-rotators, each having the hardware equivalent of slightly more than two multipliers. The trigonometric interpolator 1400 employs one such angle-rotator and one multiplier yielding an equivalent of slightly more than three multipliers.

2.7 Trigonometric Interpolator Application

An important application of the interpolation method and apparatus described in this patent is the following. It is often necessary to increase the sampling rate of a given signal by a fixed integer factor. For example, a signal received at a rate of 1000 samples per second might need to be converted to one at a rate of 4000 samples per second, which represents an increase of the sampling rate by the integer factor four. There are methods in common practice for doing such a conversion. One method is a very popular two-step process wherein the first step creates a signal at the desired higher sampling rate but one where simple zero-valued samples (three of them in the example situation just mentioned) are inserted after each input data value. The second step in the interpolation scheme is to pass this "up-sampled" or "data-rate expanded" signal through an appropriately designed lowpass digital filter which, in effect, smoothes the signal by "filling in" data values at the previously inserted zero-valued samples. In the process of doing this filtering operation it might or might not be important that the original data samples remain intact, and when this is important there exist certain special lowpass filters that will not alter those samples.

We can easily adapt the trigonometric interpolator described herein to efficiently create such a sampling rate conversion system, but one that does not require such filtering operations. If we denote the integer factor by which we desire to increase the data rate as L (in the above example, L=4) we proceed as follows. We build the system 7800 shown below in FIG. 78). System 7800 includes a Delay Module 7802 and Add/Subtract Module 7804 (that are similar those in FIG. 10), and such that it can accommodate incoming data at a rate r. We now build L copies of the Angle-Rotation Module 7806 (similar to that in FIG. 10), with each one being fed by the same outputs of the Add/Subtract Module. Within each of these L Angle-Rotation Modules 7806 we fix the $\mu$ value; that is, each one has a different one of the values: $1/L, 2/L, \ldots, (1-L)/L$. With such fixed F values, each Angle-Rotation Module 7806 can be constructed as a set of fixed multipliers (a very B17special case of the table-lookup method), although any of the Angle-Rotation Module implementations previously discussed can be employed.

As shown in FIG. 78, the L−1 outputs, i.e., the interpolated samples that are offset by the values $1/L, 2/L, \ldots, (L-1)/L$ from the first of the two data points (indicated as $\mu=0$ and $\mu=1$ in the Delay Module of FIG. 78) are routed to a multiplexer 7808, along with the input data point from which all interpolated samples are offset. The multiplexer 7808 simply selects these samples, in sequence, and provides them to the output at the expanded data rate L x r.

A major advantage of the system 7800 is that all of the system's components are operated at the (slow) input data rate except the output multiplexer 7808. If desired, it would also be possible to employ fewer Angle-Rotation Modules 7806, but operating them at a higher data rate, and using several i values, sequentially, for each. This would result in a system that employed less hardware but one that traded off the hardware savings for a higher data rate operation of such modules. 2.8 Trigonomeoric Interpolator Summary In this Section we have described an interpolation method that we have devised that uses trigonometric series for interpolation. Comparing the interpolations using the trigonometric polynomial and the Lagrange polynomial of the same degree, the trigonometric-based method achieves higher interpolation accuracy while simultaneously reducing the computation time and the amount of required hardware. Moreover, the trigonometric-based method performs operations that are similar to those of a phase rotator for carrier phase adjustment. This allows a reduction in the overall synchronization circuit complexity by sharing resources.

This trigonometric interpolator yields less computational delay, as compared to algebraic interpolators. To achieve the same throughput rate, this translates into more savings in hardware using the proposed structure, because the data registers that are required by algebraic interpolators to pipeline the computation for a faster rate would not be needed by our structure.

We have also introduced two implementations of the trigonometric interpolation method: one using a lookup table, and one using an angle rotation processor (to be discussed in Section 5).

After introducing a first interpolation method, we have shown that we can trade one angle rotator for a multiplier by conceptually modifying the input samples, then by "correcting" the interpolated value obtained from the "modified" samples. Through this modification, we have obtained a simpler implementation structure while simultaneously improving the performance when interpolating most practical signals. This performance improvement has been demonstrated by comparing the frequency responses of the interpolators and the mean-squared interpolation errors using these interpolators. Our discussion of the optimal digital resampler in Section 4 will be based on this simplified interpolator.

3. Interpolation Filters with Arbitrary Frequency Response

In Section 2, an interpolation method using a trigonometric polynomial was introduced, along with an example of such an interpolation structure of length N=4. In addition to being a very simple structure, our analyses and simulations also demonstrated that the trigonometric interpolator outperformed the interpolator of the same length using a Lagrange polynomial. In this Section, a more systematic approach will be taken to analyze this method from the digital signal processing point of view. A formula giving its impulse response allows us to analyze the frequency response of the interpolation filter. We then show how to modify the algorithm to achieve arbitrary frequency response. The discussions in this Section will provide the framework for the optimal interpolator of Section 4.

3.1 Formulating the Trigonometric Interpolator as an Interpolation Filter

We have shown that, given N equally-spaced samples y(n), a continuous-time signal can be reconstructed as $$y(t) = \sum_{n=-N/2+1}^{N/2} y(n) f(t-n) \quad (3.1)$$

where f(t) is the impulse response of a continuous-time interpolation filter. As in Section 2, it is assumed that the sampling period is $T_s=1$. This assumption makes the notation simpler and the results can easily be extended for an arbitrary $T_s$. In other words, the invention is not limited to a sampling period of $T_s=1$, as other sampling periods could be utilized. In Section 2 we have shown that f(t) can be expressed as:

$$f(t) = \begin{cases} 1 + 2\sum_{k=1}^{N/2-1} \cos\frac{2\pi}{N}kt + \cos\pi t & |t| \leq N/2 \\ 0 & |t| > N/2. \end{cases} \quad (3.2)$$

Figure 20A:
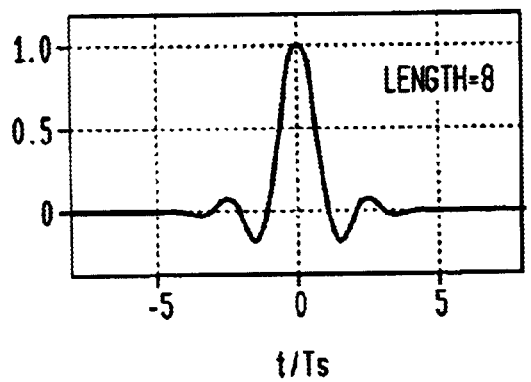
FIG. 20 illustrates normalized impulse responses f of the interpolation filters according to embodiments of the present invention.
Figure 20B:
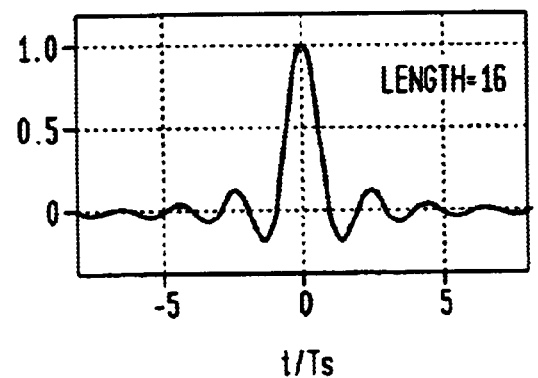
Figure 21A:
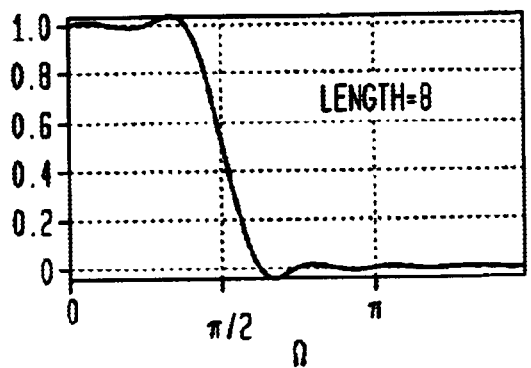
FIG. 21 illustrates normalized frequency responses F of the interpolation filters according to embodiments of the present invention.
Figure 21B:
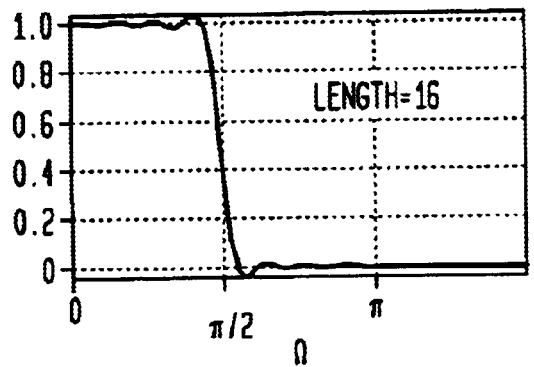

FIG. 20 illustrates f for the trigonometric interpolation filters for N=8 and N=16. By computing the Fourier transform off we obtain the frequency response of the interpolation filter. The frequency responses for the N=8 and N=16 cases are plotted in FIG. 21. Since f(t) is real and symmetric around t=0, its frequency response has zero phase. In FIG. 21, the oscillatory behavior near the band edge is quite obvious. In addition, by comparing FIGS. 21a and b, we can see that as the filter length is increased from N=8 to N=16 the amount of ripple does not decrease. Well known as the Gibbs phenomenon, the magnitude of the ripples does not diminish as the duration of the impulse response is increased.

It is apparent that the amount of oscillation cannot be reduced using the method discussed thus far while only increasing the filter length N. Moreover, it seems that an arbitrary frequency response cannot be achieved using this method. To address these problems, let us examine how the frequency response of this method is determined.

3.2 Analysis of the Frequency Response

Let us examine how the frequency response off for the trigonometric interpolator is obtained using the example in FIGS. 22 with N=8. According to (3.2), the interpolation filter's impulse response f(t) on the interval $$-\frac{N}{2} \leq t \leq \frac{N}{2}$$

is a weighted sum of cosine functions. We can view the finite-length filter f in (3.2) as having been obtained by applying a window 2206 according to the following:

$$w(t) = \begin{cases} 1 & |t| \leq N/2 \\ 0 & |t| > N/2 \end{cases} \quad (3.3)$$

to an infinitely-long, periodic function 2204 with period N:

$$f_c(t) = 1 + 2\sum_{k=1}^{N/2-1} \cos\frac{2\pi}{N}kt + \cos\pi t \quad -\infty < t < \infty \quad (3.4)$$

$$= \sum_{k=-N/2+1}^{N/2-1} W_N^{kt} + \frac{1}{2}W_N^{-(N/2)t} + \frac{1}{2}W_N^{(N/2)t}$$

such that $$f(t)=f_c(t)w(t), -\infty<t<\infty. \quad (3.5)$$

Thus F the frequency response off can be obtained by convolving $F_c$ and W the Fourier transforms of $f_c$ and w, respectively.

The Fourier transform of the periodic function $f_c(t), -\infty<t<\infty$, is $$F_c(\Omega) = \sum_{k=-N/2+1}^{N/2-1} \delta\left(\Omega - \frac{2\pi}{N}k\right) + \frac{1}{2}\delta(\Omega - \pi) + \frac{1}{2}\delta(\Omega + \pi) \quad (3.6)$$

which consists of a sequence of impulses 2208. We will subsequently refer to the weights of these impulses as frequency samples. Denoting the weight of $$\delta\left(\Omega - \frac{2\pi}{N}k\right)$$

by $\hat{F}(k)$, we have $$F_c(\Omega) = \sum_{k=-M}^{M} \hat{F}(k)\delta\left(\Omega - \frac{2\pi}{N}k\right) \quad (3.7)$$

where $$M \geq \frac{N}{2}$$

is an integer. In the case of (3.6), $$M = \frac{N}{2}.$$

For our particular interpolation filter, according to (3.6), all in-band frequency samples $\hat{F}(k) =1$ for $|k|<N/2$. For $|k|>N/2$, the out-of-band samples $\hat{F}(k) =0$. The two samples in the transition band are $\hat{F}(N/2)=\hat{F}(-N/2)=1/2$. The transition bandwidth is determined by the distance between the last in-band, and the first out-of-band frequency samples.

Since w is a rectangular function, W must be a sinc function 2210. Convolving $F_c$ and the sinc function W simply interpolates the frequency samples $\hat{F}(k)$ to obtain $F(\omega)$, $-\infty \leq \omega \leq \infty$, shown as response 2212. (Here we have plotted the symmetric F only on the positive half of the $\omega$ axis.) We thus have $$\hat{F}(k) = F(\Omega)|_{\Omega=2\pi k/N}, \quad -\frac{N}{2} \leq k \leq \frac{N}{2}. \tag{3.8}$$

Figure 23A:
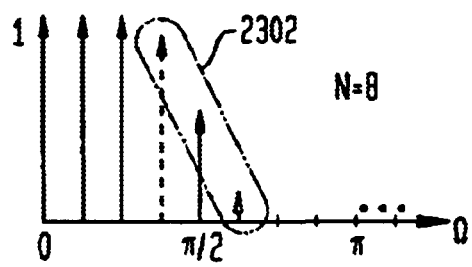
FIG. 23 illustrates the effect of a more gradual transition at the band edge according to embodiments of the present invention.
Figure 23B:
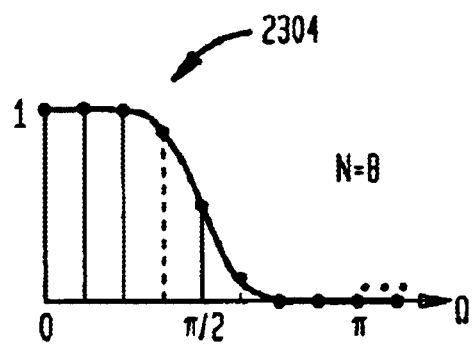

From response 2212, the continuous-frequency response $F(\omega)$ is uniquely determined by an infinite number of equally spaced frequency samples $\hat{F}(k)$. If we modify the frequency samples 2214 near the passband edge to let the transition between the passband and stopband be more gradual, as depicted in FIG. 23, then the ripple is decreased. FIG. 23 demonstrates gradually reduced samples 2302, and the reduction of ripples in the overall response 2304, as compared to the response 2212 in FIG. 22. The cost of this improvement is an increased transition bandwidth in the response 2304, as compared to the response 2212.

If a narrower transition band is desired, we can increase the duration of the filter $f(t)$. This can be seen by comparing FIG. 24, where N=16, with response 2304 in FIG. 23, in which N=8.

3.3 Implementing the Modified Algorithm

By comparing (3.6) and (3.4) we can see that the frequency sample values, i.e., the weights of the impulses in (3.6), are determined by the weights in the sum in (3.4).

We can modify our original interpolation filter in (3.2) for $|t| \leq N/2$ as $$f_m(t) = \hat{F}(0) + 2\sum_{k=1}^{M} \hat{F}(k)\cos\frac{2\pi}{N}kt. \tag{3.9}$$

By expressing (3.9) using the $W_N$ notation, for $|t|<N/2$ we have $$f_m(t) = \hat{F}(0)W_N^{0t} + \sum_{k=1}^{M} \hat{F}(k)(W_N^{kt} + W_N^{-kt}) = \sum_{k=-M}^{M} \hat{F}(k)W_N^{-kt}. \tag{3.10}$$

and $f_m(t)=0$ for $|t|>N/2$. Substituting this result into (3.1), and re-ordering terms, we have $$y(t) = \frac{1}{N}\sum_{k=-M}^{M} \hat{c}_k W_N^{-kt} \tag{3.11}$$

where $$\hat{c}_k = \hat{F}(t)\left(\sum_{n=-N/2+1}^{N/2} y(n)W_N^{kn}\right). \tag{3.12}$$

By comparing (3.12) to (2.9), we can see that, for $$k = -\frac{N}{2}+1, \ldots, \frac{N}{2},$$

$$\hat{c}_k \hat{F}(k) c_k. \tag{3.13}$$

Thus, a modified algorithm can be implemented as the following steps:

Step 1'. (Same as Step 1 in Section 2.4): Given an even number of samples N, calculate the Fourier coefficients $C_k$, k=0, . . . ,N/2 using (2.9).

Step 2': Multiply the coefficients $c_k$ by scale factors $\hat{F}(k)$ using (3.13).

Step 3': Given a fractional delay $\mu$, compute the synchronized samples using (3.11), which, due to $\hat{c}_k = \hat{c}_{-k}$, can be simplified as:

$$y(\mu) = \frac{1}{N}\text{Re}\left(\hat{c}_0 + 2\sum_{k=1}^{M} \hat{c}_k W_N^{-k\mu}\right). \tag{3.14}$$

It seems that, in Step 3', we need coefficients $\hat{c}(k)$ (hence $c_k$) not only for $k \leq N/2$ but also for $k>N/2$ while only $c_k$ values for $k \leq N/2$ are computed in Step 1'. However, $c_k$ values for $k>N/2$ can be obtained using $$C_k = C_{k-mN} \tag{3.15}$$

where m is an integer such that $0 \leq k-mN \leq N/2$. We have (3.15) because $c_k$ is periodic in k with period N, because $c_k$ is obtained from the Fourier transform of the discrete-time signal $y(n)$, $-N/2+1 \leq n \leq N/2$.

At this point, we have shown that the continuous-time frequency response of the interpolation filter having impulse response $f(t)$ can be improved by modifying the weights $\hat{F}(k)$ in (3.10). Now a question arises: the modification of the weights would alter the shape of the impulse response of the $f(t)$ filter. How do we guarantee that the resulting filter does not change the original samples?

3.4 Conditions for Zero ISI

In order for $f(t)$ not to alter the original samples when used for interpolation as in (3.1), it must have zero-crossings at integer multiples of the sampling period:

$$f(n) = \begin{cases} 1 & n = 0 \\ 0 & n \neq 0, n \text{ an integer.} \end{cases} \tag{3.16}$$

The well-known Nyquist condition for zero ISI (Proakis, J. G., Digital Communications, McGraw-Hill, New York, N.Y. (1993)) states that the necessary and sufficient condition for (3.16) is $$\sum_{n=-\infty}^{\infty} F(\Omega - 2\pi n) = 1 \quad -\infty < \Omega < \infty. \tag{3.17}$$

Since the filter's impulse response $f(t)$ has a finite duration, i.e. $f(t)=0$ for $|t|>N/2$, (3.16) holds if and only if the frequency samples $\hat{F}(k)$ satisfy $$\sum_{n=-\infty}^{\infty} \hat{F}(k - Nn) = 1, \quad k = \text{integer.} \tag{3.18}$$

The proof is given in Appendix A.

In summary, we can still guarantee that the modified interpolation filter f does not alter the original samples as long as the modified weights $\hat{F}(k)$ (frequency samples) satisfy (3.18). Using this constraint, we can design the weights $\hat{F}(k)$ to meet given frequency response requirements.

3.5 Optimization Algorithm

Using the approach discussed, one can approximate an arbitrary frequency response by choosing appropriate weights $\hat{F}(k)$. For example, a desired frequency response $F_d(\Omega)$ for an interpolation filter should be unity in the passband and be zero in the stopband, as $$F_d(\Omega) = \begin{cases} 1 & -\frac{\pi}{2} \leq \Omega \leq \frac{\pi}{2} \\ 0 & |\Omega| > \pi. \end{cases} \quad (3.19)$$

The interpolation error using our interpolation filter is defined as $$e(\Omega) = W_t(\Omega)|F_d(\Omega) - F(\Omega)| \quad (3.20)$$

where $W_t(\Omega)$ is a weighting function.

From Section 3.2 we have $F(\Omega) = F_c(\Omega)\hat{X}\sin c(\Omega)$. Thus, we can express $F(\Omega)$ in terms of $\hat{F}(k)$, using (3.7), as $$F(\Omega) = \left(\sum_{k=-M}^{M} \hat{F}(k)\delta\left(\Omega - \frac{2\pi}{N}\right)\right) \otimes \mathrm{sinc}(\Omega) \quad (3.21)$$

$$= \sum_{k=-M}^{M} \hat{F}(k)\mathrm{sinc}\left(\Omega - \frac{2\pi}{N}k\right).$$

An optimal interpolation filter can be designed by choosing $\hat{F}(k)$ to minimize the peak interpolation error, as $$L_\infty = \max_\Omega\{e(\Omega)\} \quad (3.22)$$

or the mean-squared interpolation error $$L_2 = \int_{-\infty}^{\infty} e^2(\Omega)d\Omega \quad (3.23)$$

subject to the constraint described by (3.18).

Figure 24:
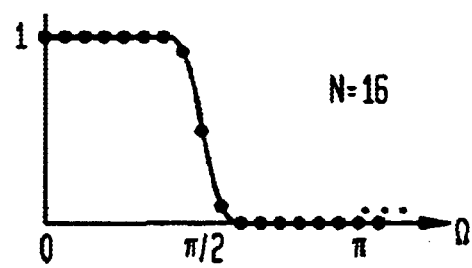
FIG. 24 illustrates reducing the transition bandwidth by increasing N according to embodiments of the present invention.

By examining FIGS. 23 and 24, we can see that, by modifying only two frequency samples, those nearest the band edge, a significant improvement is achieved. In these cases we have $\hat{F}(k)=0$ for $|k|>N/2+1$.

3.6 Conclusion

In this Section, an interpolation method was presented that achieves arbitrary frequency response by modifying the trigonometric interpolator discussed in Section 2. Using this approach, the performance of a trigonometric interpolation filter can be further improved.

Figure 25A:
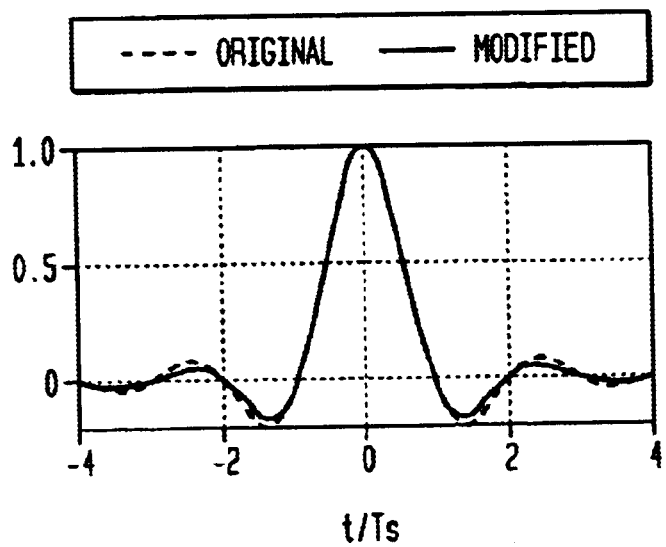
FIGS. 25A–B illustrate (A) impulse response of the original filter and the modified filter; (B) The equivalent window, according to embodiments of the present invention.
Figure 25B:
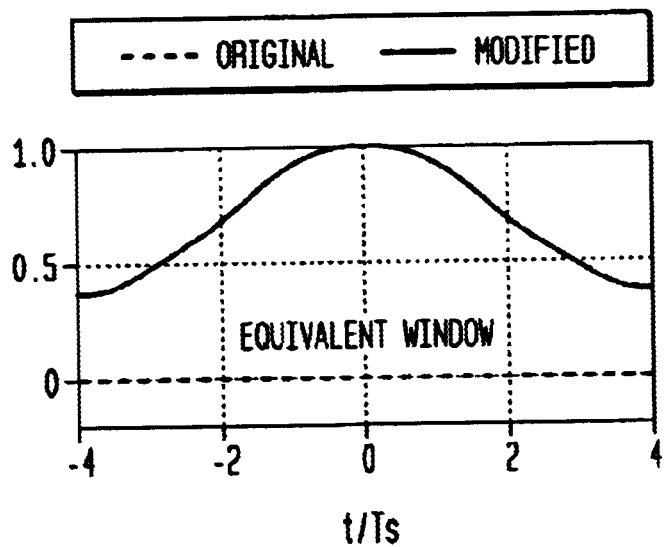

It is interesting to note that this procedure is equivalent to the well-known filter design method using windows. FIG. 25a depicts the impulse responses of the original filter (3.2) as the dashed line, and the modified filter (3.9) as the solid line. By comparing the two impulse responses, we have found a function illustrated in FIG. 25b. If we multiply the original impulse response by this function, we get the impulse response that we obtained by modifying the frequency samples. Therefore, this function is equivalent to a window. According to this interpretation, our frequency domain design method is equivalent to designing a better window than the rectangular window (3.3) in the time domain.

4. Design of Optimal Resamplers 4.1 Motivation

We have thus far discussed digital resampling using interpolation methods. To accomplish this, we conceptually reconstruct the continuous-time signal by fitting a trigonometric polynomial to the existing samples and then re-sample the reconstructed signal by evaluating this polynomial for a given sampling mismatch (or offset) $\mu$. The reconstruction of the continuous-time bandlimited signal y(t) from existing samples y(m) using interpolation filter f(t), according to (3.1), is $$y(t) = \sum_{m=-N/2+1}^{N/2} y(m)f(t-m). \quad (4.1)$$

Then y is resampled at $t=\mu$ as $$y(\mu) = \sum_{m=-N/2+1}^{N/2} y(m)f(\mu-m) = y \otimes f_\mu \quad (4.2)$$

where $f_\mu(m) = f(m-\mu)$.

In the previous sections we approached the problem only from the point of view of reconstructing the continuous-time signal, as in (4.1), since we have only examined the frequency response of the continuous-time filter f(t). However, what we actually are interested in is the new sample $y(\mu)$ that is obtained by resampling the continuous-time signal at a new sampling instant, $t=\mu$.

Now, a question arises: Even when the frequency response $F(\Omega)$ of the continuous-time filter is optimized as in Section 3.5, do we necessarily obtain the minimum error in producing a new sample $y(\mu)$ for each p value?

According to (4.2), the new sample $y(\mu)$ is actually obtained by filtering the original samples y(m) using a discrete-time filter whose impulse response $f_\mu(m)$ depends on a particular delay $\mu$. What is the desired frequency response of the $f_\mu(m)$ filter?

A digital resampler that is used in timing recovery simply compensates for the timing offset in sampling the received signal. Ideally, the $f_\mu(m)$ filter should not alter the signal spectrum as it simply delays the existing samples by $\mu$. Obviously, the desired frequency response of the discrete-time $f_\mu(m)$ filter is $$F_d(\omega, \mu) = e^{j\omega\mu}$$

where $\omega$ is the normalized angular frequency. Let us define the frequency response of $f_\mu(m)$ as $F_\mu(\omega)$. The error in approximating the ideal frequency response $F_d(\omega, \mu)$ by $F_\mu(\omega)$ for a given $\mu$ value, is $$e(\omega) = W_t(\omega)|F_d(\omega, \mu) - F_\mu(\omega)| \quad (4.4)$$

where $W_t(\omega)$ is a weighting function.

Figure 26:
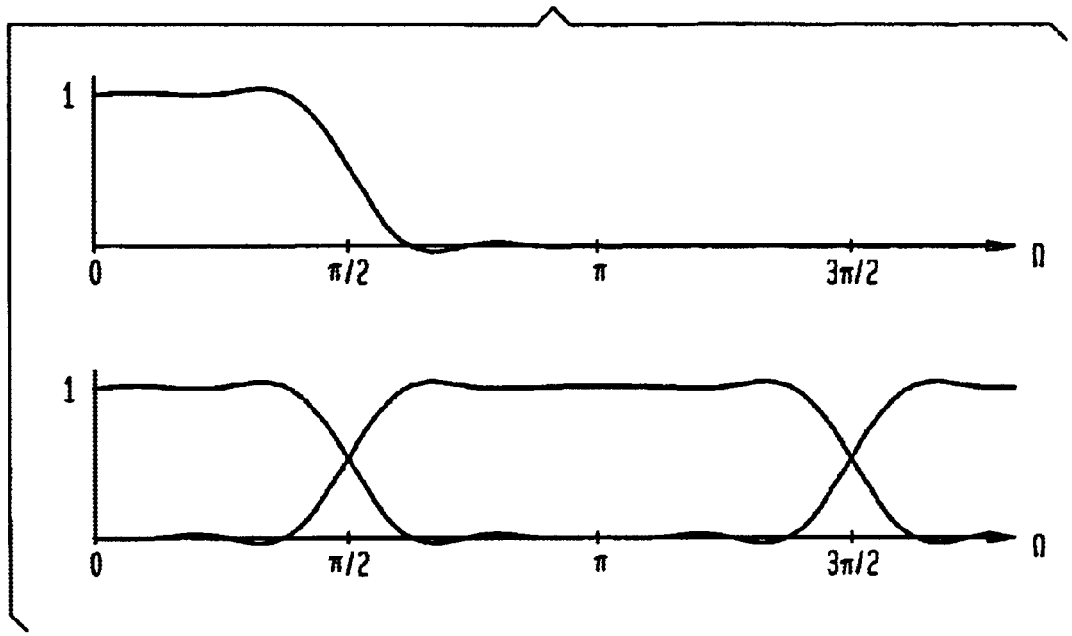
FIG. 26 illustrates forming the frequency response of the discrete-time fractional-delay filter according to embodiments of the present invention.
Figure 27A:
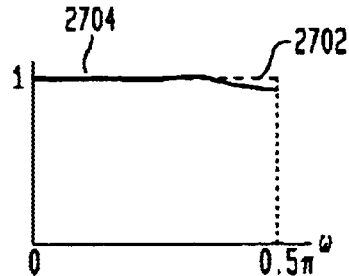
FIGS. 27A–B illustrate a fractional-delay filter with (A) $\mu$=0.12 and (B) $\mu$=0.5, using the preliminary N=8 interpolator according to embodiments of the present invention.
Figure 27B:
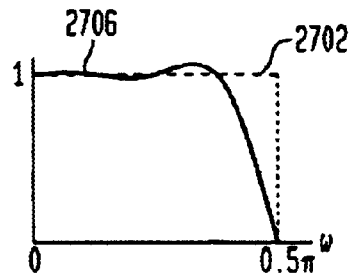

We now examine how the discrete-time fractional-delay frequency response $F_\mu(\omega)$ is obtained. We denote by $F(\Omega)$ the Fourier transform of the continuous-time filter f(t). Hence, the Fourier transform of $f(t-\mu)$ must be $e^{-j\Omega\mu}F(\Omega)$. We know that $f_\mu(n) = f(n-\mu)$ are just samples off $f(t-\mu)$, where $-\infty < t < \infty$. Therefore, according to the sampling theorem (Proakis, J. G., Digital Signal Processing, Macmillan, New York, N.Y. (1992)), the Fourier transform of $f_\mu(n)$ is $$F_\mu(\omega) = \sum_{k=-\infty}^{\infty} e^{-j(\Omega-2\pi k)\mu}F(\Omega-2\pi k) \quad (4.5)$$

after we replace $\Omega$ on the right-hand-side expression by the normalized angular frequency variable $\omega$ ($\omega=\Omega$ since $T_s=1$). This relationship is shown in FIG. 26, where $F(\Omega)$ corresponds to the N=8 interpolator of FIG. 11. As discussed in Section 3.2, f(t) is symmetric around t=0. This implies that $F(\Omega)$ has zero phase. To make the f(t) filter physically realizable, of course, we must introduce a delay of N/2, where N corresponds to the length of the filter. However, this delay simply "shifts" all input samples by N/2, which is an integer because N is even, and it does not change the characteristic of the input signal. Thus, it does not influence the interpolation accuracy. Therefore, to simplify our notation, we just use $F(\Omega)$ as a real function. Hence, the phase of the complex function $e^{-j\Omega\mu}F(\Omega)$ is $-\Omega\mu$ if $F(\Omega)\geq 0$, or $-\Omega\mu+\pi$ if $F(\Omega)<0$ —the phase depends on $\mu$. FIG. 26 shows that the frequency response of the discrete-time filter $F_\mu(\omega)$ is obtained by first making an infinite number of copies of $e^{-j\Omega\mu}F(\Omega)$ by shifting this function uniformly in successive amounts of $2\pi$, then by adding these shifted versions to $e^{-j\Omega\mu}F(\Omega)$. As a sum of complex functions, the shape of $F_\mu(\omega)$ depends not only on the shape of the continuous-time frequency response $F(\Omega)$ but also on the value $\mu$. The dependence of $F_\mu(\omega)$ on $\mu$ is illustrated in FIG. 27, where $F_\mu(\omega)$ is obtained from the function $F(\Omega)$ in FIG. 26, using $\mu=0.12$ and $\mu=0.5$. The magnitude of the ideal fractional-delay frequency response, defined in (4.3), is shown in both FIG. 27A and FIG. 27B as the dashed lines. It is evident that the frequency response 2706 is worse for $\mu=0.5$ than the frequency response 2704 is for $\mu=0.12$, since the response 2706 deviates more from the ideal frequency response 2702 than does the frequency response 2704. Hence, the interpolation error is larger for $\mu=0.5$ than for $\mu=0.12$. We have observed in our simulations that the largest interpolation error occurs when $\mu=0.5$, i.e., when the interpolated sample is exactly in the middle of the two nearest existing samples. As $\mu$ approaches 0 or 1 (i.e., as the interpolated sample gets closer to an existing sample), the interpolation error becomes smaller. Moreover, the interpolation errors obtained for $\mu$ and $1-\mu$ are the same.

4.2 Resampler Optimizations

In Section 3, we analyzed the relationship between the weights $\hat{F}(k)$ in (3.9) and the frequency response of the interpolator. We have shown that we can enhance $F(\Omega)$ by adjusting the $\hat{F}(k)$ values. In FIG. 23 (N=8), for example, the $\hat{F}(3)$ and $\hat{F}(5)$ values correspond to the magnitude of the pulses 2302 near the band edge. If we adjust $\hat{F}(3)$ and $\hat{F}(5)$ such that the transition between the passband and stopband is more gradual, we can achieve a better frequency response.

To further improve the interpolation performance, we could take $\mu$ into account, by optimizing $F_\mu(\omega)$ for each $\mu$ value. As in Section 3, we could adjust $\hat{F}(k)$ near the band edge to change the shape of $F(\Omega)$, for each $\mu$ value, such that the discrete-time frequency response $F_\mu(\omega)$, which is obtained from (4.5), best approximates the desired response of (4.3).

As discussed in Section 3, to guarantee that the original samples are not altered using the modified interpolator, the weights $\hat{F}(k)$ should satisfy (3.18). When N=8, for example, we modify $\hat{F}(3)$ and $\hat{F}(5)$ together in order to satisfy (3.18). Here, however, our goal of optimization is to obtain the best approximation for the sample corresponding to a specific $\mu$. Hence we need not be concerned with the issue of altering the original samples in Section 3, where there is only one set of optimized weights for all $\mu$ values.

Figure 28A:
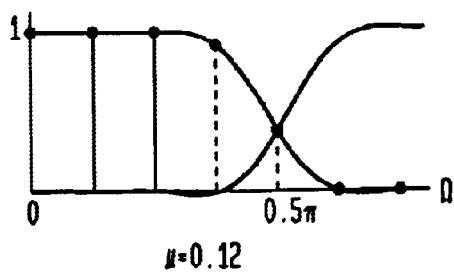
FIGS. 28A–D illustrate modification to $F(\Omega)$, and the corresponding $F_\mu(\omega)$ according to embodiments of the present invention.
Figure 28B:
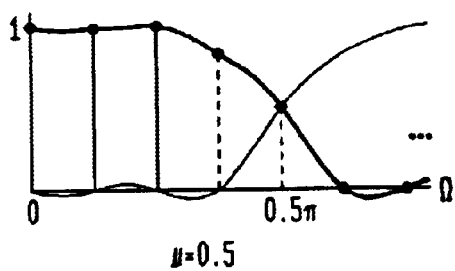
Figure 28C:
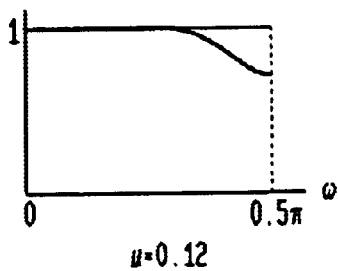
Figure 28D:
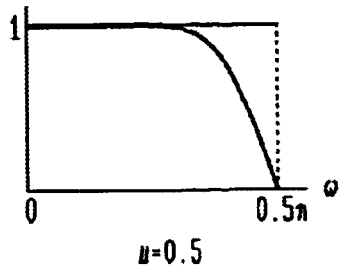

Let us demonstrate this method using the example of N=8. We chose to modify $\hat{F}(3)$ and $\hat{F}(4)$. For each given $\mu$, we search for the $\hat{F}(3)$ and $\hat{F}(4)$ values such that (4.4) is minimized. We denote such $\hat{F}(3)$ and $\hat{F}(4)$ values by $\hat{F}_\mu(3)$ and $\hat{F}_\mu(4)$ respectively, since they are now also dependent on $\mu$. FIGS. 28A and B show the modifications to $F(\Omega)$ for $\mu=0.12$ and $\mu=0.5$, respectively. The corresponding optimized $F_\mu(\omega)$ functions are illustrated in FIGS. 28C and 28D, respectively.

Figure 29A:
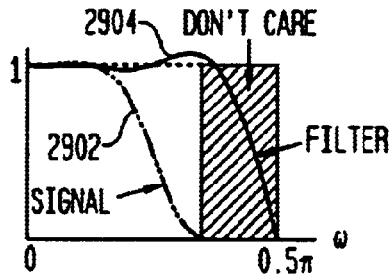
FIGS. 29A–B illustrate $F_\mu(\omega)$, with $\mu$=0.5, N=8, (A) before and (B) after optimization according to embodiments of the present invention.
Figure 29B:
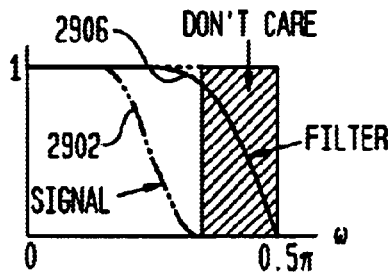

To demonstrate the performance improvement, let us use this example: Given $\mu=0.5$, we optimize $F_\mu(\omega)$ for the signal whose spectrum is shown in dashed lines 2902 in FIG. 29. Comparing the un-optimized frequency response 2904 with the optimized frequency response 2906, the modification clearly produces a better frequency response. More specifically, the response 2906 is flat in the frequency band where the power of the signal 2902 is concentrated, and the deviation from the ideal response mostly falls in the "don't care" band.

Similar to Section 3, to implement this improved method, we first compute the coefficients $c_k$ from the existing samples as in (2.9). Then, given the $\mu$ value, we multiply, e.g., for N=8, the $c_3$ and $c_4$ values by $\hat{F}_\mu(3)$ and $\hat{F}_\mu(4)$, respectively. Finally, we compute the synchronized sample $y(\mu)$ using (2.11), where $c_3$ and $c_4$ are replaced by $\hat{F}_\mu(3) c_3$ and $\hat{F}_\mu(4) c_4$, respectively.

Figure 30A:
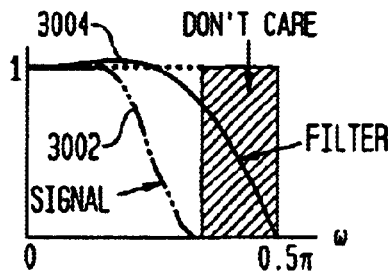
FIGS. 30A–30B illustrate $F_\mu(\omega)$ for $\mu$=0.5, N=4, (A) before and (B) after modification according to embodiments of the present invention.
Figure 30B:
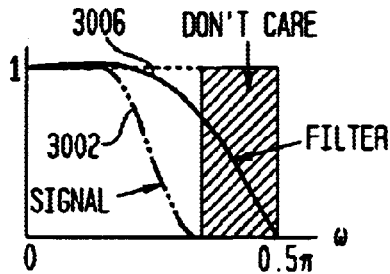

We can apply similar modifications to the interpolator with N=4. FIG. 30A show the frequency response of the interpolator 1000, for $\mu=0.5$, while FIG. 30B displays the results of a modified interpolator 1000, where parameters $\hat{F}(1)$ and $\hat{F}(2)$ are optimized, for $\mu=0.5$, to maximize the interpolation accuracy for the signal whose spectrum is shown in dashed lines. As can be seen the optimized response 3006 is flatter in the part of the spectrum of the signal 3002 where most of its energy is concentrated than is the un-optimized response 3004.

The flowchart 3400 in FIG. 34 generalizes the optimization of the trigonometric optimization procedure. The flowchart 3400 is similar to the flowchart 1700, but includes the additional steps of 3402 and 3404 that are described as follows.

In step 3402, a factor $\hat{F}_\mu$ is determined to adjust the frequency response of the trigonometric interpolator so that it is consistent with the frequency response of N-data samples and the offset $\mu$.

In step 3404, one or more of the complex coefficients are multiplied by the $\hat{F}_\mu$ to modify the frequency response of the interpolator so that it is consistent with the input signal and the offset $\mu$.

The optimization routine can also be used with K-modified data samples that leads to the simplified interpolator structures of FIGS. 14 and 15. The flowchart 3500 illustrates the $\hat{F}_\mu$ factor modification in the context of the flowchart 1900.

As will be shown in the section that follows, the steps 3402, 3404, and 1708 can be combined into a single step if a table lookup is used to determine the rotation factor. In other words, the sine and cosine values can be multiplied by the $\hat{F}_\mu$ factor before they are stored in the ROM.

In Section 2.6, we have presented an efficient algorithm that eliminates one angle-rotation. For example, for N=4, we can "modify" the input samples according to (2.22). With this modification, we can treat the new samples as if the input signal satisfies $c_2=0$. The remaining non-zero coefficients are $c_0$ and $c_1$. In the example for N=4 in the previous Section, two parameters, $\hat{F}_\mu(1)$ and $\hat{F}_\mu(2)$, are optimized to achieve the best approximation of a desired fractional-delay frequency response described by (4.3). Now, with $c_2=0$, we have only one parameter, $\hat{F}_\mu(1)$, to choose.

Figure 31A:
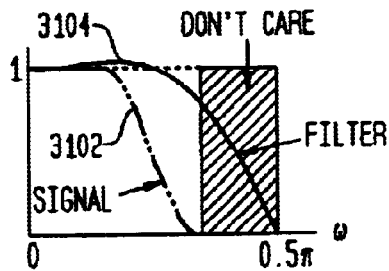
FIGS. 31A–31B illustrate $F_\mu(\omega)$, $\mu$=0.5, simplified N=4 structure, (A) before and (B) after modification according to embodiments of the present invention.
Figure 31B:
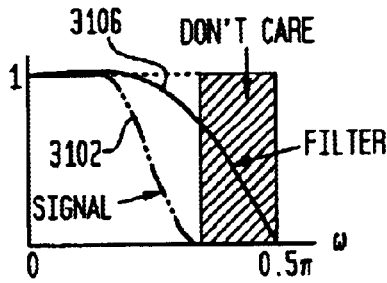

The impulse response of the simplified interpolation filter is derived in Appendix B. From the mathematical expression of the impulse response (B.5), we can obtain the corresponding frequency response. The frequency responses of the interpolator 1400 (FIG. 14) before and after applying the $\hat{F}_\mu(1)$ modification are shown in FIG. 31 A–B, respectively. We can see an improved frequency response 3106 over the response 3104, as the response 3106 is flatter in the part of the signal 3102 where its energy is concentrated. Furthermore, it seems that the frequency response 3106, where only $c_1$ is modified ($c_2=0$!), is as good as the modified response 3006 in FIG. 30B where both $c_1$ and $c_2$ are modified.

4.3 Implementations

It may appear that additional hardware is needed to implement the multiplication by, for example, $\hat{F}_\mu(1)$ for the simplified N=4 structure. Let us examine the corresponding computations. As we know, we first compute coefficients $c_0$ and $c_1$ according to (2.25) ($c_2=0$, of course). We then compute $y(\mu)$ using $$y(\mu) = \frac{1}{4}(c_0) + \frac{1}{2}\text{Re}(\hat{F}_\mu(1)c_1 e^{j\frac{\pi}{2}\mu}) - K\mu \quad (4.6)$$

according to (2.26) and (2.27), where K is defined in (2.24). As discussed in Section 2.4, the computation $$\text{Re}(\hat{F}_\mu(1)c_1 e^{j\frac{\pi}{2}\mu}) = \text{Re}(c_1)(\text{Re}(\hat{F}_\mu(1)e^{j\frac{\pi}{2}}) - \text{Im}(c_1)\text{Im}(\hat{F}_\mu(1)e^{j\frac{\pi}{2}\mu}) \quad (4.7)$$

can be accomplished by retrieving the $$\hat{F}_\mu(1)e^{j\frac{\pi}{2}\mu}$$

value from a ROM lookup table and then multiplying $\text{Re}(c_1)+j\,\text{Im}(c_1)$ by the retrieved value, since both $\hat{F}_\mu(1)$ and $$e^{j\frac{\pi}{2}\mu}$$

can be pre-determined for all $\mu$ values.

If the angle-rotation method is used, we can use a lookup table to store the $\hat{F}_\mu(1)$ values. In real-time, after computing $$c_1 e^{j\frac{\pi}{2}\mu}$$

using an angle-rotation processor, we can multiply the result by $\hat{F}_\mu(1)$. In this case, if $\hat{F}_\mu(1)$ is allowed to be a complex number in optimizing performance, we then need two real multiplications to obtain $$\text{Re}(\hat{F}_\mu(1)c_1 e^{j\frac{\pi}{2}\mu})$$

in (4.6). However, if we restrict $\hat{F}_\mu(1)$ to be a real number, we can use just one real multiplication as $$\text{Re}(\hat{F}_\mu(1)c_1 e^{j\frac{\pi}{2}\mu}) = \hat{F}_\mu(1)\text{Re}(c_1 e^{j\frac{\pi}{2}\mu}) \quad (4.8)$$

According to Table 4.1, the NMSE using complex and real $\hat{F}_\mu(1)$ values are $-37.41$ dB and $-37.08$ dB, respectively. Therefore, the performance degradation caused by restricting $\hat{F}_\mu(1)$ to be a real number is insignificant.

When the table-lookup method is employed, the implementation structure for the optimal interpolator is the same as that for the interpolator 1400, except for the coefficient $c_1$ which is now multiplied by $$\hat{F}_\mu(1)e^{j\frac{\pi}{2}\mu}$$

instead of $$e^{j\frac{\pi}{2}\mu}.$$

The table should therefore contain the $$\text{Re}(\hat{F}_\mu(1)e^{j\frac{\pi}{2}\mu})$$

and $$\text{Im}(\hat{F}_\mu(1)e^{j\frac{\pi}{2}\mu})$$

values, rather than the $$\sin\frac{\pi}{2}\mu$$

and $$\cos\frac{\pi}{2}\mu$$

values used by the interpolator 1400. We now show that the size of the table is the same as the one storing the sine and cosine values.

Figure 32:
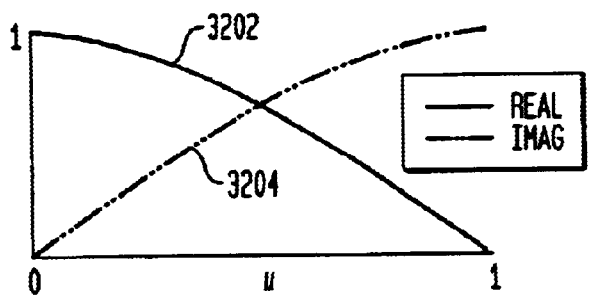
FIG. 32 illustrates real and imaginary components of the $$\hat{F}_\mu(l)e^{j\frac{\pi}{2}\mu}$$

Let us examine the contents of the lookup table. FIG. 32 displays the $$\text{Re}(\hat{F}_\mu(1)e^{j\frac{\pi}{2}\mu})$$

and $$\text{Im}(\hat{F}_\mu(1)e^{j\frac{\pi}{2}\mu})$$

values, used by (4.7), where the real values are represented by curve 3202, and the imaginary values are represented by the curve 3204. These values are monotonic with respect to $\mu$, just like the $$\sin\frac{\pi}{2}\mu$$

and $$\cos\frac{\pi}{2}\mu$$

values for $0\leq\mu1$. Moreover, simulations show that, when optimal values of $\hat{F}(1)$ are reached, the real and imaginary components of $$\hat{F}_\mu(1)e^{j\frac{\pi}{2}\mu}$$

display the following complementary relationship:

$$\text{Im}(\hat{F}_\mu(1)e^{j\frac{\pi}{2}\mu}) = \text{Re}(\hat{F}_{1-\mu}(1)e^{j\frac{\pi}{2}(1-\mu)}). \quad (4.9)$$

Therefore, we need only store one of the $$Re(\hat{F}_\mu(1)e^{j\frac{\pi}{2}\mu})$$

and $$Im(\hat{F}_\mu(1)e^{j\frac{\pi}{2}\mu})$$

values. The other can be obtained by looking-up the value corresponding to $1-\mu$. This is the same technique used in storing and retrieving the sine and cosine values with the purpose of reducing the table size.

Various circuit implementations of optimized interpolators having N=4 are illustrated in FIGS. 36–37. These circuit implementations are presented for example purposes only and are not meant to be limiting, as those skilled in the arts will recognize other circuit implementation based on the discussion given herein, including interpolator configurations having different N values.

FIG. 36 illustrates an optimized interpolator 3600 that is based on the simplified interpolator 1400 (FIG. 14). The interpolator 3600 includes an $\hat{F}_\mu$ ROM 3602 and a multiplier 3604. The ROM 3600 stores the appropriate $\hat{F}_\mu$ value indexed by $\mu$. The multiplier 3604 multiples the complex coefficient $C_1$ by the appropriate $\hat{F}_\mu$ value, and therefore optimizes the frequency response of the interpolator 3600. As discussed above, the order of the angle rotator 1010b and the multiplier 3604 can be interchanged so that the rotated complex coefficient is modified by the $\hat{F}_\mu$ value.

FIG. 37 illustrates an optimized interpolator 3700 that is similar to the optimized interpolator 3600, except that the $\hat{F}_\mu$ ROM 3602, the multiplier 3604, and the angle rotator 1010b are combined into to a single ROM 3702, that stores the $$Re(\hat{F}_\mu(1)e^{j\frac{\pi}{2}\mu})$$

and $$Im(\hat{F}_\mu(1)e^{j\frac{\pi}{2}\mu})$$

values. Therefore, coefficient optimization and angle rotation are performed in a simultaneous and efficient manner.

It will be apparent to those skilled in the arts that the combined $\hat{F}_\mu$ and angle rotator ROM 3702 can be implemented for interpolator configurations that include more than N=4 elements, based on the discussions herein.

4.4 Simulation Results

We have verified the new design with the following simulation. A baseband signal, shown in FIG. 33, with raised cosine spectrum, two samples per symbol and 40% excess bandwidth was generated. Table 4.1 compares the result for N=4 using four interpolation structures: 1) the Lagrange cubic interpolator, 2) the interpolator 1000, 3) the interpolator 1400, 4) the optimal resampler using a complex $\hat{F}_\mu(1)$ value, and 5) the optimal resampler employing a real $\hat{F}_\mu(1)$ value.

Using the optimal structure, the NMSE is reduced by 4 dB over the method without optimization (FIG. 14 structure). The performance is improved by more than 6 dB compared to the Lagrange cubic interpolator, while the hardware is reduced. Comparing the optimal structure to the FIG. 14 structure, a 4 dB performance gain was obtained without increasing the amount of hardware.

TABLE 4.1

Comparison of interpolators for N = 4.

| N = 4 | Lagr. cubic struct. | Struct. in FIG. 10 | Struct. in FIG. 14 | Optimal table-lookup[a] | Optimal angle-rotat.[b] |
|---|---|---|---|---|---|
| NMSE in dB | −31.08 | −31.21 | −33.51 | −37.41 | −37.08 |
| Scaling multipliers | 2 | 0 | 0 | 0 | 0 |
| Data multipliers | 3 | 3 | 3 | 3 | 4 |
| Multipliers in critical path | 4 | 2 | 2 | 2 | 3 | a. Complex $\hat{F}_\mu(1)$ values are used. The table stores the $$\hat{F}_\mu(1)e^{j\frac{\pi}{2}\mu}$$

values.

b. Real $\hat{F}_\mu(1)$ values are used. The output of the angle-rotator $$Re(c_1 e^{j\frac{\pi}{2}\mu})$$

is multiplied by $\hat{F}(1)$. Thus, one more real multiplexer is needed.

The frequency response of an optimized interpolator 1400 (FIG. 14) using a lookup table is shown in FIG. 16D. Also shown in FIGS. 16A–D are the frequency responses of the Lagrange cubic interpolator 400, the interpolator 1000, and the interpolator 1400 without optimization. The signal spectrum of FIG. 33 is shown in FIG. 16D in dashed lines 1604. The interpolation error corresponds to the gray area 1606. From FIG. 16D, the performance improvement achieved by the optimal interpolator is evident because the gray area 1606d is a lower amplitude than the corresponding gray areas 1606a–c. In addition, these improvements are accomplished without increasing the amount of hardware.

For a high-performance interpolator, we now turn to the structure described in Section 2.6.2, for N=8. Applying a similar approach for N=4, as just discussed, to the N=8 interpolator of Section 2.6.2, we can multiply the $c_3$ coefficient by $\hat{F}_\mu(3)$, whose value optimizes the frequency response $F_\mu(\omega)$ of a fractional-delay filter with delay $\mu$.

In designing the proposed N=8 interpolator, only one parameter $\hat{F}_\mu(3)$ was adjusted to minimize the MSE in (3.22).

Next, three interpolators of length N=8 were used to interpolate the signal in FIG. 33: 1) a Lagrange polynomial interpolator, 2) a Vesma-Saramäki optimal polynomial interpolator (Vesma, J., and Saramali, T., "Interpolation filters with arbitrary frequency response for all-digital receivers," in Proc. 1996 IEEE Int. Symp. Circuits Syst. (May 1996), pp. 568–571) (with length 8 but a third degree polynomial) and, 3) the proposed interpolator.

Table 4.2 shows the simulation results. These results demonstrate that our method has an NMSE more than 16 dB lower than the Lagrange interpolator, and more than 4 dB lower than the Vesma-Saramäki polynomial interpolator in (Vesma, J., and Saramaki, T., "Interpolation filters with arbitrary frequency response for all-digital receivers," in Proc. 1996 IEEE Int. Symp. Circuits Syst. (May 1996), pp. 568–571).

TABLE 4.2

Performance comparison.

| N = 8 | Lagrange interpolator | Vesma-Saramäki interpolator | Proposed interpolator |
|---|---|---|---|
| NMSE in dB | −45.29 | −57.34 | −62.17 |
| Scaling multipliers | 25 | 16 | 2 |
| Multipliers | 7 | 3 | 7 |

4.5 Conclusion

Instead of optimizing F(Ω), the frequency response of the continuous-time interpolation filter, we could optimize $F_\mu(\omega)$ of the fractional-delay filter for each $\mu$ value. By doing this, better interpolation performance can be achieved, as demonstrated by the simulations.

As for the implementation complexity, when a table-lookup method is employed, the optimal interpolator does not require additional hardware, just table values that implement the coefficient optimization and angle rotation. When the angle rotation method is used, one additional real multiplier is needed.

For N=4, the optimal interpolator attained a 6 dB lower NMSE than the Lagrange cubic interpolator, while requiring less hardware.

5. A High-Speed Angle Rotation Processor

In previous Sections, an interpolation method and apparatus for timing recovery using a trigonometric polynomial has been discussed. The major computation in this method is the angle rotation, such as angle rotator 1010 (in FIG. 10 and FIG. 14). As mentioned in Section 2.4, these operations, together with the phase rotator for carrier recovery, can be implemented by table-lookup in a ROM containing pre-computed sine and cosine values, followed by four real multipliers to perform the angle rotation (see FIG. 18). Herein, going forward, this approach will be referred to as the single-stage angle rotation. Although fast angle rotation can be achieved with efficient multiplier design techniques, for practical precision requirements, the ROM table can be quite large. For applications where low complexity and low power are the major concern, can we further reduce the amount of hardware for angle rotation with slightly more computational delay?

There are various hardware designs that accomplish angle rotations, notably the CORDIC processors (Ahn, Y., et al., "VLSI design of a CORDIC-based derotator," in *Proc. 1998 IEEE Int. Symp. Circuits Syst., Vol. II* (May 1998), pp. 449–452; Wang, S., et al. "Hybrid CORDIC algorithms," *IEEE Trans. Comp.* 46:1202–1207 (1997)), and, recently, an angle-rotation processor (Madisetti, A., et al. "A 100-MHz, 16-b, direct digital frequency synthesizer with a 100-dBc spurious-free dynamic range," *IEEE J. Solid-State Circuits* 34:1034–1043 (1999)). These algorithms accomplish the rotation through a sequence of subrotations, with the input to each subrotation stage depending on the output of the previous stage. In these cases, the latency is proportional to the precision of the angle.

We now propose a different approach for angle rotation. Here the rotation is partitioned into just two cascaded rotation stages: a coarse rotation and a fine rotation. The two specific amounts of rotation are obtained directly from the original angle without performing iterations as does CORDIC. The critical path is therefore made significantly shorter than that of the CORDIC-type methods. In addition, only a small lookup table is needed.

In this Section, methods and apparatus for two-stage angle rotation will be described. These method and apparatus are meant for example purposes only, and are not meant to be limiting. Those skilled in the arts will recognize other methods and apparatus for two stage angle rotation based on the discussion given herein. These other methods and apparatus for angle rotation are within the scope and spirit of the present invention.

It will be shown that more precision and less hardware can be obtained using the two stage angle rotator compared to the single-stage angle rotator, with slightly more computational delay. We will then show that, given an overall output precision requirement, various simplifications can be applied to the computations within the two stages to reduce the total hardware.

5.1 The angle rotation problem

If we rotate a point in the X-Y plane having coordinates $(X_0, Y_0)$ counterclockwise, around the origin, by the angle φ, a new point having coordinates (X, Y) is obtained. It is related to the original point $(X_0, Y_0)$ as:

$$X = X_0 \cos\phi - Y_0 \sin\phi$$

$$Y = Y_0 \cos\phi + X_0 \sin\phi \quad (5.1)$$

5.1.1 Single-Stage Angle Rotation

The operation in (5.1) is found in many communication applications, notably in digital mixers which translate a baseband signal to some intermediate frequency and vice versa. In addition to accomplishing (5.1) with CORDIC, a very common implementation is to store pre-computed sine/cosine values in a ROM (Tan, L. and Samueli, H., "A 200-MHz quadrature frequency synthesizer/mixer in 0.8–μm CMOS," *IEEE J Solid-State Circuits* 30:193–200 (1995)). Then, in real-time, the computation in (5.1) is accomplished with a ROM access for each given φ followed by four real multiplications. This method avoids the excessive latency of the iterations performed by CORDIC and can yield lower latency than the angle-rotation method (Madisetti, A., "VLSI architectures and IC implementations for bandwidth efficient communications," Ph.D. dissertation, University of California, Los Angeles (1996)). Furthermore, a very fast circuit can be built, based on efficient multiplier design techniques. However, since the size of the ROM grows exponentially with the precision of φ, a rather large ROM is required to achieve accurate results.

ROM compression can be achieved by exploiting the quarter-wave symmetry of the sine/cosine functions and such trigonometric identities as $\sin\theta = \cos(\pi/2 - \theta)$. The angle φ in the full range [0,2π] can be mapped into an angle $\theta \in [0, \pi/4]$. This is accomplished by conditionally interchanging the input values and $X_0$ and $Y_0$, and conditionally interchanging and negating the output X and Y values (Madisetti, A., "VLSI architectures and IC implementations for bandwidth efficient communications," Ph.D. dissertation, University of California, Los Angeles (1996)). Thus, we will focus only on $\theta \in [0, \pi/4]$ and replace φ by θ in (5.1). Defining $\theta = (\pi/4)\bar\theta$, we must have $\bar\theta \in [0, 1]$.

Obviously, the sine/cosine ROM samples must be quantized because of the limited storage space for sine/cosine samples. This produces an error in the ROM output when compared to the true (unquantized) sine/cosine value, which will subsequently be referred to as the ROM quantization error. Next we examine how this error affects the output. Let cos θ and sin θ be quantized to N bits, to become [cos θ] and [sin θ], respectively. We have $$\cos\theta = [\cos\theta] + \Delta_{\cos\theta}$$
$$\sin\theta = [\sin\theta] + \Delta_{\sin\theta} \quad (5.2)$$

where $\Delta_{\cos\theta}$ and $\Delta_{\sin\theta}$ are the ROM quantization errors, which satisfy $|\Delta_{\cos\theta}| < 2^{-N}$ and $|\Delta_{\sin\theta}| < 2^{-N}$. The error in X due to the ROM quantization is the difference between X calculated using infinite-precision sine/cosine values and the quantized values, that is $$\Delta_x = (X_0\cos\theta - Y_0\sin\theta) - (X_0[\cos\theta] - Y_0[\sin\theta]) = X_0\Delta_{\cos\theta} - Y_0\Delta_{\sin\theta}. \quad (5.3)$$

Its upper bound is $$|\Delta_x| < (|X_0| + |Y_0|)2^{-N}. \quad (5.4)$$

5.1.2 Rotation by a Small Angle

If the rotation angle happens to be so small that $$|\theta| < 2^{-N/3} \quad (5.5)$$

then its sine/cosine values can be approximated as $$\sin\theta \approx \theta \quad (5.6)$$
$$\cos\theta \approx 1 - (\theta^2/2). \quad (5.7)$$

For such θ no table is needed. Next, we show how accurate (5.6) and (5.7) are by estimating their approximation errors.

The Taylor expansion of sin θ near θ=0 yields $$\sin\theta = \theta - \frac{\sin'\xi}{6}\theta^3 \quad (5.8)$$

where ξ=hθ, 0≤h≤1. Thus, since $$|\sin'\xi| = |\cos\xi| \leq 1 \quad (5.9)$$

and in view of (5.5), an error bound on (5.6) is $$|\Delta_{\sin\theta}| = |\sin\theta - \theta| \leq |\theta^3/6| < 2^{-N}/6. \quad (5.10)$$

Similarly, the Taylor expansion of cos θ yields $$\cos\theta = 1 - \frac{1}{2}\theta^2 + \frac{\cos\xi}{24}\theta^4. \quad (5.11)$$

Thus, an error bound on (5.7) is $$|\Delta_{\cos\theta}| = |\cos\theta - (1 - \theta^2/2)| \leq |\theta^4/24| \quad (5.12)$$

which is negligible in comparison to the bound on $|\Delta_{\sin\theta}|$.

5.1.3 Partitioning into Coarse and Fine Rotations

While it is unlikely that (5.5) is satisfied for a given θ∈[0,π/4], i.e., $\bar\theta$∈[0,1], if we let B>N/3 be the number of bits in $\bar\theta$, then we can express $\bar\theta = \bar\theta_M + \bar\theta_L$ where $$\bar\theta_M = d_1 2^{-1} + \ldots + d_{N/3} 2^{-N/3} \quad (5.13)$$

$$\bar\theta_L = d_{N/3+1} 2^{-N/3-1} + \ldots + d_B 2^{-B} \quad (5.14)$$

with $d_i \in \{0,1\}$. Next we define $\theta_M = (\pi/4)\bar\theta_M$ and $\theta_L = (\pi/4)\bar\theta_L$. Clearly, with πn/4<1 and from (5.14), $\theta_L$ satisfies (5.5).

If we substitute $\theta = \theta_M + \theta_L$ for φ in (5.1) and expand $\cos(\theta_M + \theta_L)$ and $\sin(\theta_M + \theta_L)$, we obtain:

$$X = X_1 \cos\theta_L - Y_1 \sin\theta_L$$
$$Y_1 = Y_0 \cos\theta_L + X_1 \sin\theta_L \quad (5.15)$$

and $$X_1 = X_0 \cos\theta_M - Y_0 \sin\theta_M$$
$$Y_1 = Y_0 \cos\theta_M + X_0 \sin\theta_M. \quad (5.16)$$

Now the rotation (5.1) is decomposed into two stages: a coarse rotation (5.16) by $\theta_M$ followed by a fine rotation (5.15) by $\theta_L$. With this partitioning (5.5) and (5.6) can be applied to the fine stage:

$$X = X_1(1 - \theta_L^2/2) - Y_1\theta_L$$
$$Y = Y_1(1 - \theta_L^2/2) + X_1\theta_L. \quad (5.17)$$

A benefit of this partitioning is that the functions $\cos\theta_M$ and $\sin\theta_M$ in (5.16) depend only on the N/3 most significant bits of the angle $\bar\theta$, where $\theta=(\pi/4)\bar\theta$. They can be stored in a small lookup table. This results in a significant ROM size reduction. However, the approximation (5.6) introduces additional error. We now seek to achieve an overall precision comparable to that in the implementation having one stage and a large ROM table.

Defining the approximation errors $\Delta_{\sin\theta_L} = \sin\theta_L - \theta_L$ and $\Delta_{\cos\theta_L} = \cos\theta_L - (1 - \theta_L^2/2)$, and neglecting terms that are products of error terms or products of an error term and sin $\theta_L$, which is always small, we calculate the total error in X as the difference between X calculated using (5.15) and (5.16) and X calculated using quantized $\sin\theta_M$ and $\cos\theta_M$, and in (5.16) and using (5.17) instead of (5.15). We obtain:

$$\Delta_x = X_0(\Delta_{\cos\theta_M}\cos\theta_L + \Delta_{\cos\theta_L}\cos\theta_M - \Delta_{\sin\theta_L}\sin\theta_M)$$
$$-Y_0(\Delta_{\sin\theta_M}\cos\theta_L + \Delta_{\cos\theta_L}\sin\theta_M - \Delta_{\sin\theta_L}\cos\theta_M) \quad (5.18)$$

Comparing this error estimate with (5.3) and (5.4) it is evident that, so long as the errors due to $\Delta_{\cos\theta}$ and $\Delta_{\sin\theta_L}$ are sufficiently small, the error $\Delta_X$ in (5.18) can be made comparable to that of (5.4) by reducing the $\Delta_{\cos\theta_M}$ and $\Delta_{\sin\theta_M}$ values, i.e., by increasing the number of bits in the sine/cosine samples stored in the ROM. For example, if we add one more bit to the sine/cosine samples, then $|\Delta_{\cos\theta_M}| < 2^{-N-1}$ and $|\Delta_{\sin\theta_M}| < 2^{-N-1}$. Therefore, from (5.18), we have $$|\Delta_x| < |X_0|(2^{-N-1} + 2^{-4N/3}/24 + 2^{-N}/6) + |Y_0|(2^{-N-1} + 2^{-4N/3}/24 + 2^{-N}/6) = (|X_0| + |Y_0|)2^{-N}(1/2 + 1/6 + (1/24)^{-N/3}) \quad (5.19)$$

which is smaller than (5.4). A similar relationship can be found for $\Delta_y$. This demonstrates that, if we add one more bit of precision to the ROM for the coarse stage, we can achieve the same precision as that in the one-stage case, but with a significantly smaller ROM.

A straightforward implementation of this method is illustrated by the angle rotator 3800 in FIG. 38. The angle rotator 3800 includes a ROM 3802, butterfly circuits 3806 and 3810, and fine adjustment circuit 3804.

The ROM 3802 stores the $\cos\theta_M$ and $\sin\theta_M$ values, where $\theta_M$ is the most significant part of the input angle θ. In embodiments the input angle θ is normalized and represented by a binary number, so that $\theta_M$ is the most significant word of the binary number, and $\theta_L$ is the least significant word of the binary number.

The first butterfly circuit 3806 multiplies the input complex number 3812 by the $(\cos\theta_M)^+$ and the $(\sin\theta_M)^+$ to perform a coarse rotation, where the ( )⁺ denotes that the appropriate ROM quantization errors have been added to the $\cos\theta_M$ and $\sin\theta_M$, by the adders 3814.

The fine adjustment circuit 3804 generates a fine adjust value $(1-\tfrac{1}{2}\theta_L^2)$, where $\theta_L$ is the least significant word of the input angle $\theta$.

The second butterfly circuit 3810 multiples the output of circuit 3806 by $\theta_L^+$ and the fine adjustment value from circuit 3804, to perform a fine rotation that results in the rotated complex number 3814. The+on the $\theta_L^+$ denotes the that an error value $\Delta_{\sin\theta_L}$ has been added to improve the accuracy of the fine rotation.

The three error sources $\Delta_{\cos\theta_M}$, $\Delta_{\sin\theta_M}$ and $\Delta_{\sin\theta_L}$ are shown. The much smaller error source $\Delta_{\cos\theta_L}$ has been neglected. The thick line depicts the path along which the ROM quantization error $\Delta_{\cos\theta_M}$ propagates to X. The error $\Delta_{\cos\theta_M}$ is multiplied by $X_0$ and then by $\cos\theta_L$ as it propagates along this path to become $\Delta_{\cos\theta_M} X_0 \cos\theta_L$ when it reaches the output. This matches the error term in (5.18) obtained from our calculation. In subsequent discussions we will use this graphical approach to find the error at the output due to various error sources.

The ROM table 3802 in the rotator 3800 contains many fewer sine/cosine samples in comparison to the number of samples needed to implement (5.1) using a conventional (single stage) table-lookup approach. Although the approximation (5.6) introduces additional error, so long as that error is smaller than the conventional ROM quantization error, we can increase the precision of the samples in our small ROM table such that, overall, precision is not sacrificed. In principle, we can reduce the hardware complexity significantly in one block of our structure, with the corresponding accuracy loss compensated by higher precision from another block, and at the cost of a slight increase in the complexity of that block. As a result, the complexity of the overall structure is reduced without loss of accuracy. We will now exploit this idea again to further reduce the computational complexity.

5.2 Simplification of the Coarse Stage

The coarse stage, according to (5.16), involves multiplications of input data $X_0$ and $Y_0$ by the $\cos\theta_M$ and $\sin\theta_M$ values. Writing $\sin\theta_M$ as the binary number $$\sin\theta_{M=0}.b_1\ldots b_{N/3}b_{N/3+1}\ldots \qquad (5.20)$$

where $b_n \in \{0,1\}$, we now round $\sin\theta_M$ upward, to obtain an (N/3+1)-bit value $[\sin\theta_M]$, as $$[\sin\theta_M]=0.b_1\ldots b_{N/3}b_{N/3+1}+2^{-(N/3+1)}, \qquad (5.21)$$

where N represents the number of bits in the real part and the imaginary part of the input complex number. In other words, the real part has Nbits, and the imaginary part has N bits. Letting $\theta_1$ be the angle for which $$\sin\theta_1=[\sin\theta_M] \qquad (5.22)$$

we must have $\theta_1 \geq \theta_M$. Next we can compute the corresponding $\cos\theta_1$ value. Using $\sin\theta_1=[\sin\theta_M]$ and $\cos\theta_1$ values, we actually rotate the point having coordinate $(X_0, Y_0)$ by $\theta_1$, instead of $\theta_M$, as $$X_1=X_0\cos\theta-Y_0\sin\theta$$

$$Y_1=Y_0\cos\theta_1+X_0\sin\theta_1. \qquad (5.23)$$

Since $\theta_1=\arcsin([\sin\theta_M])$ and, of course, $\theta_M=\arcsin(\sin\theta_M)$, applying the mean value theorem we have $$\frac{\theta_1-\theta_M}{[\sin\theta_M]-\sin\theta_M}=a\sin'\xi=\frac{1}{\sqrt{1-\xi^2}} \qquad (5.24)$$

where $\xi$ satisfies $\sin\theta_M \leq \xi \leq [\sin\theta_M]$. Since $\sin\theta_M \leq 1/\sqrt{2}$, according to (5.21) we must have $$\xi \leq [\sin\theta_M] \leq \sin\theta_M + 2^{-(N/3+1)} \leq \frac{1}{\sqrt{2}} + 2^{-(N/3+1)}. \qquad (5.25)$$

For most applications, $N \geq 9$. Thus, according to (5.25), we have $\xi \leq 0.7696$. Applying this value to (5.24), $$\theta_1-\theta_M \leq \frac{1}{\sqrt{1-0.7696^2}} \times ([\sin\theta_M]-\sin\theta_M) \leq 1.566 \times 2^{-(n/3+1)}. \qquad (5.26)$$

Because $0 \geq \theta_M \geq \pi/4$, we have, for $N \leq 12$, that $$0 \leq \theta_1 \leq 0.0978+\pi/4=0.8832. \qquad (5.27)$$

The resulting fine-stage angle is $\theta-\theta_1$, instead of $\theta_L=\theta-\theta_M$. Thus, as in (Madisetti, A., "VLSI architectures and IC implementations for bandwidth efficient communications," Ph.D. dissertation, University of California, Los Angeles (1996)), a modified fine-stage angle compensates for a simplified coarse-stage angle. Since $\sin\theta_1=[\sin\theta_M]$, by rotating by $\theta_1$, the (N/3+1)-bit number $\sin\theta_1$ decreases the number of partial products needed in computing $X_0\sin\theta_1$ and $Y_0\sin\theta_1$ to just over a third of those needed for $X_0\sin\theta_M$ and $Y_0\sin\theta_M$. This simplifies the computation in (5.23). However, if we can also reduce the multiplier size in computing $X_0\cos\theta_1$ and $Y_0\cos\theta_1$, we can further simplify (5.23). Certainly, truncating the $\cos\theta_1$ value would reduce the number of partial products in computing $X_0\cos\theta_1$ and $Y_0\cos\theta_1$. Let us truncate $\cos\theta_1$ to 2N/3 bits to obtain [$\cos\theta_1$]. Then, $$0 \leq \Delta_{\cos 1}=\cos\theta_1-[\cos\theta_1]<2^{-2N/3} \qquad (5.28)$$

We now have $$X_1=X_0[\cos\theta_1]-Y_0\sin\theta_1$$

$$Y_1=Y_0[\cos\theta_1]+X_0\sin\theta_1. \qquad (5.29)$$

Apparently, by truncating $\cos\theta_1$, smaller multipliers are needed. But the amount of rotation is no longer $\theta_1$. We now examine the effect on $\theta_1$ of using the truncated value [$\cos\theta_1$] instead of $\cos\theta_1$ as $$\theta_m=a\tan\frac{\sin\theta_1}{[\cos\theta_1]}. \qquad (5.30)$$

First, we determine how $\theta_m$ is different from $\theta_1$ due to the truncation of $\cos\theta_1$. Letting $\cos\theta_1$ and [$\cos\theta_1$] denote specific values of a variable z we consider the function $$\Theta(z)=a\tan\frac{\sin\theta_1}{z}. \qquad (5.31)$$

Hence, $\theta_1$ and $\theta_m$ are the $\Theta(z)$ values corresponding to $z_1 = \cos \theta_1$ and $Z_2 = [\cos \theta_1]$, i.e., $\theta_1 = \Theta(z_1)$ and $\theta_m = \Theta(z_2)$. According to the mean value theorem, we have $$\frac{\Theta(z_1) - \Theta(z_2)}{z_1 - z_2} = \Theta'(\xi) \qquad (5.32)$$

or $$\frac{\theta_1 - \theta_m}{\cos\theta_1 - [\cos\theta_1]} = a\tan'\frac{\sin\theta_1}{\xi} \qquad (5.33)$$

where $[\cos \theta_1] \le \xi \le \cos \theta_1$. The negation of the derivative $a\tan'$ $$\frac{A}{\xi}$$

satisfies $$-a\tan'\frac{\sin\theta_1}{\xi} = \qquad (5.34)$$

$$-\frac{\frac{\sin\theta_1}{\xi^2}}{1 + \left(\frac{\sin\theta_1}{\xi}\right)^2} = \frac{\sin\theta_1}{(\sin\theta_1)^2 + \xi^2} \le \frac{\sin\theta_1}{(\sin\theta_1)^2 + [\cos\theta_1]^2}.$$

According to (5.27), for $N \ge 9$ we have $$0 \le \sin \theta_1 \le 0.7727$$

$$0.6347 \le \cos \theta_1 \le 1$$

$$0.6406 < [\cos \theta_1] \le 1. \qquad (5.35)$$

Since $[\cos \theta_1] = \cos \theta_1 - \Delta_{\cos \theta_1}$ from (5.28) we also have $$(\sin\theta_1)^2 + [\cos\theta_1]^2 = (\sin\theta_1)^2 + (\cos\theta_1 - \Delta_{\cos\theta_1})^2 \qquad (5.36)$$

$$= 1 - 2\cos\theta_1 \Delta_{\cos\theta_1} + \Delta_{\cos\theta_1}^2 > 1 - 2^{-N/3+1}$$

Combining (5.35) and (5.36), one can verify, for $N \ge 9$, that (5.34) satisfies $$-a\tan'\frac{\sin\theta_1}{\xi} < 0.7976. \qquad (5.37)$$

Thus, according to (5.28) and (5.33), we have $$\theta_m - \theta_1 < (\cos\theta_1 - [\cos\theta_1])_D \times 0.7976 \le 0.7976 \times 2^{-2N/3}. \qquad (5.38)$$

Combining (5.26) and (5.38), and for $N \ge 9$, we have $$0 \le \theta_m - \theta_M \le 1.566 \times 2^{-(N/3+1)} + 0.7976 \times 2^{-2N/3} < 0.8827 \times 2^{-N/3}. \qquad (5.39)$$

This is the amount of coarse rotation error, due to coarse-stage simplifications, that a modified fine stage must compensate. Let us examine the bound on the fine-stage angle.

Now, the fine rotation angle is $\theta_1 = \theta - \theta_m$ instead of $\theta_L$. If $\theta_1$ satisfies $$|\theta_1| < 2^{-N/3} \qquad (5.40)$$

then we have $|\sin \theta_1 - \theta_1 \theta| < 2^{-N}/6$. That is, the approximations $\sin \theta_1 \approx \theta_1$ and $\cos \theta_1 \approx 1 - \theta_1^2/2$ can be applied as discussed in Section 5.1. Let us now examine the bound on $\theta_1$. By definition, $$0 \le \theta_L = \frac{\pi}{4}\overline{\theta}_L < 0.7854 \times 2^{-N/3}. \qquad (5.41)$$

Therefore, subtracting (5.39) from (5.41) yields $$-0.8827 \times 2^{-N/3} < \theta_L - (\theta_m - \theta_M) < 0.7854 \times 2^{-N/3} \qquad (5.42)$$

which implies (5.40) because $$\theta_1 = \theta - \theta_m = \theta_M + \theta_L = \theta_L - (\theta_m - \theta_M). \qquad (5.43)$$

Hence, no lookup table is needed for the fine stage.

Next, we examine the magnitude of the complex input sample after rotation. One can verify from (5.29) that $$X_1^2 + Y_1^2 = (X_0^2 + Y_0^2)([\cos \theta_1]^2 + (\sin \theta_1)^2) \qquad (5.44)$$

Since $[\cos \theta_1]$ is obtained by truncating $\cos \theta_1$, we must have $0 \le [\cos \theta_1] \le \cos \theta_1$, thus $$[\cos \theta_1] + (\sin \theta_1)^2 \le (\cos \theta_1) + (\sin \theta_1)^2 = 1. \qquad (5.45)$$

Therefore, $$X_1^2 + Y_1^2 \le \theta_0^2 + Y_0^2. \qquad (5.46)$$

To maintain the magnitude, the result $X_1$ and $Y_1$ must then be multiplied by $$1 / \sqrt{[\cos\theta_1]^2 + (\sin\theta_1)^2}.$$

We define a new variable $\delta_{[\cos \theta_1]}$ such that $$\frac{1}{\sqrt{[\cos\theta_1]^2 + (\sin\theta_1)^2}} = 1 + \delta_{[\cos\theta_1]}. \qquad (5.47)$$

Since $$\sqrt{(\cos\theta_1) + (\sin\theta_1)^2} = 1,$$

and $[\cos \theta_1]$ is very close to $\cos \theta_1$ because of (5.28), we have that $$\sqrt{[\cos\theta_1]^2 + (\sin\theta_1)^2}$$

is very close to 1. Thus, the $\delta_{[\cos \theta_1]}$ value must be very small. We now examine the bound on $\delta_{[\cos \theta^1]}$. We can write $$1 / \sqrt{[\cos\theta_1]^2 + (\sin\theta_1)^2}$$

as $$\frac{1}{\sqrt{[\cos\theta_1]^2 + (\sin\theta_1)^2}} = \sqrt{\frac{(\cos\theta_1)^2 + (\sin\theta_1)^2}{[\cos\theta_1]^2 + (\sin\theta_1)^2}}. \qquad (5.48)$$

Substituting (5.28) into (5.48), we have $$\frac{1}{\sqrt{[\cos\theta_1]^2 + (\sin\theta_1)^2}} = \sqrt{1 + \frac{2[\cos\theta_1]\Delta_{\cos\theta_1} + \Delta_{\cos\beta_1}^2}{[\cos\theta_1]^2 + (\sin\theta_1)^2}}. \quad (5.49)$$

Because (5.28) and (5.35) imply that $\Delta A_{\cos\theta_1} \ll [\cos\theta_1]$, we have $\Delta^2_{\cos\theta_1} \ll [\cos\theta_1]^2_{\cos\theta_1}$, hence we can omit $\Delta^2_{\cos\theta_1}$ in (5.49). Defining $$\delta = \frac{[\cos\theta_1]\Delta_{\cos\theta_1}}{[\cos\theta_1]^2 + (\sin\theta_1)^2} \quad (5.50)$$

then (5.49) becomes $$\sqrt{1+2\delta}.$$

From (5.28) and (5.35) we must have $\delta \geq 0$. Applying the mean-value theorem to $$\sqrt{1+2\delta},$$

we have $$\frac{\sqrt{1+2\delta}-\sqrt{1+0}}{\delta - 0} = \frac{1}{\sqrt{1+2\zeta}} \leq 1 \quad (5.51)$$

where $0 \leq \zeta \leq \delta$. Hence, $$\sqrt{1+2\delta} \leq 1 + \delta \quad (5.52)$$

According to (5.35), $$\frac{[\cos\theta_1]}{[\cos\theta_1]^2 + (\sin\theta_1)^2} < 1 \quad (5.53)$$

and therefore, from (5.28) and (5.50), we have $0 \leq \delta < 2^{-2N/3}$.

By definition, in (5.47), we have $$\sqrt{1+2\delta} = 1 + \delta_{[\cos\theta_1]}.$$

Thus $\delta_{[\cos\theta_1]} \leq \delta$, Hence $\delta_{[\cos\theta_1]}$ is bounded by $$0 \leq \delta_{[\cos\theta_1]} < 2^{-2N/3}. \quad (5.54)$$

According to (5.40) and (5.54), instead of storing the sin $\theta_M$ and cos $_M$ values in ROM, we may store sin $\theta_1$, which has $N/3+1$ bits for each sample, and $[\cos\theta_1]$, which has $2N/3$ bits. Given $\bar{\theta}$, the sin $\theta_1$ and $[\cos\theta_1]$ values are retrieved from the ROM to be used in performing the coarse rotation. Since the actual angle $\theta_m$ differs from the $\theta_M = (\pi/4)\bar{\theta}_M$, we must also store the $\theta_M - \theta_m$ values, so that the fine stage can compensate for the difference. The approximations (5.6) and (5.7) still apply to $\theta_1$, in view of (5.40). In addition, the change of magnitude in the rotation using the sin $\theta_1$, and $[\cos\theta_1]$ values, as seen in (5.45), must also be compensated. Therefore we store the $\delta_{[\cos\theta_1]}$ values in order to scale the coarse-stage output by $1+\delta_{[\cos\theta_1]}$.

We can now implement the coarse rotation stage as in (5.29). Later we will show that the scale factor $1+\delta_{[\cos\theta_1]}$ can be combined with the scaling that will be done for the second stage (i.e., the fine stage) at its output.

To compute $\theta_1$ we must first convert the normalized $\bar{\theta}_L$ value to the radian value $\theta_L$, which involves a multiplication by $\pi/4$. Since $\pi/4 = 2^{-1}+2^{-2}+2^{-5}+2^{-8}+2^{-13}+\ldots$, if we multiply $0 + \leq \bar{\theta}_L < 2^{-N/3}$ by $(2^{-1}+2^{-2}+2^{-5}+2^{-8})$, this product and $(\pi/4)\bar{\theta}_L$ differ by no more than $2^{-12} \times 2^{-N/3} = 2^{(N/3+12)}$, which is sufficiently small for a 12-bit system. (And two more bits would suffice for building a 16-bit system.)

5.3 Reduction of Multiplier Size in the Fine Stage

In the fine rotation stage, the computations involved in generating $X_2$ are $$X_2 = X_1(1-\theta_1^2/2) - Y_1\theta_1$$

$$= X_1 - (\theta_1^2/2)X_1 - Y_1\theta_1. \quad (5.55)$$

Since $|\theta_1| < 2^{-N/3}$ it follows that $\theta_1$ can be expressed as $$\theta_1 = s.s \ldots s\,\theta_{N/3+1} \ldots \theta_{2N/3}\theta_{2N/3+1} \ldots \quad (5.56)$$

where s is the sign bit. The $N/3$ MSBs do not influence the result. This property helps to reduce the size of the multipliers that implement (5.55). Even more savings in hardware can be achieved by further reducing multiplier size, with just a small loss of accuracy.

Let $[Y_1]$ represent the $2N/3$ MSBs of $Y_1$ as in $$Y_1 = s \cdot Y_1 \ldots Y_{2N/3}Y_{2N/3+1} \ldots = [Y_1] + \Delta_{Y_1}. \quad (5.57)$$

Then we must have $|\Delta_{Y_1}| < 2^{-2N/3}$ The error contributed to the product $Y_1\theta_1$ by using $[Y_1]$ instead of $Y_1$ is $$|Y_1\theta_1 - [Y_1]\theta_1| = |\Delta_{Y_1}\theta_1| < 2^{-N}. \quad (5.58)$$

Therefore, for N-bit precision, the multiplication $Y_1\theta_1$ can be accomplished with a $(2N/3) \times (2N/3)$ multiplier.

This method can be applied to the computation of $\theta_1^2/2$. Defining $[\theta_1]$ as the $2N/3$ MSBs of $\theta_1$, and letting $\Delta_{\theta_1}$ denote the remaining LSBs, we have $$[\theta_1] = s.s \ldots s\theta_{N/3+1} \ldots \quad (5.59)$$

and $$\Delta_{\theta_1} = \theta_{2N/3+1} \ldots \quad (5.60)$$

The error in calculating $\theta_1^2/2$ using $[\theta_1]$ instead of $\theta_1$ is $$|([\theta_1]+\Delta_{\theta_1})^2 - [\theta_1]^2/2| \approx |[\theta_1]\Delta_{\theta_1}| < 2^{-N}. \quad (5.61)$$

Thus $\theta_1^2$ can be implemented with an $(N/3) \times (N/3)$ multiplier, since the $N/3$ MSBs of $[\theta_1]$ are just sign-bits.

5.4 Scaling Multiplier Simplification

As mentioned in Section 5.2, the scale factor $1+\delta_{\cos\theta_1}$ can be applied at the output of the fine stage. A straightforward implementation would use the full wordlength of $1+\delta_{[\cos\theta_1]}$ in the product $X = X_2 (1+\delta_{[\cos\theta_1]})$ which would require a multiplier of size $N \times N$. But this multiplier's size can be reduced as follows: According to (5.54), $0 \leq \delta_{[\cos\theta_1]} < 2^{-2N/3}$. Moving the factor $1+\delta_{[\cos\theta_1]}$ into the fine stage, we have $$X_2 = X_1(1-\theta_1^2/2)(1+\delta_{[\cos\theta_1]}) - Y_1\theta_1(1+\delta_{[\cos\theta_1]}) \quad (5.62)$$

$$= X_1 + X_1(\delta_{[\cos\theta_1]} - \theta_1^2/2) - Y_1\theta_1. \quad (5.63)$$

The only significant error in approximating (5.62) by (5.63) is the absence of the $\theta_1\delta_{[\cos\theta_1]}$ term in the factor multiplying $Y_1$. But this is tolerable since, according to (5.54) and (5.40), $$|\theta_1\delta_{[\cos\theta_1]}| < 2^{-N}. \quad (5.64)$$

In view of (5.40) we have $0 \leq \theta_1^2 < 2^{-2N/3}$ which, combined with (5.54), yields $$|\theta_{[\cos \theta_1]} - \theta_1^2/2| 2^{-2N/3}. \quad (5.65)$$

Thus, if we truncate $\delta_{\cos \theta_m} - \theta_1^2/2$ to N bits, only the least significant N/3 bits in the truncated result will be non-sign bits. Therefore, in our computation of $X_1(\delta_{\cos \theta_m} - \theta_1^2/2)$ in (5.63), if we truncate $X_1$ to N/3 bits, we can use an (N/3)×(N/3) multiplier, with the product's error bound being $$|\delta_{[\cos \theta_1]} - \theta_1^2/2| 2^{-N/3} < 2^{-N}. \quad (5.66)$$

By merging the scale factor of the coarse stage into the fine stage, we thus replace multiplications by the scale factor by additions. The final architecture is shown in FIG. 39, where the size of the multipliers is shown in FIG. 40.

FIG. 39 illustrates an angle rotator 3900 according to embodiments of the invention. The angle rotator 3900 includes a ROM 3902, a fine adjustment circuit 3904, a first butterfly circuit 3908, and a second butterfly circuit 3910. The angle rotator 3900 rotates an input complex signal 3906 according to angle θ to produce a rotated complex output signal 3912. The angle θ can be broken down into a most significant portion (or word) $\theta_M$ and least significant portion (word) $\overline{\theta}_L$. Note that normalized angle values are shown in FIG. 39, as represented by the $\overline{\theta}$ nomenclature. However normalized angle values are not required, as will be understood by those skilled in the arts.

The ROM 3902 stores the following for each corresponding $\overline{\theta}$: $\sin \theta_1$, $[\cos \theta_1]$, $\delta_{[\cos \theta_1]}$ and $\theta_M - \theta_m$, where all of these values have been exactly defined in preceding sections. To summarize, the $\sin \theta_1$ and $[\cos \theta_1]$ values are MSBs of $\sin \theta_M$ and $\cos \theta_1$, respectively. The $\delta_{[\cos \theta_1]}$ error value represents the difference between the $\cos \theta_M$ and the $[\cos \theta_1]$ value. (The exact definition for $\delta_{[\cos \theta_1]}$ is given in (5.47)) Likewise, the $(\theta_M - \theta_m)$ error value represents the difference between $\sin \theta_M$ and the $\sin \theta_1$ value. (The exact definition for $\theta_m$ is given in equation (5.30))

The butterfly circuit 3908 includes multiple multipliers and adders as shown. The implementation of these multipliers and adders is well known to those skilled in the arts. In embodiments, the sizes of the multipliers and adders are as shown in FIG. 40. Note that savings are obtained on the size of the multipliers because of bit truncated approximations that are described above. This produces a faster and more efficient angle rotator compared to other angle rotator schemes.

The operation of the angle rotator 3900 is further described in reference to the flowchart 4100. As with all flowcharts herein, the order of the steps is not limiting, as one or more steps can be performed simultaneously (or in a different order) as will be understood by those skilled in the arts.

In step 4102, the input complex signal is received.

In step 4104, the $\sin \theta_1$, $\cos [\theta_1]$, $\delta_{[\cos \theta_1]}$, and $\theta_M - \theta_m$ values are retrieved from the ROM 3902, based on the rotation angle θ.

In step 4106, the butterfly circuit 3908 multiplies the input complex signal by the $\sin \theta_1$ and $[\cos \theta_1]$ values to perform a coarse rotation of the input complex signal, resulting in an intermediate complex signal at the output of the butterfly circuit 39081

In step 4108, the adder 3914 adds the $\theta_L$ value to the error value $\theta_M - \theta_m$ to produce a $\theta_1$ angle.

In step 4110, a fine adjustment circuit 3904 generates a fine adjust value $$\left(\delta_{[\cos \theta_1]} - \frac{1}{2}\theta_l^2\right)$$

based on the $\theta_l$ angle and $\delta_{[\cos \theta_l]}$.

In step 4112, the butterfly circuit 3910 multiplies the intermediate complex signal by the $\theta_l$ angle, and the fine adjustment value $$\left(\delta_{[\cos \theta_1]} - \frac{1}{2}\theta_l^2\right)$$

to perform a fine rotation of the intermediate complex number, resulting in the output complex signal 3912.

In embodiments, the ROM 3902 storage space is $2^{N/3}$ words, where N is the bit size of the real or imaginary input complex number 3906. Therefore, the overall size o f the ROM 3902 c an be quite small compared with other techniques. This occurs because of the two-stage coarse/fine rotation configuration of the angle rotator 3900, and saving of storing $\sin \theta_1$, $[\cos \theta_1]$ instead of $\sin \theta$ and $\cos \theta$. Also, there is another advantage to having a small ROM: in certain technologies it is awkward to implement a ROM. Thus, if only a small ROM is needed, it is possible to implement the ROM's input/output relationship by combinatorial logic circuits instead of employing a ROM. Such circuits will not consume an unreasonable amount of chip area if they need only be equivalent to a small ROM.

5.5 Computational Accuracy and Wordlength

In this section we study the effect of quantization errors on the final output's computational accuracy and the most efficient way to quantize the data for a given accuracy.

In our algorithm, the errors can be classified into three categories. The first category is the quantization of the values in the ROM table. The second category is the error due to the truncation of data before multiplications, to reduce multiplier size. The third type of error is that resulting from approximating $\sin \theta_1$ by $\theta_1$. Quantization errors are marked in FIG. 40 with an $\epsilon$ marker as shown. The total error can be obtained by combining the errors propagated from each source. To calculate the propagated error at the output with a given error at the source, we can first identify all paths by which the error reaches the output and then use the approach discussed in Section 5.1.3. Let us first examine all the error sources and determine their effects on X, which is the real component of the output complex signal 3912. Table 5.1 displays this information. (Similar results apply to Y.)

The values stored in the ROM are $\sin \theta_1$, $[\cos \theta_1]$, $\theta_M - \theta_m$ and $\delta_{[\cos \theta_1]}$, where $\sin \theta_1$ and $[\cos \theta_1]$ are MSBs of $\sin \theta_M$ and $\cos \theta_1$, respectively. A loss of precision due to ROM quantization error depends only on the number of bits used in representing $\theta_M - \theta_m$ and $\delta_{[\cos \theta_1]}$.

TABLE 5.1

Effect of errors at the X output

| | Error source | Error at the output |
|---|---|---|
| $\epsilon_1$ | quantizing $(\theta_M - \theta_m)$ in ROM | $Y_1 \epsilon_1$ |
| $\epsilon_2$ | quantizing $(\delta_{[\cos \theta_1]})$ in ROM | $Y_1 \epsilon_2$ |
| $\epsilon_3$ | truncating $Y_1$ for $Y_1 \theta_1$ | $-\theta_1 \epsilon_3$ |

TABLE 5.1-continued

Effect of errors at the X output

| Error source | | Error at the output |
|---|---|---|
| $\epsilon_4$ | $\left[X_1\left(\delta_{[\cos\theta_1]} - \frac{\theta_l^2}{2}\right)\right]$ | $\left(\delta_{[\cos\theta_1]} - \frac{\theta_l^2}{2}\right)\epsilon_2$ |
| $\epsilon_5$ | truncating $\theta_l$ for $\theta_l^2$ | $-\theta_l X_1 \epsilon_5$ |
| $\epsilon_6$ | $\left[X_1\left(\delta_{[\cos\theta_1]} - \frac{\theta_l^2}{2}\right)\right]$ | $Y_1 \epsilon_6$ |
| $\epsilon_7$ | $\left(\frac{\pi}{4}\right)\theta_L$ | $Y_1 \epsilon_7$ |
| $\epsilon_8$ | quantizing X at the output | $\epsilon_8$ |
| $\epsilon_9$ | approximating $\sin\theta_l$ by $\theta_l$ | $\left(\frac{\theta_l^3}{6}\right)$ |
| $\epsilon_{10}$ | neglecting $\delta_{[\cos\theta_1]}\theta_1$ in (5.62) | $Y_1(\delta_{[\cos\theta_1]}\theta_1)$ |

The total error in X can be obtained by combining all the terms in the third column of Table 5.1:

$$Y_1(\epsilon_1 + \epsilon_7) + Y_1\theta_l\left(\frac{\theta_l^2}{6} - \delta_{[\cos\theta_1]}\right) + \tag{5.67}$$

$$X_1(\epsilon_2 + \epsilon_6) - X_1\theta_l\epsilon_5 - \theta_l\epsilon_3 + \left(\delta_{\cos\theta_m} - \frac{\theta_l^2}{2}\right)\epsilon_4 + \epsilon_8$$

Since $\epsilon_6$ in Table 5.1 is a truncation error, we have $\epsilon_6 \geq 0$. If we quantize $\delta_{[\cos\theta_1]}$ by rounding it upward before storing it in ROM, then $\epsilon_2 \leq 0$. This way such errors tend to cancel each other. Cancelling errors are grouped together in (5.67) since the magnitude of their combined error is no greater than the larger of the two. This yields seven terms in (5.67), each contributing a maximum possible error of $2^{-N}$. If the multiplier sizes are as indicated in FIG. 40, the total error in X is bounded by $7 \times 2^{-N}$.

From the above analysis it can be seen that the computation errors resulting from hardware reduction have similar magnitudes and no particular source dominates. This seems to provide the best trade-off between the hardware complexity and the accuracy of the entire system.

According to (5.67), the total output error can be reduced by increasing the internal data wordlength and the wordlength of each sample in the ROM. For each bit increase, we get one more bit of precision at the output. Therefore, we can design the processor to have the minimum hardware for a given precision requirement. Next, we give a simulation example to illustrate this method.

Example

A cosine waveform with an error less than $2^{-12}$ is specified. According to (5.67), we chose N=15, as indicated in FIG. 40. We obtained the maximum error to be approximately $5 \times 10^{-5}$, which is considerably smaller than $2^{-12}$.

In FIG. 40, the ROM is shown as having $$2^{\frac{N}{3}}$$

words to achieve no more than a total error of $7 \times 2^{-N}$ in the X output. If N is not a multiple of 3, we can choose the smallest N'>N that is a multiple of 3. Having $$2^{\frac{N'}{3}}$$

words in ROM, of course, suffices to achieve the required precision. As discussed before, the total output error is a combination of errors from various sources, such as from quantizing the data before multiplications and from approximating $\sin\theta_l$ by $\theta_l$, etc. However, our error bound estimation is rather conservative. Hence, the ROM size can be perturbed to determine the minimum size to satisfy a specific precision requirement. Our experience in designing the angle-rotation processor has shown that, even by rounding $$\frac{N}{3}$$

down to determine the ROM size, the total error is still less than $7 \times 2^{-N}$.

5.6 Comparison With the Single-stage Mixer

As mentioned earlier, the main advantage of the two-stage angle rotator is that it requires only a small ROM 3902. For the single-stage angle rotation, the ROM size grows exponentially with the precision of the angle. Thus, our two-stage method is well-suited for applications where more than 14 bits in the input angle are required. In this case, the sine lookup table for the single-stage angle-rotator, even with compression, is too large for high-speed operations (Vankka, J., "Methods of mapping from phase to sine amplitude in direct digital synthesis," *IEEE Trans. Ultrasonics, Ferroelectronics and Freq. Control* 44:526–534 (1997)). However, the following comparison of our method to a well-known single-stage method with 14-bit input angle shows that even in this case our method has advantages, and this is true even when the single-stage method is optimized for that particular precision requirement.

To compare, we use the quadrature direct digital frequency synthesizer/mixer (QDDFSM) with 14-bit input angle and 12-bit input data that is reported in (Tan, L. and Samueli, H., "A 200-MHz quadrature frequency synthesizer/mixer in 0.8-μm CMOS," *IEEE J. Solid-State Circuits* 30:193–200 (1995)). It achieves 84.3 dB spurious free dynamic range (SFDR). According to this method, the sine and cosine values are generated using a DDFS, which employs lookup tables for these values. To reduce the ROM size, ROM compression techniques are used. The DDFS is followed by four 12×12 real multiplications.

For our structure, we chose the internal wordlengths and multiplier sizes as indicated in FIG. 42. The phase-accumulator that generates $\bar{\theta}$ as well as the circuit that maps an angle in the range $[0, 2\pi]$ into $[0, \pi/4]$, are described in (Madisetti, A., "VLSI architectures and IC implementation for bandwidth efficient communications," Ph.D. dissertation, University of California, Los Angeles (1996)). These structures are also employed here in our test. Truncating the 32-bit phase word to 14 bits, this structure has achieved a SFDR of 90.36 dB, as shown in FIG. 43. This is 6 dB better than the single stage method.

The integrated circuit that implements this structure is currently being built. A preliminary estimation of its hardware complexity yields a similar transistor count as that of (Tan, L. and Samueli, H., *IEEE J. Solid-State Circuits* 30:193–200 (1995)). Thus, using approximately the same number of transistors, our structure achieves a 6 dB performance gain. Our structure requires a much smaller ROM (17×25 =425 bits) in comparison to the single-stage method, which needs a 3072-bit ROM when the ROM compression technique is employed. Since the ROM access is hard to pipeline, it is usually the bottleneck in the data path, thereby limiting the achievable data rate. Hence, one pronounced benefit of having a much smaller ROM would be the much faster ROM access. Also, there is another advantage to having a small ROM: in certain technologies it is awkward to implement a ROM. Thus, if only a small ROM is needed, it is possible to implement the ROM's input/output relationship by combinatorial logic circuits instead of employing a ROM. Such circuits will not consume an unreasonable amount of chip area if they need only be equivalent to a small ROM.

5.7 A Modified Structure When Only one Output is Needed

In some applications, such as the implementation of the trigonometric interpolator discussed in the previous sections, only one output, say X is needed. In such cases, obviously, we can eliminate certain computations used to generate Y. However, using the angle rotator 3900, only those generating Y in the fine stage are subject to deletion, while the coarse stage must remain the same, since we need both $X_1$ and $Y_1$ to generate the X output. Let us seek to further simplify the coarse stage by attempting to eliminate one multiplication by $\cos \theta_M$.

5.7.1 Modifications to the Coarse Stage

If we factor out the $\cos \theta_M$ term of the coarse stage in (5.16), we can then apply the factor $\cos \theta_M$ to the output of the second stage in (5.17), because the two operations (scaling and rotation) are permutable, to obtain $X_1 = X_0 - Y_0 \tan \theta_M$ $Y_1 = Y_0 + X_0 \tan \theta_M$ (5.68)

$$X = \cos\theta_M \left( X_1 \left(1 - \frac{\theta_L^2}{2}\right) - Y_1 \theta_L \right)$$ (5.69)

$$Y = \cos\theta_M \left( Y_1 \left(1 - \frac{\theta_L^2}{2}\right) + X_1 \theta_L \right)$$

In this case, we have only two multipliers in the coarse stage (5.68), and the multiplications by the scale factor $\theta_M$ are applied to the output of the fine stage (5.69). Unlike the situation in (5.16) and (5.17), if only one output from the angle rotator, say X, is needed, we can also eliminate one more multiplier—the one that multiplies the coarse stage output with the $\cos \theta_M$ factor. As in Section 5.2, we now seek to simplify the coarse stage in (5.68).

Let $\tan \theta_m$ be $\tan \theta_M$ rounded upward at the (N/3)-rd bit. In other words, writing $\theta_M$ as the binary number $\tan \theta_M = 0.b_1 \ldots b_{N/3} b_{N/3+1} \ldots ,$ (5.70)

where $b_n \in \{0, 1\}$, $\tan \theta_m$ is obtained from $\tan \theta_M$ according to $\tan \theta_m = 0.b_1 \ldots b_{N/3} + 2^{-N/3}.$ (5.71)

Obviously, $0 \leq \tan \theta_m - \tan \theta_M \leq 2^{-N/3}.$ (5.72)

The N/3-bit number $\tan \theta_m$ decreases the number of partial products needed in computing $X_0 \tan \theta_m$ and $Y_0 \tan \theta_m$ to at most a third of those needed for $X_0 \tan \theta_M$ and $Y_0 \tan \theta_M$.

The resulting fine-stage angle is $\theta_f = \theta - \theta_m$. Thus, as in Section 5.2, a modified fine-stage angle compensates for a simplified coarse-stage angle. If $\theta_f$ satisfies (5.40), we then have $|\sin \theta_f - \theta_f| < 2^{-N}/6$. That is, the approximations $\sin \theta_f = \theta_f$ and $\cos \theta_f = 1 - \theta_f^2/2$ can be applied. The proof that (5.40) holds is as follows:

Proof: According to the mean value theorem $$\frac{\tan\theta_m - \tan\theta_M}{\theta_m - \theta_M} = \tan'\xi$$ (5.73)

where $\xi = \theta_M + (\theta_m - \theta_M)h$, $0 \leq h \leq 1$. The derivative $\tan'\xi$ satisfies $\tan'\xi = 1 + (\tan \xi)^2 \geq 1$, for every $\xi$. (5.74)

Re-arranging (5.73), and using (5.74), we have $$\theta_m - \theta_M = \frac{\tan\theta_m - \tan\theta_M}{\tan'\xi} \leq \tan\theta_m - \tan\theta_M.$$ (5.75)

Hence, according to (5.72), $0 \leq \theta_m - \theta_M \leq 2^{-N/3}.$ (5.76)

By definition, $0 \leq \theta_L < 2^{-N/3}.$ (5.77)

Therefore, subtracting (5.76) from (5.77) yields $-2^{-N/3} < \theta_L - (\theta_m - \theta_M) < 2^{-N/3}.$ (5.78)

which is exactly (5.40) because $\theta_f = \theta - \theta_m = \theta_M + \theta_L - \theta_m = \theta_L - (\theta_m - \theta_M).$ (5.79)

This concludes our proof

This indicates that, instead of storing the $\tan \theta_M$ values in the ROM, we may store $\tan \theta_m$, which has N/3 bits for each sample, and we may store $\theta_m - \theta_M$. This results in a reduction of the multiplier size in the coarse stage. The difference between $\theta_m$ and $\theta_M$ can be compensated in the following fine rotation stage. Furthermore, the approximations (5.6) and (5.7) still apply to $\theta_f$, in view of (5.40).

We can now implement the coarse rotation stage as follows:

$X_1 = X_0 - Y_0 \tan \theta_m$ $Y_1 = Y_0 + X_0 \tan \theta_m.$ (5.80)

Accordingly, the scale-factor at the output of the fine stage is $\cos \theta_m$ instead of $\cos \theta_M$. Since $\theta_f$ satisfies (5.40), the fine stage simplification is similar to the method described in Section 5.3. Next we examine how the multiplications of the fine-stage output by $\cos \theta_m$ can be simplified.

5.7.2 Scaling Multiplier Simplification

A straightforward implementation would use the full wordlength of $\cos \theta_m$ in the product $X = X_2 \cos \theta_m$, which would require a multiplier of size N×N. But this multiplier's size can be reduced as follows: By defining [$\cos \theta_m$] as the 2N/3+1 MSBs of $\cos \theta_m$ the scale factor can be written as $$\cos\theta_m = [\cos\theta_m] + \Delta_{\cos\theta_m} = [\cos\theta_m]\left(1 + \frac{\Delta_{\cos\theta_m}}{[\cos\theta_m]}\right).$$ (5.81)

Let us define $$\delta_{\cos\theta_m} = \frac{\Delta_{\cos\theta_m}}{[\cos\theta_m]}$$

and, since $0 \leq \theta_m \leq \pi/4$, we surely have $[\cos \theta_m] > 0.5$, and hence $$0 \leq \delta_{\cos\theta_m} < 2 \times 2^{-2N/3-1}. \quad (5.82)$$

Moving the factor $1+\delta_{\cos\theta_m}$ into the fine stage, we have $$X_2 = X_1(1-\theta_I^2/2)(1+\delta_{\cos\theta_m}) - Y_1\theta_I(1+\delta_{\cos\theta_m}) \quad (5.83)$$

$$= X_1 + X_1(\delta\cos\theta_m - \theta_I^2/2) - Y_1\theta_I. \quad (5.84)$$

The only significant error in approximating (5.83) by (5.84) is the absence of the $\theta_I \delta_{\cos_m}$ term in the factor multiplying $Y_1$. But this is tolerable since, according to (5.40) and (5.82), $$|\theta_I \delta_{\cos\theta_m}| < 2^{-N}. \quad (5.85)$$

In view of (5.40) we have $0 \leq \theta_I^2 < 2^{-2N/3}$ which, combined with (5.82), yields $$|\delta_{\cos\theta_m} - \theta_I^2/2| < 2^{-N/3}. \quad (5.86)$$

Thus, if we truncate $\delta_{\cos\theta_m} - \theta_I^2/2$ to N bits, only the least significant N/3 bits in the truncated result will be non-sign bits. Therefore, in our computation of $X_1$ ($\delta_{\cos\theta_m} - \theta_I^2/2$) in (5.84), if we truncate $X_1$ to N/3 bits, we can use an (N/3)×(N/3) multiplier, with the product's error bound being $$|\delta_{\cos\theta_m} - \theta_I^2/2| 2^{-N/3} < 2^{-N}. \quad (5.87)$$

The factorization of $\cos \theta_m$ in (5.81) allows a reduction of the multiplier to approximately ⅔ its original size. In this case, the values of $[\cos \theta_m]$ and $\delta_{\cos\theta m}$ are stored in the ROM instead of $\cos \theta_m$.

The modified structure for one output is illustrated as angle rotator 4400 in FIG. 44. The angle rotator 4400 includes a ROM 4402, a fine adjustment circuit 4404, a first butterfly circuit 4408, and a second butterfly circuit 4410. The angle rotator 4400 rotates an input complex signal 4406 according to angle θ to produce a rotated complex output signal 4412. As with the rotator 3900, the angle θ can be broken down into a most significant portion (or word) $\theta_M$ and least significant portion (word) $\theta_L$. Note that normalized angle values are shown in FIGS. 39, 40, 42, and 44, as represented by the $\overline{\theta}$ nomenclature. However normalized angle values are not required, as will be understood by those skilled in the arts.

The ROM 4402 stores the following for each corresponding normalized θ: $\tan \theta_m$, $[\cos \theta_m]$, $\delta_{\cos\theta_m}$, and $\theta_M - \theta_m$, where all of these values have been exactly defined in preceding sections.

In the butterfly circuit 4410, the arithmetic units that are encircled by the line 4418 can be eliminated when only the X output is needed in the output signal 4412. This may be desirable for applications where only one output from the angle rotator 4400 is needed, such as when implementing a trigonometric interpolator, such as interpolator 1000 in FIG. 10 or interpolator 1400 in FIG. 14.

The operation of the angle rotator 4400 is further described in reference to the flowchart 4500 in FIG. 45. As with all flowcharts herein, the order of the steps is not limiting, as one or more steps can be performed simultaneously (or in a different order) as will be understood by those skilled in the arts.

In step 4502, the input complex signal 4406 is received.

In step 4504, the $\tan \theta_m$, $[\cos \theta_m]$, $\delta \cos \theta_m$, and $\theta_M - \theta_m$ values are retrieved from the ROM 4402, based on the rotation angle θ (or the normalized value $\overline{\theta}$).

In step 4506, the butterfly circuit 4408 multiplies the input complex signal 4406 by $\tan \theta_m$ to perform a coarse rotation of the input complex number, resulting in an intermediate complex signal at the output of the butterfly circuit 4408.

In step 4508, the adder 4414 adds the $\theta_L$ value to the error value $\theta_M - \theta_m$ to produce a $\theta_I$ angle.

In step 4510, a fine adjustment circuit 4404 generates a fine adjust value $$\left(\delta_{[\cos\theta_1]} - \frac{1}{2}\theta_I^2\right)$$

based on the $\theta_I$ angle and $\delta_{\cos \theta_m}$.

In step 4512, the butterfly circuit 4410 multiplies the intermediate complex signal by the $\theta_I$ angle, and the fine adjustment value $$\left(\delta_{[\cos\theta_1]} - \frac{1}{2}\theta_I^2\right)$$

to perform a fine rotation of the intermediate complex signal, resulting in the output complex signal.

In step 4514, the X value for the output complex signal is scaled by the $[\cos \theta_m]$ value, resulting in the output complex number 4412. As discussed above, the elements inside the outline 4418 can be eliminated if only the X value of signal 4412 is desired. Alternatively, similar elements could be eliminated from the butterfly circuit 4410 if only the Y value of signal 4412 was desired.

5.8 Application of Angle Rotation Processors

This subsection describes exemplary applications for angle rotator processors. These applications are provided for example purposes only and are not meant to be limiting, as those skilled in the arts will recognize other applications based on the discussions given herein. These other applications are within the scope and spirit of the present invention.

One application for the angle rotation processor is the Quadrature Direct Digital Frequency Synthesizer/Mixer (QDDFSM), including a few special cases that are candidates for the angle rotator algorithm. One is the case when only one of the outputs (X or Y) is desired, as shown by angle rotator 4400 (FIG. 44). As shown in FIG. 44, this is accomplished by simply deleting the hardware required for the computation of the unused output. Yet another special case of QDDFSM is the Direct Digital Frequency Synthesizer (DDFS). In DDFS configuration we simply fix the input vector $(X_0, Y_0)$ to be (1,0). This enables the complete elimination of the coarse stage by taking advantage of the fact that $1 \times A = A$ and $0 \times A = 0$. In the following section we will concentrate our discussion on the QDDFSM, since it is the general case, while keeping in mind the special cases and the associated hardware reductions mentioned above.

5.8.1 Using the Angle Rotation Processor in a Quadrature Direct Digital Frequency Synthesizer/Mixer The frequency synthesis and mixing operation can be described with the following pair of equations, which relate an input with x-y coordinates $(X_0, Y_0)$ and a frequency control word (fcw) for the synthesizer, to an output with new x-y coordinates (X, Y). The following pair of equations establishes the relationship between $(X_0, Y_0)$, fcw, and $(X, Y)$.

$$X = [X_0 \times \cos(fcw \times n)] - [Y_0 \times \sin(fcw \times n)]$$
$$Y = [Y_0 \times \cos(fcw \times n)] + [X_0 \times \sin(fcw \times n)] \quad (5.88)$$

where n is the time index

Per (5.88), since the sine and cosine functions are periodic with period $2\pi$ (i.e., $fcw \times n = <fcw \times n>_{2\pi} = \phi$, where $<>$ is a modulo operator) an overflowing adder is used as a phase accumulator to compute $\phi$ from the input fcw, as shown by the the phase accumulator 4600 in FIG. 46.

Now, for any given time instance n, we have a corresponding angle $\phi$ from the phase accumulator, hence the original pair of equations (5.88) for QDDFSM can be rewritten in terms of the angle $\phi$ as follows.

$$X = [X_0 \times \cos \phi] - [Y_0 \times \sin \phi]$$
$$Y = [Y_0 \times \cos \phi] + [X_0 \times \sin \phi] \quad (5.89)$$

Note that the expressions (5.89) are exactly those of an angle rotator expressed by equations (5.1). By applying a phase accumulator fed by an fcw, we have converted the QDDFSM into an angle rotation application. The only conflict between the above expressions and the angle rotation processor is that the angle rotation processor takes an angle $\theta$ in the range $[0, \pi/4]$, while the angle $\phi$ in the above expressions is in the interval $[0,2\pi)$.

5.8.1.1 A General Angle Rotator for Arbitrary Input Angles

Let us consider the changes necessary to make the angle rotation processor use an input angle $\phi$ that may lie outside the $[0, \pi/4]$ range. Fortunately, a simple interchange operation at the input of the coarse stage, and an interchange/negate operation at the output of the fine stage is all we need in order to map $\phi$ into an angle $\theta$ in the range $[0, \pi/4]$ and use it as the input to the angle rotator. Even though the input angle $\theta$ is in the range $[0, \pi/4]$, the rotation by $\theta$ along with the interchange and interchange/negate operations make the overall rotation of the input $(X_0, Y_0)$ equivalent to a rotation by the original angle $\phi$ in the full range $[0,2\pi)$. The latter is possible because of the convenient symmetry properties of sine and cosine functions over the range $[0, 2\pi]$.

For example, $\sin \phi = -\sin(\phi-\pi)$ and $\cos \phi = -\cos(\phi-\pi)$, while $\sin \phi = \cos(\phi-\pi/2)$ and $\cos \phi = -\sin(\phi-\pi/2)$, and finally, for $0 < \phi < \pi/4$, if we write $\pi/4 + \phi$ for $\phi$ then $\sin(\pi/4+\phi) = \cos(\pi/4-\phi)$ and $\cos(\pi/4+\phi) = \sin(\pi/4-\phi)$. Using the first pair of trigonometric identities, we can map $\phi$ into the range $[0, \pi])$ by simply performing a negate operation at the output of the angle rotator. Using the second pair of identities along with the first pair enables one to map $\phi$ into the range $[0, \pi/2)$ by performing negate and interchange operations at the output of the angle rotator. Finally, using all three pairs of identities, the angle $\phi$ can be mapped into the range $[0, \pi/4)$ by performing an interchange operation at the input of the angle rotator, along with interchange and negate operations at the output of the angle rotator. Note that all of these interchange and negate operations are conditioned only on the issue of which octant $\phi$ is in. This means that if $\phi$ is a normalized angle, then the interchange and negate decisions depend only on the top three MSB bits of $\phi$. The following tables show the interchange and negate operations required for all eight octants (specified by the three MSB bits of $\phi$). It is evident, as well, that other interchange and negate criteria for the input and output would also be suitable.

This table indicates when an interchange operation is required at the input and when an interchange operation is required at the output of the angle rotator.

| Octant of $\phi$ (3 MSBs of $\phi$) | Output Interchange | Input Interchange |
|---|---|---|
| 1-st octant (000) | | |
| 2-nd octant (001) | | Interchange inputs |
| 3-rd octant (010) | Interchange outputs | |
| 4-th octant (011) | Interchange outputs | Interchange inputs |
| 5-th octant (100) | | |
| 6-th octant (101) | | Interchange inputs |
| 7-th octant (110) | Interchange outputs | |
| 8-th octant (111) | Interchange outputs | Interchange inputs |

The following table indicates when a negation operation is required at the output of the angle rotator.

| Octant of $\phi$ (3 MSBs of $\phi$) | Negation of output X | Negation of output Y |
|---|---|---|
| 1-st octant (000) | | |
| 2-nd octant (001) | Negate output X | |
| 3-rd octant (010) | | Negate output Y |
| 4-th octant (011) | Negate output X | Negate output Y |
| 5-th octant (100) | Negate output X | Negate output Y |
| 6-th octant (101) | | Negate output Y |
| 7-th octant (110) | Negate output X | |
| 8-th octant (111) | | |

Note that the flag for input interchange is simply the 3rd MSB bit of $\phi$, while the flag for output interchange is just the 2nd MSB bit of $\phi$. Finally, to produce the remapped angle $\theta$ in the range $[0, \pi/4)$ for the angle rotation processor, we simply take the remaining bits of $\phi$ after stripping the top two MSBs and performing a conditional subtract operation to produce $\theta$. More specifically, if the MSB bit (after stripping the two MSB bits) is low, i.e., the angle is in an even octant (numbering them 0, . . . , 7), we pass the angle unchanged, otherwise we perform a "two's-complement type" inversion of the angle. Note here that after such remapping operation, the MSB bit of $\theta$ is set to one only in the case when $\theta = \pi/4$. This fact is useful in determining the required amount of lookup table in the angle rotation processor. In other words, even though the MSB bit of $\theta$ is an address to the lookup table, since we know that when it is '1' the remaining bits have to all be '0' we only need to allocate a single address for that case (as opposed to increasing the size of the lookup table by an entire factor of two).

5.8.1.2 Adapting the General Angle Rotator to Make a QDDFSM

The structure of the QDDFSM using an angle rotation processor 3900 is depicted in the FIG. 4700. It simply requires the employment of a phase accumulator 4702 and a conditional subtract 4704 to provide an input angle from the input frequency control word fcw. We refer to the system of FIG. 47 with the phase accumulator excluded as a General Angle Rotator. It has the capability to receive an angle in the interval $[0, 2\pi)$ and to perform an angle rotation of the input data $(X_0, Y_0)$ by that angle. We show a general angle rotator in FIG. 48, but one in which further structural simplification has been made. The method of performing these simplifications will be discussed next.

5.8.2 How to use the Conditionally Negating Multipliers in the General Angle Rotator For a moment assume we have a powerful technique for making conditionally negating multipliers. What we mean by that is a multiplier which takes a negate flag to produce an output depending on that negate flag as follows: The output is simply the product of the input signals if the flag is low (0) and the output is the negative of the product of the input signals if the flag is high (1).

Each one of the two outputs in the coarse and fine stages is computed with two multipliers and one adder as shown in FIG. 47. These multipliers and the adder are implemented in a single Carry-Save Adder (CSA) tree, with the partial products being generated from Booth decode modules corresponding to the two multipliers. This technique of employing a single tree eliminates the need for intermediate carry propagation from each multiplier and makes the propagation delay of each rotation stage very short. Note that the single CSA tree implementation is possible since the multipliers are operating in parallel. Furthermore, because the structure that is needed to compute one output of a rotation stage is identical to the structure required by the other output (with the exception of the minus sign), a single CSA tree can easily be interleaved between the two outputs for a significant amount of hardware savings. The minus sign at the output of the multiplier can be implemented very efficiently by the technique described in the following sections (using the conditionally negating multiplier). The negation or non-negation of the multiplier output can be controlled with a flag that changes between the two cycles of the interleave operation.

The angle at the output of the conditional subtract module 4704 in FIG. 47 is in the range $[0, \pi/4]$. As already discussed, the outputs for the angles outside this range are constructed by mapping the angle into the range $[0, \pi/4]$ while conditionally interchanging the inputs (inputs to the coarse stage) and conditionally interchanging and negating the outputs (outputs of the fine stage) of the angle rotator. A negation at the output of the fine stage simply means changing the output signs of the multipliers and negating the input of the adder coming from the input of the fine rotation stage. Changing the output signs of the multipliers is once again accomplished by using conditionally negating multipliers. The negation of the input to the fine rotation stage can easily be implemented with XOR gates and a conditional high or low bit insertion into the CSA tree at the position corresponding to the LSB location of the input. Since this conditional high or low bit is inserted in the CSA tree, there is no additional carry propagation introduced for the negation of the input. Note that the latter technique eliminates any circuitry required to implement the conditional negation of the outputs, and hence eliminates any carry propagations associated with two's complement numbers.

Furthermore, the conditional interchange of the outputs can be implemented by conditionally interchanging the inputs of the fine rotation stage and appropriately controlling the signs of the multiplier outputs in the fine stage. The conditional interchange of the fine stage inputs can be propagated to the inputs of the coarse stage with the same line of reasoning. Remember that the inputs to the coarse stage were conditionally interchanged according to the three MSBs of the input angle anyway. In conclusion, the conditional interchange and negation operations of the outputs can be implemented by modifying only the condition of the interchange at the inputs of the coarse stage and appropriately controlling the multiplier output signs by using conditionally negating multipliers (which we had to do for interleaving anyway). This eliminates the conditional negate and interchange block at the output of the fine stage entirely (i.e., it eliminates muxes and two's complement negators), and also eliminates the need for storing and pipelining control signals (i.e., it eliminates registers) to perform the conditional interchange and negation operations at the output. The resulting General Angle Rotator 4800 is now depicted in the following FIG. 48.

5.8.2.1 Booth Multiplier

There are many algorithms for digital multiplication. One of the most popular is the Booth multiplier. The essence of the Booth multiplier is in the decoding scheme performed on the multiplicand to reduce the number of partial products which, when added together, produce the desired product. For an N×M Booth multiplier, where N is the wordlength of the multiplier, and M is the wordlength of the multiplicand, there will be ceiling(N/2) Booth decoders. Each Booth decoder will take three bits from the multiplier (with one bit overlapping the decoders on both sides) and will manipulate the multiplicand according to the Booth decoding table 5000 shown in FIG. 50. Some relevant details for a 10×M Booth multiplier are depicted in FIG. 49, especially how the multiplier bits feed into the Booth decoders to produce the five partial products which, when added, compute the result (the product of the multiplier and the multiplicand).

5.8.2.2 How to Make a Negating Booth Multiplier

Suppose we wish to make a multiplier that produces the negative of the product. More specifically, suppose we wish to multiply two signals N and M and get $-C=-(N\times M)$. The latter can be accomplished in a number of different ways. The most obvious is perhaps to use a regular multiplier to produce the product $C=(N\times M)$ and then negate C to achieve $-C=-(N\times M)$. In case of two's complement representation, this approach requires an additional carry propagation chain through the negator, which is costly in terms of speed and additional hardware associated with a negating circuit. Another approach, described below, is more favorable in a few key aspects.

The product C is essentially the result of adding a number of partial products, which are generated by the Booth decode blocks as described in the previous section. Therefore, we can write the following sum expression for C:

$$C = \sum_{i=1}^{n} p_i \qquad (5.90)$$

where $p_i$ are the n (in the 10×M example above n=5) partial products generated from the n Booth decoders. Note that, in order to negate C, we can negate all of the partial products and proceed with the summation of the negated partial products to produce $-C$. The expression for $-C$ is then the following:

$$-C = \sum_{i=1}^{n} -p_i, \qquad (5.91)$$

where $-p_i$ are the negated n partial products generated from the n Booth decoders. Let us investigate how the Booth decoders need to change to produce the desired negated partial products. All we need to do is to change the decoding table 5000 from that of FIG. 50, to the decoding table 5100 in FIG. 51. Note that the difference between the tables is only in the partial product columns and, more specifically, the partial product column 5102 of table 5100 is the negative of the partial product column 5002 of table 5000. This means that by simply modifying the Booth decode table to the negating Booth decode table shown in FIG. 51, the result will be the negative of the product, as desired, with absolutely no additional hardware and absolutely no speed penalty. An example for a 10×M negating Booth multiplier 5200 is shown in FIG. 52.

5.8.2.3 How to Make a Conditionally Negating Booth Multiplier

A particularly interesting case arises when one wishes the multiplier product to be negated sometimes, and normal (non-negated) the other times. One can extend the idea presented in the previous section to craft the following powerful technique. Let us investigate the original Booth decode table 5000 depicted in FIG. 50 and the negating Booth decode table 5100 of FIG. 51 a bit more closely. Note the horizontal line of symmetry that runs through the mid-line of both decoding tables. This line of symmetry suggests that we can create the negating Booth decode table 5100 from the original Booth decode table 5000 by simply inverting the three bits (b2 b1 b0). For example, if the three bits (b2 b1 b0) are (0 1 0), then, according to the original Booth decode table, the corresponding partial product is A, where A is the multiplicand. If we invert the three bits (b2 b1 b0) as suggested above, we will have (1 0 1) and the corresponding partial product will be −A, exactly what is needed for a negated partial product.

Given a signal F which specifies when the output of the multiplier should be negated and when not (F=0 implies regular multiplication, F=1 implies negating multiplication), F can simply be XORd with the three bits (b2 b1 b0) at the input of the regular Booth decoders to make a new conditionally negating Booth decoder, hence a conditionally negating multiplier. The details of a conditionally negating Booth decoder 5300 are captured in FIG. 53. Note that with a minimal amount of hardware (N XOR gates for an N×M multiplier, which is insignificant compared to the hardware cost of the entire multiplier), we have the means to control the sign of the multiplier product. Also note that the overall latency of the multiplier is increased insignificantly since the latency through a single XOR gate is much smaller than the latency through the entire multiplier. Furthermore, the latency of a single XOR gate is much smaller than the latency associated with a carry propagation chain that would be necessary if one built such a circuit with a two's complement negator. A 10×M conditionally negating multiplier 5400 is shown in FIG. 54.

Figure 55:
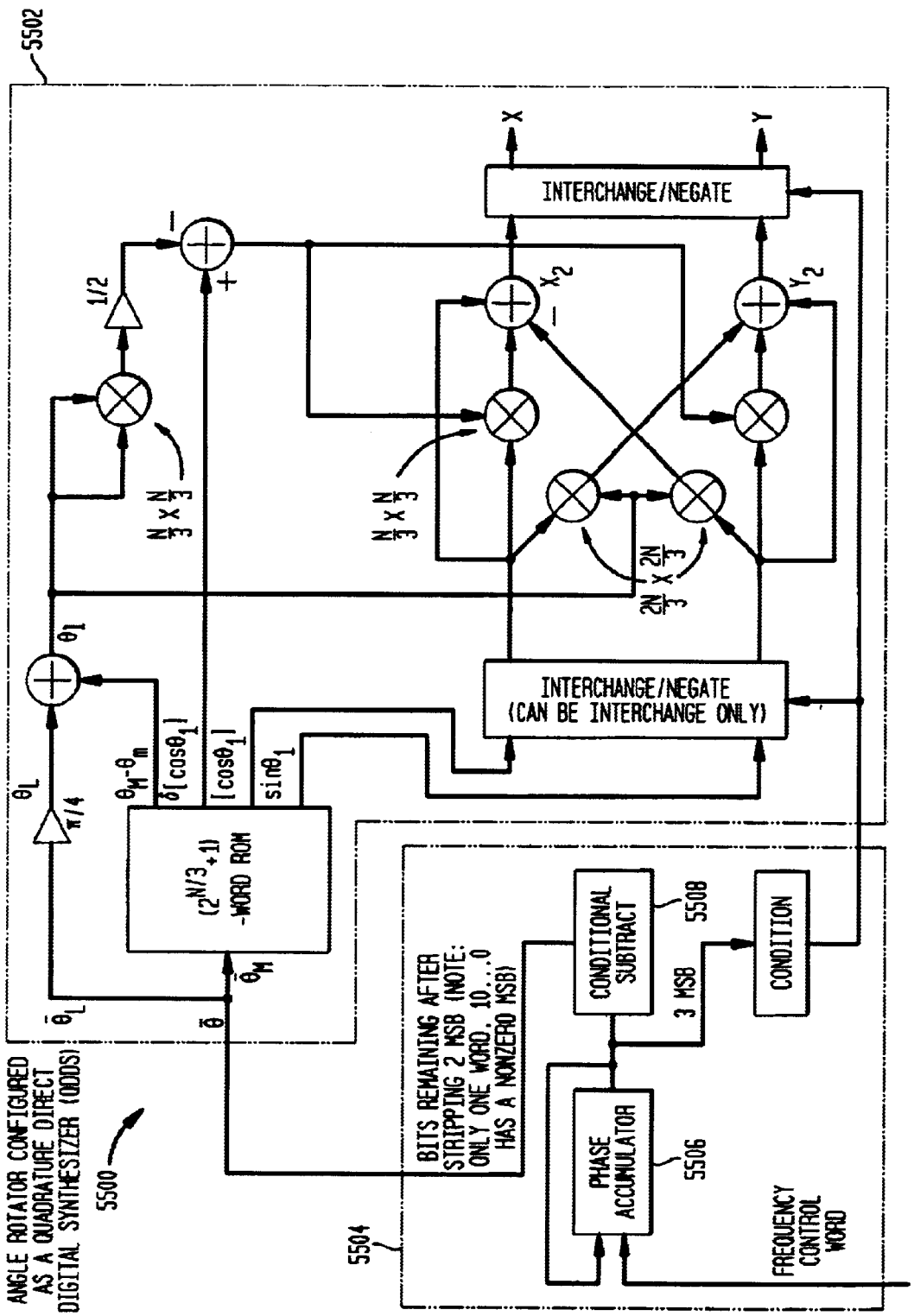

5.8.3 Using the Angle Rotation Processor in a Quadrature Direct Digital Frequency Synthesizer As mentioned above, the angle rotator is useful in implementing various forms of direct digital synthesizers. In this case, all starting points for the angle rotations are $X_0=1$, $Y_0=0$ (with, of course, the various usual interchange/negation requirements). FIG. 55 shows a quadrature direct digital synthesizer (QDDS) 5500, a system having two outputs, one being samples of a cosine waveform and the other being samples of a sine waveform. An exact 90-degree phase offset between the two waveforms is obtained by the QDDS, and numerous applications for such a device are well known. No $X_0$ and $Y_0$ input samples are shown in the FIG. 55 system. These fixed values have been "built in" and used to greatly simplify the coarse rotation stage.

Notice that the angle rotator 5502 is preceded by a system 5504 that generates a data stream of input rotation angles, a so-called overflowing phase accumulator 5506, and its input is a single fixed data word that precisely controls the frequency of the output sample waveforms. The three MSBs of each phase accumulator output word, of course, assess the approximate size of the angle that is being used as a rotation angle (i.e., these three bits show how many octants the rotation angle spans), and they are stripped off to control the interchange/negation operations that are appropriate for obtaining the desired output samples. Also, the third MSB is used, as described previously, to determine whether or not to perform a "two's complement type" inversion of the LSBs. One other operation is required by the "Conditional Subtract" module 5508 shown in FIG. 55; in addition to stripping off the three MSBs, it appends one MSB having the value zero except in the case where a rotation angle of exactly π/4 is required. In that case, the appended MSB is one and all other ROM-address bits are zero.

A special case of the QDDS system, one having only a single output data stream, which could be either of the two, but which we call the "cosine-only" case, is also useful for various well-known applications. FIG. 56 and FIG. 57 show two specializations of the angle rotator circuits previously discussed to implement the cosine-only DDS. The system 5600 in FIG. 56 results from specializing the angle-rotation system 3900 in FIG. 39. The system 5700 in FIG. 57 is a specialization of the angle rotator 4400 in FIG. 44.

5.9 Conclusion

Based on the design method discussed, for a given accuracy requirement, an architecture with the least amount of hardware is produced by balancing the precision of intermediate computations and the complexity of each arithmetic block, while keeping the output error within the specified bound. Furthermore, our architecture consolidates all operations into a small number of reduced-size multipliers. This permits us to take advantage of many efficient techniques that have been developed for multiplier implementation, such as Booth encoding, thereby yielding a smaller and faster circuit than those previously proposed.

Simulations and preliminary complexity estimation show that, even comparing to the method of (Tan, L. and Samueli, H., *IEEE J. Solid-State Circuits* 30:193–200 (1995)) that is optimized for a 14-bit input angle, our method achieved 6 dB more SFDR while using approximately the same number of transistors as those needed by (Tan, L. and Samueli, H., *IEEE J. Solid-State Circuits* 30: 193–200 (1995)). In addition, since our structure employs only a small ROM, it overcomes the problem of slow access time that occurs when large ROMs are used, thereby facilitating a higher data rate. Using the two-stage method, when a higher precision is needed, it is very straightforward to satisfy such a requirement, since more accurate results can be attained simply by increasing the wordlength and the multiplier size. For the single-stage method, however, when high precision is desired, the required lookup table is likely to be too large to be practical, particularly for high-speed operation.

6. Symbol Synchronization for Bursty Transmissions

We have thus far discussed methods that provide efficient implementations of the resampler for symbol synchronization in a digital receiver using trigonometric interpolation as well as the phase rotator for carrier recovery. To produce the correct samples, a timing recovery circuit must supply the resampler with symbol timing information, as shown in FIG. 1D. We will now consider how this can be accomplished.

6.1 Initial Parameter Estimations for Burst Modems

There are many methods to derive timing information from the received signal. According to their topologies, synchronization circuits can be divided into two categories: there are feedback and feedforward schemes. Feedback structures usually have very good tracking performance, and they work quite well in continuous mode transmissions. For packet data systems used by third-generation mobile communications, where the transmission is bursty, it is essential to acquire initial synchronization parameters rapidly from the observation of a short signal-segment.

A typical packet format is shown in FIG. 58. It includes a short preamble 5802 followed by user data 5804. The preamble 5802 is a set of known modulation symbols added to the user data packet at the transmitter with the intention of assisting the receiver in acquisition.

There are many approaches to burst demodulation, depending on the specific system requirements. In one approach (S. Gardner, "Burst modem design techniques, part 1, " *Electron. Eng.* 71:85–92 (September, 1999); Gardner, S., "Burst modem design techniques, part 2, " *Electron. Eng.* 71:75–83 (December, 1999)), the receiver first detects the presence of the preamble, using a correlator, whose output should produce a large magnitude when the preamble is present. It then estimates the symbol timing. If the sampling frequency error is small, the total change of the timing phase from the start of the short preamble to the end is negligible. Next, it estimates the initial carrier frequency and phase. The above steps assume that the impairment caused by the channel is small enough that the modem can successfully track the timing carrier phase prior to equalization. Otherwise, equalizer training prior to the timing and carrier recovery is needed.

With a typical preamble of 8 to 32 symbols, depending on the required system performance, for QPSK modulation, rapid acquisition is desired. Feedforward timing estimation is known to have rapid acquisition, since it produces a one-shot estimate instead of tracking the initial timing through a feedback loop.

A well-known method, digital square timing recovery (Oerder M., and Meyr, H., *IEEE Trans. Comm.* 36:605–612 (1988)), has shown rapid acquisition, but it requires oversampling of the signal at, typically, four times the symbol rate, which imposes a demand for higher processing speed on the subsequent digital operations. Moreover, it does not work well for signals employing small excess bandwidth. However, pulses with small excess bandwidth are of interest for bandwidth-efficient modulation.

For applications where low power and low complexity are the major requirements, such as in personal communications, it is desirable to sample the signal at the lowest possible rate and to have the synchronizer be as simple as possible. In this section, a synchronizer is proposed that needs just two samples per symbol period. In addition, it has been shown to work well for small excess bandwidth, which is important for spectral efficiency. Using this method, the estimations of the symbol timing and the carrier phase can be carried out independently of each other. Hence, they can be carried out in parallel. Using the proposed structure, the timing and carrier-phase estimators can be implemented efficiently by means of direct computation (instead of a search, as is employed, for example, by (Sabel, L., and Cowley, W., "A recursive algorithm for the estimation of symbol timing in PSK burst modems," in *Proc. Globecom* 1992, vol. 1 (1992), pp.360–364) using an efficient rectangular-to-polar converter (to be discussed in Section 7). This yields a very small computation load. Thus, this structure is well suited for low-power, low-complexity and high-data-rate applications, such as those in multimedia mobile communications.

6.2 Background Information

The system model 5900 used in developing the symbol timing and carrier phase recovery algorithm described in this section is shown in FIG. 59.

Here h(t) is a real-valued, unit-energy square-root Nyquist pulse and w(t) is complex white Gaussian noise with independent real and imaginary components, each having power spectral density $N_0/2$.

As mentioned in Section 6.1, a typical data packet for a burst modem consists of a short preamble 5802 followed by user data 5804. According to the approach of (Gardner, S.,

*Electron. Eng.* 71:85–92 (September, 1999)), the matched filter output is sampled every $T_s=T/2$ seconds, i.e., at twice the symbol rate. The receiver then detects the presence of the preamble in the received signal by correlating the conjugate of the known preamble sequence $\alpha_m$, whose length is L, with the sampled data $x(nT_s)$ as $$r_{xx}(n) = \sum_{m=0}^{L-1} a_m^* x(nT_s + 2mT_s). \tag{6.1}$$

The correlator output $r_{xx}(in)$ should produce a large magnitude $|r_{xx}(n)|$ when the preamble is encountered. It then estimates the initial synchronization parameters, namely the symbol timing and the carrier phase, assuming the transmitter/receiver frequency mismatches are insignificant.

The complex envelope x(t) of the received signal, after the matched filter, is $$x(t) = e^{j\theta} \sum_{k=-\infty}^{\infty} a_k g(t - kT - \tau) + v(t) \tag{6.2}$$

where $\{\alpha_k\}$ is a sequence of independent equally-probable symbols with $E[|\alpha_k|^2]=1$. We also have that $v(t)=w(t)\otimes h(-t)$ and that $g(t)=h(t)\otimes h(-t)$ is a Nyquist pulse. The time delay $\tau$ and the carrier phase $\theta$ are both unknown.

To estimate the data sequence $\alpha_k$ we want sample values of x(t) at $t=mT+\tau$, with m an integer, whereas only the samples $x(nT_s)$ are available after sampling x(t) by a fixed clock.

Now let us examine how the correlator output relates to symbol timing and carrier phase. Inserting (6.2) into (6.1) yields $$r_{xx}(n) = \tag{6.3}$$
$$\sum_{m=0}^{L-1} \sum_{k=-\infty}^{\infty} a_m^* a_k g(nT_s + 2mT_s - kT - \tau)e^{j\theta} + \sum_{m=0}^{L-1} a_m^* v(nT_s + 2mT_s).$$

Since the data are independent, and they are independent of the noise, we have $$E[a_m^* a_k] = \begin{cases} 1 & k = m \\ 0 & k \neq m \end{cases} \tag{6.4}$$

$$E[\alpha_m^* v(nT_s+2mT_s)]=0. \tag{6.5}$$

According to (6.4) and (6.5), and because $T=2T_s$ the expectation of $r_{xx}(n)$ with respect to the data and the noise is (for simplicity, we omit the constant real scale factor L)

$$E[r_{xx}(n)]=e^{j\theta}g(nT_s-\tau). \tag{6.6}$$

Thus, the mean value of the complex preamble correlator output actually equals the sample of the delayed signaling pulse g(t), with delay being $\tau$, rotated by the angle $\theta$. This is shown in FIG. 60 for $\theta=0$, where g(t) is a raised cosine Nyquist pulse with $\alpha=0.35$. The total timing delay $\tau$ can be expressed as $$\tau=n_0 T_s+\mu \tag{6.7}$$

where the integer $n_0$ represents the portion of $\tau$ that corresponds to an integer multiple of the sampling interval $T_s$ and $0 \leq \mu < T_s$ is the sampling time mismatch.

Most practical signaling pulses g(t) are symmetrical and their peak value occurs at g(0). If θ is known, using these properties, we can estimate the sampling time mismatch $\mu$ from the correlator output $r_{xx}(n)$. In the next section we will discuss such an algorithm. We will derive this algorithm by first assuming that θ=0. Then we will discuss how the method can be carried out independently of the carrier phase. Simultaneously, we also derive a phase estimation algorithm that is independent of the symbol timing.

6.3 Symbol Timing Estimation Assuming θ=0

From (6.6), with θ=0, we have $$E[r_{xx}(n)] = g(nT_s - \tau). \tag{6.8}$$

According to (6.7) and (6.8), if the transmission delay τ is exactly an integer multiple of $T_s$ we must have $\mu=0$, and thus $r_{xx}(n_0)$ must correspond to the peak g(0). Otherwise, we have $\mu \neq 0$, with $r_{xx}(n_0)$ and $r_{xx}(n_0+1)$ being the two correlator output values nearest the peak value g(0), as shown in FIG. 60. That is, $r_{xx}(n_0)$ and $r_{xx}(n_0+1)$ must be the two largest correlator outputs. Therefore, once the largest correlator output is located, we can obtain $n_0$, the integer part of τ.

We now turn to finding $\mu$. Without loss of generality, let us assume $T_s=1$. Replacing n by $N_0+n$ we have, according to (6.8) and (6.7), $$E[r_{xx}(n_0+n)] = g((n_0+n) - \tau) = g(n-\mu). \tag{6.9}$$

For simplicity in our discussion on finding the fractional delay $\mu$, we henceforth drop the index $n_0$, which corresponds to an integer multiple of sample delays, from our notation. Next we define $R(e^{j\omega})$ as the Fourier transform of $r_{xx}(n)$:

$$R(e^{j\omega}) = \sum_{n=-\infty}^{\infty} r_{xx}(n) e^{j\omega n}. \tag{6.10}$$

The expectation of $R(e^{j\omega})$ can be expressed as $$E[R(e^{j\omega})] = E[FT(r_{xx}(n))] = FT(E[r_{xx}(n)]). \tag{6.11}$$

According to (6.9), and (C.4) in Appendix C, we have $$E[R(e^{j\omega})] = FT(g(n-\mu)) = e^{j\omega\mu} G(e^{j\omega}) \tag{6.12}$$

where $G(e^{j\omega})$ is the Fourier transform of g(n). Since g(n) is symmetrical, $G(e^{j\omega})$ must have zero phase. Thus, according to (6.12), $$\arg(E[R(e^{j\omega})]) = \arg(e^{j\omega\mu} G(e^{j\omega})) = \omega\mu. \tag{6.13}$$

Evaluating (6.13) at ω=π/2, we can obtain an estimate of $\mu$ as $$\mu = \frac{2}{\pi} \arg(R(e^{j\pi/2})). \tag{6.14}$$

Therefore, the unknown sampling mismatch $\mu$ can be obtained by taking the Fourier transform of $r_{xx}(n)$ and evaluating the phase corresponding to ω=π/2.

To make the implementation of (6.14) realistic, we should truncate the sequence $r_{xx}(n)$ before taking its Fourier transform. For example, using only the four samples $r_{xx}(-1)$, $r_{xx}(0)$, $r_{xx}(1)$, and $r_{xx}(2)$, we have $$R_T(e^{j\pi/2}) = [r_{xx}(0) - r_{xx}(2)] j[r_{xx}(-1) - r_{xx}(1)]. \tag{6.15}$$

Using the correlator output, the $\mu$ value can be obtained by first computing $R_T(e^{j\pi/2})$ according to (6.15), and then from the following:

$$\mu = \frac{2}{\pi} \arg(R_T(e^{j\pi/2})). \tag{6.16}$$

For low precision requirements, this operation can be accomplished using a small CORDIC processor (Chen, A., et al., "Modified CORDIC demodulator implementation for digital IF-sampled receiver," in *Proc. Globecom* 1995, vol. 2 (November, 1995), pp. 1450–1454) or a ROM lookup table (Boutin, N., *IEEE Trans. Consumer Electron.* CE-38:5–9 (1992)). With high accuracy requirements, however, the CORDIC processor will have long delays, while the table-lookup method will certainly require a very large ROM. In this case, we propose to use the rectangular-to-polar converter which will be discussed in Section 7. This rectangular-to-polar converter requires two small ROMs and it consolidates the operations into small array-multipliers, which can yield a smaller and faster circuit using well-known efficient multiplier implementation techniques.

A synchronizer 6100 for implementing the synchronization scheme described above is illustrated in FIG. 61. The synchronizer 6100 includes a correlator 6102, a Fourier Transform module 6104, and a rectangular-to-polar converter 6106. The Fourier transform module 6104 includes various delays and adders that are known to those skilled in the arts. The rectangular-to-polar converter is described further in Section 7.

The synchronizer 6100 receives data samples associated with sampling one or more received symbols and determines an offset $\pi\mu/2$, where $\mu$ represents a synchronization offset of the data samples relative to the incoming symbols. The operation of synchronizer 6100 is described in reference to the flowchart 6200, as follows.

In step 6202, a set of complex data samples is received.

In step 6204, the correlator 6102 correlates the complex data samples with a complex conjugate of a preamble data set ($a_m^*$), resulting in correlated complex data samples.

In step 6206, the Fourier transform module 6104 determines the Fourier transform of the correlated data samples signal, according to equations (6.10)–(6.13) and related equations;

In step 6208, the Fourier transform module 6104 evaluates the Fourier transform of the correlated data samples at π/2, generating a complex signal representing a complex number;

In step 6210, the rectangular-to-polar converter 6106 determines an angle in a complex plane associated with the complex number of step 6210, where the angle represents synchronization between the data samples and the incoming symbols.

In step 6212, the angle from step 6210 is scaled by 2/π to determine the synchronization offset.

6.4 Bias in Symbol Timing Estimation due to Truncating the Sequence

By truncating the sequence $r_{xx}(n)$ before taking the Fourier transform, we have produced a very simple structure to compute $\mu$. However, since $R_T(e^{j\omega})$ differs from $R(e^{j\omega})$ we must determine how this difference would affect the estimated $\mu$ value. The truncated sequence $r_T(n)$ is related to the original sequence $r_{xx}(n)$ as $$r_T(n) = r_{xx}(n) w(n) \tag{6.17}$$

where w(n) is a rectangular function whose Fourier transform $W(e^{j\omega})$ is a sinc function. Thus, $$R_T(e^{j\omega}) = R(e^{j\omega}) \otimes W(e^{j\omega}). \tag{6.18}$$

Taking the expectation of (6.18) we have $$E[R_T(e^{j\omega})] = E[R(e^{j\omega}) \circledx W(e^{j\omega})]$$

$$= E[R(e^{j\omega})] \circledx W(e^{j\omega}). \qquad (6.19)$$

Obviously, the $\mu$ value obtained using $R_{T(e^{j\omega})}$ in (6.16) would be different from that obtained using $R(e^{j\omega})$. This will introduce a non-zero timing-jitter mean (bias) to the $\mu$ value obtained using $R_T(e^{j\omega})$ instead of $R(e^{j\omega})$. But the phase difference of the expected values of $R_{T(e^{j\pi/2})}$ and $R(e^{j\pi/2})$ can be computed for a given g(t).
The procedure is as follows:

1. Given the pulse waveform g(t), obtain, for each value $\mu$, the samples g(n−$\mu$), n=−1, . . . , 2.
2. Compute $R_T(e^{j\pi/2})$ using these samples g(n−τ) according to (6.15).
3. Find the value $\hat{\mu}$ according to (6.16). The difference between the desired value $\mu$ and the value $\hat{\mu}$ computed using finite samples g(n−$\mu$), n=−1, . . . , 2, is the bias.

This bias is illustrated in FIG. 63, where g(t) is a raised cosine Nyquist pulse with rolloff factor α=0.1.

From FIG. 63, the bias is a function of $\mu$ and it can be precalculated and stored in a ROM in the receiver. Although the size of the ROM depends on the precision of $\mu$, for typical precision requirements on $\mu$ the ROM can be quite small. Let us illustrate this point using an example: If an 8-bit accuracy is desired for the bias, the bias value corresponding to the three most significant bits (MSBs) in $\mu$ is indistinguishable from that corresponding to the full-precision $\mu$ value. Hence, we can use only the 3 MSBs in $\mu$ to determine the bias, thereby needing only 8 words in the bias lookup table.

Thus, for each of our symbol timing detector output samples, we can obtain the corresponding bias value from the ROM table, then subtract this bias from the original timing estimate to obtain an unbiased estimate.

We have thus far restricted our discussion to the timing recovery algorithm for θ=0. We now consider how this algorithm can be made to accommodate an arbitrary carrier phase θ.

6.5 Carrier-independent Symbol Timing Recovery

According to (6.6), with the $T_s$=1 normalization, the complex correlator output $r_{xx}(n)$ is dependent on θ. Although the expectation of its magnitude $$E[|r_{xx}(n)|] = |g(n-\tau)| \qquad (6.20)$$

does not depend on θ, it is non-trivial to compute the magnitude of $r_{xx}(n)$ from its real and imaginary components. Expressing $r_{xx}(n)$ in terms of its real and imaginary components, according to (6.6), we have $$E[r_{xx}(n)] = g(n-\mu)\cos\theta + j\, g(n-\mu)\sin\theta. \qquad (6.21)$$

Thus, $$E[Re[r_{xx}(n)]] = g(n-\mu)\cos\theta \qquad (6.22)$$

$$E[Im[r_{xx}(n)]] = g(n-\mu)\sin\theta. \qquad (6.23)$$

Since the carrier phase θ does not depend on $\mu$ we can treat it as a constant scale factor in $Re[r_{xx}(n)]$ and $Im[r_{xx}(n)]$ when we are only concerned with extracting the timing information.

Clearly, therefore, instead of using the magnitude of the complex $r_{xx}(n)$ value, we can use one of its real and imaginary parts, which are available at the output of the preamble correlator.

We, of course, must decide which of $Re[r_{xx}(n)]$ and $Im[r_{xx}(n)]$ to use. If the unknown phase θ is such that cos θ≈0 it is certainly desirable to use $Im[r_{xx}(n)]$ instead of $Re[r_{xx}(n)]$, and vise versa. But we don't know the θ value thus far. How do we decide which one to use?

From (6.22) and (6.23) we can see that the relative magnitudes of cos θ and sin θ can be obtained from the real and imaginary components of $r_{xx}(n)$. For example, if $|Re[r_{xx}(n)]| > |Im[r_{xx}(n)]|$ we certainly have that $|\cos\theta| > |\sin\theta|$, thus we should use the real part of the correlator output to find $\mu$. Henceforth we denote the appropriate (real or imaginary) part of $r_{xx}(n)$ by $\hat{r}_{xx}(n)$.

6.6 Carrier Phase Computation

Next, let us examine the problem of extracting the carrier phase. From (6.6) we can see that the phase of the complex number $E[r_{xx}(n)]$ does not depend on $\mu$. Moreover, the carrier phase can simply be obtained by extracting the phase of $r_{xx}(n)$. In order to achieve the best precision, it is desirable to choose the $r_{xx}(n)$ value with the largest magnitude for carrier phase estimation. For example, if $r_{xx}(n_0)$ is the correlator output with largest squared-magnitude, we choose $r_{xx}(n_0)$ to compute $$\theta = \arg(r_{xx}(n_0)). \qquad (6.24)$$

One advantage of this approach is that the symbol timing and carrier phase estimations are independent of each other. They can thus be carried out in parallel.

As for symbol timing estimation in (6.16), the computation in (6.24) can be accomplished efficiently using the rectangular-to-polar converter to be discussed in Section 7.

A synchronizer 6400 for determining timing and phase offsets is shown in FIG. 64. Similar to synchronizer 6100, the synchronizer 6400 receives data samples associated with sampling one or more received symbols and determines a timing offset π$\mu$/2, where $\mu$ represents a synchronization offset between the data samples and the incoming symbols. Additionally, the synchronizer 6400 determines a carrier phase offset represented by θ. The synchronizer 6400 includes the correlator 6102, sample selectors 6404 and 6406, the Fourier transform module 6104, and two rectangular-to-polar converters 6106. The operation of synchronizer 6400 is described in reference to the flowchart 6500 in FIGS. 65A–B, as follows. The order of the steps in flowchart 6500 is not limiting, as one or more steps can be performed simultaneously or in a different order, as will be understood by those skilled in the relevant arts.

In step 6502, a set of complex data samples is received.

In step 6504, the correlator 6102 correlates the complex data samples with a complex conjugate of a preamble data set ($a_m^*$), resulting in correlated complex data samples. Each correlated complex data sample includes a real sample and an imaginary sample.

In step 6506, the sample set selector 6404 selects either the set of real correlated samples or the set of imaginary correlated samples. In embodiments, the set with the larger magnitude is selected.

In step 6508, the Fourier transform module 6104 determines the Fourier transform of the selected real or imaginary data samples, according to equations (6.10)–(6.13) and related equations;

In step 6510, the Fourier transform module 6104 evaluates the Fourier transform at π/2, generating a complex signal representing a complex number;

In step 6512, the rectangular-to-polar converter 6106a determines an angle in a complex plane associated with the complex number of step 6510, where the angle represents synchronization between the data samples and the incoming symbols.

In step 6514, the angle from step 6512 is scaled by $2/\pi$ to determine the synchronization offset.

In step 6516, the selector 6406 selects the largest correlator complex output. This selection can be based on an examination of one of the parts (real, imaginary) of the data sequence.

In step 6518, the rectangular-to-polar converter 6106b determines an angle in a complex plane associated with complex output of step 6516, where the angle represents the carrier phase offset θ.

6.7 Simulation Result

We have used the above procedures to estimate the timing delay and the carrier phase of binary PAM symbols. The pulse shape was raised cosine with rolloff factor $\alpha=0.4$. The block size was L=32 preamble symbols. To demonstrate its performance for signals with small excess bandwidth, we also tested this method with $\alpha=0.1$. For a carrier phase offset $\theta=45°$, we ran the simulation repeatedly using the synchronizer 6400, each time using $\mu$ value randomly chosen between 0 and 1.

In addition to synchronizer 6400, we have also used the following two well-known methods to estimate the sampling mismatch:

1) the DFT-based square-timing recovery (Oerder M., and Meyr, H., *IEEE Trans. Comm.* 36:605–612 (1988)),
2) the method of (Gardner, S., *Electron. Eng.* 71:75–83 (December, 1999)) that maps $r_{xx}(n_0+1)/r_{xx}(n_0)$—the ratio of the two correlation values nearest the peak (see FIG. 60)—to the sampling mismatch value $\mu$.

The variances of the timing jitter using these estimation methods for $\alpha=0.4$ and $\alpha=0.1$ are plotted in FIG. 66 and FIG. 67, respectively. The corresponding Cramer-Rao bounds (CRB)—the theoretical lower bounds of estimation errors (Meyr, H., et al., *Digital Communication Receivers: Synchronization, Channel Estimation and Signal Processing*, Wiley, New York, N.Y. (1998))—are also shown. We can see that, in both cases, the timing-jitter variance using the proposed synchronizer is quite close to the theoretical bound. It clearly outperforms the other two methods, even for signals employing small excess bandwidth, as seen in FIG. 67.

The variance of the phase estimation error is depicted in FIG. 68. It shows that, using the proposed method, the phase estimation error agrees quite well with the theoretical bound.

6.8 Conclusion

A synchronizer for initial symbol timing and carrier phase estimation using preambles has been presented. This synchronizer requires just two samples per symbol. Since the two estimations are independent of each other, they can be carried out simultaneously. These characteristics would ease the demand for computational speed for high-data-rate applications. Moreover, this synchronizer has demonstrated very good timing estimation performance even for signals with small excess bandwidth, which is essential for bandwidth efficient communications. The parameter estimations can be implemented very efficiently using the synchronizer 6400. Due to its simplicity, this method is attractive for applications where low power and low complexity are desired, such as in a hand-held transceiver.

7. A High-speed Processor for Rectangular-to-polar Conversion

As discussed previously, the rapid acquisition characteristic of feed forward symbol synchronizers is essential to symbol synchronization for burst modems. Many feedforward structures require the evaluation of the phase of a complex number. That is, an efficient implementation of the phase extraction process is crucial. In order to handle a wide range of communications problems (Section 8), a general rectangular-to-polar conversion problem is considered.

There are several well-known implementations for a rectangular to polar coordinate conversion, i.e. obtaining the magnitude and phase of a complex number. One method uses a ROM lookup table with both the real and imaginary components as input. This is practical only for low bit-accuracy requirements, as the ROM size grows exponentially with an increasing number of input bits. To reduce the ROM size, we can first divide the imaginary by the real component, then use the quotient to index the lookup table. But the hardware for a full-speed divider is very complicated and power consuming. An iterative divider implemented using shifting and subtraction requires less hardware, but it is usually quite slow. Recently, CORDIC has been applied in this coordinate conversion (Chen, A., and Yang, S., "Reduced complexity CORDIC demodulator implementation for D-AMPS and digital IF-sampled receiver," in *Proc. Globecom* 1998, vol. 3 (1998), pp. 1491–1496). However, due to the sequential nature of CORDIC, it is difficult to pipeline, thus limiting the throughput rate.

In burst-mode communication systems, rapid carrier and clock synchronization is crucial (Andronico, M., et al., "A new algorithm for fast synchronization in a burst mode PSK demodulator," in *Proc. 1995 IEEE Int. Conf. Comm.*, vol. 3 (June, 1995), pp. 1641–1646). Therefore, a fast rectangular-to-polar conversion is desired. In this section, we present an apparatus and method that implements the angle computation for rectangular-to-polar conversion with low latency and low hardware cost. This processor and the polar-to-rectangular processor presented in Section 5 (See rotator 3900 in FIG. 39), together, can perform the M-ary PSK modulation devised in (Critchlow, D., "The design and simulation of a modulatable direct digital synthesizer with non-iterative coordinate transformation and noise shaping filter," M.S. thesis, University of California, San Diego (1989)).

7.1 Partitioning the Angle

FIG. 69 displays a point in the Cartesian X-Y plane having coordinates $(X_0, Y_0)$, wherein $X_0$ and $Y_0$ represent the real and imaginary parts of an input complex signal. The angle $\phi$ can be computed as $$\phi = \tan^{-1}(Y_0/X_0). \tag{7.1}$$

In deriving the core of our algorithm, we assume the dividend and divisor satisfy $$X_0 \geq Y_0 \geq 0. \tag{7.2}$$

We will discuss how to extend the result to arbitrary values in Section 7.4. To achieve the highest precision for given hardware, the inputs $X_0$ and $Y_0$ should be scaled such that $$1 \leq X_0 < 2. \tag{7.3}$$

A straightforward method for fast implementation of (7.1) can be devised as follows:

1) Obtain the reciprocal of $X_0$ from a lookup table.
2) Compute $Y_0 \times (1/X_0)$ with a fast multiplier.
3) Use this product to index an arctangent table for $\phi$.

However, the size of the two tables grows exponentially with increased precision requirements on $\phi$, and rather large tables would be required to achieve accurate results. Therefore, for high-precision applications, such an implementation seems impractical.

If we approximate $1/X_0$ by the reciprocal of the most significant bits (MSBs) of $X_0$, denoted by $[X_0]$, then the required reciprocal table is much smaller. We can then multiply the table output by $Y_0$ to yield $Y_0/[X_0]$, which is an approximation of $Y_0/X_0$. This quotient can then be used to index an arctangent table. Similar to the reciprocal table, a much smaller arctangent table is needed if we use only the MSBs of $Y_0/[X_0]$, denoted by $[Y_0/[X_0]]$, to address the table, which returns $\phi_1 = \tan^{-}([Y_0/[X_0]])$. Obviously, this result is just an approximation to $\phi$. We will subsequently refer to the computation of $\phi_1$ as the coarse computation stage.

Let $\phi_2$ be the difference between $\phi$ and $\phi_1$. Using the trigonometric identity $$\tan \phi_2 = \tan(\phi - \phi_1) = (\tan \phi - \tan \phi_1)/(1 + \tan \phi \times \tan \phi_1) \quad (7.4)$$

and the definitions $\tan \phi = Y_0/X_0$ and $\tan \phi_1 = [Y_0/[X_0]]$, we have $$\tan\varphi_2 = \frac{Y_0/X_0 - [Y_0/[X_0]]}{1 + (Y_0/X_0) \times [Y_0/[X_0]]} = \frac{Y_0 - X_0 \times [Y_0/[X_0]]}{X_0 + Y_0 \times [Y_0/[X_0]]}. \quad (7.5)$$

Using this relationship, $\phi_2$ can be determined from $[Y_0/[X_0]]$, the coarse computation results. Therefore, the desired result $\phi$ can be obtained by adding the fine correction angle $\phi_2$ to the coarse approximation $\phi_1$. This procedure of finding $\phi_2$ will subsequently be referred to as the fine computation stage.

By partitioning the computation of (7.1) into two stages, the table size in the coarse stage can be reduced significantly at the expense of additional computations, which are handled by the fine stage. Let us now examine the complexity of the fine stage. To find $\phi_2$, we can first compute $$X_1 = X_0 + Y_0 \times [Y_0/[X_0]]$$

$$Y_1 = Y_0 - X_0 \times [Y_0/[X_0]] \quad (7.6)$$

and then find $\phi_2$ as $$\phi_2 = \tan^{-1}(Y_1/X_1). \quad (7.7)$$

The computation in (7.6) involves only adders and multipliers, while (7.7) requires lookup tables. Moreover, it seems we can't use the same coarse-stage tables because they have low resolution and thus can't satisfy the high precision requirements for the fine angle $\phi_2$. Now let us analyze $\phi_2$ to see if there is any property that can help in this situation.

If $\phi_1$ is a good approximation of $\phi$, then $\phi_2 = \phi - \phi_1$ is close to zero. In view of (7.7), $Y_1/X_1$ should be very small too. This property helps us in two respects: 1) The difference between $Y_1/X_1$ and $Y_1/[X_1]$ is much smaller than that between $1/X_1$ and $1/[X_1]$. This suggests that if we use the same low resolution reciprocal table as in the coarse stage, the error contributed to the final result will be very small. We will demonstrate this in the next section. 2) If $Y_1/X_1$ is sufficiently small to satisfy $$|Y_1/X_1| = |\tan \phi_2| < 2^{-N/3} \quad (7.8)$$

where N denotes the desired number of bits in $\phi$, then $$\phi_2 = \tan^{-1}(Y_1/X_1) \approx Y_1/X_1 \quad (7.9)$$

and we can compute $\phi_2$ without using an arctangent table. This is explained as follows:

From the Taylor expansion of $\tan^{-}(Y_1/X_1)$ near $Y_1/X_1 = 0$, we obtain $$\tan^{-}(Y_1/X_1) = Y_1/X_1 - (Y_1/X_1)^3/3 + O((Y_1/X_1)^5). \quad (7.10)$$

Since $O((Y_1/X_1)^5)$ is negligible in comparison to $(Y_1/X_1)^3/3$, it can be omitted. Therefore, if $Y_1/X_1$ is used to approximate $\tan^{-1}(Y_1/X_1)$, an error $$\Delta_{tan} = \tan^{-1}(Y_1/X_1) - Y_1/X_1 = -(Y_1/X_1)^3/3 \quad (7.11)$$

will occur. However, according to (7.8), $\Delta_{tan}$ is bounded by $$|\Delta_{tan}| < 2^{-N}/3 \quad (7.12)$$

which is very small. This indicates that the approximation (7.9) is quite accurate if (7.8) is satisfied.

From the above analysis, no additional tables are needed for the fine stage if $\phi_1$ is sufficiently close to $\phi$. On the other hand, the better that $\phi_1$ approximates $\phi$, the larger the tables required for its computation become. As mentioned previously, table size grows exponentially as the precision increases. A good trade-off is obtained when the result $\phi_1$ of the coarse stage is just close enough to $\phi$ that (7.8) is satisfied, thereby eliminating the additional tables in the fine stage. A detailed description of a rectangular-to-polar converter that implements the algorithm follows.

FIG. 71 illustrates a rectangular-to-polar converter 7100 that implements the coarse and fine rotation described in section 7 herein, including equation (7.1)–(7.53). The converter 7100 receives a complex input signal 7102 (that represents a complex number having $X_0$ and $Y_0$ components) and determines the angle $\phi$, which represents the position of the complex signal 7102 in the complex plane. In doing so, the converter 7100 determines a coarse angle computation that is represented by the angle $\phi_1$, and performs a fine angle computation represented by the angle $\phi_2$. Once $\phi_1$ is determined, the input complex number 7102 is conceptually rotated back toward the X-axis to an intermediate complex signal 7115 as represented in FIG. 72, and $\phi_2$ is determined from intermediate complex signal 7115. The angles $\phi_1$ and $\phi_2$ are added together to determine $\phi$.

The converter 7100 includes: an input mux 7104, reciprocal ROM 7106, output demux 7108, an arctan ROM 7110, a multiplier 7112, a butterfly circuit 7114, a scaling shifter 7116, a fine angle computation stage 7124, and an adder 7126. The fine angle computation includes a multiplier set 7118, a one's complementer 7120, and a multiplier 7122.

The ROM 7106 stores reciprocal values of $[X_0]$, wherein $[X_0]$ is defined as the most significant bits (MSB) of $X_0$ of the input signal 7102. The reciprocal of $[X_0]$ is represented as $Z_0$, for ease of reference. As will be shown, the ROM 7106 is re-used to determine the reciprocal of $[X_1]$, where $X_1$ is the real part of the intermediate complex number 7115 shown in FIG. 71 and FIG. 72. The reciprocal of $[X_1]$ is represented as $Z_1$, for ease of reference. In embodiments, the ROM 7106 has $2^{N/3+1}$ storage spaces, where N is the number of bits that represents $X_0$ (and $Y_0$) of the input signal 7102.

The input mux 7104 chooses between $[X_0]$ and $[X_1]$ as an input to the reciprocal ROM 7106, according to the control 7128. The output demux 7108 couples an output of the ROM 7106 to $Z_0$ or $Z_1$ according to the control 7128. The control 7128 assures that $Z_0$ receives the stored reciprocal value for $[X_0]$, and that $Z_1$ receives the stored reciprocal value for $[X_1]$.

The arctan ROM 7110 stores the coarse approximation angle $\phi_1$ based on a $[Y_0 Z_0]$ input. Therefore, a coarse stage can be described as including the ROM ROM 7110, the ROM 7106, and the multiplier 7112, as they are used in the coarse angle computation.

The operation of the converter 7100 is described further with reference to the flowchart 7300, as follows. The order of the steps in the flowchart 7300 is not limiting as one or more of the steps can be performed simultaneously, or in different order.

In step 7302, the input complex signal 7102 having a $X_0$ component and a $Y_0$ component is received. In embodiments, the $X_0$ and $Y_0$ components are N-bit binary numbers.

In step 7304, the control 7128 causes $Z_0$ to be retrieved from the ROM 7106, where $Z_0$ represents $1/[X_0]$, and wherein $[X_0]$ is the MSBs of $X_0$.

In step 7306, the multiplier 7112 multiplies $Y_0$ of the input complex number 7102 by $Z_0$, resulting in a $[Z_0Y_0]$ component. The $[Z_0Y_0]$ component is an approximation of $Y_{0/X0}$.

In step 7308, the coarse angle $\phi_1$ is retrieved from the ROM 7110 based on $[Z_0Y_0]$, and is sent to the adder 7126. Note that the coarse stage can be described as including the ROM 7110, the ROM 7106, and the multiplier 7112, as they are used in the coarse angle computation.

In step 7310, the butterfly circuit 7114 multiplies the input complex signal 7102 by $[Z_0Y_0]$. This causes the input complex signal 7102 to be rotated in the complex plane toward the real axis to produce the intermediate complex signal 7115 (representing an intermediate complex number), having a real $X_1$ component and an imaginary $Y_1$ component.

In step 7312, the scaler 7116 scales the $X_1$ component of the intermediate complex signal so that it is compatible with the reciprocal values stored in the ROM 7106. The scaler also scales the $Y_1$ component by the same amount.

In step 7314, the control 7128 causes $Z_1$ to be retrieved from the ROM 7106 based on $[X_1]$, where $Z_1$ represents $1/[X_1]$, and wherein $[X_1]$ is the MSBs of $X_1$. Note, that the ROM 7106 is efficiently used twice to calculate two different reciprocals $Z_0$ and $Z_1$, thereby reducing overall memory size.

In step 7316, the fine angle computation stage 7124 determines the fine angle $\phi_2$ based on $Z_1$ and the scaled intermediate complex number 7115. In doing so the Newton-Raphson method is emulated in hardware to estimate $\phi_2$, which is the arctan of $Z_1Y_1$. More specifically, multiplier set 7118 multiples $X_1$, $Y_1$, by $Z_1$. The ones' (approximating two's) complement 7120 is then determined for $X_1Z_1$. After which, the multiplier 7127 multiplies $(2-X_1Z_1)$ by $Y_1Z_1$, to determine tan $\phi_2$. Since $\phi_2$ is a small angle, the value tan $\phi_2$ is used as an approximation of $\phi_2$.

In step 7316, the $\phi_1$ and $\phi_2$ are added together to get $\phi$.

A more detailed description of the algorithm follows.

7.2 The Two-stage Algorithm

In this section we first analyze how the coarse approximation error $\phi_2 = \phi - \phi_1$ depends upon the precision of the tables 7106 and 7110, in order to determine the amount of hardware that must be allocated to the coarse stage. Next we explore ways to simplify the computations in the fine stage.

72.1 Simplification in the Coarse Computation Stage

The main concern in the coarse stage design is how the lookup table values are generated to produce as precise results as possible for a given table size. As mentioned previously, there are two lookup tables:

7.2.1.1 The Reciprocal Table 7106

The input to this table, $1 \leq X_0 < 2$, can be expressed as $$X_0 = 1.x_1 x_2 \ldots x_m \ldots x_N \tag{7.13}$$

where only bits $x_1$ through $x_m$ are used to index the table. To generate the table value, if we merely truncate $X_0$ as $$[X_0] = 1.x_1 x_2 \ldots x_m \tag{7.14}$$

then the quantization error $\Delta_{x_0} = X_0 - [X_0]$ is bounded by $$0 < \Delta_{x_0} < 2^{-m}. \tag{7.15}$$

Thus, the difference between the table value and $1/X_0$, $$1/X_0 - 1/[X_0] = ([X_0] - X_0)/([X_0]X_0) \approx -\Delta_{x_0}/X_0^2 \tag{7.16}$$

is bounded by $$-2^{-m} < 1/X_0 - 1/[X_0] \leq 0. \tag{7.17}$$

But if we generate the table value corresponding to $$[X_0] = 1.x_1 x_2 \ldots x_m 1 \tag{7.18}$$

with a bit "1" appended as the LSB, then the quantization error in (7.15) is centered around zero:

$$-2^{-m-1} < \Delta_{x_0} < 2^{-m-1} \tag{7.19}$$

hence, the error in the reciprocal is also centered around zero:

$$-2^{-m-1} < 1/X_0 - 1/[X_0] \leq 2^{-m-1}. \tag{7.20}$$

Comparing (7.20) to (7.17), the maximum absolute error is reduced. This is the technique introduced in (Fowler, D. L., and Smith, J. E., "An accurate high speed implementation of division by reciprocal approximation," in *Proc. 9th Symp. on Computer Arithmetic* (1989), pp.60–67).

Since the output of the table will be multiplied by $Y_0$, the fewer the bits in the table value, the smaller the required multiplier hardware. Let the table value $Z_0$ be generated by rounding $1/[X_0]$ to n bits:

$$Z_0 = 0.1 z_2 z_3 \ldots z_n. \tag{7.21}$$

The quantization error $\Delta_{Z_0} = 1/[X_0] - Z_0$ is then bounded by $$-2^{-n-1} < \Delta_{Z_0} < 2^{-n-1}. \tag{7.22}$$

Once we have obtained $Z_0$ from the reciprocal table, we can get an approximation to the quotient $Y_0/X_0$ by computing $Y_0Z_0$. This result is then used to address the arctangent table for $\phi_1$.

7.2.1.2 The Arctangent Table 7110

In order to use a very small table, $Y_0Z_0$ is rounded to k bits to the right of the radix point to become $[Y_0Z_0]$, with the rounding error bounded by $$-2^{-k-1} < \Delta_{Y_0Z_0} = Y_0Z_0 - [Y_0Z_0] < 2^{-k-1}. \tag{7.23}$$

Then, $[Y_0Z_0]$ is used to index the arctangent table, which returns the coarse angle $\phi_1 = \tan^{-1}([Y_0 Z_0])$.

Now we must determine the minimum m, n and k values such that (7.8) is satisfied. First, let us examine $X_1$ and $Y_1$ which are computed using $[Y_0Z_0]$ as $$X_1 = X_0 + Y_0[Y_0Z_0] \tag{7.24}$$

$$Y_1 = Y_0 - X_0[Y_0Z_0]. \tag{7.25}$$

Dividing (7.25) by (7.24), and then dividing both the numerator and denominator by $X_0$, we have $$|Y_1/X_1| = |(Y_0/X_0 - [Y_0Z_0])/(1 + (Y_0/X_0)[Y_0Z_0])| \leq |Y_0/X_0 - [Y_0Z_0]|. \tag{7.26}$$

The inequality is true because $X_0 \geq Y_0 \geq 0$ and $[Y_0 Z_0] \geq 0$. Taking into account all the quantization errors in (7.20), (7.22) and (7.23), we can express $Y_0/X_0$ in terms of $[Y_0 Z_0]$ as $$Y_0(1/X_0) \approx Y_0(1/[X_0])$$

$$-\Delta_{X_0}/X_0^2) = Y_0$$

$$((Z_0 + \Delta_{Z_0}))$$

$$-\Delta_{X_0}/X_0^2) = Y_0 Z_0 + Y_0$$

$$\Delta_{Z_0} - Y_0(\Delta_{X_0}/X_0^2) =$$

$$[Y_0 Z_0] + \Delta_{Y_0 Z_0} + Y_0$$

$$\Delta_{Z_0} - Y_0(\Delta_{X_0}/X_0^2). \tag{7.27}$$

Substituting this result into (7.26), we have $$|Y_1/X_1| \leq |\Delta_{Y_0 Z_0} + Y_0 \Delta_{Z_0} - Y_0$$

$$(\Delta_{X_0}/X_0^2)|. \tag{7.28}$$

Since $Y_0(\Delta_{X_0}/X_0^2) = (Y_0/X_0)(\Delta_{X_0}/X_0)$, from (7.2) and (7.19), $$-2^{-m-1} < Y_0(\Delta_{X_0}/X_0^2) < 2^{-m-1}. \tag{7.29}$$

Also, according to (7.2) and (7.22), we have $$-2^{-n} < Y_0 \Delta_{Z_0} < 2^{-n}. \tag{7.30}$$

Applying (7.23), (7.29) and (7.30) to (7.28), we obtain $|Y_1/X_1| < 2^{-m-1} + 2^{-n} + 2^{-k-1}$. If we choose $m \geq N/3+1$, $n \geq N/3+2$ and $k \geq N/3+1$, then $$|Y_1/X_1| < 0.75 \times 2^{-N/3}. \tag{7.31}$$

Therefore, since the inputs $X_1$ and $Y_1$ to the fine stage satisfy (7.8), no additional tables are needed for the fine stage. Henceforth we choose $m = N/3+1$, $n = N/3+2$ and $k = N/3+1$.

7.2.2 Hardware Reduction in the Fine Computation Stage 7124

Since (7.8) is satisfied, we can obtain the fine angle $\phi_2$ by computing the quotient $Y_1/X_1$. From (7.24), we have $X_0 \leq X_1 \leq X_0 + Y_0$, hence $1 \leq X_1 < 4$. In order to use the same reciprocal table as in the coarse stage, $X_1$ should be scaled such that $$1 \leq X_1 < 2. \tag{7.32}$$

This can be satisfied by shifting $X_1$ to the right if $X_1 \geq 2$. Of course $Y_1$ should also be shifted accordingly so that $Y_1/X_1$ remains unchanged.

As in the coarse stage, the reciprocal table accepts $N/3+1$ MSBs of $X_1$ and returns $Z_1$. We define the reciprocal error $\delta_1 = 1/X_1 - Z_1$. Since the same reciprocal table is used as in the coarse stage, $\delta_1$ and $\delta_0$ must have the same bound. Since $$\delta_1 = \delta_0 = 1/X_0 - Z_0 = 1/X_0 - 1/[X_0] + \Delta_{Z_0} \tag{7.33}$$

we can use (7.20) and (7.22) to obtain $$-0.75 \times 2^{-N/3-1} < \delta_1 < 0.75 \times 2^{-N/3-1}. \tag{7.34}$$

The bound on $Y_1$ can be found using (7.31) and (7.32):

$$|Y_1| < 0.75 \times 2^{-N/3+1}. \tag{7.35}$$

Now we can obtain the final error bound in approximating $X_1/Y_1$ by $Y_1 Z_1$, according to (7.34) and (7.35), as $$|Y_1/X_1 - Y_1 Z_1| = |Y_1 \delta_1| < (0.75)^2 \times 2^{-2N/3}. \tag{7.36}$$

Clearly, this approximation error is too large. To reduce the maximum error below $2^{-N}$, the bound on $|\delta_1|$ should be approximately $2^{-2N/3}$, which would require the reciprocal table to accept $2N/3$ bits as input. That is, the table needed for such a high-resolution input would be significantly larger than the one already employed by the coarse stage.

To overcome this difficulty, we can apply the Newton-Raphson iteration method (Koren, I., *Computer Arithmetic Algorithms*, Prentice Hall, Englewood Cliffs, N.J. (1993)) to reduce the initial approximation error $\delta_1$. We now briefly explain how this method works. First, let us define the following function:

$$f(Z) = 1/Z - X_1. \tag{7.37}$$

Obviously, we can obtain $Z = 1/X_1$ by solving $f(Z) = 0$. In other words, we can find $1/X_1$ by searching for the Z value such that $f(Z)$ intersects the Z-axis, as shown in FIG. 70A.

Shifting the Z-axis down by $X_1$, we obtain a new function $$f_1(Z) = \frac{1}{Z},$$

shown in FIG. 70B. At $Z_1 = 1/[X_1]$, $Z_1$ being the initial guess, the slope of $f_1(Z) = 1/Z$ is $$f_1'(Z_1) = -\frac{1}{Z_1^2}. \tag{7.38}$$

The tangent, shown as the dashed line 7102, intersects the $f_1(Z) = X_1$ line at a new point $Z_2$. From FIG. 70B, $Z_2$ is much closer to the desired value $1/X_1$ than the initial guess $Z_1$. Let us now find $Z_2$. According to FIG. 70B, we must have $$\frac{X_1 - 1/Z_1}{Z_2 - Z_1} = -\frac{1}{Z_1^2}. \tag{7.39}$$

Expressing $Z_2$ in terms of $Z_1$ and $X_1$ we have $$Z_2 = Z_1(2 - X_1 Z_1). \tag{7.40}$$

Thus, we can obtain $Z_2$, a more accurate approximation of $1/X_1$, from $Z_1$. One may wonder how accurate $Z_2$ is in approximating $1/X_1$. Let us now examine the approximation error bound.

Substituting $Z_1 = 1/X_1 - \delta_1$ into (7.40), we have $$Z_2 = (1/X_1 - \delta_1)(2 - X_1(1/X_1 - \delta_1)) = 1/X_1 - X_1 \delta_1^2. \tag{7.41}$$

According to (7.32), (7.34) and (7.35), after one Newton-Raphson iteration, the error in $Y_1 Z_2$ is reduced to $$|Y_1/X_1 - Y_1 Z_2| = |Y_1 X_1 \delta_1^2| < (0.75)^3 \times 2^{-N}. \tag{7.42}$$

Thus, a rather accurate result is obtained with just one iteration.

Finally, the fine angle can be computed by multiplying $Z_2$ by $Y_1$:

$$\phi_2 \approx Y_1 Z_2 = Y_1 Z_1(2 - X_1 Z_1). \tag{7.43}$$

Although there are three multipliers involved in (7.43), the size of these multipliers can be reduced with just a slight accuracy loss by truncating the data before feeding them to the multipliers. The computational procedure of (7.43) is as follows:

1) The inputs to the fine stage, $X_1$ and $Y_1$, are truncated to $2N/3+2$ and $N+3$ bits to the right of their radix points, respectively. Since the N/3−1 MSBs in $Y_1$ are just sign bits, as indicated by (7.35), they do not influence the complexity of the multiplier that produces $Y_1Z_1$. The corresponding quantization errors are bounded by $$0 \leq \Delta_{X_1} < 2^{-2N/3-2} \tag{7.44}$$

$$0 \leq \Delta_{Y_1} < 2^{-N-3} \tag{7.45}$$

2) Both quantized $X_1$ and $Y_1$ are multiplied by $Z_1$.

3) To form $2-X_1Z_1$, instead of generating the two's complement of $X_1Z_1$, we can use the ones complement with only an insignificant error. Since this error is much smaller, in comparison to the truncation error in the next step, we can neglect it.

4) The product $Y_1Z_1$ is truncated to N+3 bits. We would also truncate the ones complement of $X_1Z_1$. But since the inverted LSBs of $X_1K_1Z$, will be discarded, we can truncate $X_1Z_1$ to 2N/3+2 bits and then take its ones vcomplement. The corresponding quantization errors, as discussed above, are:

$$0 \leq \Delta_{X_1Y_1} < 2^{-2N/3-2} \tag{7.46}$$

$$0 \leq \Delta_{Y_1X_1} < 2^{-N-3} \tag{7.47}$$

After including all the error sources due to simplification, we now analyze the effects of these errors on the final result $\phi_2$. Taking the errors into account, we can rewrite (7.43) as:

$$\phi_2 \approx ((Y_1 - \Delta_{Y_1})(1/X_1 - \delta_1) + \Delta_{Y_1Z_1})(2 - (X_1 - \Delta_{X_1})(1/X_1 - \delta_1) + \Delta_{X_1Z_1}) \tag{7.48}$$

Expanding this product and neglecting terms whose magnitudes are insignificant, we have $$\phi_2 \approx Y_1/X_1 - Y_1X_1\delta_1^2 + (Y_1/X_1^2)\Delta X_1 - (1/X_1)\Delta_{Y_1} + (Y_1/X_1)(\Delta_{X_1Z_1}) + \Delta_{Y_1Z_1}. \tag{7.49}$$

As mentioned in Section 7.1, $Y_1/X_1$ is an approximation of $\tan^{-1}(Y_1/X_1)$. Its approximation error, defined in (7.8), is bounded by $$|\Delta_{tan}| = |(Y_1/X_1)^3/3| < (0.75)^3 \times 2^{-N}/3. \tag{7.50}$$

Replacing $Y_1/X_1$ by $\tan^{-1}(Y_1/X_1) + (Y_1/X_1)^3/3$ in (7.49), we have $$\phi_2 \approx \tan^{-1}(Y_1/X_1) + (Y_1/X_1)^3/3 - Y_1X_1\delta_1^2 + (Y_1/X_1^2)\Delta_{X_1} - (1/X_1)\Delta_{Y_1} + (Y_1/X_1)\Delta_{X_1Z_1} + \Delta_{Y_1Z_1}. \tag{7.51}$$

The total error, $\epsilon = \phi_2 - \tan^{-1}(Y_1/X_1)$, is $$\epsilon = (Y_1/X_1)\{(Y_1/X_1)^2/3 - (X_1\delta_1)^2 + \Delta_{X_1}/X_1 + \Delta_{X_1Z_1}\} - (1/X_1)\Delta_{Y_1} + \Delta_{Y_1Z_1}. \tag{7.52}$$

All terms in the subtotal $(Y_1/X_1)^2/3 - (X_1\delta_1)^2 + \Delta_{X_1}/X_1 + \Delta_{X_1Z_1}$ are non-negative. Thus, the lower bound of this subtotal is the minimum value of $-(X_1\delta_1)^2$, which is $-0.75^2 \times 2^{-2N/3} = -0.56 \times 2^{-2N/3}$, according to (7.34). Correspondingly, its upper bound is the sum of the maximum values of the other three terms: $(0.75^2/3 + 2^{-2} + 2^{-2}) \times 2^{-2N/3} = 0.68 \times 2^{-2N/3}$.

Finally, we can obtain the total error bound as:

$$|\epsilon| < 0.75 \times 2^{-N/3} \times 0.68 \times 2^{-2N/3} + 2^{-N-3} + 2^{-N-3} = 0.76 \times 2^{-N}. \tag{7.53}$$

7.3 Magnitude Calculation

Once the angle of the vector $(X_0, Y_0)$ is known, its magnitude can be obtained by multiplying $X_0$ by $1/\cos\phi$, whose values can be pre-calculated and stored in a ROM, thereby requiring only a single multiplication. However, if we use all the available bits to index the ROM table, it is likely that a very large ROM will be needed.

As we know from the preceding discussion, the coarse angle $\phi_1$ is an approximation of $\phi$. Similarly $1/\cos\phi_1$ approximates $1/\cos\phi$. Therefore, we can expand the coarse-stage ROM 7110 to include also the $1/\cos\phi_1$ values. That is, for each input $[Y_0Z_0]$, the coarse-stage ROM would output both $\phi_1 = \tan^{-1}([Y_0Z_0])$ and $1/\cos\phi_1$. Since $X_0$ and $Y_0$ satisfy (7.2) and (7.3), the $1/\cos\phi$ value is within the interval $[1, \sqrt{2}]$.

For many applications, the magnitude value is used only to adjust the scaling of some signal level, and high precision is not necessary. For applications where a higher precision is desired, we propose the following approach:

First, instead of using the above-mentioned table of $1/\cos\phi_1$ values, we pre-calculate and store in ROM the $1/\cos\phi_M$ values, where $\phi_M$ contains only the m MSBs of $\phi$. Obviously a small table, one of comparable size to the $1/\cos\phi_1$ table, is needed. Then, we can look up the table entries for the two nearest values to $\phi$, namely $\phi_M$ and $\phi'_M = \phi_M + 2^{-m}$. Then a better approximation of $1/\cos\phi$ can be obtained by interpolating between the table values $1/\cos\phi_M$ and $1/\cos\phi'_M$ as $$1/\cos\varphi \approx 1\cos\varphi_M + \frac{1/\cos\varphi'_M - 1/\cos\varphi_M}{\varphi'_M - \varphi_M} \times (\varphi - \varphi_M). \tag{7.54}$$

Let $\phi_L = \phi - \phi_M$. Obviously, $\phi_L$ simply contains the LSBs of $\phi$. We can now rewrite (7.54) as $$1\cos\phi \approx 1/\cos\phi_M + (1/\cos\phi'_M - 1/\cos\phi_M) \times \phi_L \times 2^m \tag{7.55}$$

which involves only a multiplication and a shift operation, in addition to two adders.

7.4 Converting Arbitrary Inputs

In previous sections we have restricted the input values to lie within the bounds of (7.2) and (7.3). However, if the coordinates of $(X_0, Y_0)$ do not satisfy that condition, we must map the given point to one whose coordinates do. Of course, the resulting angle must be modified accordingly. To do that, we replace $X_0$ and $Y_0$ by their absolute values. This maps $(X_0, Y_0)$ into the first quadrant. Next, the larger of $|X_0|$ and $|Y_0|$ is used as the denominator in (7.1) and the other as the numerator. This places the corresponding angle in the interval $[0, \pi/4]$. We can now use the procedure discussed previously to obtain $\phi$. Once we get $\phi$, we can find the angle $\phi$ that corresponds to the original coordinates from $\phi$. First, if originally $|X_0| < |Y_0|$ we should map $\phi$ to $[\pi/4, \pi/2]$ using $\phi' = \pi/2 - \phi$. Otherwise $\phi' = \phi$. We then map this result to the original quadrant according to Table 7.1.

Next, let us examine the affect of the above-mentioned mapping on the magnitude calculation. Since the negation and exchange of the original $X_0$ and $Y_0$ values do not change the magnitude, whose value is $(X_0^2 + Y_0^2)^{1/2}$, the result obtained using the $X_0$ and $Y_0$ values after the mapping needs no correction. However, if the input values were scaled to satisfy (7.3), we then need to scale the computed magnitude to the original scale of $X_0$ and $Y_0$.

TABLE 7.1

Converting Arbitrary Inputs

| Original coordinates | Modification to the angle |
|---|---|
| $X_0 < 0, Y_0 > 0$ | $\phi = \pi - \phi'$ |
| $X_0 < 0, Y_0 < 0$ | $\phi = \pi + \phi'$ |
| $X_0 > 0, Y_0 < 0$ | $\phi = 2\pi - \phi'$ |

7.5 Test Result

We have verified our error bound estimation by a bit-level simulation of the rectangular-to-polar converter 7100. To test the core algorithm described in Section 7.2, we generated the pair of inputs $X_0$ and $Y_0$ randomly within the range described by (7.2) and (7.3). This test was run repeatedly over many different values of $X_0$ and $Y_0$, and the maximum error value was recorded. Choosing N=9 for this simulation, the error bound estimate according to (7.53) is 0.0015. Our test results yielded the error bounds [−0.00014, 0.00051], well within the calculated bound.

7.6 Conclusion

An efficient rectangular-to-polar converter is described. The angle computation of a complex number is partitioned into coarse and fine computational stages. Very small arctangent and reciprocal tables are used to obtain a coarse angle. These tables should provide just enough precision such that the remaining fine angle is small enough to approximately equal its tangent value. Therefore the fine angle can be obtained without a look-up table. The computations are consolidated into a few small multipliers, given a precision requirement. While a low-precision magnitude can be obtained quite simply, a high-precision result can be achieved by combining the angle computation with the angle rotation processor 3900 of Section 5.

The applications of this converter include the implementation of the converter 6106 in the symbol synchronizer 6100 and the synchronizer 6400. However, the converter is not limited to symbol synchronization. It also provides efficient implementation of computational tasks for many communication systems, such as constant-amplitude FSK and PSK modems (Chen, A., and Yang, S., "Reduced complexity CORDIC demodulator implementation for D-AMPS and digital IF-sampled receiver," in *Proc. Globecom* 1998, vol. 3 (1998), pp. 1491–1496; Boutin, N., *IEEE Trans. Consumer Electron.* 38:5–9 (1992)), DMT modems (Arivoli, T., et al., "A single chip DMT modem for high-speed WLANs," in *Proc. 1998 Custom Integrated Circuits Conf.* (May 1998), pp. 9–11), as well as carrier synchronization (Andronico, M., et al., "A new algorithm for fast synchronization in a burst mode PSK demodulator," in *Proc. 1995 IEEE Int. Conf. Comm.*, vol. 3 (June 1995), pp. 1641–1646; Fitz, M. P., and Lindsey, W. C., *IEEE Trans. Comm.* 40:1644–1653 (1992) where the computation of phase and magnitude from the rectangular coordinates is essential.

8. Exemplary Computer System

Embodiments of invention may be implemented using hardware, software or a combination thereof and may be implemented in a computer system or other processing system. In fact, in one embodiment, the invention is directed toward a software and/or hardware embodiment in a computer system. An example computer system 7702 is shown in FIG. 77. The computer system 7702 includes one or more processors, such as processor 7704. The processor 7704 is connected to a communication bus 7706. The invention can be implemented in various software embodiments that can operate in this example computer system. After reading this description, it will become apparent to a person skilled in the relevant art how to implement the invention using other computer systems and/or computer architectures.

Computer system 7702 also includes a main memory 7708, preferably a random access memory (RAM), and can also include a secondary memory or secondary storage 7710. The secondary memory 7710 can include, for example, a hard disk drive 7712 and a removable storage drive 7714, representing a floppy disk drive, a magnetic tape drive, an optical disk drive, etc. The removable storage drive 7714 reads from and/or writes to a removable storage unit 7716 in a well known manner. Removable storage unit 7716, represents a floppy disk, magnetic tape, optical disk, etc. which is read by and written to by removable storage drive 7714. As will be appreciated, the removable storage unit 7716 includes a computer usable storage medium having stored therein computer software and/or data.

In alternative embodiments, secondary memory 7710 may include other similar means for allowing computer software and data to be loaded into computer system 7702. Such means can include, for example, a removable storage unit 7720 and an storage interface 7718. Examples of such can include a program cartridge and cartridge interface (such as that found in video game devices), a removable memory chip (such as an EPROM, or PROM) and associated socket, and other removable storage units 7720 and interfaces 7718 which allow software and data to be transferred from the removable storage unit 7720 to the computer system 7702.

Computer system 7702 can also include a communications interface 7722. Communications interface 7722 allows software and data to be transferred between computer system 7702 and external devices 7726. Examples of communications interface 7722 can include a modem, a network interface (such. as an Ethernet card), a communications port, a PCMCIA slot and card, etc. Software and data transferred via communications interface 7722 are in the form of signals, which can be electronic, electromagnetic, optical or other signals capable of being received by the communications interface 7722. These signals are provided to the communications interface 7722 via a channel 7724. This channel 7724 can be implemented using wire or cable, fiber optics, a phone line, a cellular phone link, an RF link and other communications channels.

Computer system 7702 may also include well known peripherals 7703 including a display monitor, a keyboard, a printers and facsimile, and a pointing device such a computer mouse, track ball, etc.

In this document, the terms "computer program medium" and "computer usable medium" are used to generally refer to media such as the removable storage devices 7716 and 7718, a hard disk installed in hard disk drive 7712, semiconductor memory devices including RAM and ROM, and associated signals. These computer program products are means for providing software (including computer programs that embody the invention) and/or data to computer system 7702.

Computer programs (also called computer control logic or computer program logic) are generally stored in main memory 7708 and/or secondary memory 7710 and executed therefrom. Computer programs can also be received via communications interface 7722. Such computer programs, when executed, enable the computer system 7702 to perform the features of the present invention as discussed herein. In particular, the computer programs, when executed, enable the processor 7704 to perform the features of the present invention. Accordingly, such computer programs represent controllers of the computer system 7702.

In an embodiment where the invention is implemented using software, the software may be stored in a computer program and loaded into computer system 7702 using removable storage drive 7714, hard drive 7712 or communications interface 7722. The control logic (softwware), when executed by the processor 7704, causes the processor 7704 to perform the functions of the invention as described herein.

In another embodiment, the invention is implemented primarily in hardware using, for example, hardware components such as application specific integrated circuits (ASICs), stand alone processors, and/or digital signal processors (DSPs). Implementation of the hardware state machine so as to perform the functions described herein will be apparent to persons skilled in the relevant art(s). In embodiments, the invention can exist as software operating on these hardware platforms.

In yet another embodiment, the invention is implemented using a combination of both hardware and software.

9. Appendices

The following Appendices are included.
9.1 Appendix A: Proof of the Zero ISI Condition.

In Section 3.4 we have examined the condition for a real-valued function f(t) to have zero crossings at integer multiples of the sampling period, i.e., for satisfying (3.16). We have stated that f(t) satisfies (3.16) if and only if $\hat{F}(k)$, defined as samples of $F(\Omega)$ in (3.8) (F is the frequency response of f), satisfy (3.18). Here, $-\infty < k < \infty$ is an integer. We now provide the proof.

Proof: First let us define a periodic, of period N, extension of f(t) as $$f_c(t) = \sum_{n=-\infty}^{\infty} f(t - Nn). \quad (A.1)$$

Its Fourier transform consists of a sequence of impulses $$F_c(\Omega) = \sum_{k=-\infty}^{\infty} \hat{F}(k)\delta\left(\Omega - \frac{2\pi}{N}k\right). \quad (A.2)$$

Next, consider an impulse chain.

$$c(t) = \sum_{n=-\infty}^{\infty} \delta(t-n). \quad (A.3)$$

whose Fourier transform is $$C(\Omega) = \sum_{k=-\infty}^{\infty} \delta(\Omega - 2\pi k). \quad (A.4)$$

The convolution $F_c \otimes C$ can be expressed as $$F_c(\Omega) \otimes C(\Omega) = F_c(\Omega) \otimes \sum_{m=-\infty}^{\infty} \delta(\Omega - 2\pi m) \quad (A.5)$$

$$= \sum_{m=-\infty}^{\infty} F_c(\Omega - 2\pi m)$$

Substituting (A.2) into (A.5) yields:

$$F_c(\Omega) \otimes C(\Omega) = \sum_{m=-\infty}^{\infty} \left( \sum_{k=-\infty}^{\infty} \hat{F}(k)\delta\left(\Omega - 2\pi m - \frac{2\pi}{N}k\right) \right) \quad (A.6)$$

$$= \sum_{k=-\infty}^{\infty} \sum_{m=-\infty}^{\infty} \hat{F}(k)\delta\left(\Omega - \frac{2\pi}{N}(k + Nm)\right)$$

$$= \sum_{k=-\infty}^{\infty} \left( \sum_{m=-\infty}^{\infty} \hat{F}(k - Nm) \right) \delta\left(\Omega - \frac{2\pi}{N}k\right).$$

Therefore, we have the following relationships $$(3.16) \Leftrightarrow f_c(t) = \begin{cases} 1 & t = Nm, m \text{ an integer} \\ 0 & \text{all other integers.} \end{cases}$$

$$\Leftrightarrow f_c(t)c(t) = \sum_{m=-\infty}^{\infty} \delta(t - Nm)$$

$$\Leftrightarrow F_c(\Omega) \otimes C(\Omega) = \sum_{k=-\infty}^{\infty} \delta\left(\Omega - \frac{2\pi}{N}k\right)$$

$$(A.6) \Leftrightarrow \sum_{k=-\infty}^{\infty} \left( \sum_{m=-\infty}^{\infty} \hat{F}(k - Nm) \right) \delta\left(\Omega - \frac{2\pi}{N}k\right) = \sum_{k=-\infty}^{\infty} \delta\left(\Omega - \frac{2\pi}{N}k\right)$$

$$\Leftrightarrow \sum_{m=-\infty}^{\infty} \hat{F}(k - Nm) = 1$$

$$\Leftrightarrow (3.18)$$

This concludes the proof.

9.2 Appendix B: Impulse Response of the Simplified Interpolators

In Section 2, after introducing a preliminary interpolation method, we have shown that we can trade one angle rotator for a multiplier by conceptually modifying the input samples, then by "correcting" the interpolated value obtained from the "modified" samples. A simpler implementation structure as well as better performance in interpolating most practical signals have been facilitated. We now derive the impulse response of this interpolation filter. As discussed in Section 2, the interpolated sample is computed as $$y(\mu) = \frac{1}{N} \sum_{k=-N/2+1}^{N/2-1} c_k W_N^{-k\mu} - K\mu \quad (B.1)$$

where K is defined in (2.30), and $$c_k = \sum_{m=-N/2+1}^{N/2} \tilde{y}(m) W_N^{km} = \sum_{m=-N/2+1}^{N/2} (y(m) + mK) W_N^{km} \quad (B.2)$$

where k=0, ..., N/2−1.

Substituting (2.30) into (B.2), we have $$c_k = \sum_{m=-N/2+1}^{N/2} y(m) W_N^{km} - \sum_{m=-N/2+1}^{N/2} \left( m\frac{2}{N} \sum_{n=-N/2+1}^{N/2} (-1)^n y(n) \right) W_N^{km} \quad (B.3)$$

$$= \sum_{m=-N/2+1}^{N/2} y(m) W_N^{km} - \sum_{n=-N/2+1}^{N/2} \left( \sum_{m=-N/2+1}^{N/2} m\frac{2}{N} W_N^{km} \right) (-1)^n y(n)$$

$$= \sum_{m=-N/2+1}^{N/2} y(m) W_N^{km} - \sum_{m=-N/2+1}^{N/2} \left( \sum_{n=-N/2+1}^{N/2} n\frac{2}{N} W_N^{kn} \right) (-1)^m y(m)$$

Replacing K and $c_k$ in (B.1) by (2.30) and (B.3), respectively, we have $$y(\mu) = \frac{1}{N} \sum_{k=-N/2+1}^{N/2-1} \sum_{m=-N/2+1}^{N/2} \left( W_N^{km} - \sum_{n=-N/2+1}^{N/2} n\frac{2}{N} W_N^{km}(-1)^m \right) \quad (B.4)$$

-continued $$y(m)W_N^{-k\mu} + \frac{2}{N}\sum_{m=-N/2+1}^{N/2}(-1)^m y(m)\mu$$

$$= \sum_{m=-N/2+1}^{N/2} y(m)\left(\frac{1}{N}\sum_{k=-N/2+1}^{N/2-1} W_N^{k(m-\mu)} - \frac{2}{N}(-1)^m\left(\sum_{n=-N/2+1}^{N/2}\frac{n}{N}\sum_{k=-N/2+1}^{N/2-1} W_N^{k(n-\mu)} - \mu\right)\right)$$

$$= \sum_{m=-N/2+1}^{N/2} y(m)f(\mu-m).$$

where f(t), the impulse response of the simplified interpolation filter discussed in Section 2.6.1, is now defined as $$f(t) = \frac{1}{N}\sum_{k=-N/2+1}^{N/2-1} W_N^{-kt} - \frac{2}{N}(-1)^m\left(\sum_{n=-N/2+1}^{N/2-1}\frac{n}{N}\sum_{k=-N/2+1}^{N/2-1} W_N^{k(n-t-m)} - (t+m)\right) \quad (B.5)$$

for $-m \leq t \leq 1-m$, $m=-N/2+1, \ldots, N/2$. Otherwise, $f(t)=0$.

The frequency response, of course, can be obtained by taking the Fourier transform of f(t). To modify the frequency response of f(t), we can multiply the $c_k$ coefficient in (B.3) by a value denoted by $\hat{F}\mu(k)$. In designing an optimal interpolation filter as discussed in Section 4, we search for the $\hat{F}\mu(k)$ value that minimizes (4.4), i.e., $F_\mu(\omega)$ most accurately approximates the desired response (4.3).

9.3 Appendix C: Fourier Transform of $g(nT_s-\mu)$

Since, in Section 6, the $g(nT_s)$ are samples of the continuous-time pulse g(t), assuming, without loss of generality, that $T_s=1$, it is well-known (Freeman, H., *Discrete-Time Systems*, Wiley, New York, N.Y. (1965)) that the Fourier transforms are related as $$G(e^{j\omega}) = \sum_{k=-\infty}^{\infty}\hat{G}(\omega+2\pi k) \quad (C.1)$$

where $G(e^{j\omega})$ and $\hat{G}(\omega)$ are the Fourier transforms of g(n) and g(t), respectively. Since g(t) is bandlimited, i.e., $|\hat{G}(\omega)|=0$ for $|\omega|>\pi$, we have $$G(e^{j\omega})=\hat{G}(\omega), \quad -\pi \leq \omega \leq \omega. \quad (C.2)$$

Using the Fourier transform's time-shifting property, the Fourier transform of $g(t-\mu)$ is $$e^{j\omega\mu}\hat{G}(\omega). \quad (C.3)$$

Since the $g(n-\mu)$ are samples of $g(t-\mu)$, for the same reason as the above, their Fourier transforms are the same in the interval $-\pi \leq \omega \leq \pi$, as in (C.2). Thus, according to (C.2) and (C.3) we have $$FT(g(n-\mu))=e^{j\omega\mu}G(e^{j\omega}), \quad -\pi \leq \omega \leq \pi. \quad (C.4)$$

9.4 Appendix D: Interpolation on Non-center Intervals

When we first discussed the interpolation problem in Section 2, we focused on interpolating between the two samples in the middle of the set of samples used to generate a synchronized sample. What is the impact on interpolation performance when we interpolate in an interval not at the center of the samples being used? FIG. 74 shows such an example for N=4, where the interpolation is performed between y(0) and y(1) using y(−2), y(−1), y(0) and y(1) (as opposed to using y(−1), y(0), y(1) and y(2), as seen in FIG. 2).

Using the procedure described in Section 2, given N samples y(n), n=−N+2, ..., 1, we first compute the Fourier coefficients as $$c_k = \sum_{n=-N+2}^{1} y(i)W_N^{kn}, k = -\frac{N}{2}+1, \ldots, \frac{N}{2}. \quad (D.1)$$

Comparing (D.1) to (2.9), their only difference is the range of the summation. As in Section 2, for a given offset $0 \leq \mu \leq 1$, the synchronized sample $y(\mu)$ can be computed as:

$$y(\mu) = \frac{1}{N}\text{Re}\left(c_0 + 2\sum_{k=1}^{N/2-1} c_k W_N^{-k\mu} + c_{N/2}e^{j\pi\mu}\right). \quad (D.2)$$

We can express $y(\mu)$ in terms of y(n) by substituting (D.2) into (D.1), as $$y(\mu) = \frac{1}{N}\sum_{n=-N+2}^{1} y(n) \quad (D.3)$$

$$\left(1 + 2\sum_{k=1}^{N/2-1}\cos\frac{2\pi k}{N}(\mu-n) + \cos\pi(\mu-n)\right)$$

$$= \frac{1}{N}\sum_{n=-N+2}^{1} y(n)f(\mu-n)$$

where $$f(t) = \begin{cases} 1 + 2\sum_{k=1}^{N/2-1}\cos\frac{2\pi k}{N}t + \cos\pi t & t-1 \leq t \leq -N+2 \\ 0 & \text{otherwise} \end{cases} \quad (D.4)$$

is the impulse response of the corresponding interpolation filter. For N=4, f(t) is plotted in FIG. 75A. Taking the Fourier transform of f(t), we obtain the corresponding frequency response, which is shown in FIG. 76A.

Comparing the FIG. 76A frequency response to FIG. 7A, both for N=4, we can see that the interpolation performance degraded significantly, as shown by the ripples in the passband and large sidelobes in the stopband in FIG. 76A, when the interpolation is not done in the center interval.

However, using the optimization method discussed in Section 4, we can "reshape" the impulse response f(t) such that the corresponding frequency response is a better approximation to the ideal interpolation frequency response. The impulse response of an optimized interpolation filter for a non-center interval is illustrated in FIG. 75B. The corresponding frequency response is shown in FIG. 76B, which is clearly better than FIG. 76A, since it has less ripple in the passband and more attenuation in the stopband.

Using samples y(−N+2), ..., y(−1), and y(0), to interpolate obviously reduces the latency in generating synchronized samples, as compared to using samples y(−N/2+1), ..., y(0), ..., y(N/2), since the interpolator does not have to wait until samples y(1), ..., y(N/2), become available. In applications where low latency takes a higher priority than interpolation accuracy, this approach will be useful.

9.5 Appendix E

The following documents are incorporated by reference in their entirities:

1. Buchanan, K., et al., *IEEE Pers. Comm.* 4:8–13 (1997);
2. Reimers, U., *IEEE Comm. Magazine* 36:104–110 (1998);
3. Cho, K., "A frequency-agile single-chip QAM modulator with beamforming diversity," Ph.D. dissertation, University of California, Los Angeles (1999);
4. Oerder M., and Meyr, H., *IEEE Trans. Comm.* 36:605–612 (1988);
5. Pollet T., and Peeters, M., *IEEE Comm. Magazine* 37:80–86 (1999);
6. Gardner, F. M., *IEEE Trans. Comm.* 41:502–508 (1993);
7. Erup, L., et al., *IEEE Trans. Comm.* 41:998–1008 (1993);
8. Farrow, C., "A continuously variable digital delay element," in *Proc. IEEE Int. Symp. Circuits Syst.* (June 1988), pp. 2641–2645;
9. Proakis, J. G., *Digital Communications*, McGraw-Hill, New York, N.Y. (1993);
10. Proakis, J. G., *Digital Signal Processing*, Macmillan, New York, N.Y. (1992);
11. Vesma, J., and Saramäki, T., "Interpolation filters with arbitrary frequency response for all-digital receivers," in *Proc. 1996 IEEE Int. Symp. Circuits Syst.* (May 1996), pp. 568–571;
12. Ahn, Y., et al., "VLSI design of a CORDIC-based derotator," in *Proc. 1998 IEEE Int. Symp. Circuits Syst.*, Vol. II (May 1998), pp. 449–452;
13. Wang, S., et al., *IEEE Trans. Comp.* 46:1202–1207 (1997);
14. Madisetti, A., et al., *IEEE J. Solid-State Circuits* 34:1034–1043 (1999);
15. Tan, L. and Samueli, H., *IEEE J. Solid-State Circuits* 30:193–200 (1995;
16. Madisetti, A., "VLSI architectures and IC implementations for bandwidth efficient communications," Ph.D. dissertation, University of California, Los Angeles (1996);
17. Vankka, J., *IEEE Trans. Ultrasonics, Ferroelectronics and Freq. Control* 44:526–534 (1997);
18. Daneshrad, B., "System design of a 1.6 Mbps all-digital QAM transceiver for digital subscriber line applications," Ph.D. dissertation, University of California, Los Angeles (1993);
19. Tan, L., "High performance architectures and circuits for QAM transceivers," Ph.D. dissertation, University of California, Los Angeles (1995);
20. Gardner, S., *Electron. Eng.* 71:85–92 (1999);
21. Gardner, S., *Electron. Eng.* 71:75–83 (1999);
22. Sabel, L., and Cowley, W., "A recursive algorithm for the estimation of symbol timing in PSK burst modems," in *Proc. Globecom* 1992, vol. 1 (1992), pp. 360–364;
23. Chen, A., et al., "Modified CORDIC demodulator implementation for digital IF-sampled receiver," in *Proc. Globecom* 1995, vol. 2 (1995), pp. 1450–1454;
24. Boutin, N., *IEEE Trans. Consumer Electron.* 38:5–9 (1992);
25. Meyr, H., et al., *Digital Communication Receivers: Synchronization, Channel Estimation and Signal Processing*, Wiley, New York, N.Y. (1998);
26. Chen, A., and Yang, S., "Reduced complexity CORDIC demodulator implementation for D-AMPS and digital IF-sampled receiver," in *Proc. Globecom* 1998, vol. 3 (1998), pp. 1491–1496;
27. Andronico, M., et al., "A new algorithm for fast synchronization in a burst mode PSK demodulator," in *Proc. 1995 IEEE nt. Conf. Comm.*, vol. 3 (June 1995), pp. 1641–1646;
28. Critchlow, D., "The design and simulation of a modulatable direct digital synthesizer with non-iterative coordinate transformation and noise shaping filter," M.S. thesis, University of California, San Diego (1989);
29. Arivoli, T., et al., "A single chip DMT modem for high-speed WLANs," in *Proc. 1998 Custom Integrated Circuits Conf.* (May 1998), pp. 9–11;
30. Fitz, M. P., and Lindsey, W. C., *IEEE Trans. Comm.* 40:1644–1653 (1992);
31. Fowler, D. L., and Smith, J. E., "An accurate high speed implementation of division by reciprocal approximation," in *Proc. 9th Symp. on Computer Arithmetic* (1989), pp. 60–67;
32. Koren, I., *Computer Arithmetic Algorithms*, Prentice Hall, Englewood Cliffs, N.J. (1993);
33. Fu, D., and Willson, Jr., A. N., "Interpolation in timing recovery using a trigonometric polynomial and its implementation," in *Globecom 1998 Comm. Theory Mini Conf. Record* (November 1998), pp. 173–178;
34. Lang, T., and Antelo, E., *IEEE Trans. Comp.* 47:736–749 (1998);
35. Moeneclaey, M., *IEEE Trans. Comm.* 31:1029–1032 (1983);
36. Vuori, J., *IEEE Trans. Consum. Electron.* 45:1098–1103 (1999); and
37. Freeman, H., *Discrete-Time Systems*, Wiley, New York, N.Y. (1965).

10. Conclusion

Example implementations of the methods, systems and components of the invention have been described herein. As noted elsewhere, these example implementations have been described for illustrative purposes only, and are not limiting. Other implementation embodiments are possible and covered by the invention, such as but not limited to software and software/hardware implementations of the systems and components of the invention. Such implementation embodiments will be apparent to persons skilled in the relevant art(s) based on the teachings contained herein.

While various application embodiments of the present invention have been described above, it should be understood that they have been presented by way of example only, and not limitation. Thus, the breadth and scope of the present invention should not be limited by any of the above-described exemplary embodiments.

What is claimed is:

1. In a communications device, a method of determining an interpolation value between two data samples at an offset $\mu$ that is referenced from one of the two data samples, the method comprising the steps of:

(1) receiving a set of N data samples having the two data samples that are to be interpolated;

(2) determining coefficients for a trigonometric polynomial based on said set of N data samples; and (3) evaluating said trigonometric polynomial at the offset $\mu$, wherein a real part of said trigonometric polynomial represents the desired interpolation value, whereby the interpolation value is data processed by the communications device.

2. The method of claim 1, wherein step (2) comprises the step of determining a discrete Fourier transform (DFT) for said coefficients.

3. The method of claim 1, wherein step (2) comprises the step of multiplying one or more of said data samples by a complex scaling factor $W_N^{kn}$ to generate a $k^{th}$ coefficient for said trigonometric polynomial, wherein $W_N = e^{-j2\pi/N}$, and wherein n represents an $n^{th}$ data sample of said N data samples.

4. The method of claim 1, wherein step (3) comprises the steps of (a) determining a $W_N^{-k\mu}$ value for a corresponding $k^{th}$ coefficient of said trigonometric polynomial, wherein $W_N = e^{-j2\pi/N}$; and (b) multiplying said $k^{th}$ coefficient by said corresponding $W_N^{-k\mu}$ value to evaluate said trigonometric polynomial.

5. The method of claim 4, further comprising the step of:

(c) repeating step (b) for each coefficient of said trigonometric polynomial.

6. The method of claim 4, wherein step (a) comprises the step of retrieving $W_N^{-k\mu}$ from a lookup table, for a given value of $\mu$.

7. The method of claim 4, wherein step (a) comprises the step of determining $W_N^{-k\mu}$ using an angle rotator device for a given value of $\mu$.

8. The method of claim 1, wherein said coefficients in step (2) are determined according to the following:

$$c_k = \sum_{n=-N/2+1}^{N/2} y(n) W_N^{kn}, k = -\frac{N}{2}+1, \ldots, \frac{N}{2};$$

$W_N = e^{-j2\pi/N}$; and wherein y(n) represents a $n^{th}$ data sample of said data sample set having N data samples.

9. The method of claim 8, wherein said trigonometric polynomial is evaluated at the offset $\mu$, as follows:

$$y(\mu) = \frac{1}{N}\left( \sum_{n=-N/2+1}^{N/2-1} c_k W_N^{-k\mu} + c_{N/2}\cos\pi\mu \right).$$

10. The method of claim 8, wherein said trigonometric polynomial is evaluated at the offset $\mu$, as follows:

$$y(\mu) = \frac{1}{N}\text{Re}\left( c_0 + 2\sum_{k=1}^{N/2-1} c_k W_N^{-k\mu} + c_{N/2} e^{j\pi\mu} \right).$$

11. The method of claim 1, wherein step (2) comprises the steps of;

(a) modifying said set of N data samples so that a coefficient $c_{N/2}$ is 0; and (b) determining said coefficients for said trigonometric polynomial based on said modified set of data samples.

12. The method of claim 11, wherein said step (b) is done simultaneously with step (a).

13. The method of claim 11, wherein step (b) comprises the step of determining said coefficients, with the exception of coefficient $c_{N/2}$, for said trigonometric polynomial based on said modified set of data samples.

14. The method of claim 11, further comprising the step of;

(4) compensating the interpolation value to correct for said modified data samples.

15. The method of claim 11, wherein step (a) comprises the step of adjusting one or more of said data samples according to the following equation:

$$y(n)_{mod} = y(n) + n\cdot K;$$

$$K = -\frac{2}{N} \sum_{n=-N/2+1}^{N/2} (-1)^n y(n);$$

wherein y(n) represents a $n^{th}$ data sample of said N data samples, and wherein $y(n)_{mod}$ is a modified $n^{th}$ data sample.

16. The method of claim 11, further comprising the step of:

(4) compensating the interpolation value to correct for said modified data samples, according to the following equation:

$$y(\mu) = y(\mu)_{mod} - K\cdot\mu$$

wherein $y(\mu)_{mod}$ represents an uncompensated interpolation value, and $y(\mu)$ represents a compensated interpolation value.

17. In a communications device, a method of determining an interpolation value between two data samples at an offset $\mu$ that is referenced from one of the two data samples, the method comprising the steps of:

(1) receiving a set of N data samples having the two data samples that are to be interpolated;

(2) determining coefficients for a trigonometric polynomial based on said set of N data samples, comprising the step of multiplying one or more of said data samples by a complex scaling factor $W_N^{kn}$, wherein $W_N = e^{-j2\pi/N}$, wherein n represents an $n^{th}$ data sample of N total data samples; and (3) evaluating said trigonometric polynomial at the offset $\mu$, wherein a real part of said trigonometric polynomial represents the desired interpolation value including the steps of (a) determining a $W_N^{-k\mu}$ value for a $k^{th}$ coefficient of said trigonometric polynomial, wherein $W_N = e^{-2\pi/N}$; and (b) multiplying said $k^{th}$ coefficient by said corresponding $W_N^{-k\mu}$ value to evaluate said trigonometric polynomial.

18. The method of claim 17, wherein said coefficients in step (2) are determined according to the following:

$$c_k = \sum_{n=-N/2+1}^{N/2} y(n) W_N^{kn}, k = -\frac{N}{2}+1, \ldots, \frac{N}{2};$$

$W^N = e^{-j2\pi/N}$; and wherein y(n) represents a $n^{th}$ data sample of said data sample set having N data samples.

19. The method of claim 18, wherein said trigonometric polynomial is evaluated at the offset $\mu$, as follows:

$$y(\mu) = \frac{1}{N}\left( \sum_{n=-N/2+1}^{N/2-1} c_k W_N^{-k\mu} + c_{N/2}\cos\pi\mu \right).$$

20. The method of claim 18, wherein said trigonometric polynomial is evaluated at said offset $\mu$, according to the following equation:

$$y(\mu) = \frac{1}{N}\text{Re}\left(c_0 + 2\sum_{k=1}^{N/2-1} c_k W_N^{-k\mu} + c_{N/2}e^{j\pi\mu}\right).$$

21. In a communications device, a method of determining an interpolation value between two data samples at an offset $\mu$ that is referenced from one of the two data samples, the method comprising the steps of:
  (1) receiving a set of N data samples comprising the first data sample and the second data sample;
  (2) generating a first complex coefficient and a second coefficient based on said set of N data samples;
  (3) rotating said first complex coefficient and said second complex coefficient in a complex plane based on the offset $\mu$ to produce a first rotated complex number and a second rotated complex number; and
  (4) determining the interpolation value based on a real part of said first rotated complex number and a real part of said second rotated complex number, whereby the interpolation value is data processed by said communications device.

22. The method of claim 21, wherein step (4) comprises the step of adding said real part of said first rotated complex number to a real part of said second rotated complex number.

23. The method of claim 21, wherein step (2) comprises the step of modifying at least one of said first complex and said second complex coefficient to account for a frequency characteristic of said set of N data samples.

24. The method of claim 21, wherein step (2) comprises the step of modifying at least one of said first complex coefficient and said second complex coefficient based on the $\mu$ offset.

25. In a communications device, a method of determining an interpolation value between two data samples at an offset $\mu$ that is referenced from one of the two data samples, the method comprising the steps of:
  (1) receiving a set of N data samples that includes the two data samples that are to be interpolated;
  (2) generating a complex coefficient and a non-complex coefficient based on said set of N data samples;
  (3) rotating said complex coefficient in a complex plane based on the offset $\mu$ to produce a rotated complex number; and
  (4) determining the interpolation value based on a real part of said rotated complex number and said non-complex coefficient, whereby the interpolation value is data processed by said communications device.

26. The method of claim 25, wherein step (4) comprises the step of adding a real part of said complex coefficient to said non-complex coefficient.

27. The method of claim 25, further comprising the step of generating a value of K·$\mu$ based on the N data samples, where $$K = -\frac{2}{N}\sum_{n=-N/2+1}^{N/2}(-1)^n y(n),$$

wherein y(n) represents a $n^{th}$ data sample of said data sample set having N data samples; and
  wherein step (4) comprises the step of determining the interpolation value based on a real part of said first rotated complex number, said non-complex coefficient, and said value K·$\mu$.

28. The method of claim 25, wherein step (2) comprises the step of modifying said complex coefficient to account for frequency characteristics of the set of N data samples.

29. The method of claim 25, wherein step (2) comprises the step of modifying said complex coefficient based on the offset $\mu$.

30. An apparatus for interpolating between two data samples at an offset $\mu$ that is referenced from one of the two data samples, wherein the two data samples are part of a set of N data samples, the apparatus comprising:
  a delay module that receives the set of N data samples;
  an adder/subtractor module, coupled to an output of said delay module, wherein said adder module generates one or more coefficients based on delayed data samples from said delay module, wherein at least one of said coefficients is a complex coefficient; and
  an angle rotator, coupled to an output of said adder module, said angle rotator rotating said complex coefficient in a complex plane based on the offset $\mu$ to generate a rotated complex coefficient, whereby said interpolation value is determined based on said rotated complex coefficient.

31. The apparatus of claim 30, wherein said adder/subtractor module generates a second complex coefficient, said apparatus further comprising:
  a second angle rotator, coupled to an output of said adder module, said second angle rotator rotating said second complex coefficient in said complex plane based on said offset $\mu$.

32. The apparatus of claim 31, further comprising an output adder that is coupled to an output of said angle rotator and an output of said second angle rotator, said output adder combining a real part of said rotated complex number and a real part of said second rotated complex number.

33. The apparatus of claim 30, wherein said adder/subtractor module generates a K value that is determined so that a coefficient $c_{N/2}=0$, wherein said apparatus further comprises a multiplier that receives said K value and the offset $\mu$, wherein said multiplier multiplies said K value by the offset $\mu$ to produce a K$\mu$ value.

34. The apparatus of claim 33, wherein said constant K is:

$$K = -\frac{2}{N}\sum_{n=-N/2+1}^{N/2}(-1)^n y(n)$$

wherein y(n) represents a $n^{th}$ data sample of said data sample set having N data samples.

35. The apparatus of claim 33, further comprising an output adder that is coupled to said angle rotator and said multiplier, wherein said output adder adds together a real part of said rotated complex number and said K$\mu$ value.

36. The apparatus of claim 35, wherein said output adder is also coupled to said adder/subtractor module, wherein said output adder adds together a real part of said rotated complex number, said K$\mu$ value, and at least one other coefficient from said adder/subtractor module.

37. The apparatus of claim 30, further comprising a multiplier, coupled between said adder/subtractor module and said angle rotator, wherein said multiplier multiples at least one of said complex coefficients by a factor $\hat{F}_\mu$, wherein said factor $\hat{F}_\mu$ is chosen to adjust a frequency response of said apparatus so that it is consistent with a frequency response of said N data samples and the offset $\mu$.

38. The apparatus of claim 37, wherein said factor $\hat{F}_\mu$ is determined based on an optimization routine.

39. The apparatus of claim 30, wherein said angle rotator comprises:
- a lookup table that is indexed by the offset $\mu$, wherein said lookup table stores a first value that is based on a cosine $(x \cdot \pi \cdot \mu)$ and stores a second value based on a sine $(x \cdot \pi \cdot \mu)$, and wherein x is a fraction between 0 and 1; and
- a multiplier for multiplying said complex coefficient by said first value and said second value.

40. The apparatus of claim 39, wherein said multiplier multiplies a real part of said complex coefficient by said first value, and multiplies an imaginary part of said complex coefficient by said second value.

41. The apparatus of claim 39, wherein said first value is based on $\hat{F}_\mu \cdot \text{cosine}(x \cdot \pi \cdot \mu)$, and said second value is based on $\hat{F}_\mu \cdot \text{sine}(x \cdot \pi \cdot \mu)$, wherein $\hat{F}_\mu$ is chosen to adjust a frequency response of said apparatus so that it is consistent with a frequency response of the N data samples, and the offset $\mu$.

42. An apparatus for interpolating between two data samples at an offset $\mu$ that is referenced from one of the two data samples, wherein the two data samples are part of a set of N data samples, the apparatus comprising:
- a delay module that receives the set of N data samples;
- an adder/subtractor module, coupled to an output of said delay module, wherein said adder module generates one or more coefficients based on delayed data samples from said delay module, wherein at least one of said coefficients is a complex coefficient, and wherein said adder/subtractor module generates a K value that is determined so that $c_{N/2}=0$;
- an angle rotator, coupled to an output of said adder module, said angle rotator rotating said complex coefficient in a complex plane based on the offset $\mu$, said angle rotator including,
  - a lookup table that is indexed by $\mu$, wherein said lookup table stores a first value that is based on $\hat{F}_\mu \cdot \text{cosine}(x \cdot \pi \cdot \mu)$ and stores a second value based on $\hat{F}_\mu \cdot \text{sine}(x \cdot \pi \cdot \mu)$, wherein x is a fraction between 0 and 1; wherein $\hat{F}_\mu$ is chosen to adjust a frequency response of said apparatus so that it is consistent with a frequency response of the N data samples and the offset $\mu$, and
  - a first multiplier for multiplying said complex coefficient by said first value and said second value, to produce a real part of said rotated complex coefficient;
- a second multiplier that multiples said K value from the adder/subtractor module with the offset $\mu$, to produce a $K\mu$ value; and
- an output adder, coupled to an output of said first multiplier and an output said second multiplier and an output of said adder/subtractor module, wherein said output adder adds together said real part of said rotated complex number and said $K\mu$ value and at least one non-complex coefficient from said adder/subtractor module.

43. An apparatus for increasing a sampling rate of a set of data samples by a factor L, the apparatus comprising:
- a delay module that receives the set of N data samples;
- an adder/subtractor module, coupled to an output of said delay module, wherein said adder module generates one or more coefficients based on delayed data samples from said delay module, wherein one or more of said coefficients is a complex coefficient;
- a plurality of N angle rotator modules, coupled to an output of said adder module, each angle rotator rotating one or more of said coefficients in a complex plane based on a corresponding offset $\mu$ to generate a rotated complex coefficient, wherein $\mu$ varies for each angle rotator module according to $\mu=n(L-1)/L$, where n increases from n=1 to N and represents one of the N angle rotator modules; and
- a multiplexer, coupled to outputs of said plurality of angle rotator modules, said multiplexer operating at a rate of Lr.

* * * * *

UNITED STATES PATENT AND TRADEMARK OFFICE
CERTIFICATE OF CORRECTION

PATENT NO. : 6,772,181 B1
DATED : August 3, 2004
INVENTOR(S) : Fu et al.

It is certified that error appears in the above-identified patent and that said Letters Patent is hereby corrected as shown below:

Column 6,
After line 20, please insert -- FIG. 55 illustrates as an angle rotator configured as quadrature direct synthesizer (QDDS) according to embodiments of the present invention. --

Column 14,
Line 20, delete equation (2.10) and insert the following:

-- $$y(\mu) = \frac{1}{N}\left(\sum_{k=-N/2+1}^{N/2-1} c_k W_N^{-k\mu} + c_{N/2}\cos\pi\mu\right).$$ (2.10) --

Column 15,
Line 5, delete equation (2.13) and insert the following:

-- $$f(\mu - n) = C_n(\mu), \quad 0 \le \mu < 1, \quad -N/2+1 \le n < N/2.$$ (2.13) --

Column 17,
Line 1, delete equation (2.20) and insert the following:
--

$$c_0 = y(-3) + y(-2) + y(-1) + y(0) + y(1) + y(2) + y(3) + y(4)$$
$$c_1 = \{y(0) - y(4) + [-y(-3) + y(1) + y(-1) - y(3)]\cos(\pi/4)\}$$
$$\quad + j\{y(-2) - y(2) + [y(-3) - y(1) + y(-1) - y(3)]\cos(\pi/4)\}$$
$$c_2 = \{-y(-2) + y(0) - y(2) + y(4)\} + j\{-y(-3) + y(-1) - y(1) + y(3)\}$$
$$c_3 = \{y(0) - y(4) + [y(-3) - y(1) + (-y(-1) + y(3))]\cos(\pi/4)\}$$
$$\quad + j\{-y(-2) + y(2) + [y(-3) - y(1) + (-y(-1) - y(3))]\cos(\pi/4)\}$$
$$c_4 = -y(-3) + y(-2) - y(-1) + y(0) - y(1) + y(2) - y(3) + y(4).$$

(2.20) --

Line 65, delete "igns".

Column 18,
After line 12, insert the following:
-- In step 1704, the delay module 1004 delays the input data samples. --

UNITED STATES PATENT AND TRADEMARK OFFICE
CERTIFICATE OF CORRECTION

PATENT NO. : 6,772,181 B1
DATED : August 3, 2004
INVENTOR(S) : Fu et al.

It is certified that error appears in the above-identified patent and that said Letters Patent is hereby corrected as shown below:

Column 20,
Line 49, delete equation (2.22) and insert the following:

$$\tilde{y}(-1) = y(-1) - K$$
$$\tilde{y}(0) = y(0)$$
$$\tilde{y}(1) = y(1) + K$$
$$\tilde{y}(2) = y(2) + 2K \qquad (2.22)$$

Column 21,
Line 25, delete equation (2.27) and insert the following:

$$y(\mu) = \tilde{y}(\mu) - K\mu. \qquad (2.27)$$

Line 35, delete equation (2.28) and insert the following:

$$\tilde{y}(n) = y(n) + nK, \qquad n = \text{integer}. \qquad (2.28)$$

Column 85,
Line 2, delete "of" and insert -- of: --
Line 35, delete the equation and insert the following:

$$y(\mu) = \frac{1}{N}\left(\sum_{k=-N/2+1}^{N/2-1} c_k W_N^{-k\mu} + c_{N/2} \cos \pi\mu \right).$$

Lines 50 and 65, delete "of;" and insert -- of: --

Column 86,
Lines 34-35, delete the phrase "wherein $W_N = e^{31j2\pi/N}$," and insert:
-- wherein $W_N = e^{-j2\pi/N}$, --
Line 43, delete the phrase "wherein $W_N = {}^{-2\pi/N}$," and insert:
-- wherein $W_N = e^{-j2\pi/N}$, --
Line 54, delete "$W^N = e^{-j2\pi/N}$" and insert -- $W_N = e^{-j2\pi/N}$ --

UNITED STATES PATENT AND TRADEMARK OFFICE
CERTIFICATE OF CORRECTION

PATENT NO. : 6,772,181 B1
DATED : August 3, 2004
INVENTOR(S) : Fu et al.

It is certified that error appears in the above-identified patent and that said Letters Patent is hereby corrected as shown below:

Column 86 (cont'd),
Line 60, delete the equation and insert the following:

$$y(\mu) = \frac{1}{N}\left(\sum_{k=-N/2+1}^{N/2-1} c_k W_N^{-k\mu} + c_{N/2}\cos\pi\mu\right).$$

Column 88,
Line 36, delete "ofclaim" and insert -- of claim --

Signed and Sealed this

Twelfth Day of July, 2005

JON W. DUDAS
*Director of the United States Patent and Trademark Office*